US011469232B2

(12) United States Patent
Lee

(10) Patent No.: US 11,469,232 B2

(45) Date of Patent: Oct. 11, 2022

(54) EPITAXIAL SILICON WITHIN HORIZONTAL ACCESS DEVICES IN VERTICAL THREE DIMENSIONAL (3D) MEMORY

(71) Applicant: Micron Technology, Inc., Boise, ID (US)

(72) Inventor: Si-Woo Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/171,336

(22) Filed: Feb. 9, 2021

(65) Prior Publication Data

US 2022/0254784 A1 Aug. 11, 2022

(51) Int. Cl.
*H01L 27/108* (2006.01)
*H01L 21/762* (2006.01)

(52) U.S. Cl.
CPC .. *H01L 27/10847* (2013.01); *H01L 21/76294* (2013.01)

(58) Field of Classification Search
CPC .................... H01L 27/10847; H01L 21/76294
See application file for complete search history.

(56) References Cited

U.S. PATENT DOCUMENTS 10,607,995 B2 * 3/2020 Roberts ............... H01L 27/1085
11,164,872 B1 * 11/2021 Pulugurtha ....... H01L 27/10805
11,227,864 B1 * 1/2022 Saeedi Vahdat ............................. H01L 21/02565
2018/0323199 A1 * 11/2018 Roberts ............. H01L 27/10805
2018/0323200 A1 * 11/2018 Tang ................. H01L 29/42376
2019/0103406 A1 * 4/2019 Tang ................... H01L 27/1082
2019/0164985 A1 * 5/2019 Lee ................... H01L 27/10805
2020/0411523 A1 * 12/2020 Shin .................. H01L 27/10808
2021/0104526 A1 * 4/2021 Son ................... H01L 27/10879
2021/0104527 A1 * 4/2021 Son ................... H01L 27/10873
2021/0125989 A1 * 4/2021 Shin .................. H01L 27/11551
2021/0183862 A1 * 6/2021 Son ................... H01L 21/02603

FOREIGN PATENT DOCUMENTS

CN 112151546 A * 12/2020 ............ G11C 5/063

* cited by examiner

*Primary Examiner* — Edward Chin

(74) *Attorney, Agent, or Firm* — Brooks, Cameron & Huebsch, PLLC

(57) ABSTRACT

Systems, methods and apparatus are provided for an array of vertically stacked memory cells having horizontally oriented access devices and storage nodes. The horizontally oriented access devices having a first source/drain regions and a second source drain regions separated by epitaxially grown channel regions. Gates opposing the channel regions formed fully around every surface of the channel region as gate all around (GAA) structures separated from a channel regions by a gate dielectrics. The memory cells have horizontally oriented storage nodes coupled to the second source/drain regions and digit lines coupled to the first source/drain regions.

27 Claims, 90 Drawing Sheets

(ALONG CUT-LINE A-A' IN FIG 5A)

(ALONG CUT-LINE A-A' IN FIG 6A)

(ALONG CUT-LINE B-B' IN FIG 6A)

(ALONG CUT-LINE D-D' IN FIG 6A)

(ALONG CUT-LINE A-A' IN FIG 7A)

(ALONG CUT-LINE B-B' IN FIG 7A)

(ALONG CUT-LINE A-A' IN FIG 8A)

(ALONG CUT-LINE B-B' IN FIG 8A)

(ALONG CUT-LINE C-C' IN FIG 8A)

(ALONG CUT-LINE D-D' IN FIG 8A)

(ALONG CUT-LINE A-A' IN FIG 9A)

(ALONG CUT-LINE C-C' IN FIG 9A)

(ALONG CUT-LINE D-D' IN FIG 9A)

(ALONG CUT-LINE A-A' IN FIG 10A)

(ALONG CUT-LINE C-C' IN FIG 10A)

(ALONG CUT-LINE A-A' IN FIG 11A)

(ALONG CUT-LINE C-C' IN FIG 11A)

(ALONG CUT-LINE D-D' IN FIG 11A)

(ALONG CUT-LINE A-A' IN FIG 12A)

(ALONG CUT-LINE B-B' IN FIG 12A)

(ALONG CUT-LINE C-C' IN FIG 12A)

(ALONG CUT-LINE D-D' IN FIG 13A)

(ALONG CUT-LINE A-A' IN FIG 14A)

(ALONG CUT-LINE C-C' IN FIG 14A)

(ALONG CUT-LINE D-D' IN FIG 14A)

(ALONG CUT-LINE A-A' IN FIG 15A)

(ALONG CUT-LINE B-B' IN FIG 15A)

(ALONG CUT-LINE C-C' IN FIG 15A)

(ALONG CUT-LINE D-D' IN FIG 15A)

(ALONG CUT-LINE A-A' IN FIG 16A)

(ALONG CUT-LINE B-B' IN FIG 16A)

(ALONG CUT-LINE C-C' IN FIG 16A)

(ALONG CUT-LINE D-D' IN FIG 16A)

(ALONG CUT-LINE A-A' IN FIG 17A)

(ALONG CUT-LINE B-B' IN FIG 17A)

(ALONG CUT-LINE C-C' IN FIG 17A)

(ALONG CUT-LINE D-D' IN FIG 17A)

(ALONG CUT-LINE A-A' IN FIG 18A)

(ALONG CUT-LINE B-B' IN FIG 18A)

(ALONG CUT-LINE C-C' IN FIG 18A)

(ALONG CUT-LINE D-D' IN FIG 18A)

(ALONG CUT-LINE A-A' IN FIG 19A)

(ALONG CUT-LINE C-C' IN FIG 19A)

(ALONG CUT-LINE B-B' IN FIG 20A)

(ALONG CUT-LINE C-C' IN FIG 20A)

(ALONG CUT-LINE D-D' IN FIG 20A)

EPITAXIAL SILICON WITHIN HORIZONTAL ACCESS DEVICES IN VERTICAL THREE DIMENSIONAL (3D) MEMORY

TECHNICAL FIELD

The present disclosure relates generally to memory devices, and more particularly, to epitaxial silicon within horizontal access devices in vertical three dimensional (3D) memory.

BACKGROUND

Memory is often implemented in electronic systems, such as computers, cell phones, hand-held devices, etc. There are many different types of memory, including volatile and non-volatile memory. Volatile memory may require power to maintain its data and may include random-access memory (RAM), dynamic random-access memory (DRAM), static random-access memory (SRAM), and synchronous dynamic random-access memory (SDRAM). Non-volatile memory may provide persistent data by retaining stored data when not powered and may include NAND flash memory, NOR flash memory, nitride read only memory (NROM), phase-change memory (e.g., phase-change random access memory), resistive memory (e.g., resistive random-access memory), cross-point memory, ferroelectric random-access memory (FeRAM), or the like.

As design rules shrink, less semiconductor space is available to fabricate memory, including DRAM arrays. A respective memory cell for DRAM may include an access device, e.g., transistor, having a first and a second source/drain regions separated by epitaxially grown channel regions. A gate may oppose the channel region and be separated therefrom by a gate dielectric. An access line, such as a word line, is electrically connected to the gate of the DRAM cell. A DRAM cell can include a storage node, such as a capacitor cell, coupled by the access device to a digit line. The access device can be activated (e.g., to select the cell) by an access line coupled to the access transistor. The capacitor can store a charge corresponding to a data value of a respective cell (e.g., a logic “1” or “0”).

DETAILED DESCRIPTION

Embodiments of the present disclosure describe forming epitaxial silicon within horizontal access devices in vertical three dimensional (3D) memory. A vertically oriented digit line is formed with horizontally oriented access devices and access lines in an array of vertically stacked memory cells. The horizontal access devices are integrated with horizontally oriented access lines having a first source/drain regions and a second source drain regions separated by epitaxially grown channel regions and integrated with vertically oriented digit lines. In vertically stacked memory array structures, such as transistor structures, polycrystalline silicon (also referred to as polysilicon) can be leaky, allowing current to leak through the polycrystalline structure, making the transistor less effective. Single crystal silicon is not very leaky, however, single crystal silicon cannot grow on amorphous dielectric materials, such as oxides or nitrides, which are the common materials upon which transistors are formed.

However, as disclosed in the embodiments of the present disclosure, it is possible to use a silicon wafer for a transistor that can be utilized as a substrate during the high temperature processes required for single crystal silicon formation. In such embodiments, a layer of silicon germanium can be grown on the silicon substrate. Single crystal silicon can, then, be grown on the silicon germanium.

This may be accomplished, for example, by providing a thin single crystal silicon germanium layer, as a seed layer, and then heating the layer to grow the single crystal silicon germanium layer thickness through epitaxial growth. Once the desired layer thickness is formed, a silicon layer can be formed into the surface of the silicon germanium layer. As with the silicon germanium layer, this may be accomplished, for example, by providing a thin single crystal silicon layer, as a seed layer, and then heating the layer to grow the thin single crystal silicon layer thickness into a thicker single crystal silicon layer through epitaxial growth.

Figure 4:
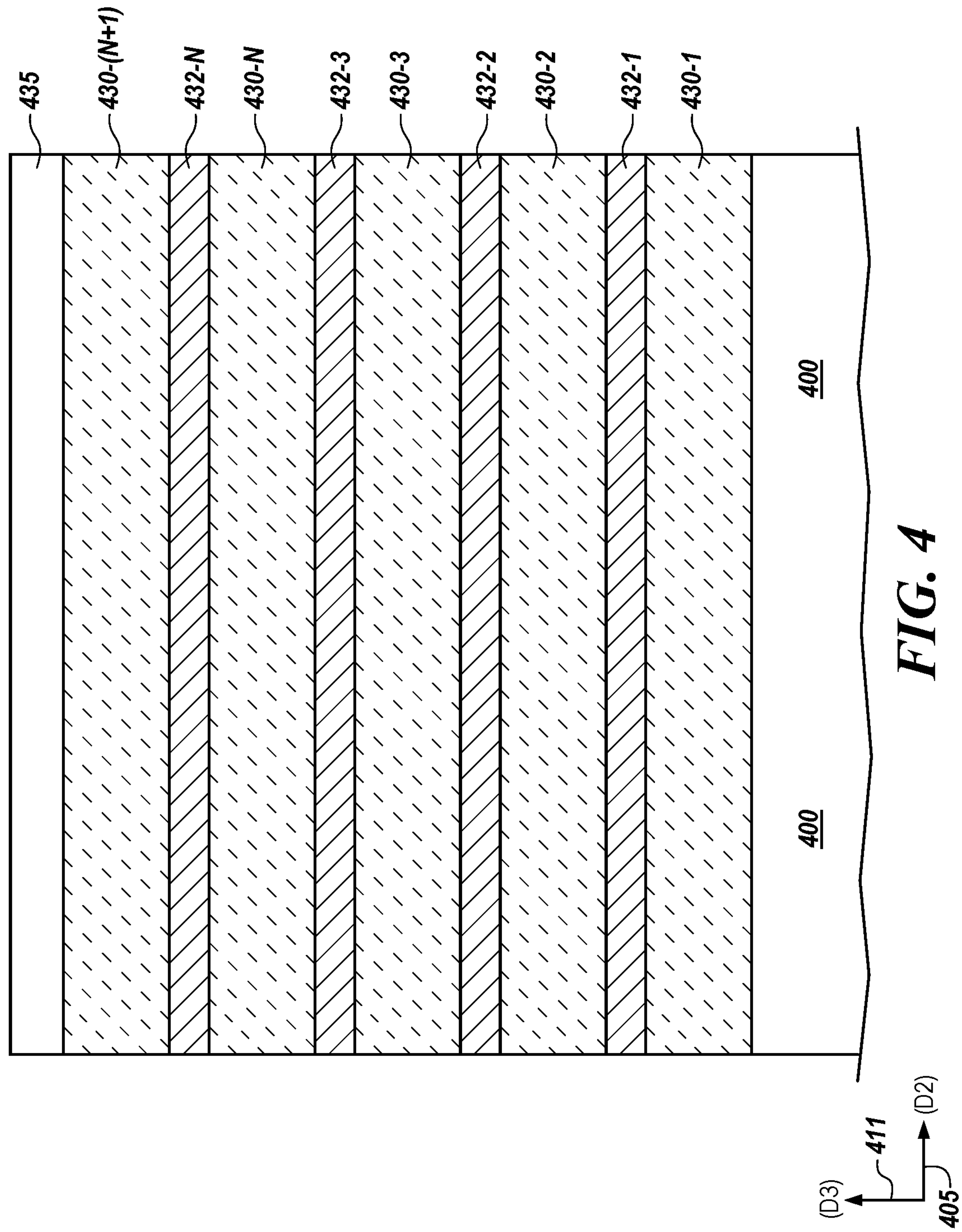
FIG. 4 is a cross-sectional view for forming epitaxial silicon within horizontal access devices in vertical three dimensional (3D) memory in accordance with a number of embodiments of the present disclosure.

Depending on the silicon germanium concentration, if silicon is x quantity and germanium is y quantity and, if y is smaller than x, then silicon/silicon germanium has a small lattice mismatch with respect to the lattice of single crystal silicon. This allows silicon to be grown on top of silicon germanium with a single crystal structure. If a thin layer of single crystal silicon is applied to the surface of the silicon germanium, then the whole silicon layer acts as a seed for the growth of the single crystal silicon layer. Such layering can be done in alternating iterations (e.g., SiGe/Si/SiGe/Si, etc.) to create a superlattice structure in the form of a vertical stack such as shown in FIG. 4.

For example, a seed layer of silicon germanium can be formed that is 100 Angstroms in thickness (height) and can be grown to, for example 1000 Angstroms. A thin silicon seed layer can be formed on the surface of the silicon germanium layer that is, for example, 50 Angstroms and can be grown to a thickness of, for example, 300 Angstroms. These thicknesses are merely provided as examples and should not be regarded as limiting unless recited explicitly in a particular claim.

The transistor devices of the present disclosure will have better performance with regard to I-on, better I-off, drivability, and/or leakage current because there is no grain boundary and therefore current cannot leak through the grain boundary which is where leakage often occurs in polysilicon. In some embodiments, devices can have, for example, three orders of magnitude lower I-off (leakage).

Advantages to the structure and process described herein can include a lower off-current (Ioff) for the access devices, as compared to silicon based (Si-based) access devices (e.g., transistors), better DRAM refresh requirement, and/or reduced gate/drain induced leakage (GIDL) for the access devices. The present disclosure describes a channel region formed from a epitaxially grown materials. Combined with a gate all around (GAA) structure at the channel region of the semiconductor material, provides better electrostatic control on the channel, better subthreshold slope and a more cost effective process.

The figures herein follow a numbering convention in which the first digit or digits correspond to the figure number of the drawing and the remaining digits identify an element or component in the drawing. Similar elements or components between different figures may be identified by the use of similar digits. For example, reference numeral 104 may reference element "04" in FIG. 1, and a similar element may be referenced as 204 in FIG. 2. Multiple analogous elements within one figure may be referenced with a reference numeral followed by a hyphen and another numeral or a letter. For example, 302-1 may reference element 302-1 in FIGS. 3 and 302-2 may reference element 302-2, which may be analogous to element 302-1. Such analogous elements may be generally referenced without the hyphen and extra numeral or letter. For example, elements 302-1 and 302-2 or other analogous elements may be generally referenced as 302.

Figure 1A:
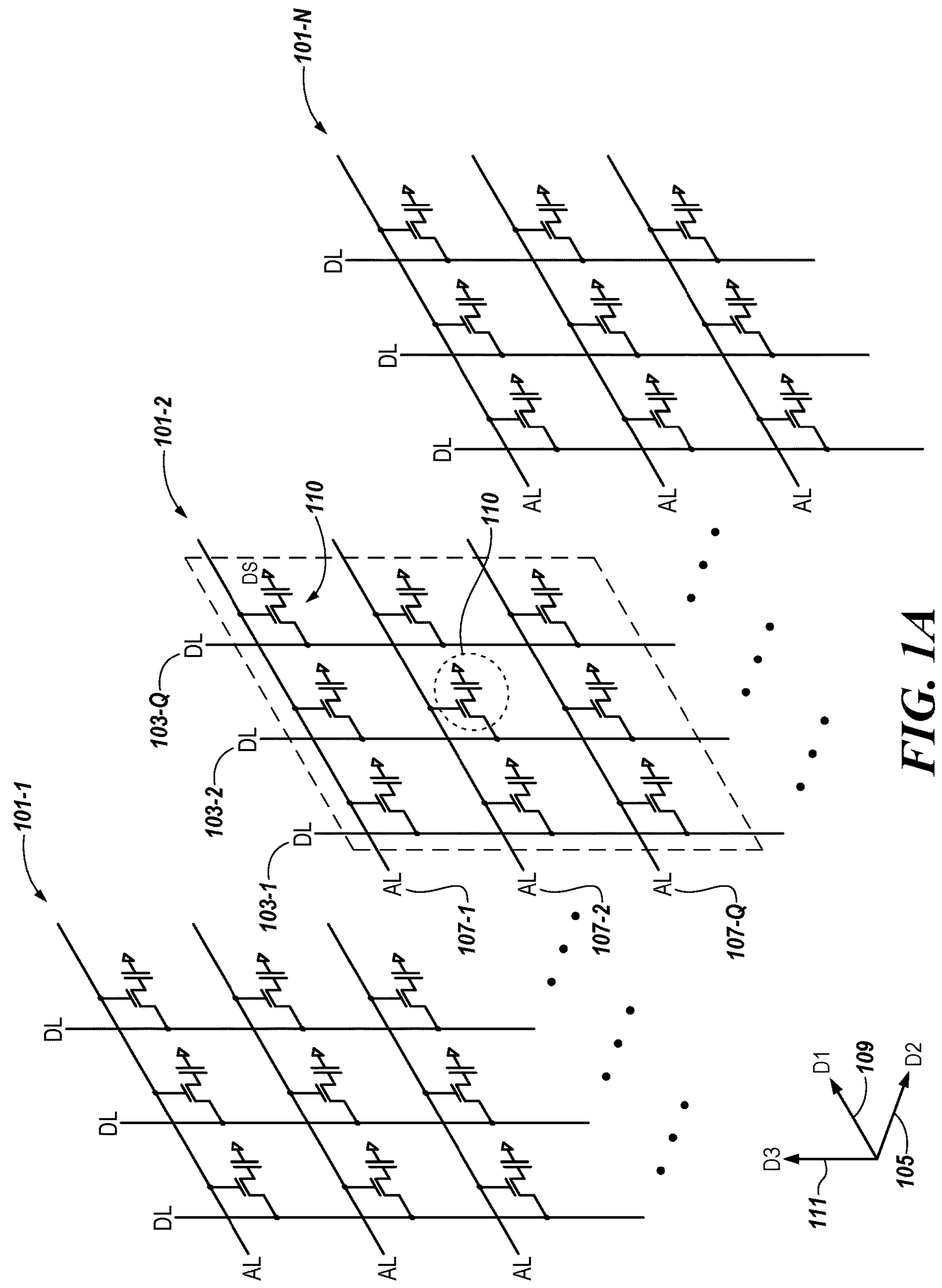
FIG. 1A is a schematic illustration of a horizontal access device in a vertical three dimensional (3D) memory in accordance a number of embodiments of the present disclosure.

FIG. 1A is a block diagram of an apparatus in accordance with a number of embodiments of the present disclosure. FIG. 1A illustrates a circuit diagram showing a cell array of a three dimensional (3D) semiconductor memory device according to embodiments of the present disclosure. FIG. 1A illustrates that a cell array may have a plurality of sub cell arrays 101-1, 101-2, . . . , 101-N. The sub cell arrays 101-1, 101-2, . . . , 101-N may be arranged along a second direction (D2) 105. Each of the sub cell arrays, e.g., sub cell array 101-2, may include a plurality of access lines 107-1, 107-2, . . . , 107-Q (which also may be referred to a word lines). Also, each of the sub cell arrays, e.g., sub cell array 101-2, may include a plurality of digit lines 103-1, 103-2, . . . , 103-Q (which also may be referred to as bit lines, data lines, or sense lines). In FIG. 1A, the access lines 107-1, 107-2, . . . , 107-Q are illustrated extending in a first direction (D1) 109 and the digit lines 103-1, 103-2, . . . , 103-Q are illustrated extending in a third direction (D3) 111. According to embodiments, the first direction (D1) 109 and the second direction (D2) 105 may be considered in a horizontal ("X-Y") plane. The third direction (D3) 111 may be considered in a vertical ("Z") plane. Hence, according to embodiments described herein, the digit lines 103-1, 103-2, . . . , 103-Q are extending in a vertical direction, e.g., third direction (D3) 111.

A memory cell, e.g., 110, may include an access device, e.g., access transistor, and a storage node located at an intersection of each access line 107-1, 107-2, . . . , 107-Q and each digit line 103-1, 103-2, . . . , 103-Q. Memory cells may be written to, or read from, using the access lines 107-1, 107-2, . . . , 107-Q and digit lines 103-1, 103-2, . . . , 103-Q. The access lines 107-1, 107-2, . . . , 107-Q may conductively interconnect memory cells along horizontal rows of each sub cell array 101-, 101-2, . . . , 101-N, and the digit lines 103-1, 103-2, . . . , 103-Q may conductively interconnect memory cells along vertical columns of each sub cell array 101-, 101-2, . . . , 101-N. One memory cell, e.g. 110, may be located between one access line, e.g., 107-2, and one digit line, e.g., 103-2. Each memory cell may be uniquely addressed through a combination of an access line 107-1, 107-2, . . . , 107-Q and a digit line 103-1, 103-2, . . . , 103-Q.

The access lines 107-1, 107-2, . . . , 107-P may be or include conducting patterns (e.g., metal lines) disposed on and spaced apart from a substrate. The access lines 107-1, 107-2, . . . , 107-Q may extend in a first direction (D1) 109. The access lines 107-1, 107-2, . . . , 107-Q in one sub cell array, e.g., 101-2, may be spaced apart from each other in a vertical direction, e.g., in a third direction (D3) 111.

The digit lines 103-1, 103-2, . . . , 103-Q may be or include conductive patterns (e.g., metal lines) extending in a vertical direction with respect to the substrate, e.g., in a third direction (D3) 111. The digit lines in one sub cell array, e.g., 101-2, may be spaced apart from each other in the first direction (D1) 109.

A gate of a memory cell, e.g., memory cell 110, may be connected to an access line, e.g., 107-2, and a first conductive node, e.g., first source/drain region, of an access device, e.g., transistor, of the memory cell 110 may be connected to a digit line, e.g., 103-2. Each of the memory cells, e.g., memory cell 110, may be connected to a storage node, e.g., capacitor. A second conductive node, e.g., second source/drain region, of the access device, e.g., transistor, of the memory cell 110 may be connected to the storage node, e.g., capacitor. While first and second source/drain region references are used herein to denote two separate and distinct source/drain regions, it is not intended that the source/drain region referred to as the "first" and/or "second" source/drain regions have some unique meaning. It is intended only that one of the source/drain regions is connected to a digit line, e.g., 103-2, and the other may be connected to a storage node.

Figure 1B:
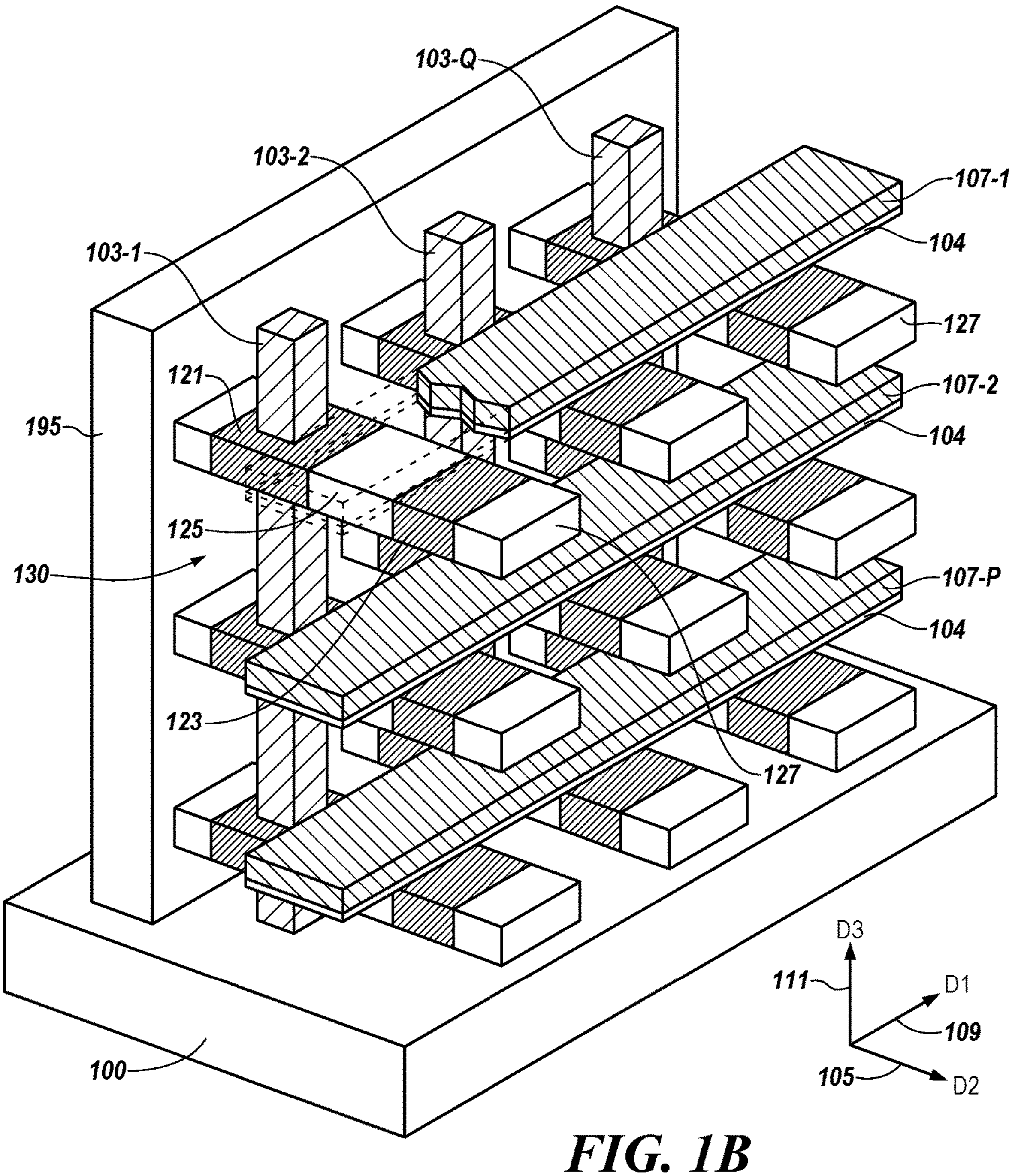
FIG. 1B is a perspective view illustrating a portion of a horizontal access devices in vertical three dimensional (3D) memory in accordance with a number of embodiments of the present disclosure.

FIG. 1B illustrates a perspective view showing a three dimensional (3D) semiconductor memory device, e.g., a portion of a sub cell array 101-2 shown in FIG. 1A as a vertically oriented stack of memory cells in an array, according to some embodiments of the present disclosure.

As shown in FIG. 1B, a substrate 100 may have formed thereon one of the plurality of sub cell arrays, e.g., 101-2, described in connection with FIG. 1A. For example, the substrate 100 may be or include a silicon substrate, a germanium substrate, or a silicon-germanium substrate, etc. Embodiments, however, are not limited to these examples.

As shown in the example embodiment of FIG. 1B, the substrate 100 may have fabricated thereon a vertically oriented stack of memory cells, e.g., memory cell 110 in FIG. 1A, extending in a vertical direction, e.g., third direction (D3) 111. According to some embodiments the vertically oriented stack of memory cells may be fabricated such that each memory cell, e.g., memory cell 110 in FIG. 1A, is formed on plurality of vertical levels, e.g., a first level (L1), a second level (L2), and a third level (L3). The repeating, vertical levels, L1, L2, and L3, may be arranged, e.g., "stacked", a vertical direction, e.g., third direction (D3) 111 shown in FIG. 1A, and may be separated from the substrate 100 by an insulator material 120. Each of the repeating, vertical levels, L1, L2, and L3 may include a plurality of discrete components, e.g., regions, to the horizontally oriented access devices 130, e.g., transistors, and storage nodes, e.g., capacitors, including access line 107-1, 107-2, . . . , 107-Q connections and digit line 103-1, 103-2, . . . , 103-Q connections. The plurality of discrete components to the horizontally oriented access devices 130, e.g., transistors, may be formed in a plurality of iterations of vertically, repeating layers within each level, as described in more detail below in connection with FIGS. 4A-4K, and may extend horizontally in the second direction (D2) 105, analogous to second direction (D2) 105 shown in FIG. 1A.

The plurality of discrete components to the laterally oriented access devices 130, e.g., transistors, may include a first source/drain region 121 and a second source/drain region 123 separated by a channel region 125, extending laterally in the second direction (D2) 105, and formed in a body of the access devices. In some embodiments, the channel region 125 may include silicon, germanium, silicon-germanium, and/or indium gallium zinc oxide (IGZO). In some embodiments, the first and the second source/drain regions, 121 and 123, can include an n-type dopant region formed in a p-type doped body to the access device to form an n-type conductivity transistor. In some embodiments, the first and the second source/drain regions, 121 and 123, may include a p-type dopant formed within an n-type doped body to the access device to form a p-type conductivity transistor. By way of example, and not by way of limitation, the n-type dopant may include phosphorous (P) atoms and the p-type dopant may include atoms of boron (B) formed in an oppositely doped body region of polysilicon semiconductor material. Embodiments, however, are not limited to these examples.

The storage node 127, e.g., capacitor, may be connected to one respective end of the access device. As shown in FIG. 1B, the storage node 127, e.g., capacitor, may be connected to the second source/drain region 123 of the access device. The storage node may be or include memory elements capable of storing data. Each of the storage nodes may be a memory element using one of a capacitor, a magnetic tunnel junction pattern, and/or a variable resistance body which includes a phase change material, etc. Embodiments, however, are not limited to these examples. In some embodiments, the storage node associated with each access device of a unit cell, e.g., memory cell 110 in FIG. 1A, may similarly extend in the second direction (D2) 105, analogous to second direction (D2) 105 shown in FIG. 1A.

As shown in FIG. 1B a plurality of horizontally oriented access lines 107-1, 107-2, . . . , 107-Q extend in the first direction (D1) 109, analogous to the first direction (D1) 109 in FIG. 1A. The plurality of horizontally oriented access lines 107-1, 107-2, . . . , 107-Q may be analogous to the access lines 107-1, 107-2, . . . , 107-Q shown in FIG. 1A. The plurality of horizontally oriented access lines 107-1, 107-2, . . . , 107-Q may be arranged, e.g., "stacked", along the third direction (D3) 111. The plurality of horizontally oriented access lines 107-1, 107-2, . . . , 107-Q may include a conductive material. For example, the conductive material may include one or more of a doped semiconductor, e.g., doped silicon, doped germanium, etc., a conductive metal nitride, e.g., titanium nitride, tantalum nitride, etc., a metal, e.g., tungsten (W), titanium (Ti), tantalum (Ta), ruthenium (Ru), cobalt (Co), molybdenum (Mo), etc., and/or a metal-semiconductor compound, e.g., tungsten silicide, cobalt silicide, titanium silicide, etc. Embodiments, however, are not limited to these examples.

Among each of the vertical levels, (L1) 113-1, (L2) 113-2, and (L3) 113-P, the horizontally oriented memory cells, e.g., memory cell 110 in FIG. 1A, may be spaced apart from one another horizontally in the first direction (D1) 109. However, the plurality of discrete components to the horizontally oriented access devices 130, e.g., first source/drain region 121 and second source/drain region 123 separated by a channel region 125, extending laterally in the second direction (D2) 105, and the plurality of horizontally oriented access lines 107-1, 107-2, . . . , 107-Q extending laterally in the first direction (D1) 109, may be formed within different vertical layers within each level. For example, the plurality of horizontally oriented access lines 107-1, 107-2, . . . , 107-Q, extending in the first direction (D1) 109, may be formed on a top surface opposing and electrically coupled to the channel regions 125, separated therefrom by a gate dielectric, and orthogonal to horizontally oriented access devices 130, e.g., transistors, extending in laterally in the second direction (D2) 105. In some embodiments, the plurality of horizontally oriented access lines 107-1, 107-2, . . . , 107-Q, extending in the first direction (D1) 109 are formed in a higher vertical layer, farther from the substrate 100, within a level, e.g., within level (L1), than a layer in which the discrete components, e.g., first source/drain region 121 and second source/drain region 123 separated by a channel region 125, of the horizontally oriented access device are formed.

As shown in the example embodiment of FIG. 1B, the digit lines, 103-1, 103-2, . . . , 103-Q, extend in a vertical direction with respect to the substrate 100, e.g., in a third direction (D3) 111. Further, as shown in FIG. 1B, the digit lines, 103-1, 103-2, . . . , 103-Q, in one sub cell array, e.g., sub cell array 101-2 in FIG. 1A, may be spaced apart from each other in the first direction (D1) 109. The digit lines, 103-1, 103-2, . . . , 103-Q, may be provided, extending vertically relative to the substrate 100 in the third direction (D3) 111 in vertical alignment with source/drain regions to serve as first source/drain regions 121 or, as shown, be vertically adjacent first source/drain regions 121 for each of the horizontally oriented access devices 130, e.g., transistors, extending laterally in the second direction (D2) 105, but adjacent to each other on a level, e.g., first level (L1), in the first direction (D1) 109. Each of the digit lines, 103-1, 103-2, . . . , 103-Q, may vertically extend, in the third direction (D3), on sidewalls, adjacent first source/drain regions 121, of respective ones of the plurality of horizontally oriented access devices 130, e.g., transistors, that are vertically stacked. In some embodiments, the plurality of vertically oriented digit lines 103-1, 103-2, . . . , 103-Q, extending in the third direction (D3) 111, may be connected to side surfaces of the first source/drain regions 121 directly and/or through additional contacts including metal silicides.

For example, a first one of the vertically extending digit lines, e.g., 103-1, may be adjacent a sidewall of a first source/drain region 121 to a first one of the horizontally oriented access devices 130, e.g., transistors, in the first level (L1) 113-1, a sidewall of a first source/drain region 121 of a first one of the horizontally oriented access devices 130, e.g., transistors, in the second level (L2) 113-2, and a sidewall of a first source/drain region 121 a first one of the horizontally oriented access devices 130, e.g., transistors, in the third level (L3) 113-P, etc. Similarly, a second one of the vertically extending digit lines, e.g., 103-2, may be adjacent a sidewall to a first source/drain region 121 of a second one of the horizontally oriented access devices 130, e.g., transistors, in the first level (L1) 113-1, spaced apart from the first one of horizontally oriented access devices 130, e.g., transistors, in the first level (L1) 113-1 in the first direction (D1) 109. And the second one of the vertically extending digit lines, e.g., 103-2, may be adjacent a sidewall of a first source/drain region 121 of a second one of the laterally oriented access devices 130, e.g., transistors, in the second level (L2) 113-2, and a sidewall of a first source/drain region 121 of a second one of the horizontally oriented access devices 130, e.g., transistors, in the third level (L3) 113-P, etc. Embodiments are not limited to a particular number of levels.

The vertically extending digit lines, 103-1, 103-2, . . . , 103-Q, may include a conductive material, such as, for example, one of a doped semiconductor material, a conductive metal nitride, metal, and/or a metal-semiconductor compound. The digit lines, 103-1, 103-2, . . . , 103-Q, may correspond to digit lines (DL) described in connection with FIG. 1A.

As shown in the example embodiment of FIG. 1B, a conductive body contact may be formed extending in the first direction (D1) 109 along an end surface of the horizontally oriented access devices 130, e.g., transistors, in each level (L1) 113-1, (L2) 113-2, and (L3) 113-P above the substrate 100. The body contact may be connected to a body (as shown by 336 in FIG. 3) e.g., body region, of the horizontally oriented access devices 130, e.g., transistors, in each memory cell, e.g., memory cell 110 in FIG. 1A. The body contact may include a conductive material such as, for example, one of a doped semiconductor material, a conductive metal nitride, metal, and/or a metal-semiconductor compound.

Although not shown in FIG. 1B, an insulating material may fill other spaces in the vertically stacked array of memory cells. For example, the insulating material may include one or more of a silicon oxide material, a silicon nitride material, and/or a silicon oxynitride material, etc. Embodiments, however, are not limited to these examples.

Figure 2A:
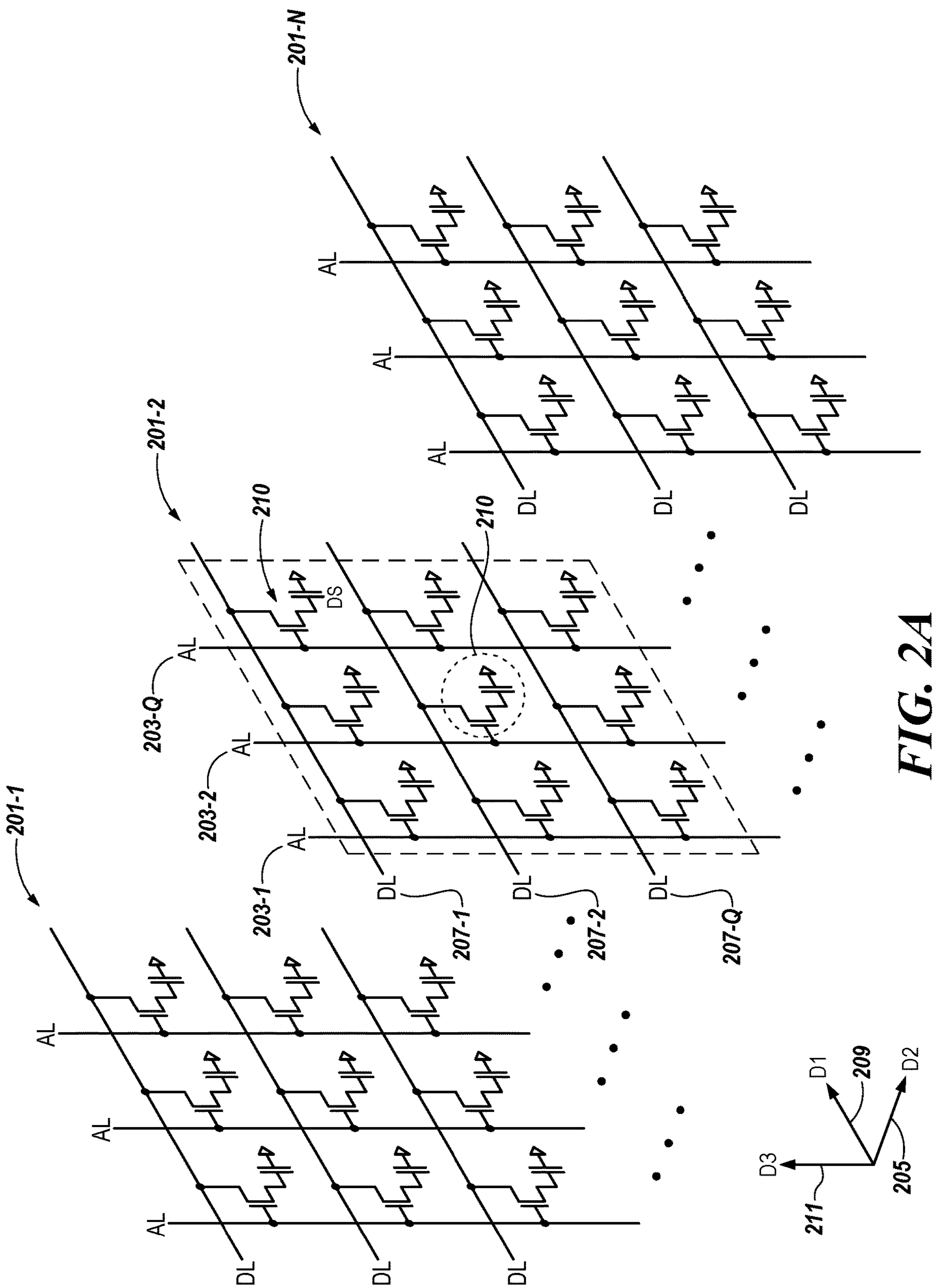
FIG. 2A is a schematic illustration of a horizontal access device in a vertical three dimensional (3D) memory in accordance a number of embodiments of the present disclosure.

FIG. 2A is a block diagram of an apparatus in accordance with a number of embodiments of the present disclosure. FIG. 2A illustrates a circuit diagram showing a cell array of a three dimensional (3D) semiconductor memory device according to embodiments of the present disclosure. FIG.

2A illustrates that a cell array may have a plurality of sub cell arrays 201-1, 201-2, . . . , 201-N. The sub cell arrays 201-1, 201-2, . . . , 201-N may be arranged along a second direction (D2) 205. Each of the sub cell arrays (e.g., sub cell array 201-2) may include a plurality of access lines 203-1, 203-2, . . . , 203-Q (which also may be referred to as word lines). Also, each of the sub cell arrays (e.g., sub cell array 201-2) may include a plurality of digit lines 207-1, 207-2, . . . , 207-Q (which also may be referred to as bit lines, data lines, or sense lines). In FIG. 2A, the digit lines 207-1, 207-2, . . . , 207-Q are illustrated extending in a first direction (D1) 209 and the access lines 203-1, 203-2, . . . , 203-Q are illustrated extending in a third direction (D3) 211.

The first direction (D1) 209 and the second direction (D2) 205 may be considered in a horizontal ("X-Y") plane. The third direction (D3) 211 may be considered in a vertical ("Z") direction (e.g., transverse to the X-Y plane). Hence, according to embodiments described herein, the access lines 203-1, 203-2, . . . , 203-Q are extending in a vertical direction (e.g., third direction (D3) 211).

A memory cell (e.g., 210) may include an access device (e.g., access transistor) and a storage node located at an intersection of each access line 203-1, 203-2, . . . , 203-Q and each digit line 207-1, 207-2, . . . , 207-Q. Memory cells may be written to, or read from, using the access lines 203-1, 203-2, . . . , 203-Q and digit lines 207-1, 207-2, . . . , 207-Q. The digit lines 207-1, 207-2, . . . , 207-Q may conductively interconnect memory cells along horizontal columns of each sub cell array 201-, 201-2, . . . , 201-N, and the access lines 203-1, 203-2, . . . , 203-Q may conductively interconnect memory cells along vertical rows of each sub cell array 201-1, 201-2, . . . , 201-N. One memory cell, e.g., 210, may be located between one access line (e.g., 203-2) and one digit line (e.g., 207-2). Each memory cell may be uniquely addressed through a combination of an access line 203-1, 203-2, . . . , 203-Q and a digit line 207-1, 207-2, . . . , 207-Q.

The digit lines 207-1, 207-2, . . . , 207-Q may be or include conducting patterns (e.g., metal lines) disposed on and spaced apart from a substrate. The digit lines 207-1, 207-2, . . . , 207-Q may extend in a first direction (D1) 209. The digit lines 207-1, 207-2, . . . , 207-Q in one sub cell array (e.g., 201-2) may be spaced apart from each other in a vertical direction (e.g., in a third direction (D3) 211).

The access lines 203-1, 203-2, . . . , 203-Q may be or include conductive patterns (e.g., metal lines) extending in a vertical direction with respect to the substrate (e.g., in a third direction (D3) 211). The access lines in one sub cell array (e.g., 201-2) may be spaced apart from each other in the first direction (D1) 209.

A gate of a memory cell (e.g., memory cell 210) may be connected to an access line (e.g., 203-2) and a first conductive node (e.g., first source/drain region) of an access device (e.g., transistor) of the memory cell 210 may be connected to a digit line (e.g., 207-2). Each of the memory cells (e.g., memory cell 210) may be connected to a storage node (e.g., capacitor). A second conductive node (e.g., second source/drain region) of the access device (e.g., transistor) of the memory cell 210 may be connected to the storage node (e.g., capacitor). Storage nodes, such as capacitors, can be formed from ferroelectric and/or dielectric materials such as zirconium oxide (ZrO2), hafnium oxide (HfO2) oxide, lanthanum oxide (La2O3), lead zirconate titanate (PZT, Pb[Zr(x) Ti(1−x)]O3), barium titanate (BaTiO3), aluminum oxide (e.g., $Al_2O_3$), a combination of these with or without dopants, or other suitable materials.

While first and second source/drain region reference are used herein to denote two separate and distinct source/drain regions, it is not intended that the source/drain region referred to as the "first" and/or "second" source/drain regions have some unique meaning. It is intended only that one of the source/drain regions is connected to a digit line (e.g., 207-2) and the other may be connected to a storage node.

Figure 2B:
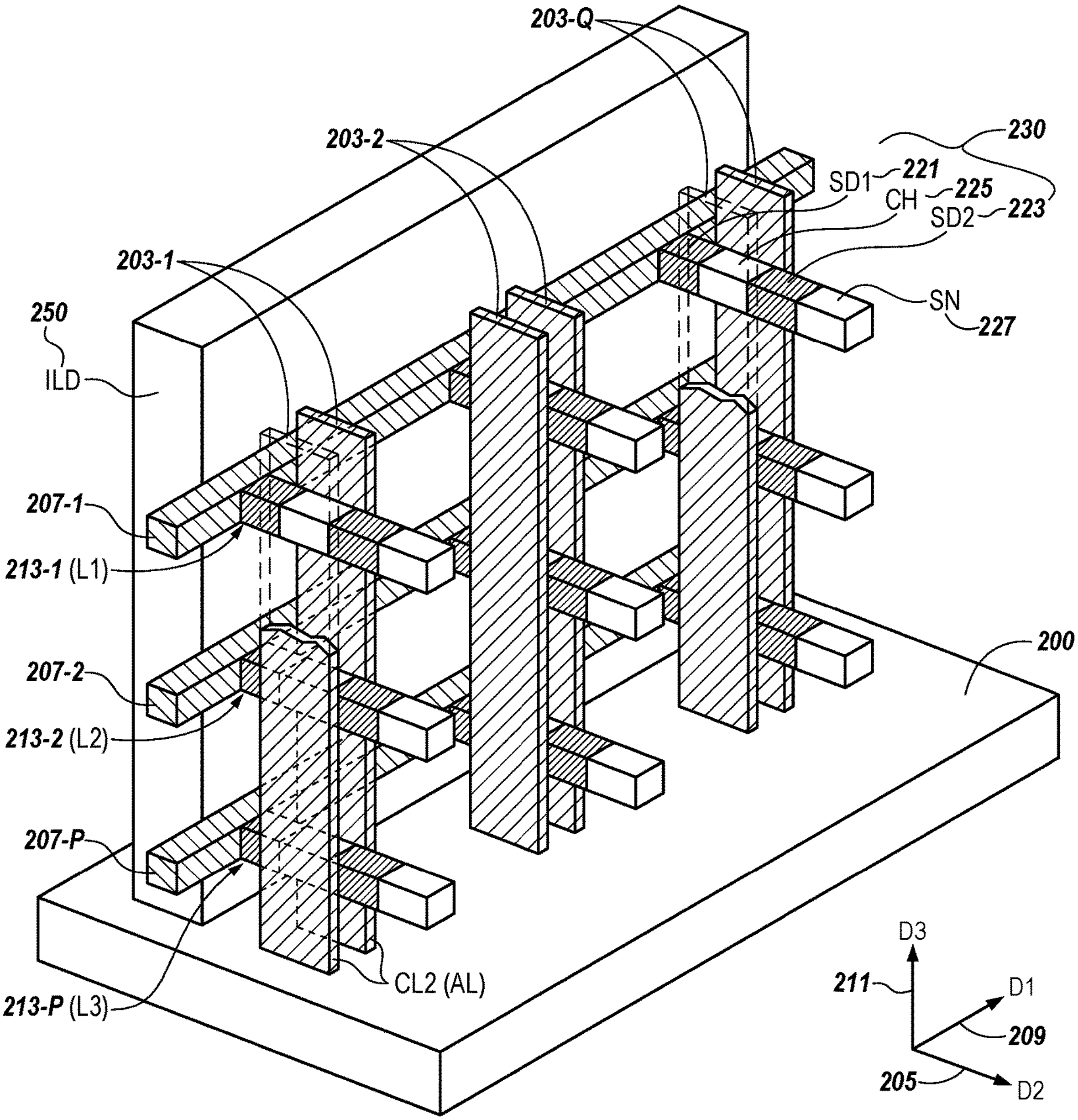
FIG. 2B is a perspective view illustrating a portion of a horizontal access devices in vertical three dimensional (3D) memory in accordance with a number of embodiments of the present disclosure.

FIG. 2B illustrates a perspective view showing a three dimensional (3D) semiconductor memory device (e.g., a portion of a sub cell array 201-2 shown in FIG. 2A as a vertically oriented stack of memory cells in an array) according to some embodiments of the present disclosure. As shown in FIG. 2B, a substrate 200 may have formed thereon one of the plurality of sub cell arrays (e.g., 201-2) described in connection with FIG. 2A. For example, the substrate 200 may be or include a silicon substrate, a germanium substrate, or a silicon-germanium substrate, etc. Embodiments, however, are not limited to these examples.

As shown in the example embodiment of FIG. 2B, the substrate 200 may have fabricated thereon a vertically oriented stack of memory cells (e.g., memory cell 210 in FIG. 2A) extending in a vertical direction (e.g., third direction (D3) 211). According to some embodiments the vertically oriented stack of memory cells may be fabricated such that each memory cell (e.g., memory cell 210 in FIG. 2A) is formed on plurality of vertical levels (e.g., a first level (L1), a second level (L2), and a third level (L3)). The repeating, vertical levels, L1, L2, and L3, may be arranged (e.g., "stacked") a vertical direction (e.g., third direction (D3) 211 shown in FIG. 2A) and may be separated from the substrate 200 by an insulator material 220. Each of the repeating, vertical levels, L1, L2, and L3 may include a plurality of discrete components (e.g., regions) to the laterally oriented access devices 230 (e.g., transistors) and storage nodes (e.g., capacitors) including access line 203-1, 203-2, . . . , 203-Q connections and digit line 207-1, 207-2, . . . , 207-Q connections. The plurality of discrete components to the laterally oriented access devices 230 (e.g., transistors) may be formed in a plurality of iterations of vertically, repeating layers within each level, as described in more detail below in connection with FIGS. 4A-4B, and may extend horizontally in the second direction (D2) 205, analogous to second direction (D2) 205 shown in FIG. 2A.

The plurality of discrete components to the laterally oriented access devices 230 (e.g., transistors) may include a first source/drain region 221 and a second source/drain region 223 separated by a channel region 225, extending laterally in the second direction (D2) 205, and formed in a body of the access devices. In some embodiments, the channel region 225 may include silicon, germanium, silicon-germanium, and/or indium gallium zinc oxide (IGZO). In some embodiments, the first and the second source/drain regions, 221 and 223, can include an n-type dopant region formed in a p-type doped body to the access device to form an n-type conductivity transistor. In some embodiments, the first and the second source/drain regions, 221 and 223, may include a p-type dopant formed within an n-type doped body to the access device to form a p-type conductivity transistor. By way of example, and not by way of limitation, the n-type dopant may include phosphorous (P) atoms and the p-type dopant may include atoms of boron (B) formed in an oppositely doped body region of polysilicon semiconductor material. Embodiments, however, are not limited to these examples.

The storage node 227 (e.g., capacitor) may be connected to one respective end of the access device. As shown in FIG. 2B, the storage node 227 (e.g., capacitor) may be connected to the second source/drain region 223 of the access device.

The storage node may be or include memory elements capable of storing data. Each of the storage nodes may be a memory element using one of a capacitor, a magnetic tunnel junction pattern, and/or a variable resistance body which includes a phase change material, etc. Embodiments, however, are not limited to these examples. In some embodiments, the storage node associated with each access device of a unit cell (e.g., memory cell 210 in FIG. 2A) may similarly extend in the second direction (D2) 205, analogous to second direction (D2) 205 shown in FIG. 2A.

As shown in FIG. 2B a plurality of horizontally oriented digit lines 207-1, 207-2, . . . , 207-Q extend in the first direction (D1) 209, analogous to the first direction (D1) 209 in FIG. 2A. The plurality of horizontally oriented digit lines 207-1, 207-2, . . . , 207-Q may be analogous to the digit lines 207-1, 207-2, . . . , 207-Q shown in FIG. 2A. The plurality of horizontally oriented digit lines 207-1, 207-2, . . . , 207-Q may be arranged (e.g., "stacked") along the third direction (D3) 211. The plurality of horizontally oriented digit lines 207-1, 207-2, . . . , 207-Q may include a conductive material. For example, the conductive material may include one or more of a doped semiconductor (e.g., doped silicon, doped germanium, etc.) a conductive metal nitride (e.g., titanium nitride, tantalum nitride, etc.) a metal (e.g., tungsten (W), titanium (Ti), tantalum (Ta), ruthenium (Ru), cobalt (Co), molybdenum (Mo), etc.) and/or a metal-semiconductor compound (e.g., tungsten silicide, cobalt silicide, titanium silicide, etc.) Embodiments, however, are not limited to these examples.

Among each of the vertical levels, (L1) 213-1, (L2) 213-2, and (L3) 213-P, the horizontally oriented memory cells (e.g., memory cell 210 in FIG. 2A) may be spaced apart from one another horizontally in the first direction (D1) 209. However, as described in more detail below in connection with FIG. 4A, et seq., the plurality of discrete components to the laterally oriented access devices 230 (e.g., first source/drain region 221 and second source/drain region 223 separated by a channel region 225), extending laterally in the second direction (D2) 205, and the plurality of horizontally oriented digit lines 207-1, 207-2, . . . , 207-Q, extending laterally in the first direction (D1) 209, may be formed within different vertical layers within each level. For example, the plurality of horizontally oriented digit lines 207-1, 207-2, . . . , 207-Q, extending in the first direction (D1) 209, may be disposed on, and in electrical contact with, top surfaces of first source/drain regions 221 and orthogonal to laterally oriented access devices 230 (e.g., transistors) extending laterally in the second direction (D2) 205. In some embodiments, the plurality of horizontally oriented digit lines 207-1, 207-2, . . . , 207-Q, extending in the first direction (D1) 209 are formed in a higher vertical layer, farther from the substrate 200, within a level (e.g., within level (L1)) than a layer in which the discrete components (e.g., first source/drain region 221 and second source/drain region 223 separated by a channel region 225) of the laterally oriented access device are formed. In some embodiments, the plurality of horizontally oriented digit lines 207-1, 207-2, . . . , 207-Q, extending in the first direction (D1) 209, may be connected to the top surfaces of the first source/drain regions 221 directly and/or through additional contacts including metal silicides.

As shown in the example embodiment of FIG. 2B, the access lines, 203-1, 203-2, . . . , 203-Q, extend in a vertical direction with respect to the substrate 200 (e.g., in a third direction (D3) 211). Further, as shown in FIG. 2B, the access lines, 203-1, 203-2, . . . , 203-Q, in one sub cell array (e.g., sub cell array 201-2 in FIG. 2A) may be spaced apart from each other in the first direction (D1) 209. The access lines, 203-1, 203-2, . . . , 203-Q, may be provided, extending vertically relative to the substrate 200 in the third direction (D3) 211 between a pair of the laterally oriented access devices 230 (e.g., transistors) extending laterally in the second direction (D2) 205, but adjacent to each other on a level (e.g., first level (L1)) in the first direction (D1) 209. Each of the access lines, 203-1, 203-2, . . . , 203-Q, may vertically extend, in the third direction (D3), on sidewalls of respective ones of the plurality of laterally oriented access devices 230 (e.g., transistors) that are vertically stacked.

For example, and as shown in more detail in FIG. 3, a first one of the vertically extending access lines (e.g., 203-1) may be adjacent a sidewall of a channel region 225 to a first one of the laterally oriented access devices 230 (e.g., transistors) in the first level (L1) 213-1, a sidewall of a channel region 225 of a first one of the laterally oriented access devices 230 (e.g., transistors) in the second level (L2) 213-2, and a sidewall of a channel region 225 a first one of the laterally oriented access devices 230 (e.g., transistors) in the third level (L3) 213-P, etc. Similarly, a second one of the vertically extending access lines (e.g., 203-2) may be adjacent a sidewall to a channel region 225 of a second one of the laterally oriented access devices 230 (e.g., transistors) in the first level (L1) 213-1, spaced apart from the first one of laterally oriented access devices 230 (e.g., transistors) in the first level (L1) 213-1 in the first direction (D1) 209. And the second one of the vertically extending access lines (e.g., 203-2) may be adjacent a sidewall of a channel region 225 of a second one of the laterally oriented access devices 230 (e.g., transistors) in the second level (L2) 213-2, and a sidewall of a channel region 225 of a second one of the laterally oriented access devices 230 (e.g., transistors) in the third level (L3) 213-P, etc. Embodiments are not limited to a particular number of levels.

The vertically extending access lines, 203-1, 203-2, . . . , 203-Q, may include a conductive material, such as, for example, one of a doped semiconductor material, a conductive metal nitride, metal, and/or a metal-semiconductor compound. The access lines, 203-1, 203-2, . . . , 203-Q, may correspond to word lines (WL) described in connection with FIG. 2A.

As shown in the example embodiment of FIG. 2B, a conductive body contact 295 may be formed extending in the first direction (D1) 209 along an end surface of the laterally oriented access devices 230 (e.g., transistors) in each level (L1) 213-1, (L2) 213-2, and (L3) 213-P above the substrate 200. The body contact 295 may be connected to a body, as shown by 336 in FIG. 3, (e.g., body region) of the laterally oriented access devices 230 (e.g., transistors) in each memory cell (e.g., memory cell 210 in FIG. 2A). The body contact 295 may include a conductive material such as, for example, one of a doped semiconductor material, a conductive metal nitride, metal, and/or a metal-semiconductor compound.

Although not shown in FIG. 2B, an insulating material may fill other spaces in the vertically stacked array of memory cells. For example, the insulating material may include one or more of a silicon oxide material, a silicon nitride material, and/or a silicon oxynitride material, etc. Embodiments, however, are not limited to these examples.

Figure 3A:
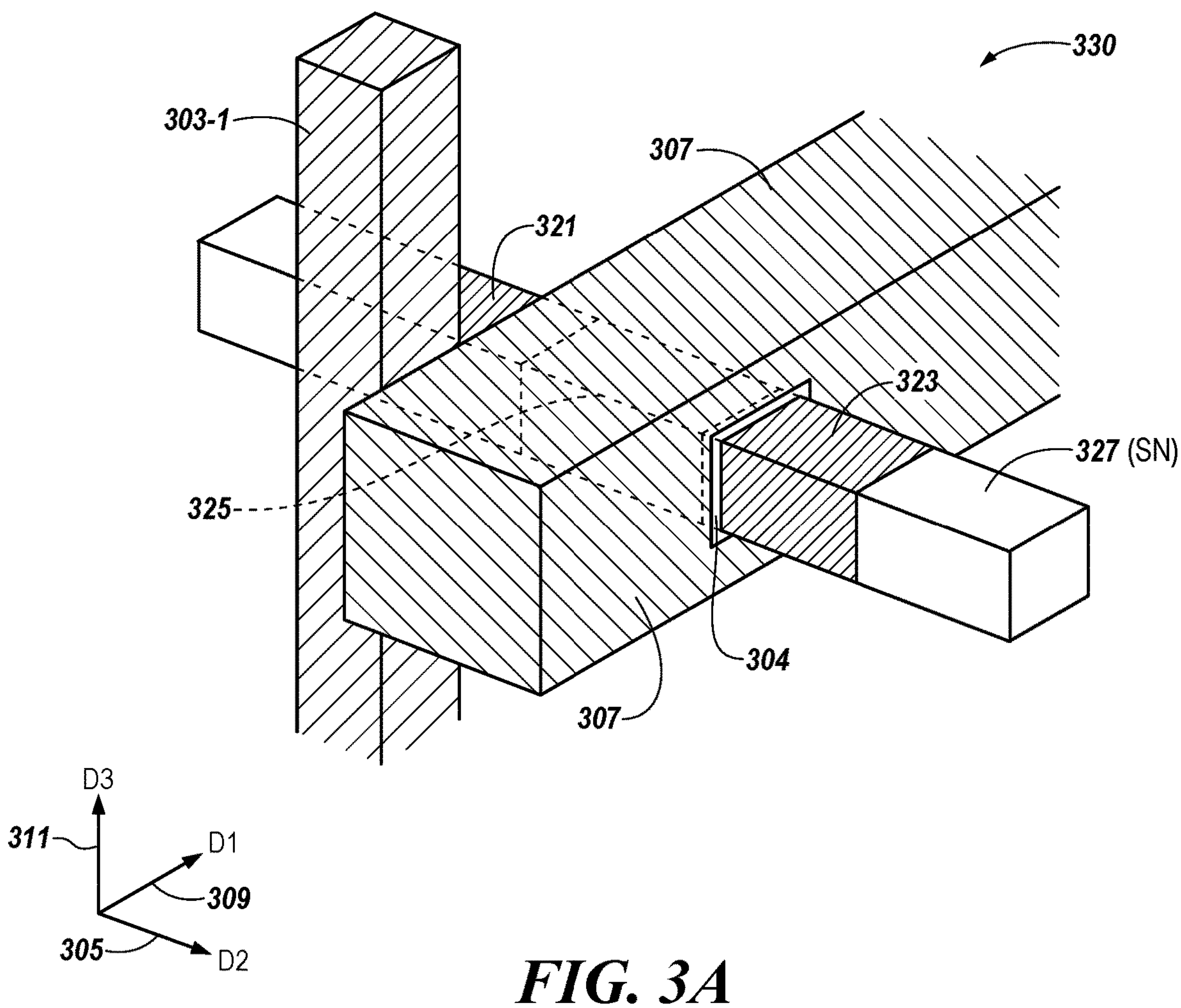
FIGS. 3A-3B illustrate a portion of a horizontal access devices in vertical three dimensional (3D) memory in accordance with a number of embodiments of the present disclosure.

FIG. 3A illustrates in more detail a unit cell, e.g., memory cell 110 in FIG. 1, of the vertically stacked array of memory cells, e.g., within a sub cell array 101-2 in FIG. 1, according to some embodiments of the present disclosure. As shown in FIG. 3A, the first and the second source/drain regions, 321 and 323, may be impurity doped regions to the laterally oriented access devices 330, e.g., transistors. The first and the second source/drain regions, 321 and 323, may be analogous to the first and the second source/drain regions 221 and 223 shown in FIG. 2. The first and the second source/drain regions may be separated by a channel 325 formed in a body of semiconductor material, e.g., body region of the horizontally oriented access devices 330, e.g., transistors. The first and the second source/drain regions, 321 and 323, may be formed from an n-type or p-type dopant doped in the body region. Embodiments are not so limited.

For example, for an n-type conductivity transistor construction the body region of the laterally oriented access devices 330, e.g., transistors, may be formed of a low doped p-type (p-) semiconductor material. In one embodiment, the body region and the channel 325 separating the first and the second source/drain regions, 321 and 323, may include a low doped, p-type (e.g., low dopant concentration (p-)) polysilicon (Si) material consisting of boron (B) atoms as an impurity dopant to the polycrystalline silicon. The first and the second source/drain regions, 321 and 323, may also comprise a metal, and/or metal composite materials containing ruthenium (Ru), molybdenum (Mo), nickel (Ni), titanium (Ti), copper (Cu), a highly doped degenerate semiconductor material, and/or at least one of indium oxide (In2O3), or indium tin oxide (In2−xSnxO3), formed using an atomic layer deposition process, etc. Embodiments, however, are not limited to these examples. As used herein, a degenerate semiconductor material is intended to mean a semiconductor material, such as polysilicon, containing a high level of doping with significant interaction between dopants, e.g., phosphorus (P), boron (B), etc. Non-degenerate semiconductors, by contrast, contain moderate levels of doping, where the dopant atoms are well separated from each other in the semiconductor host lattice with negligible interaction.

In this example, the first and the second source/drain regions, 321 and 321, may include a high dopant concentration, n-type conductivity impurity (e.g., high dopant (n+)) doped in the first and the second source/drain regions, 321 and 323. In some embodiments, the high dopant, n-type conductivity first and second drain regions 321 and 323 may include a high concentration of phosphorus (P) atoms deposited therein. Embodiments, however, are not limited to this example. In other embodiments, the horizontally oriented access devices 330, e.g., transistors, may be of a p-type conductivity construction in which case the impurity, e.g., dopant, conductivity types would be reversed.

As shown in the example embodiment of FIG. 3A, the first source/drain region 321 may occupy an upper portion in the body of the laterally oriented access devices 330, e.g., transistors. For example, the first source/drain region 321 may have a bottom surface within the body of the horizontally oriented access device 330 which is located higher, vertically in the third direction (D3) 311, than a bottom surface of the body of the laterally, horizontally oriented access device 330. As such, the laterally, horizontally oriented transistor 330 may have a body portion which is below the first source/drain region 321 and is in electrical contact with the body contact. Further, as shown in the example embodiment of FIG. 3A, an access line, e.g., 307-1, analogous to the access lines 207-1, 207-2, . . . , 207-Q in FIGS. 2 and 107-1, 107-2, . . . , 107-Q shown in FIG. 1, may disposed on a top surface opposing and coupled to a channel region 325, separated therefrom by a gate dielectric 304. The gate dielectric material 304 may include, for example, a high-k dielectric material, a silicon oxide material, a silicon nitride material, a silicon oxynitride material, etc., or a combination thereof. Embodiments are not so limited. For example, in high-k dielectric material examples the gate dielectric material 304 may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobite, etc.

As shown in the example embodiment of FIG. 3A, a digit line, e.g., 303-1, analogous to the digit lines 203-1, 203-2, . . . , 203-Q in FIGS. 2 and 103-1, 103-2, . . . , 103-Q in FIG. 1, may be vertically extending in the third direction (D3) 311 adjacent a sidewall of the first source/drain region 321 in the body to the horizontally oriented access devices 330, e.g., transistors horizontally conducting between the first and the second source/drain regions 321 and 323 along the second direction (D2) 305. In this embodiment, the vertically oriented digit line 303-1 is formed asymmetrically adjacent in electrical contact with the first source/drain regions 321. The digit line 303-1 may be formed as asymmetrically to reserve room for a body contact in the channel region 325.

Figure 3B:
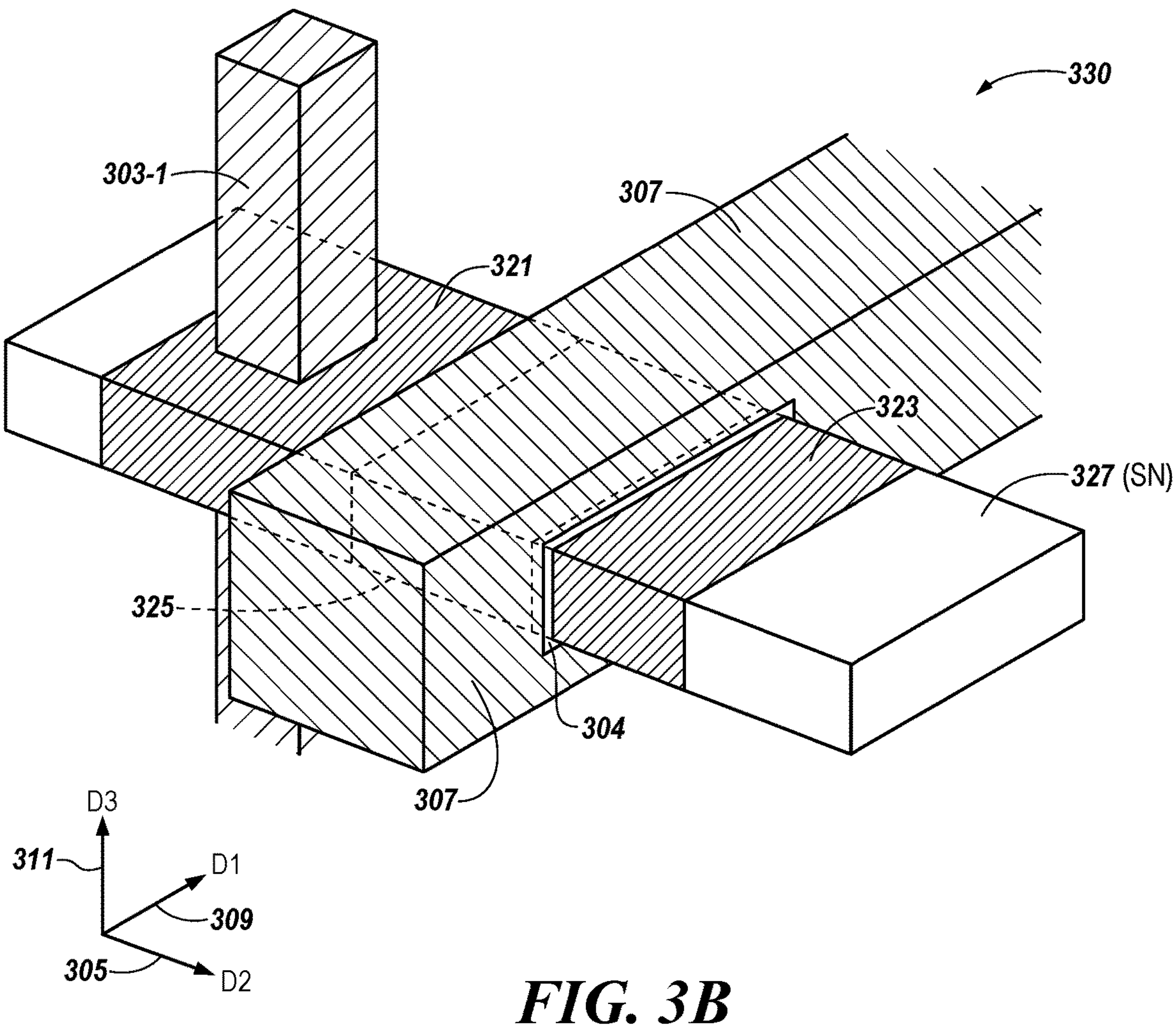

FIG. 3B illustrates in more detail a unit cell, e.g., memory cell 110 in FIG. 1, of the vertically stacked array of memory cells, e.g., within a sub cell array 101-2 in FIG. 1, according to some embodiments of the present disclosure. As shown in FIG. 3B, the first and the second source/drain regions, 321 and 323, may be impurity doped regions to the laterally oriented access devices 330, e.g., transistors. The first and the second source/drain regions, 321 and 323, may be analogous to the first and the second source/drain regions 221 and 223 shown in FIG. 2 and the first and the second source/drain regions 321 and 323 shown in FIG. 3A. The first and the second source/drain regions may be separated by a channel 325 formed in a body of semiconductor material, e.g., body region, of the horizontally oriented access devices 330, e.g., transistors. The first and the second source/drain regions, 321 and 323, may be formed from an n-type or p-type dopant doped in the body region. Embodiments are not so limited.

As shown in the example embodiment of FIG. 3B, a digit line, e.g., 303-1, analogous to the digit lines 203-1, 203-2, . . . , 203-Q in FIGS. 2 and 103-1, 103-2, . . . , 103-Q in FIG. 1, may be vertically extending in the third direction (D3) 311 adjacent a sidewall of the first source/drain region 321 in the body to the horizontally oriented access devices 330, e.g., transistors horizontally conducting between the first and the second source/drain regions 321 and 323 along the second direction (D2) 305. In this embodiment, the vertically oriented digit line 303-1 is formed symmetrically, in vertical alignment, in electrical contact with the first source/drain region 321. The digit line 303-1 may be formed in contact with an insulator material such that there is no body contact within channel 325.

As shown in the example embodiment of FIG. 3B, the digit line 303-1 may be formed symmetrically within the first source/drain region 321 such that the first source/drain region 321 surrounds the digit line 303-1 all around. The first source/drain region 321 may occupy an upper portion in the body of the laterally oriented access devices 330, e.g., transistors. For example, the first source/drain region 321 may have a bottom surface within the body of the horizontally oriented access device 330 which is located higher, vertically in the third direction (D3) 311, than a bottom surface of the body of the laterally, horizontally oriented access device 330. As such, the laterally, horizontally oriented transistor 330 may have a body portion which is below the first source/drain region 321 and is in contact with the body contact. An insulator material may fill the body contact such that the first source/drain region 321 may not be in electrical contact with channel 325. Further, as shown in the example embodiment of FIG. 3B, an access line, e.g., 307-1, analogous to the access lines 207-1, 207-2, . . . , 207-Q in FIGS. 2 and 107-1, 107-2, . . . , 107-Q shown in FIG. 1, may disposed all around and coupled to a channel region 325, separated therefrom by a gate dielectric 304.

FIG. 4 is a cross-sectional view, at one stage of a semiconductor fabrication process, for forming epitaxial silicon within horizontal access devices in vertical three dimensional (3D) memory, such as illustrated in FIGS. 1-3, and in accordance with a number of embodiments of the present disclosure.

In the example embodiment shown in the example of FIG. 4, the method comprises epitaxially forming alternating layers of a silicon germanium (SiGe) material, 430-1, 430-2, . . . , 430-N (collectively referred to as epitaxially grown silicon germanium (SiGe) 430), and a silicon (Si) material, 432-1, 432-2, . . . , 432-N (collectively referred to as epitaxially grown, single crystalline silicon (Si) material 432), in repeating iterations to form a vertical stack 401 on a working surface of a semiconductor substrate 400. In one embodiment, the epitaxially grown silicon germanium (SiGe) 430 can be deposited to have a thickness, e.g., vertical height in the third direction (D3), in a range of thirty (30) nanometers (nm) to sixty (60) nm. In one embodiment, the silicon 432 can be deposited to have a thickness (t2), e.g., vertical height, in a range of five (5) nm to thirty (30) nm. Embodiments, however, are not limited to these examples. As shown in FIG. 4, a vertical direction 411 is illustrated as a third direction (D3), e.g., z-direction in an x-y-z coordinate system, analogous to the third direction (D3), among first, second, and third directions, shown in FIGS. 1-3.

In some embodiments, the epitaxially grown silicon germanium (SiGe), 430-1, 430-2, . . . , 430-N, may be an epitaxially grown mix of silicon and germanium. By way of example, and not by way of limitation, the epitaxially grown silicon germanium (SiGe) 430 may be grown on the substrate material 400. Embodiments are not limited to these examples. In some embodiments, the epitaxially grown, single crystalline silicon (Si) material, 432-1, 432-2, . . . , 432-N, may comprise a silicon (Si) material in a polycrystalline and/or amorphous state. The epitaxially grown, single crystalline silicon (Si) material, 432-1, 432-2, . . . , 432-N, may be a low doped, p-type (p-) epitaxially grown, single crystalline silicon (Si) material. The silicon material, 432-1, 432-2, . . . , 432-N, may also be formed by epitaxially grown on the epitaxially grown silicon germanium (SiGe) 430. After the epitaxially grown silicon germanium (SiGe) 430 has been formed, the seed is turned to pure silicon. Embodiments, however, are not limited to these examples.

The repeating iterations of alternating epitaxially grown silicon germanium (SiGe), 430-1, 430-2, . . . , 430-N layers and epitaxially grown, single crystalline silicon (Si) material, 432-1, 432-2, . . . , 432-N layers may be deposited according to a semiconductor fabrication process such as chemical vapor deposition (CVD) in a semiconductor fabrication apparatus. Embodiments, however, are not limited to this example and other suitable semiconductor fabrication techniques may be used to deposit the alternating layers of a epitaxially grown silicon germanium (SiGe) and a epitaxially grown, single crystalline silicon (Si) material, in repeating iterations to form the vertical stack 401.

The layers may occur in repeating iterations vertically. In the example of FIG. 4, three tiers, numbered 1, 2, and 3, of the repeating iterations are shown. For example, the stack may include: a first epitaxially grown silicon germanium (SiGe) 430-1, a first epitaxially grown, single crystalline silicon (Si) material 432-1, a second epitaxially grown silicon germanium (SiGe) 430-2, a second epitaxially grown, single crystalline silicon (Si) material 432-2, a third SiGe material 430-3, and a third epitaxially grown, single crystalline silicon (Si) material 432-3, in further repeating iterations. Embodiments, however, are not limited to this example and more or fewer repeating iterations may be included.

Figure 5A:
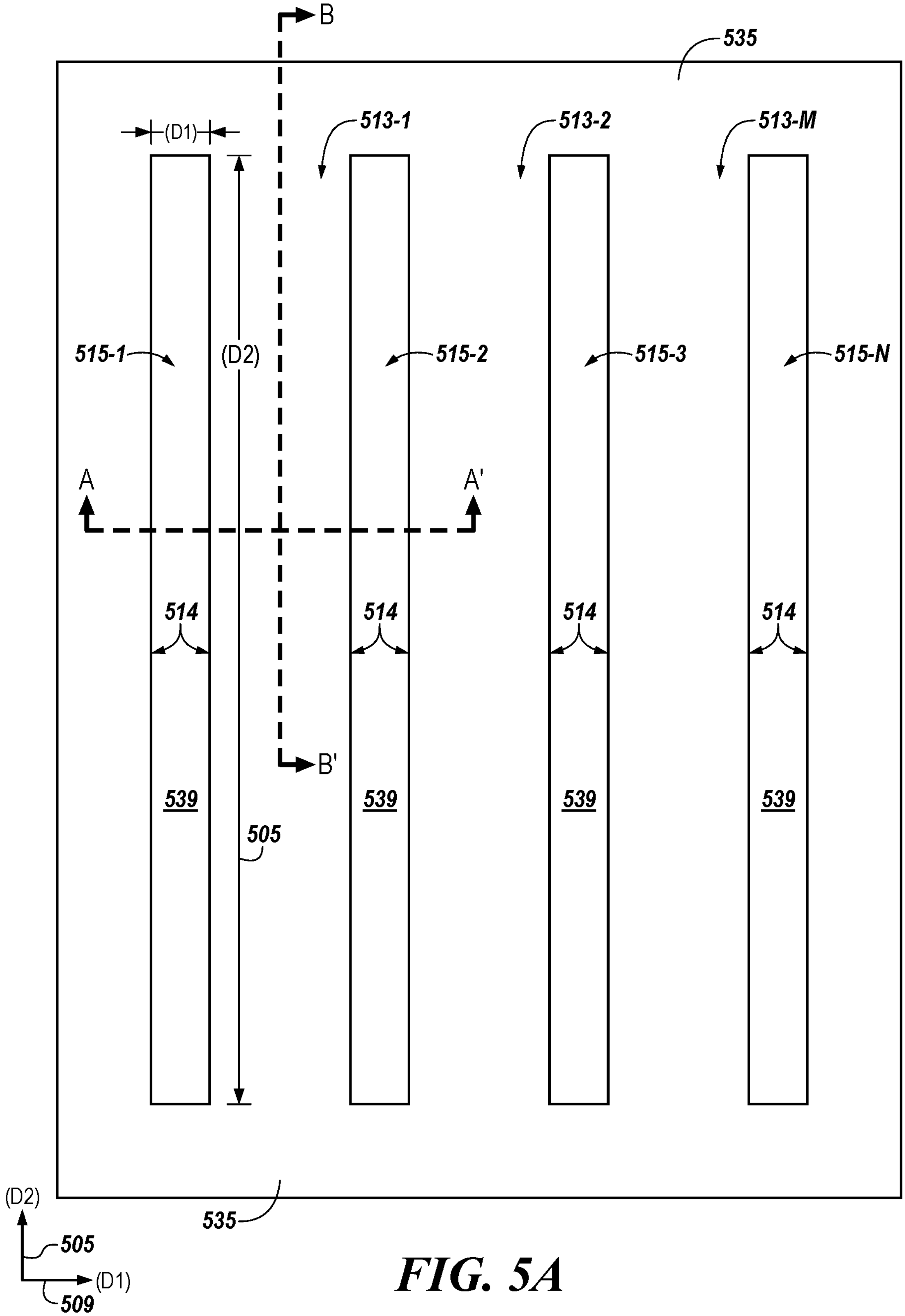
FIGS. 5A to 5B illustrate an example method, at one stage of a semiconductor fabrication process, for forming epitaxial silicon within horizontal access devices in vertical three dimensional (3D) memory, in accordance with a number of embodiments of the present disclosure.

FIG. 5A illustrates an example method, at one stage of a semiconductor fabrication process, for forming epitaxial silicon within horizontal access devices in vertical three dimensional (3D) memory, such as illustrated in FIGS. 1-3, and in accordance with a number of embodiments of the present disclosure. FIG. 5A illustrates a top down view of a semiconductor structure, at a particular point in time, in a semiconductor fabrication process, according to one or more embodiments. In the example embodiment shown in the example of FIG. 5A, the method comprises using an etchant process to form a plurality of first vertical openings 515, having a first horizontal direction (D1) 509 and a second horizontal direction (D2) 505, through the vertical stack to the substrate. In one example, as shown in FIG. 5A, the plurality of first vertical openings 515 are extending predominantly in the second horizontal direction (D2) 505 and may form elongated vertical, pillar columns 513-1, 513-2, . . . , 513-M (collectively and/or independently referred to as 513), with sidewalls 514 in the vertical stack. The plurality of first vertical openings 500 may be formed using photolithographic techniques to pattern a photolithographic mask 535, e.g., to form a hard mask (HM), on the vertical stack prior to etching the plurality of first vertical openings 515. Similar semiconductor process techniques may be used at other points of the semiconductor fabrication process described herein.

The openings 515 may be filled with a dielectric material 539. In one example, a spin on dielectric process may be used to fill the openings 515. In one embodiment, the dielectric material 539 may be an oxide material. However, embodiments are not so limited.

Figure 5B:
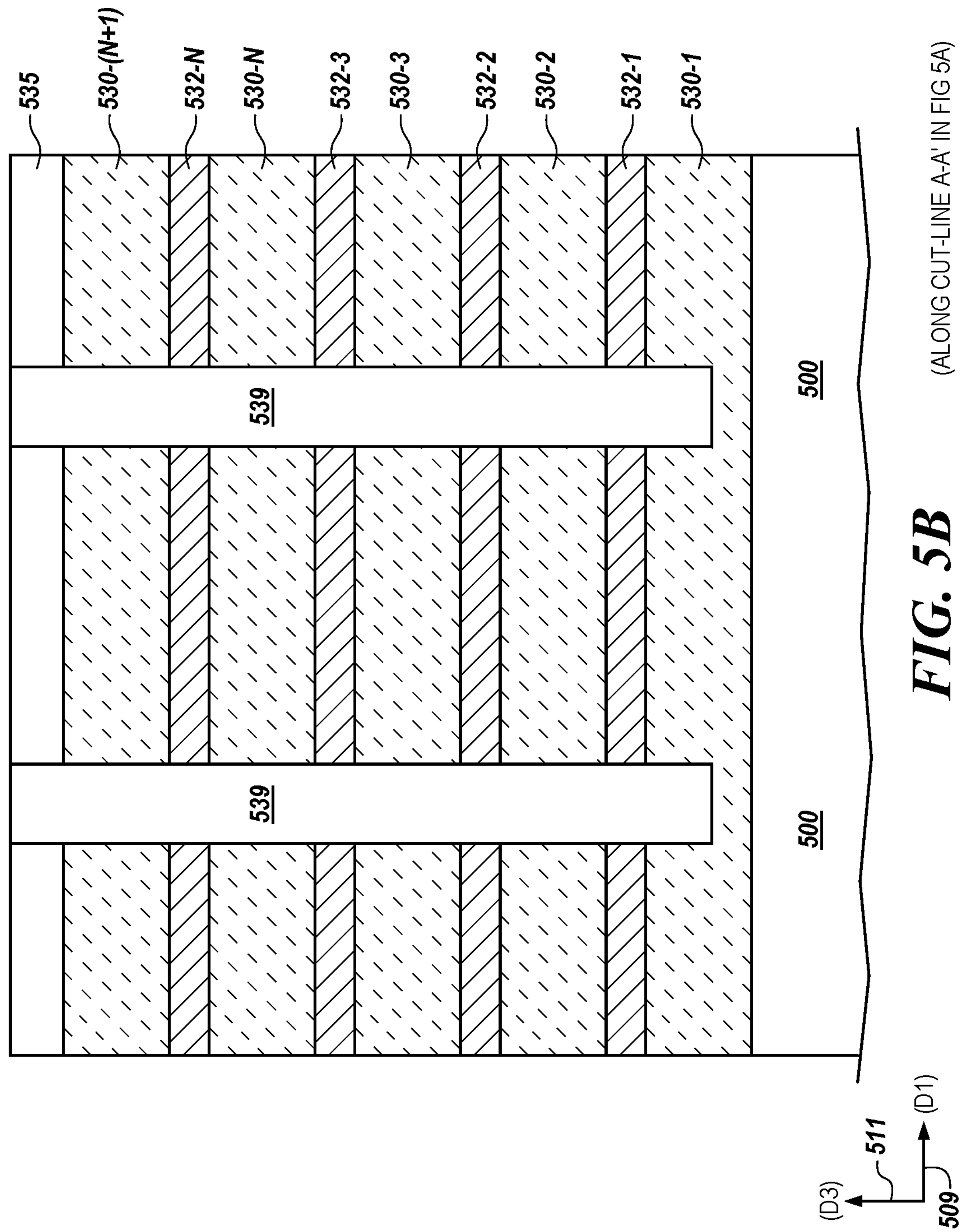

FIG. 5B is a cross sectional view, taken along cut-line A-A' in FIG. 5A, showing another view of the semiconductor structure at a particular time in the semiconductor fabrication process. The cross sectional view shown in FIG. 5B shows the repeating iterations of alternating layers of a epitaxially grown silicon germanium (SiGe) 530 and a epitaxially grown, single crystalline silicon (Si) material 532 on a semiconductor substrate 500 to form the vertical stack, e.g. 401 as shown in FIG. 4.

As shown in FIG. 5B, a plurality of first vertical openings may be formed through the layers within the vertically stacked memory cells to expose vertical sidewalls in the vertical stack and form elongated vertical pillar columns 513 and then filled with a first dielectric material 539. The first vertical openings may be formed through the repeating iterations of the epitaxially grown silicon germanium (SiGe) 530 and the epitaxially grown, single crystalline silicon (Si) material 532. As such, the first vertical openings may be formed through a first epitaxially grown silicon germanium (SiGe) 530-1, a first epitaxially grown, single crystalline silicon (Si) material 532-1, a second epitaxially grown silicon germanium (SiGe) 530-2, a second epitaxially grown, single crystalline silicon (Si) material 532-2, a third SiGe material 530-3, and a third epitaxially grown, single crystalline silicon (Si) material 532-3. Embodiments, however, are not limited to the vertical opening(s) shown in FIG. 5B. Multiple vertical openings may be formed through the layers of materials. The first vertical openings may be formed to expose vertical sidewalls in the vertical stack. The first vertical openings may extend in a second horizontal direction (D2) 505 to form elongated vertical, pillar columns with first vertical sidewalls in the vertical stack and then filled with third dielectric 539.

As shown in FIG. 5B, a first dielectric material 539, such as an oxide or other suitable spin on dielectric (SOD), may be deposited in the first vertical openings, using a process such as CVD, to fill the first vertical openings. First dielectric material 539 may also be formed from a silicon nitride ($Si_3N_4$) material. In another example, the first dielectric material 539 may include silicon oxy-nitride ($SiO_xN_y$), and/or combinations thereof. Embodiments are not limited to these examples. The plurality of first vertical openings may be formed using photolithographic techniques to pattern a photolithographic mask 535, e.g., to form a hard mask (HM), on the vertical stack prior to etching the plurality of first vertical openings. In one embodiment, hard mask 535 may be deposited over a epitaxially grown silicon germanium (SiGe) 530. Similar semiconductor process techniques may be used at other points of the semiconductor fabrication process described herein.

Figure 6A:
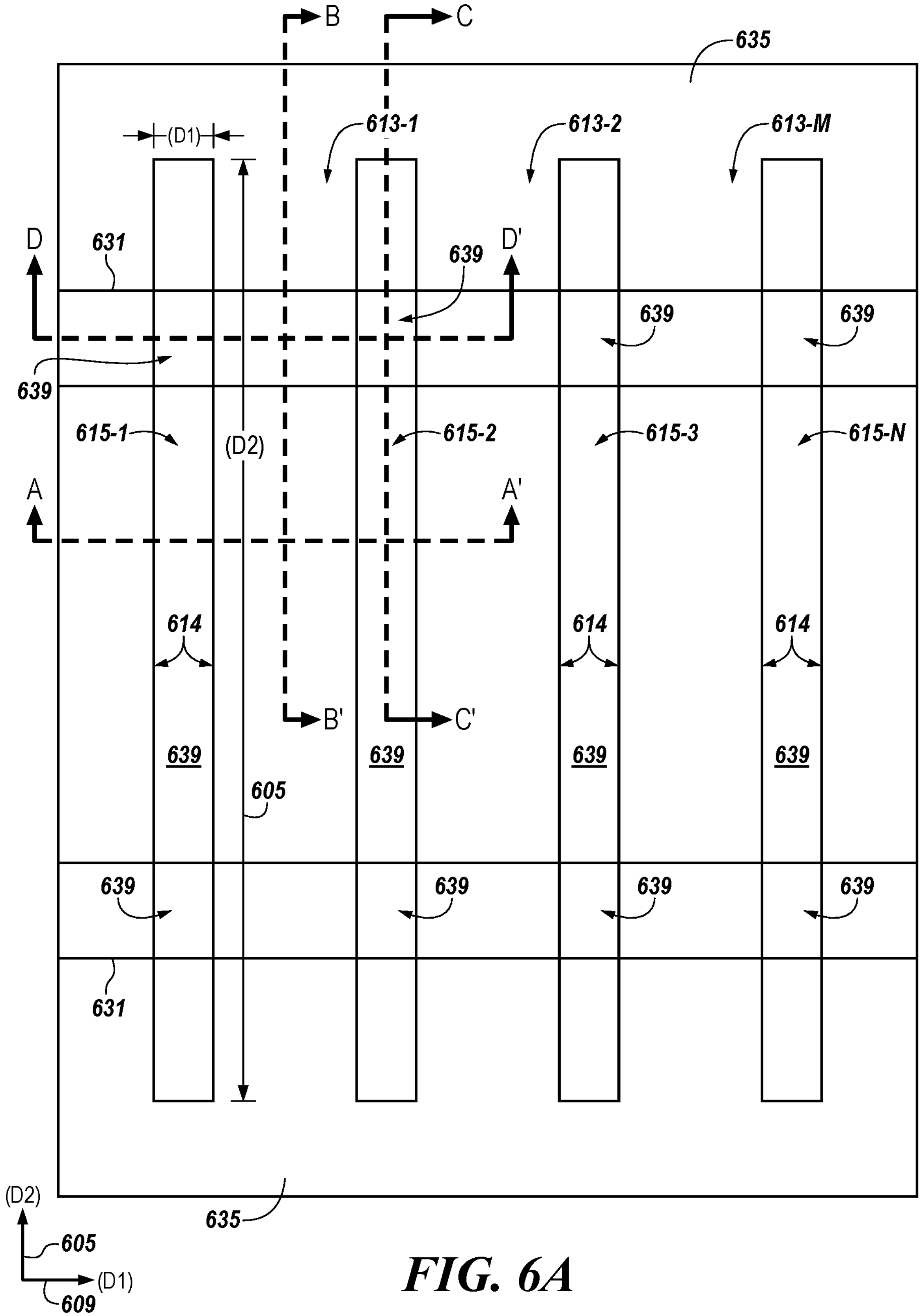
FIGS. 6A to 6E illustrate an example method, at another stage of a semiconductor fabrication process, for forming epitaxial silicon within horizontal access devices in vertical three dimensional (3D) memory, in accordance with a number of embodiments of the present disclosure.

FIG. 6A illustrates an example method, at another stage of a semiconductor fabrication process, for forming epitaxial silicon within horizontal access devices in vertical three dimensional (3D) memory in accordance with a number of embodiments of the present disclosure. FIG. 6A illustrates a top down view of a semiconductor structure, at a particular point in time, in a semiconductor fabrication process, according to one or more embodiments. In the example embodiment shown in the example of FIG. 6A, the method comprises using an etchant process to form a plurality of spaced, second vertical openings 631 through the vertical stack by patterning and selectively removing the first dielectric material 639 in the plurality of first vertical openings to expose second vertical sidewalls adjacent a first region of the epitaxially grown silicon germanium (SiGe). Multiple second vertical openings 631 may be formed through the layers of materials. In one example, as shown in FIG. 6A, the spaced, second vertical openings 631 are extending predominantly in the first horizontal direction (D2) 609 and may form short vertical squares in the plurality of first vertical openings 615 adjacent the vertical stack. The second vertical openings 631 may be formed using photolithographic techniques to pattern first dielectric material 639 to form an opening within the vertical stack prior to etching the plurality of first vertical openings 615.

Figure 6B:
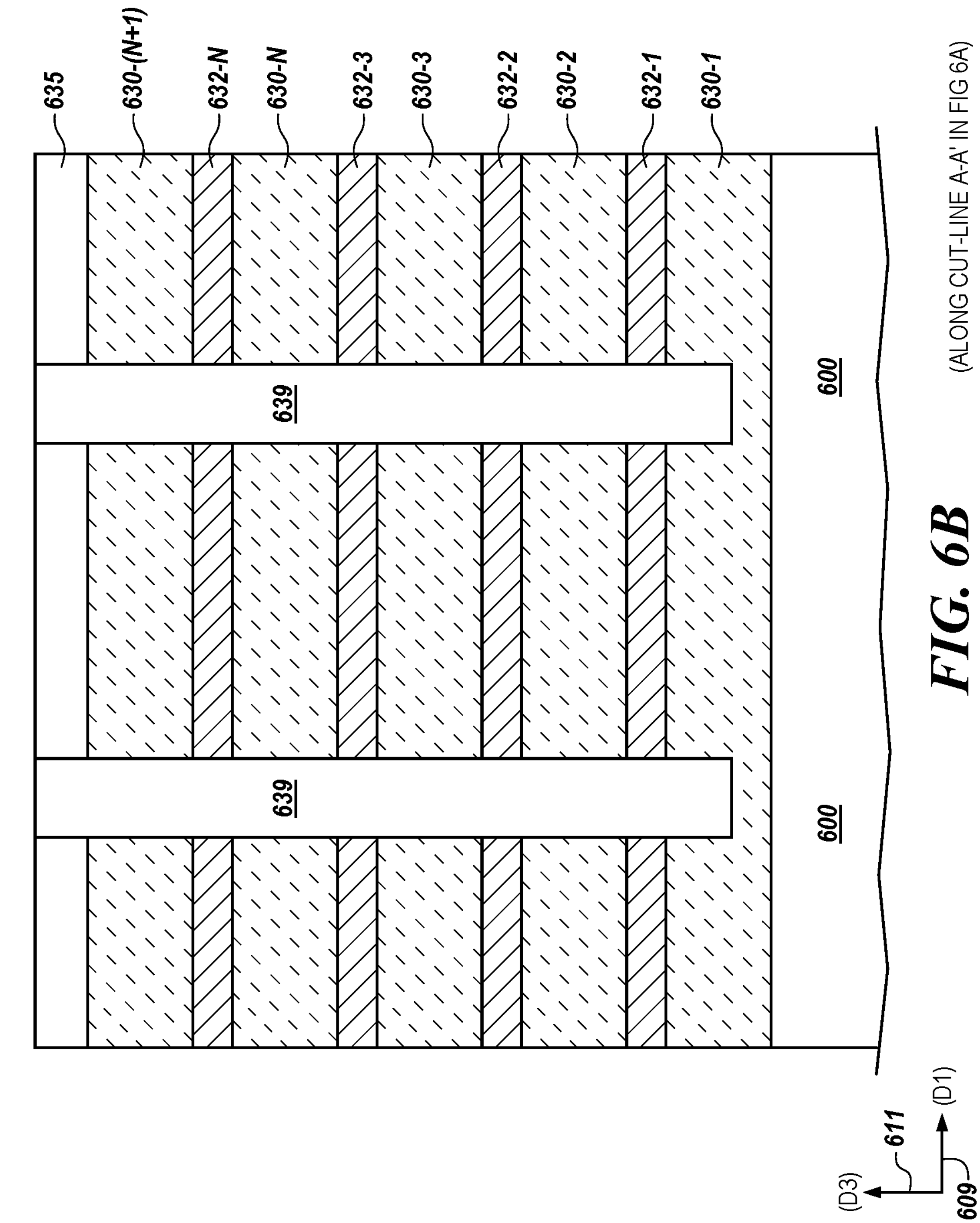

FIG. 6B is a cross sectional view, taken along cut-line A-A' in FIG. 6A, showing another view of the semiconductor structure at a particular time in the semiconductor fabrication process. The cross sectional view shown in FIG. 6B shows the repeating iterations of alternating layers of the epitaxially grown silicon germanium (SiGe) 630 and the silicon material 632, on a semiconductor substrate 600 to form the vertical stack, e.g. 401 as shown in FIG. 4.

As shown in FIG. 6B, a plurality of first vertical openings may be formed through the layers within the vertically stacked memory cells to expose vertical sidewalls in the vertical stack. The first vertical openings 615 may be formed through the repeating iterations of the epitaxially grown silicon germanium (SiGe) 630 and the epitaxially grown, single crystalline silicon (Si) material 632. As such, the first vertical openings 615 may be formed through the first epitaxially grown silicon germanium (SiGe) 630-1, the first epitaxially grown, single crystalline silicon (Si) material 632-1, the second epitaxially grown silicon germanium (SiGe) 630-2, the second epitaxially grown, single crystalline silicon (Si) material 632-2, the third epitaxially grown silicon germanium (SiGe) 630-3 and the third epitaxially grown, single crystalline silicon (Si) material 632-3. Embodiments, however, are not limited to the vertical opening(s) shown in FIG. 6B. Multiple vertical openings may be formed through the layers of materials. The first vertical openings may be formed to expose vertical sidewalls in the vertical stack. The first vertical openings may extend in a second horizontal direction (D2) 605 to form elongated vertical, pillar columns with first vertical sidewalls in the vertical stack.

As shown in FIG. 6B, a first dielectric material 639, such as an oxide or other suitable spin on dielectric (SOD), may be deposited in the first vertical openings, using a process such as CVD, to fill the first vertical openings. A photolithographic material 635, e.g., hard mask, may be deposited over the vertical stack using CVD and planarized using chemical mechanical planarization (CMP). Similar semiconductor process techniques may be used at other points of the semiconductor fabrication process described herein.

Figure 6C:
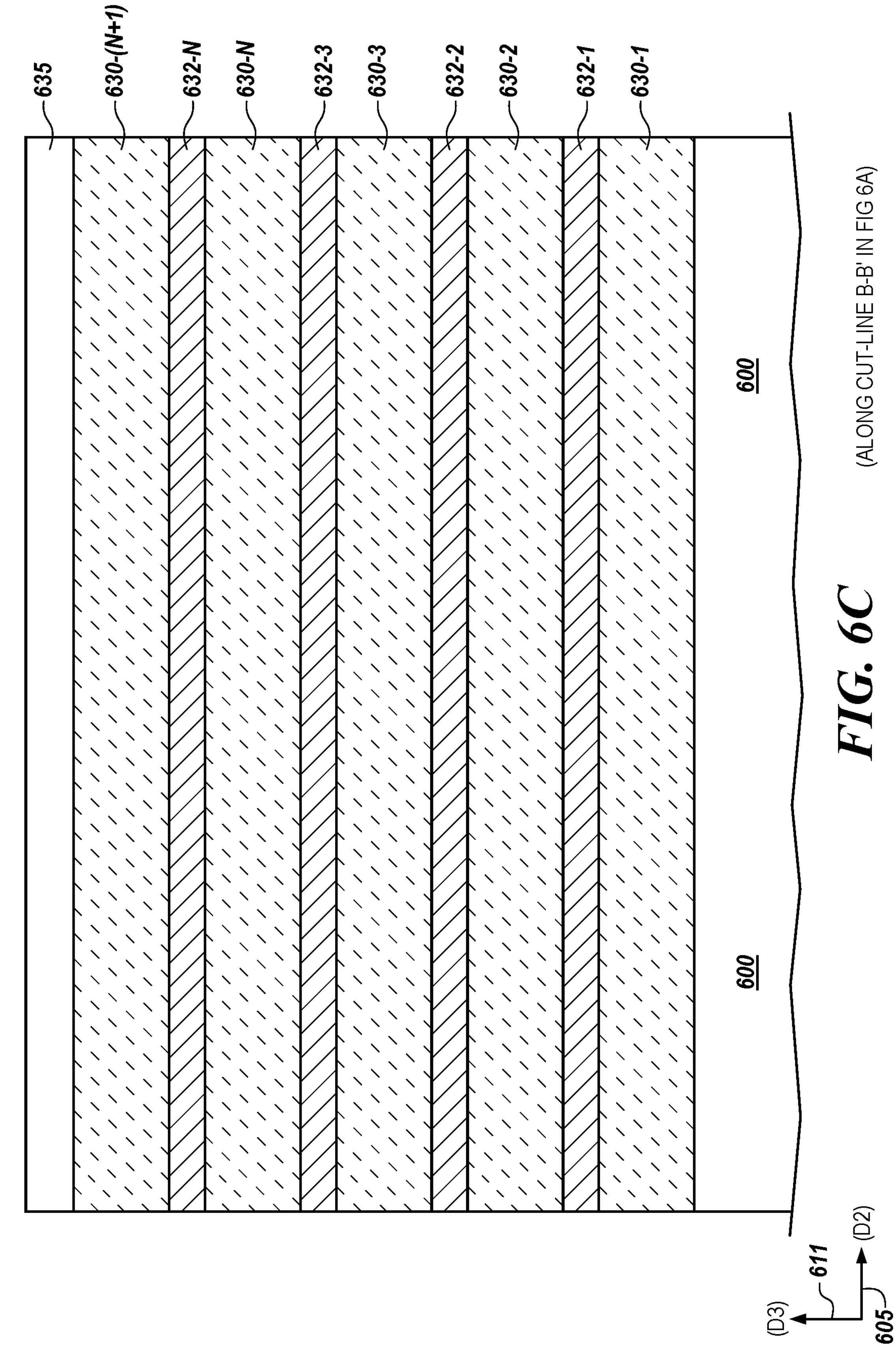

FIG. 6C is a cross-sectional view, taken along cut-line B-B' in FIG. 6A, showing another view of the semiconductor structure at this particular point in one example semiconductor fabrication process for forming vertical digit lines for semiconductor devices having horizontally oriented access devices and horizontally oriented access lines, such as illustrated in FIGS. 1-3, and in accordance with a number of embodiments of the present disclosure.

As shown in FIG. 6C, the vertical stack may consist of repeating iterations of the epitaxially grown epitaxially grown silicon germanium (SiGe) 630 and the epitaxially grown silicon (Si) material 632. As such, the vertical stack may be formed using the first epitaxially grown silicon germanium (SiGe) 630-1, the first epitaxially grown, single crystalline silicon (Si) material 632-1, the second epitaxially grown silicon germanium (SiGe) 630-2, the second epitaxially grown, single crystalline silicon (Si) material 632-2, the third epitaxially grown silicon germanium (SiGe) 630-3 and the third epitaxially grown, single crystalline silicon (Si) material 632-3. A photolithographic material 635, e.g., hard mask, may be deposited using CVD and planarized using chemical mechanical planarization (CMP) to cover the vertical stack. Similar semiconductor process techniques may be used at other points of the semiconductor fabrication process described herein.

Figure 6D:
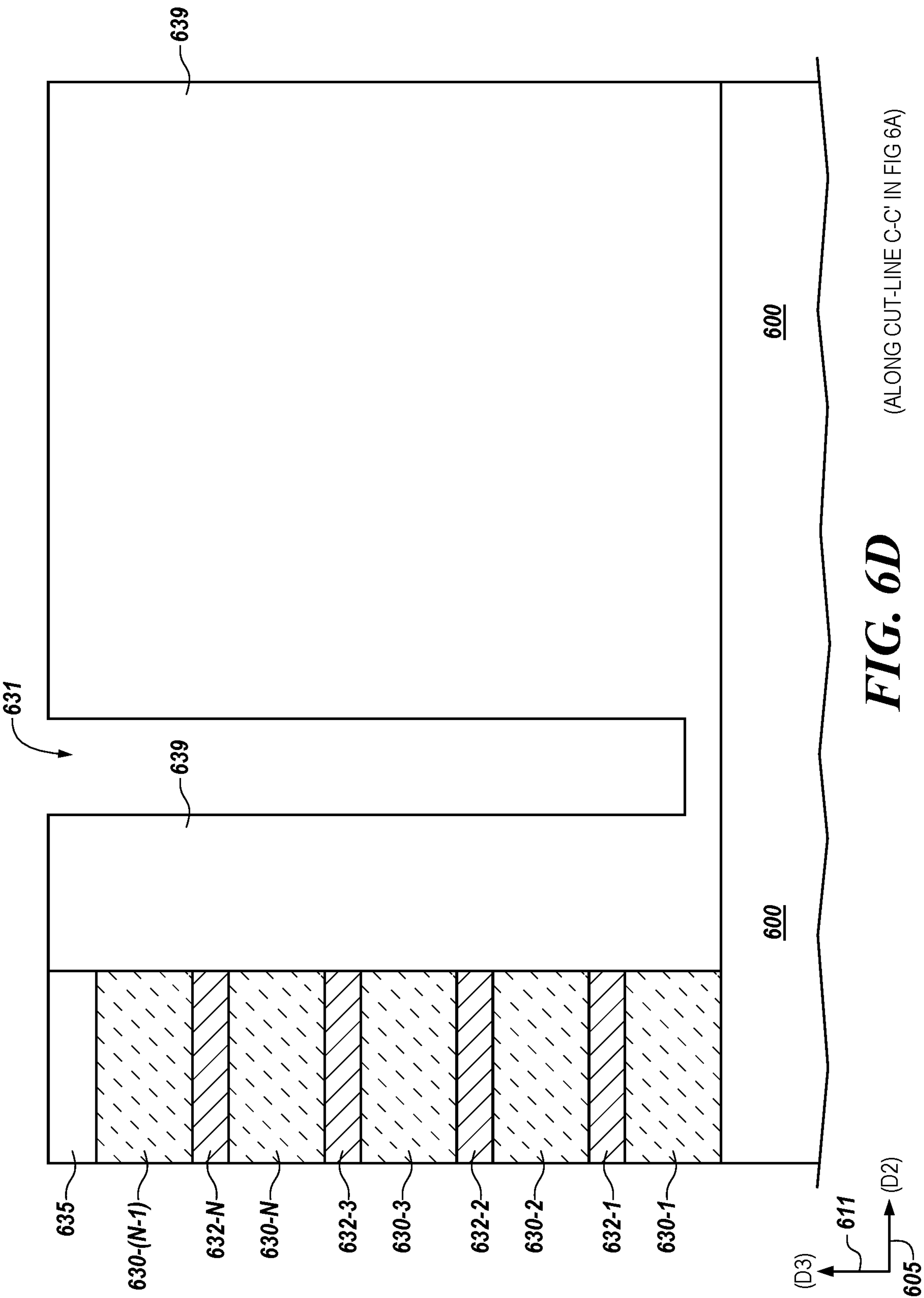

FIG. 6D illustrates a cross sectional view, taken along cut-line C-C' in FIG. 6A, showing another view of the semiconductor structure at this particular point in one example semiconductor fabrication process of an embodiment of the present disclosure. The cross sectional view shown in FIG. 6D is illustrated extending in the second horizontal direction (D2) 605, outside of a region for the horizontally oriented access devices and horizontally oriented storage nodes.

In FIG. 6D, the first dielectric material 639, such as an oxide or other suitable spin on dielectric (SOD), may be deposited in the first vertical openings, using a process such as CVD. The first dielectric material 639 is shown spaced along a first direction (D1), extending into and out from the plane of the drawings sheet, for a three dimensional array of vertically oriented memory cells. The first dielectric material 639 may be seen along an axis of the repeating iterations of alternating layers of the epitaxially grown silicon germanium (SiGe) 630 and the epitaxially grown, single crystalline silicon (Si) material 632. A hard mask 635, which may be deposited using CVD and planarized using chemical mechanical planarization (CMP), may be seen over the vertical stack. Photolithographic techniques may be used to patterned and to expose particular regions over the vertical stack. Similar semiconductor process techniques may be used at other points of the semiconductor fabrication process described herein. Using such techniques, a portion of the first dielectric material 639 may be patterned and exposed to etch a portion of the first dielectric material in a vertical direction selectively removing a portion of the first dielectric material 639 in the plurality of first vertical openings 631 to expose sidewalls adjacent a first region of the epitaxially grown silicon germanium (SiGe) 630.

Figure 6E:
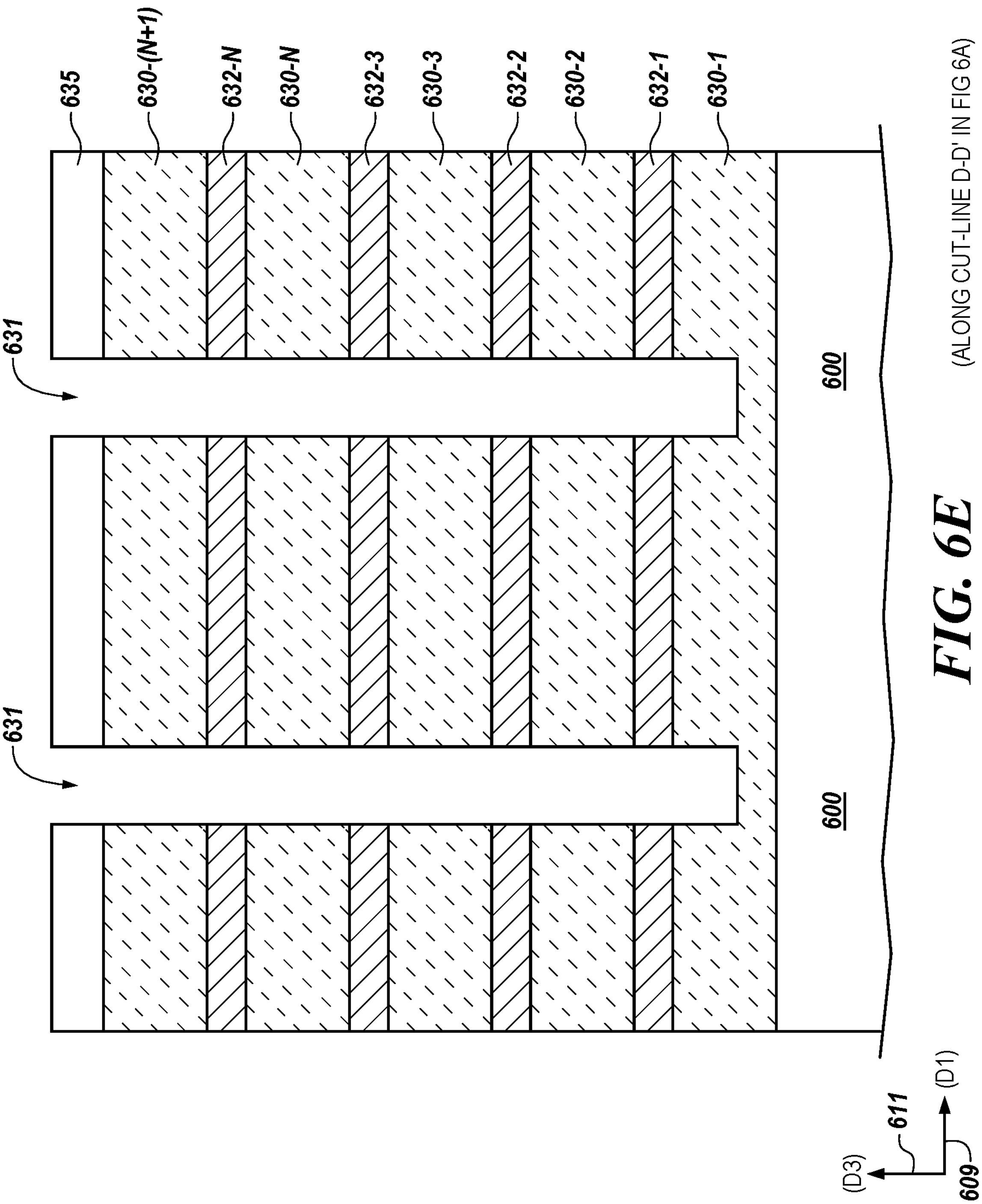

FIG. 6E illustrates a cross sectional view, taken along cut-line D-D' in FIG. 6A, showing another view of the semiconductor structure at this particular point in one example semiconductor fabrication process of an embodiment of the present disclosure. The cross sectional view shown in FIG. 6E is illustrated, right to left in the plane of the drawing sheet, extending in the first direction (D1) 609 along an axis of the repeating iterations of alternating layers of epitaxially grown silicon germanium (SiGe) 630 and the epitaxially grown, single crystalline silicon (Si) material 632.

In this cross sectional view, the second vertical openings 631 may be viewed through the repeating iterations of alternating layers of epitaxially grown silicon germanium (SiGe) 630 and the epitaxially grown, single crystalline silicon (Si) material 632 such that the repeating iterations of alternating layers of epitaxially grown epitaxially grown silicon germanium (SiGe) 630 and the epitaxially grown single crystalline silicon (Si, e.g., "epi-Si") material 632 are etched through. In FIG. 6E, the second vertical openings 631 may be formed through the repeating iterations of the epitaxially grown silicon germanium (SiGe) 630 and the epitaxially grown, single crystalline silicon (Si) material 632. As such, the second vertical openings 631 may be formed through the first epitaxially grown silicon germanium (SiGe) 630-1, the first epitaxially grown, single crystalline silicon (Si) material 632-1, the second epitaxially grown silicon germanium (SiGe) 630-2, the second epitaxially grown, single crystalline silicon (Si) material 632-2, the third epitaxially grown silicon germanium (SiGe) 630-3 and the third epitaxially grown, single crystalline silicon (Si) material 632-3. Embodiments, however, are not limited to the vertical opening(s) shown in FIG. 6E. Multiple vertical openings may be formed through the layers of materials.

Figure 7A:
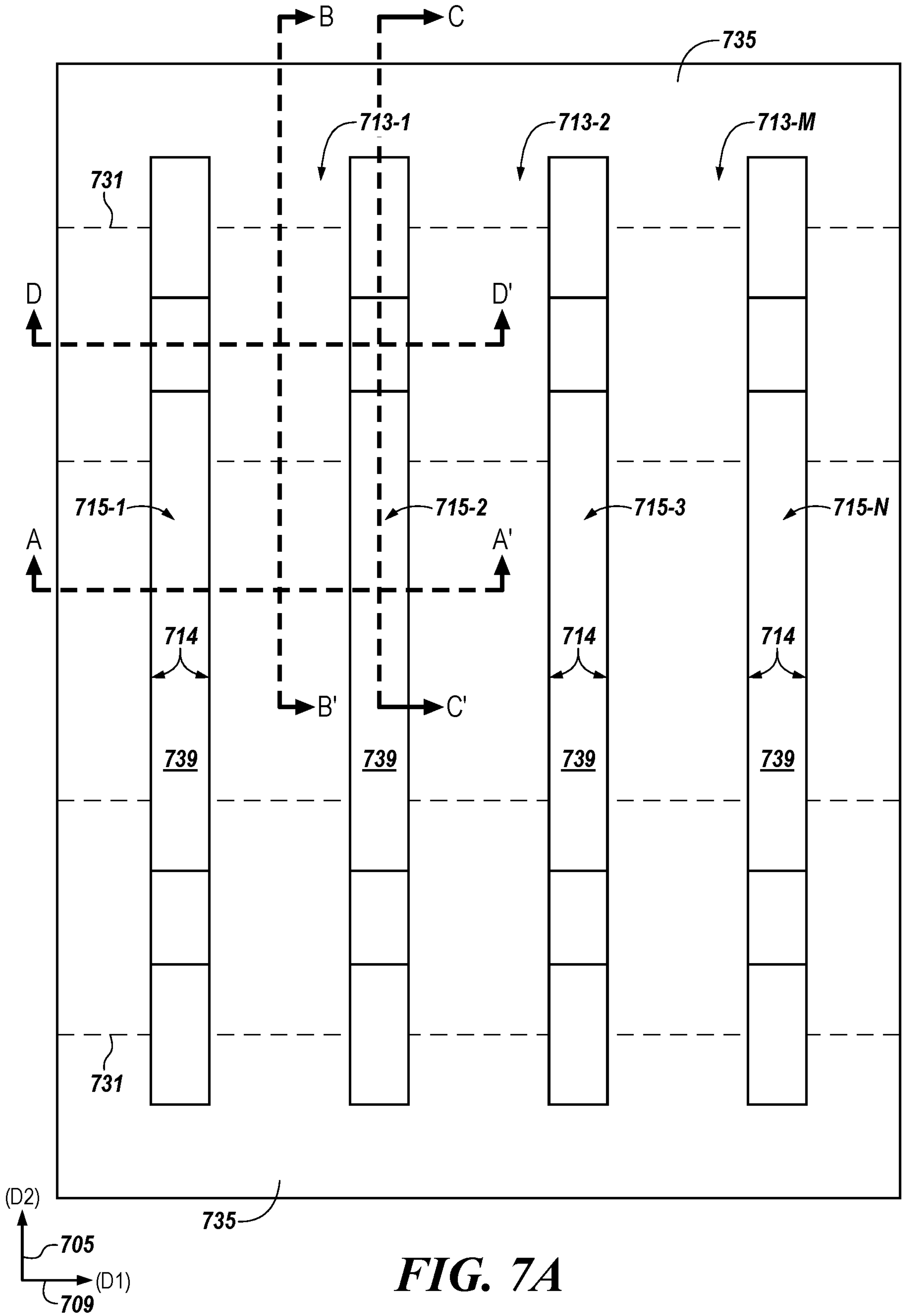
FIGS. 7A to 7E illustrate an example method, at another stage of a semiconductor fabrication process, for forming epitaxial silicon within horizontal access devices in vertical three dimensional (3D) memory, in accordance with a number of embodiments of the present disclosure.

FIG. 7A illustrates an example method, at another stage of a semiconductor fabrication process, for forming epitaxial silicon within horizontal access devices in vertical three dimensional (3D) memory, such as illustrated in FIGS. 1-3, and in accordance with a number of embodiments of the present disclosure. FIG. 7A illustrates a top down view of a semiconductor structure, at a particular point in time, in a semiconductor fabrication process, according to one or more embodiments. In the example embodiment shown in FIG. 7A, the method comprises expanding second vertical openings 731 by using an etchant process to selectively etch through the first dielectric material 739 that filled in the plurality of first vertical openings 715, having a first horizontal direction (D1) 709 and a second horizontal direction (D2) 705, a portion of the epitaxially grown silicon germanium (SiGe) 730 through the vertical stack, and a portion of the hard mask surface 735 connecting the plurality of first vertical openings 715. Multiple second vertical openings 631 may be formed through the layers of materials. The plurality of first vertical openings 715 may be viewed within the hard mask 735 covering the working surface of the vertical semiconductor stack.

Figure 7B:
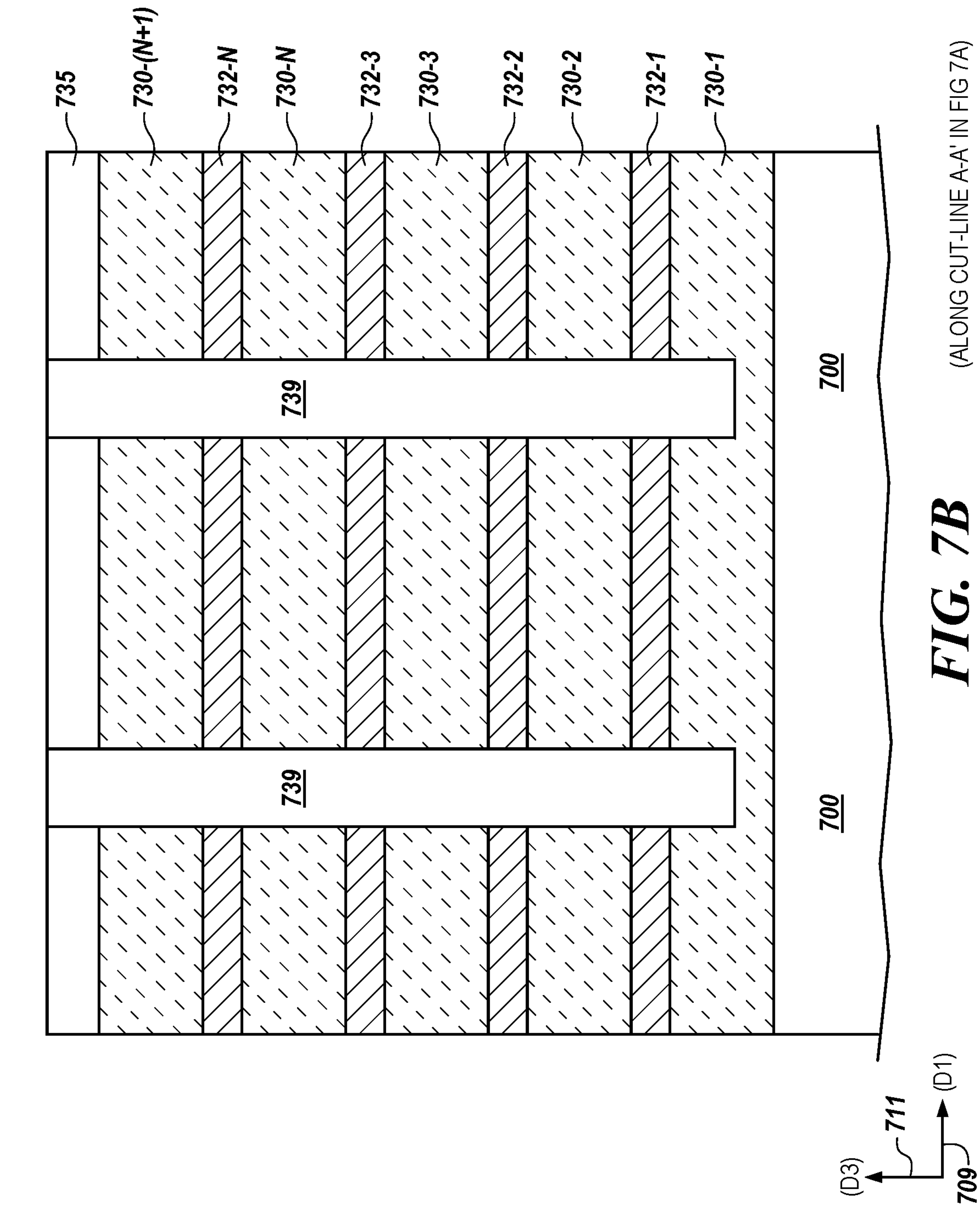

FIG. 7B is a cross sectional view, taken along cut-line A-A' in FIG. 7A, showing another view of the semiconductor structure at a particular time in the semiconductor fabrication process. The cross sectional view shown in FIG. 7B shows the repeating iterations of alternating layers of epitaxially grown silicon germanium (SiGe) 730 and the epitaxially grown, single crystalline silicon (Si) material 732, on a semiconductor substrate 715.

As shown in FIG. 7B, a plurality of first vertical openings may be formed through the layers within the vertically stacked memory cells to expose vertical sidewalls in the vertical stack. The first vertical openings may be formed through the repeating iterations of the epitaxially grown silicon germanium (SiGe) 730 and the epitaxially grown, single crystalline silicon (Si) material 732. As such, the first vertical openings may be formed through the first epitaxially grown silicon germanium (SiGe) 730-1, the first epitaxially grown, single crystalline silicon (Si) material 732-1, the second epitaxially grown silicon germanium (SiGe) 730-2, the second epitaxially grown, single crystalline silicon (Si) material 732-2, the third epitaxially grown silicon germanium (SiGe) 730-3 and the third epitaxially grown, single crystalline silicon (Si) material 732-3. Embodiments, however, are not limited to the vertical opening(s) shown in FIG. 7B. Multiple vertical openings may be formed through the layers of materials. The first vertical openings may be formed to expose vertical sidewalls in the vertical stack. The first vertical openings may extend in a first horizontal direction (D1) 709 to form elongated vertical, pillar columns with first vertical sidewalls in the vertical stack.

As shown in FIG. 7B, a first dielectric material 739, such as an oxide or other suitable spin on dielectric (SOD), may be viewed in the first vertical openings, filling the first vertical openings. A hard mask 735 may be deposited over the vertical stack. Similar semiconductor process techniques may be used at other points of the semiconductor fabrication process described herein.

Figure 7C:
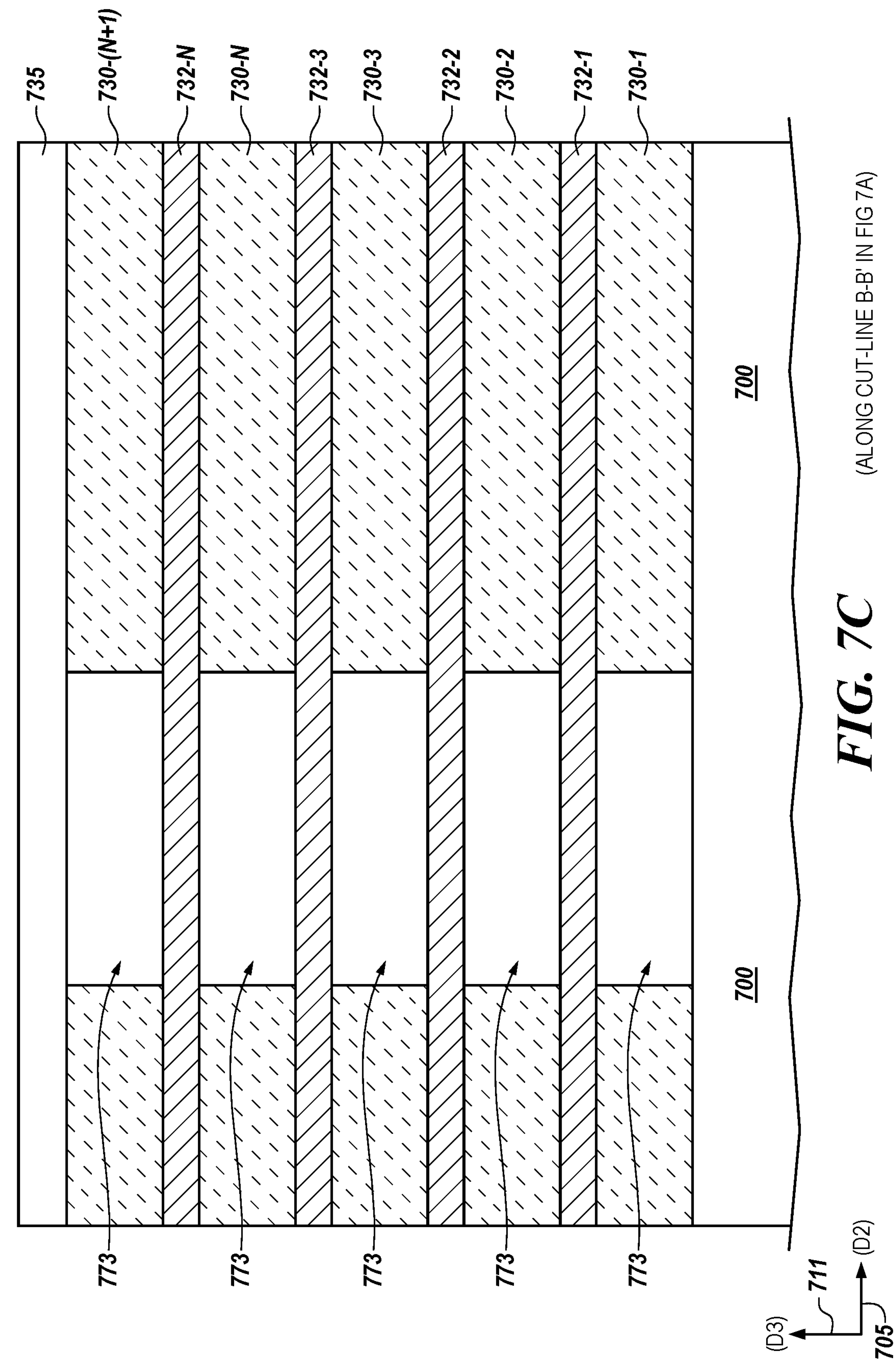

FIG. 7C is a cross-sectional view, taken along cut-line B-B' in FIG. 7A, showing another view of the semiconductor structure at this particular point in one example semiconductor fabrication process for forming epitaxial silicon within horizontal access devices in vertical three dimensional (3D) memory, such as illustrated in FIGS. 1-3, and in accordance with a number of embodiments of the present disclosure.

The epitaxially grown silicon germanium (SiGe) 730 may be selectively etched isotropically to form a plurality of first horizontal openings 773 in the first region separating layers of the Si material 732. An etchant may be flowed into the second vertical opening 731 to selectively etch a portion of the epitaxially grown silicon germanium (SiGe) 730 within the stack. As such, the etchant may target the first epitaxially grown silicon germanium (SiGe) 730-1, the second epitaxially grown silicon germanium (SiGe) 730-2, and the third epitaxially grown silicon germanium (SiGe) 730-3 within the stack. The selective etchant process may etch the epitaxially grown silicon germanium (SiGe) 730 to form the plurality of first horizontal openings 773.

The selective etchant process may comprise a selective etch chemistry of phosphoric acid ($H_3PO_4$) or hydrogen fluoride (HF) and/or dissolving the epitaxially grown silicon germanium (SiGe) 730 using a selective solvent, among other possible etch chemistries or solvents. Alternatively, or in addition, a selective etch to remove the epitaxially grown silicon germanium (SiGe) 730 may consist of one or more etch chemistries selected from an aqueous etch chemistry, a semi-aqueous etch chemistry, a vapor etch chemistry, or a plasma etch chemistries, among other possible selective etch chemistries. For example, a dry etch chemistry of oxygen ($O_2$) or $O_2$ and sulfur dioxide ($SO_2$) may be utilized. As another example, a dry etch chemistries of $O_2$ or of $O_2$ and nitrogen ($N_2$) may be used to selectively etch the epitaxially grown silicon germanium (SiGe) 730.

Figure 7D:
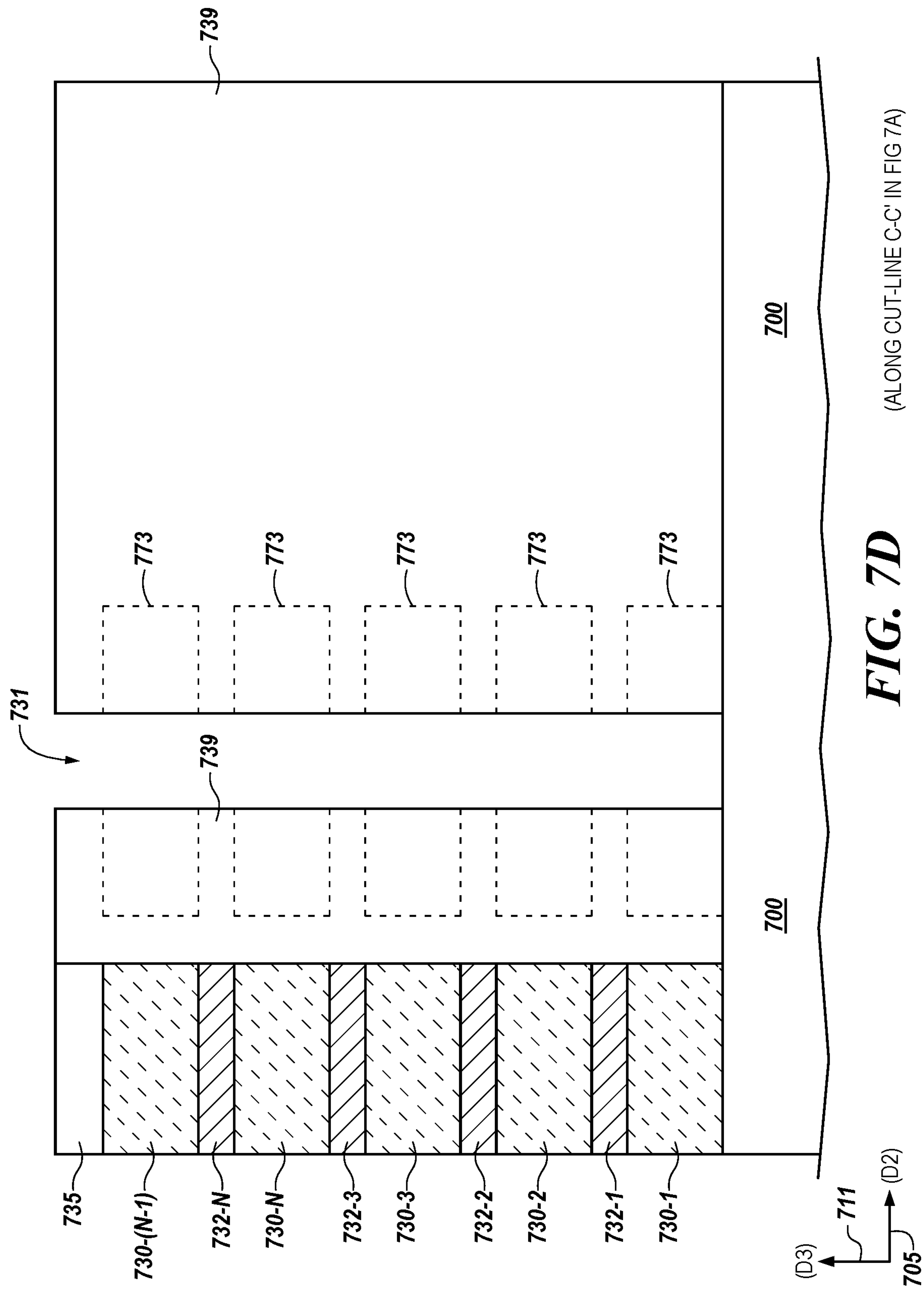

FIG. 7D illustrates a cross sectional view, taken along cut-line C-C' in FIG. 7A, showing another view of the semiconductor structure at this particular point in one example semiconductor fabrication process of an embodiment of the present disclosure. The cross sectional view shown in FIG. 7D is illustrated extending in the second horizontal direction (D2) 705, in the space between, and separating the neighboring regions for the horizontally oriented access devices and horizontally oriented storage nodes.

In FIG. 7D, the first dielectric material 739 is shown filling the space lengthwise along a second direction (D2) 705, but separating neighboring access devices and storage nodes, extending into and out from the plane of the drawings sheet in the first directions (D1), for a three dimensional array of vertically oriented memory cells. The first dielectric material 739 may be seen along an axis of the repeating iterations of alternating layers of the epitaxially grown silicon germanium (SiGe) 730 and the epitaxially grown, single crystalline silicon (Si)material 732. A portion of the first dielectric material 739 may be etched in a vertical direction reflecting the second vertical openings 731. The cross sectional view shown in FIG. 7D is illustrated, right to left in the plane of the drawing sheet, extending in the second direction (D2) 705 along an axis of the repeating iterations of alternating layers of the epitaxially grown silicon germanium (SiGe) 730 and the epitaxially grown, single crystalline silicon (Si) material 732. A hard mask 735, which may be deposited using CVD and planarized using chemical mechanical planarization (CMP), may be seen over the vertical stack. Similar semiconductor process techniques may be used at other points of the semiconductor fabrication process described herein.

Figure 7E:
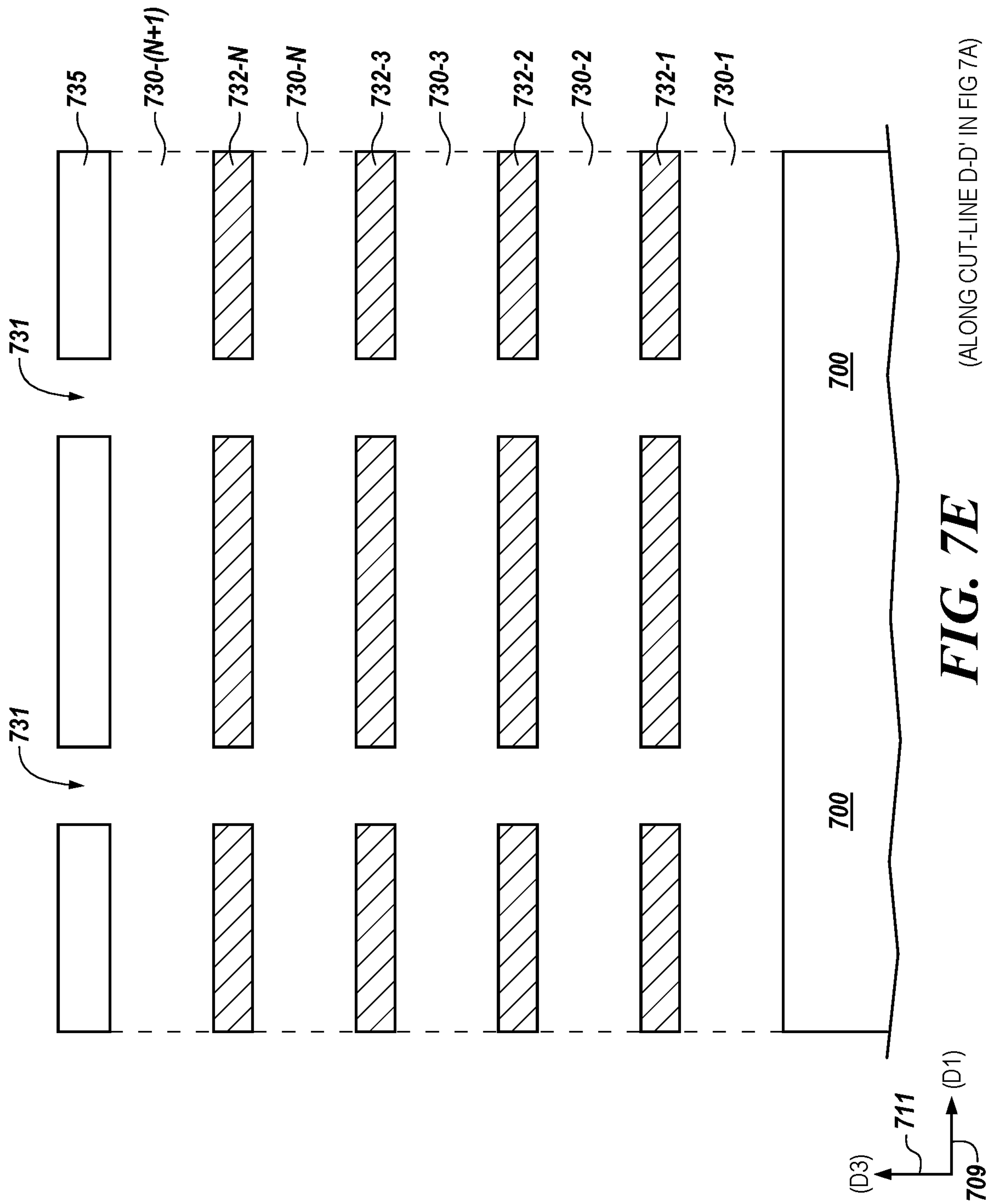

FIG. 7E illustrates a cross sectional view, taken along cut-line D-D' in FIG. 7A, showing another view of the semiconductor structure at this particular point in one example semiconductor fabrication process of an embodiment of the present disclosure. The cross sectional view shown in FIG. 7E is illustrated, right to left in the plane of the drawing sheet, extending in the first direction (D1) 709.

In FIG. 7E, the epitaxially grown silicon germanium (SiGe) has been selectively etched isotropically such that it is completely etched from this view. Alternating layers of the epitaxially grown, single crystalline silicon (Si) material 732 may be viewed. The openings created by the etched second vertical openings 731 may be formed through the repeating iterations of the epitaxially grown, single crystalline silicon (Si) material 732. As such, the first vertical openings 731 may be formed through the first epitaxially grown, single crystalline silicon (Si) material 732-1, the second epitaxially grown, single crystalline silicon (Si) material 732-2, and the third epitaxially grown, single crystalline silicon (Si) material 732-3. Embodiments, however, are not limited to the vertical opening(s) shown in FIG. 7E. Multiple second vertical openings may be formed through the layers of materials. A hard mask 735, may be deposited using CVD and planarized using chemical mechanical planarization (CMP) to cover the vertical stack. A hard mask 737, covering the vertical stack may be etched in the same manner by the first vertical openings 731.

Figure 8A:
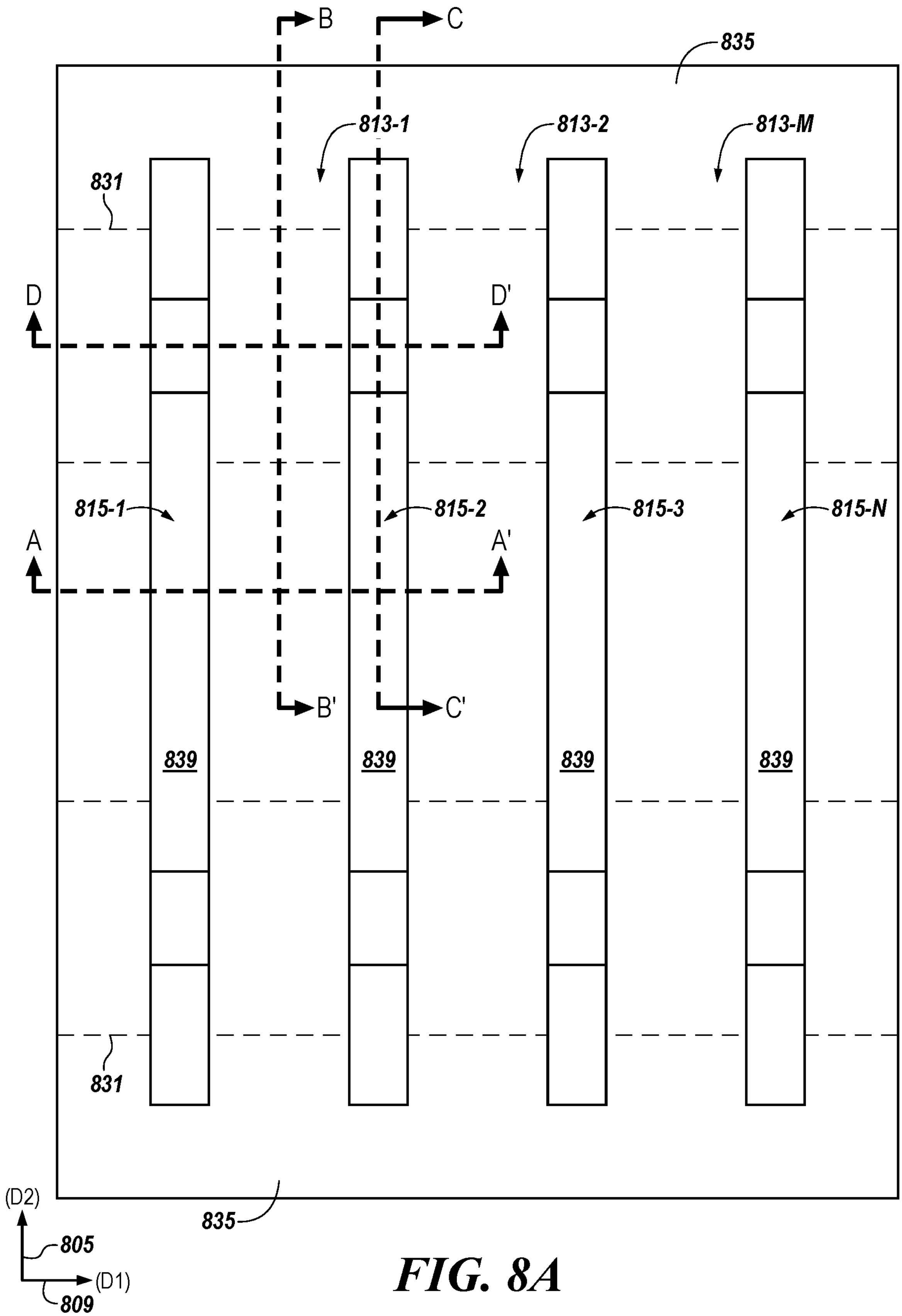
FIGS. 8A to 8E illustrate an example method, at another stage of a semiconductor fabrication process, for forming epitaxial silicon within horizontal access devices in vertical three dimensional (3D) memory, in accordance with a number of embodiments of the present disclosure.

FIG. 8A illustrates an example method, at another stage of a semiconductor fabrication process, for forming epitaxial silicon within horizontal access devices in vertical three dimensional (3D) memory, such as illustrated in FIGS. 1-3, and in accordance with a number of embodiments of the present disclosure. FIG. 8A illustrates a top down view of a semiconductor structure, at a particular point in time, in a semiconductor fabrication process, according to one or more embodiments.

Figure 8B:
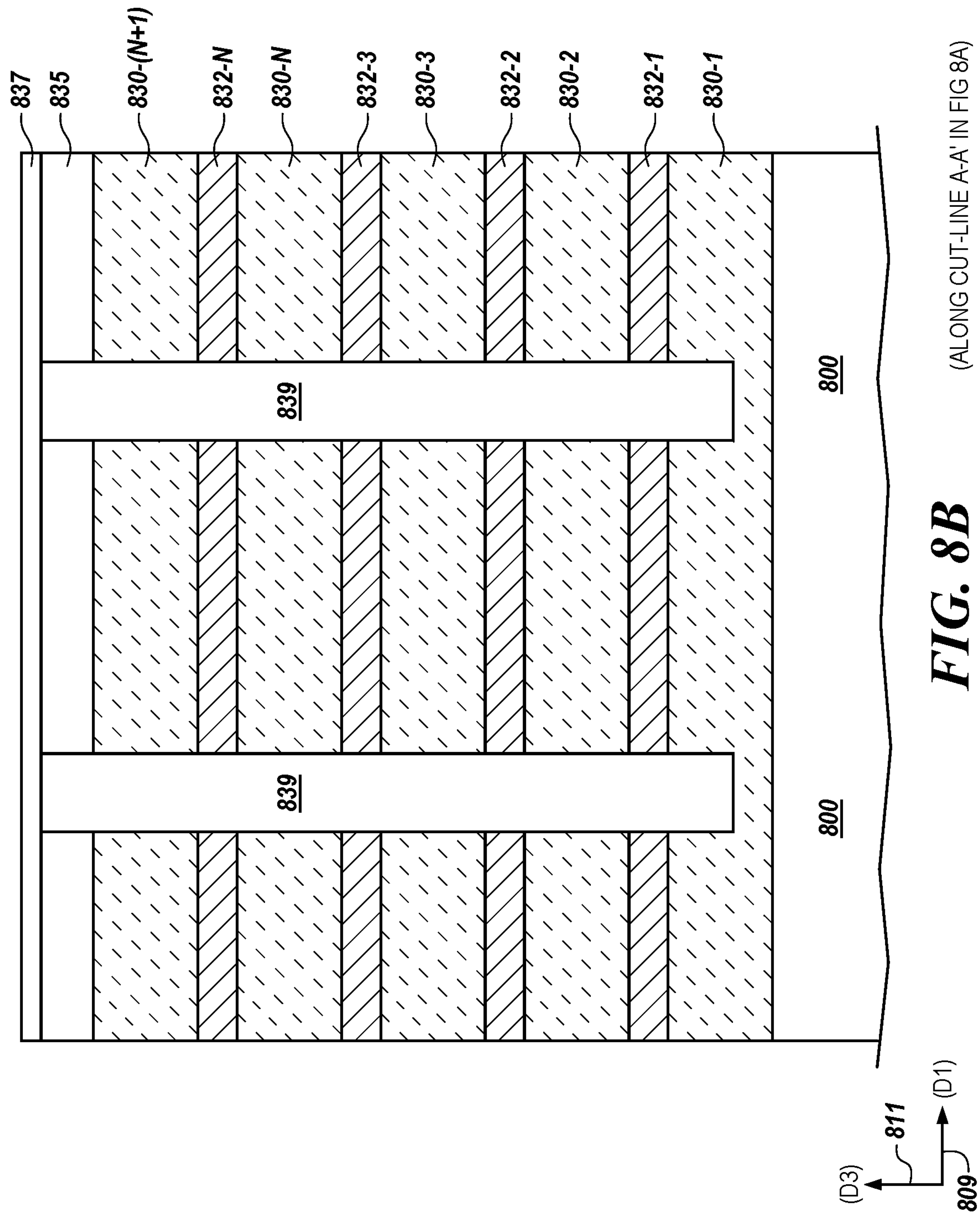

In the example embodiment shown in FIG. 8A, the method comprises a newly deposited second dielectric material 833 deposited through the second vertical openings 831 on exposed surfaces of the second vertical openings 831 and on the exposed surfaces of the epitaxially grown silicon (Si) material 832 within the first horizontal openings 873A portion of the unetched first dielectric material 839 may be seen in FIG. 8B FIG. 8B is a cross sectional view, taken along cut-line A-A' in FIG. 8A, showing another view of the semiconductor structure at a particular time in the semiconductor fabrication process. The cross sectional view shown in FIG. 8B shows the repeating iterations of alternating layers of epitaxially grown silicon germanium (SiGe) 830 and the epitaxially grown, single crystalline silicon (Si) material 832, on a semiconductor substrate 800.

As shown in FIG. 8B, a plurality of first vertical openings have already been formed through the layers within the vertically stacked memory cells to expose vertical sidewalls in the vertical stack. In FIGS. 6A-6E, the first vertical openings were formed through the repeating iterations of the epitaxially grown silicon germanium (SiGe) 830 and the epitaxially grown, single crystalline silicon (Si) material 832.

As shown in FIG. 8B, a first dielectric material 839, such as an oxide or other suitable spin on dielectric (SOD), is shown in the first vertical openings 815, filling the first vertical openings. A hard mask 835 is shown deposited over the vertical stack. The newly deposited second dielectric material 833 may also be view over the vertical stack in the cross-sectional view of FIG. 8B.

Figure 8C:
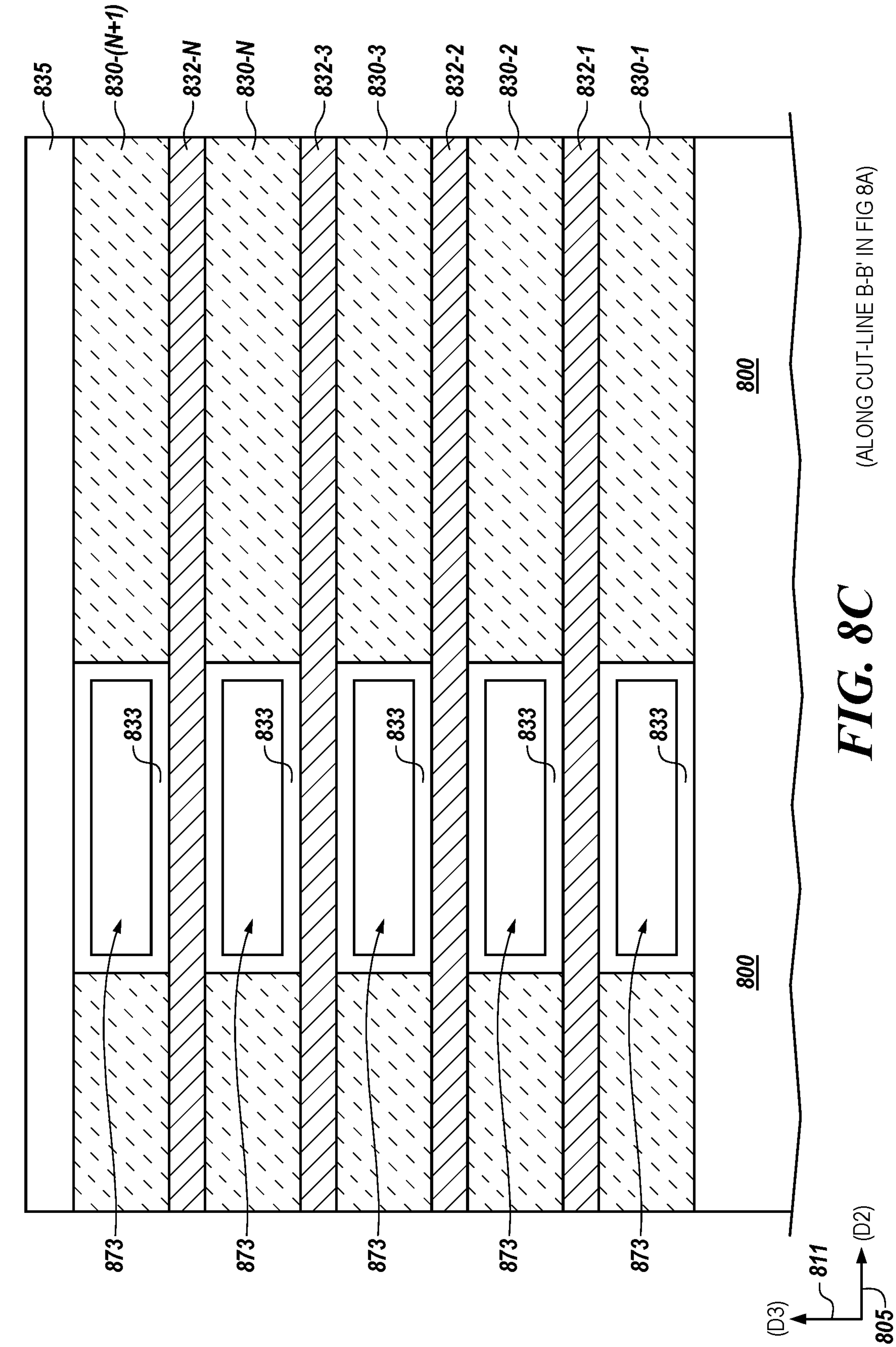

FIG. 8C is a cross-sectional view, taken along cut-line B-B' in FIG. 8A, showing another view of the semiconductor structure at this particular point in one example semiconductor fabrication process for forming vertical digit lines for semiconductor devices having horizontally oriented access devices and horizontally oriented access lines, such as illustrated in FIGS. 1-3, and in accordance with a number of embodiments of the present disclosure.

The epitaxially grown silicon germanium (SiGe) 830 has already been selectively etched isotropically to form a plurality of first horizontal openings 873 in the first region separating layers of the Si material 832. A second dielectric material 833 may be conformally deposited all around first horizontal opening 873. The second dielectric material 833 may be deposited fully around exposed surfaces in the plurality of first horizontal openings 873. The second dielectric material 833 may serve as a liner around the plurality of first horizontal openings 873. The second dielectric material 833 may be flowed into the second vertical opening 831 to cover exposed surfaces of the epitaxially grown silicon (Si) material where the epitaxially grown silicon germanium (SiGe) was removed to form the plurality of first horizontal openings 873 within the stack.

In one embodiment, the second dielectric material 833 may comprise a nitride material. In another embodiment, second dielectric material 833 may comprise a silicon nitride ($Si_3N_4$) material (also referred to herein as "SiN"). In another embodiment the second dielectric material 833 may include silicon dioxide ($SiO_2$) material. In another embodiment the second dielectric material 833 may comprise a silicon oxy-carbide (SiOxCy) material, and/or combinations thereof. Embodiments are not limited to these examples.

In one embodiment, the second dielectric material 833 may be conformally deposited all around exposed surfaces in the plurality of first horizontal openings 873 to have a thickness (t1) of approximately 100 to 300 angstroms (Å). Embodiments, however, are not limited to these examples.

Figure 8D:
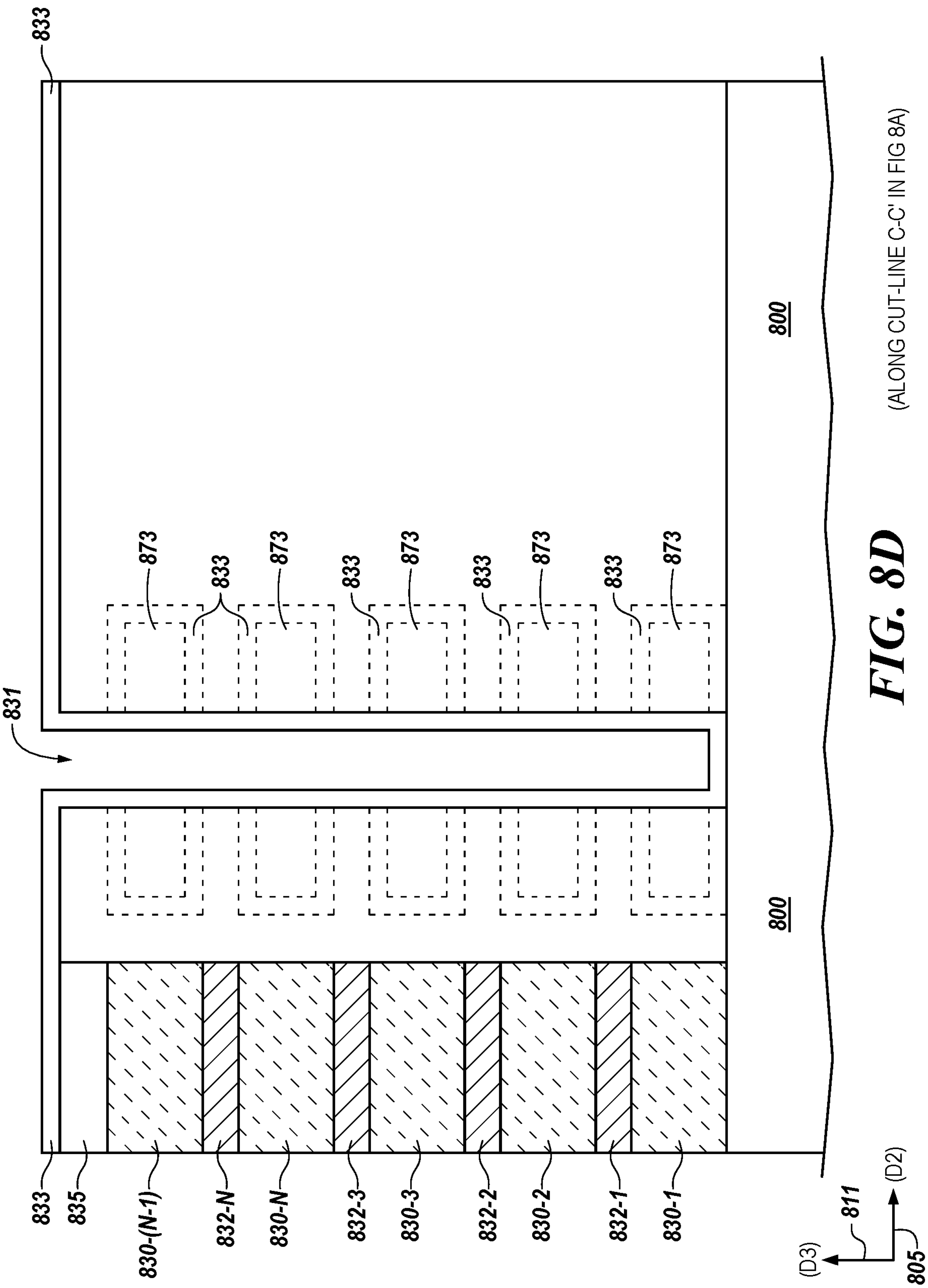

FIG. 8D illustrates a cross sectional view, taken along cut-line C-C' in FIG. 8A, showing another view of the semiconductor structure at this particular point in one example semiconductor fabrication process of an embodiment of the present disclosure. The cross sectional view shown in FIG. 8D is illustrated extending in the second horizontal direction (D2) 805, outside of a region for the horizontally oriented access devices and horizontally oriented storage nodes.

In FIG. 8D, the first dielectric material 839 is shown filling the space along a second direction (D2) 805, and separating access device and storage node regions extending into and out from the plane of the drawings sheet, for a three dimensional array of vertically oriented memory cells. The cross sectional view shown in FIG. 8D is illustrated, right to left in the plane of the drawing sheet, extending in the second direction (D2) 805 along an axis of the repeating iterations of alternating layers of epitaxially grown silicon germanium (SiGe) 830 and epitaxially grown, single crystalline silicon (Si) material 832. A portion of the first dielectric material 839 has been etched in a vertical direction, forming the second vertical openings 831, within the plurality of first vertical openings 815 to expose sidewalls adjacent a first region of the epitaxially grown silicon germanium (SiGe) 830. Here, the second dielectric material 833 may be deposited into the second vertical openings 831 to cover the sidewalls of the first dielectric material 839 and to cover exposed surfaces of the epitaxially grown silicon (Si) 830 within the formed first horizontal openings 873. A hard mask 835 may be seen over the vertical stack.

Figure 8E:
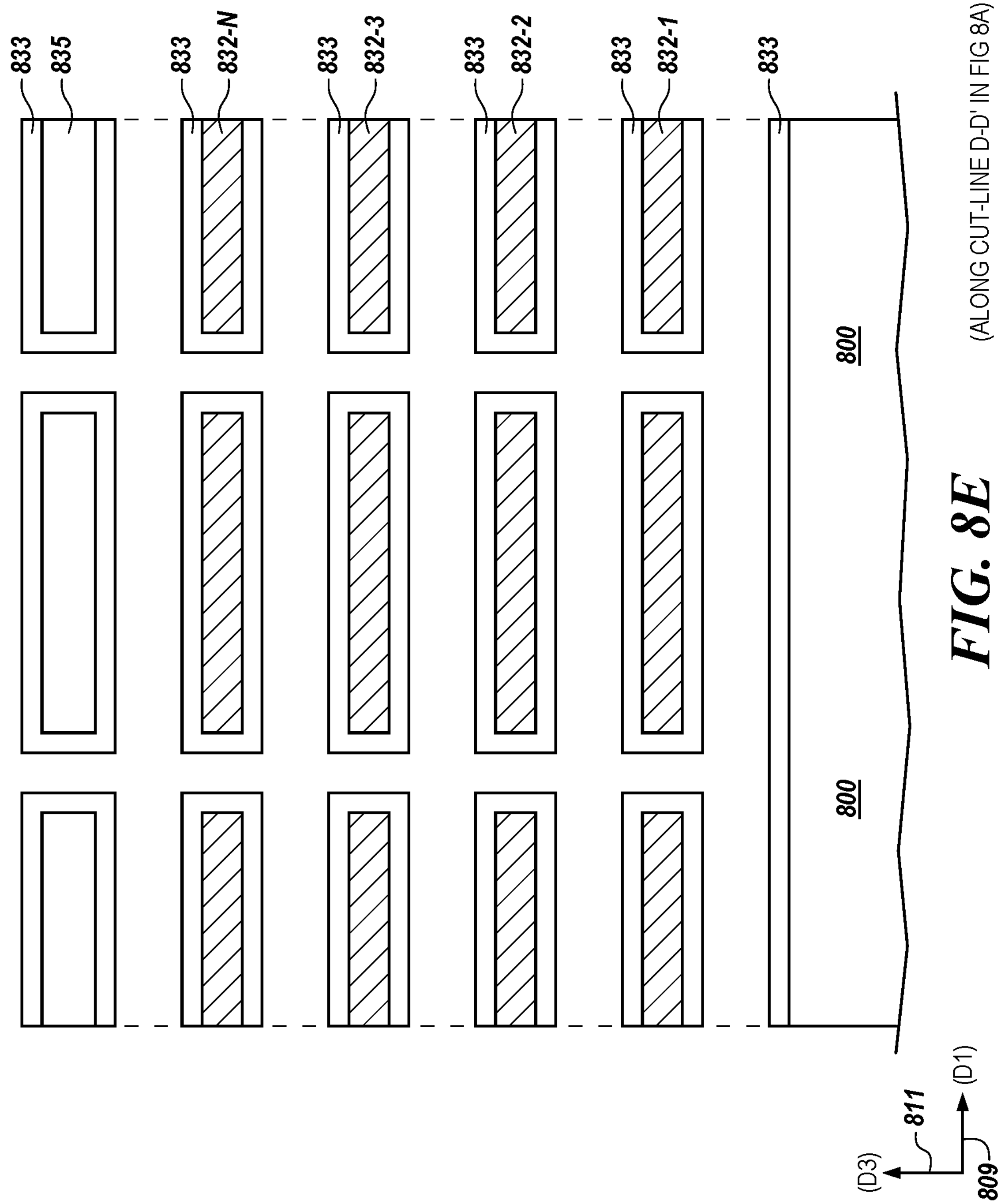

FIG. 8E illustrates a cross sectional view, taken along cut-line D-D' in FIG. 8A, showing another view of the semiconductor structure at this particular point in one example semiconductor fabrication process of an embodiment of the present disclosure. The cross sectional view shown in FIG. 8E is illustrated, right to left in the plane of the drawing sheet, extending in the first direction (D1) 809 along an axis of the repeating iterations of alternating layers of epitaxially grown silicon (Si) material 832, conformally covered with the second dielectric material 833 and bridging the first horizontal openings 873.

In FIG. 8E, the epitaxially grown silicon germanium (SiGe), in the first horizontal openings 873, has already been selectively etched isotropically such that it is completely etched away in this view. Alternating layers of the epitaxially grown, single crystalline silicon (Si) material 832 may be viewed. The second dielectric material 833 is shown conformally deposited all around the epitaxially grown, single crystalline silicon (Si) material 832. As such, the second dielectric material 833 may be formed on surfaces of the first epitaxially grown, single crystalline silicon (Si) material 832-1, the second epitaxially grown, single crystalline silicon (Si) material 832-2, and the third epitaxially grown, single crystalline silicon (Si) material 832-3. The second dielectric material 833 may also be conformally deposited all around the hard mask 835 in a similar manner as the epitaxially grown, single crystalline silicon (Si) material 832 in this cross-sectional view in an access device region of the vertical stack. The second dielectric material 833 may also be deposited over substrate 800.

Figure 9A:
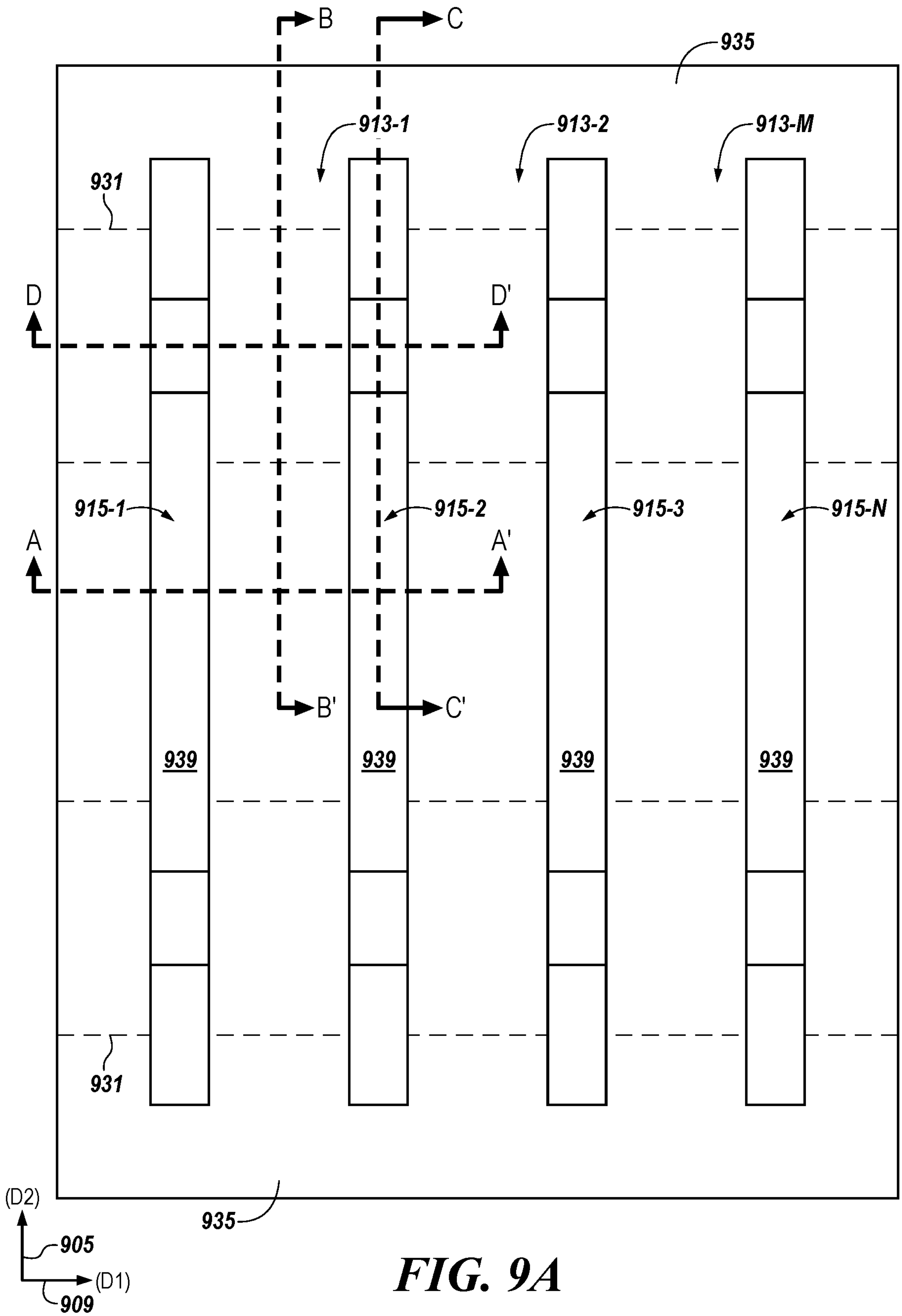
FIGS. 9A to 9E illustrate an example method, at another stage of a semiconductor fabrication process, for forming epitaxial silicon within horizontal access devices in vertical three dimensional (3D) memory, in accordance with a number of embodiments of the present disclosure.

FIG. 9A illustrates an example method, at another stage of a semiconductor fabrication process, for forming epitaxial silicon within horizontal access devices in vertical three dimensional (3D) memory, such as illustrated in FIGS. 1-3, and in accordance with a number of embodiments of the present disclosure. FIG. 9A illustrates a top down view of a semiconductor structure, at a particular point in time, in a semiconductor fabrication process, according to one or more embodiments.

In the example embodiment shown in FIG. 9A, the method comprises depositing the first dielectric material 939 to fill the first vertical openings 915. first vertical openings 915 may be completely filled with first dielectric material 939.

Figure 9B:
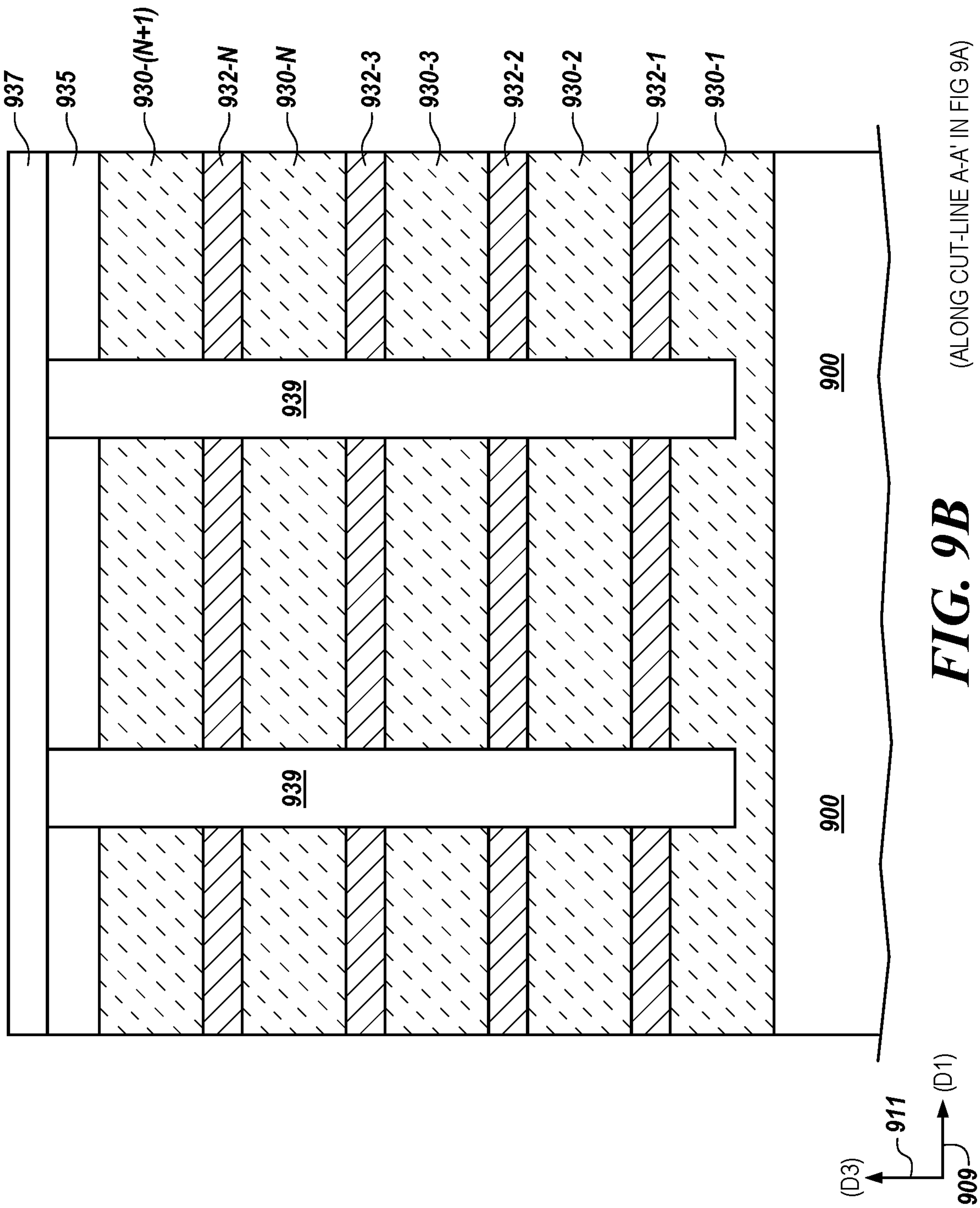

FIG. 9B is a cross sectional view, taken along cut-line A-A' in FIG. 9A, showing another view of the semiconductor structure at a particular time in the semiconductor fabrication process. The cross sectional view shown in FIG. 9B shows the repeating iterations of alternating layers of epitaxially grown silicon germanium (SiGe) 930 and epitaxially grown, single crystalline silicon (Si) material 932, on a semiconductor substrate 900.

As shown in FIG. 9B, a plurality of first vertical openings 915 have already been formed through the layers within the vertically stacked memory cells to expose vertical sidewalls in the vertical stack and filled with a first dielectric material 939. The first vertical openings were formed through the repeating iterations of the epitaxially grown epitaxially grown silicon germanium (SiGe) 930 and the epitaxially grown, single crystalline silicon (Si) material 932. As such, FIG. 9B shows the first vertical openings 915, in a storage node region, filled with the first dielectric material 939 through the first epitaxially grown silicon germanium (SiGe) 930-1, the first epitaxially grown, single crystalline silicon (Si) material 932-1, the second epitaxially grown silicon germanium (SiGe) 930-2, the second epitaxially grown, single crystalline silicon (Si) material 932-2, the third epitaxially grown silicon germanium (SiGe) 930-3 and the third epitaxially grown, single crystalline silicon (Si) material 932-3. Embodiments, however, are not limited to the vertical opening(s) shown in FIG. 9B. Multiple vertical openings may be formed through the layers of materials.

Figure 9C:
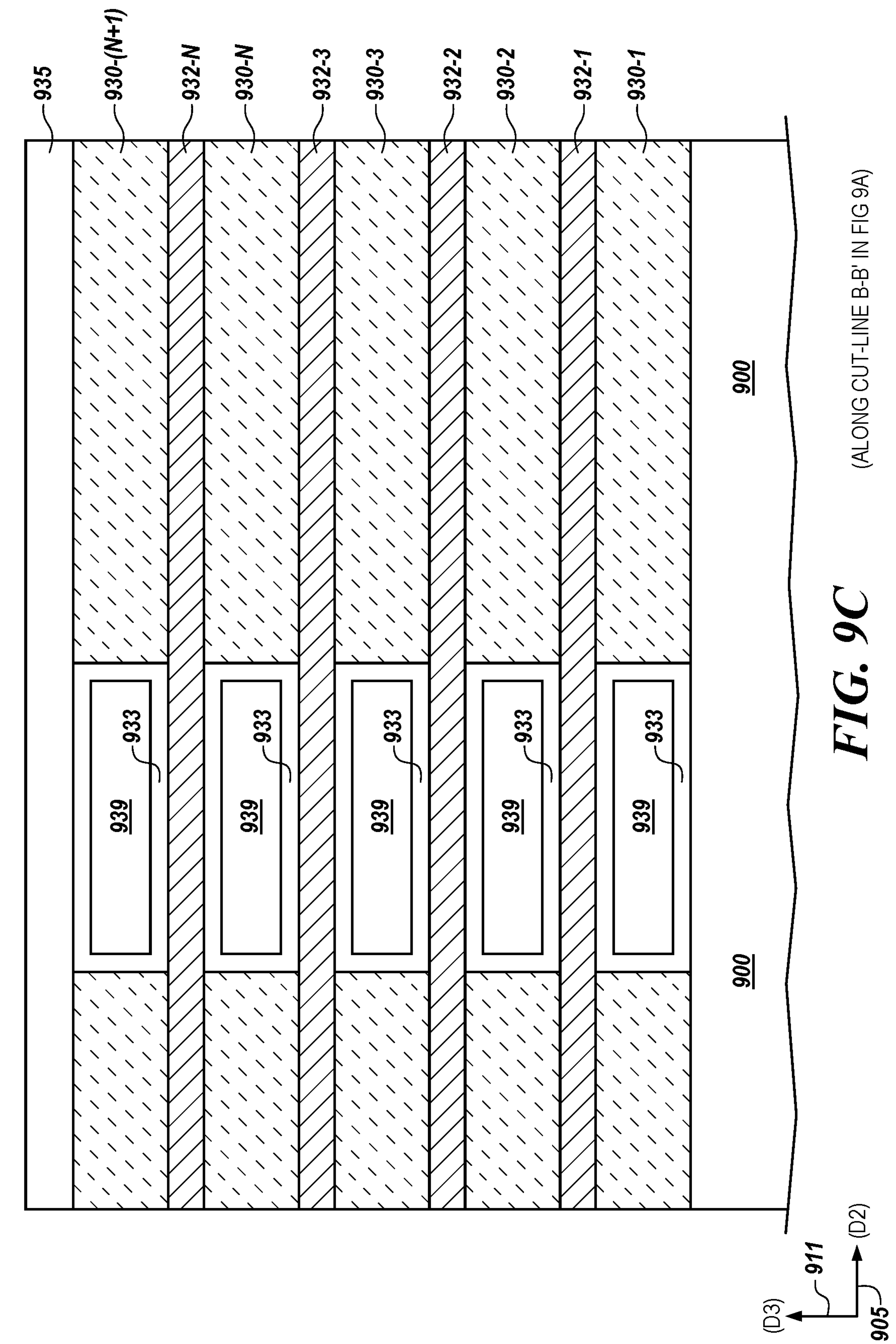

FIG. 9C is a cross-sectional view, taken along cut-line B-B' in FIG. 9A, showing another view of the semiconductor structure at this particular point in one example semiconductor fabrication process for forming epitaxial silicon within horizontal access devices in vertical three dimensional (3D) memory, such as illustrated in FIGS. 1-3, and in accordance with a number of embodiments of the present disclosure.

As shown in FIG. 9C, a first dielectric material 939, such as an oxide or other suitable spin on dielectric (SOD), is deposited into the plurality of first horizontal openings 973, on the exposed surfaces of the second dielectric material 933, to fill the first horizontal opening 973. The first dielectric material 939 may entirely fill the plurality of first horizontal openings 973. The first dielectric material 939 may be flowed into the second vertical openings 931 to fill the second vertical openings and to fill the plurality of first horizontal openings 973 within the stack. As such, the first dielectric material 939 may fill the first horizontal openings 973, formed in FIGS. 7A-7E and covered with second dielectric 933 in FIGS. 8A-8E, within the first epitaxially grown silicon germanium (SiGe) 930-1, the second epitaxially grown silicon germanium (SiGe) 930-2, and the third epitaxially grown silicon germanium (SiGe) 930-3 within the stack.

Figure 9D:
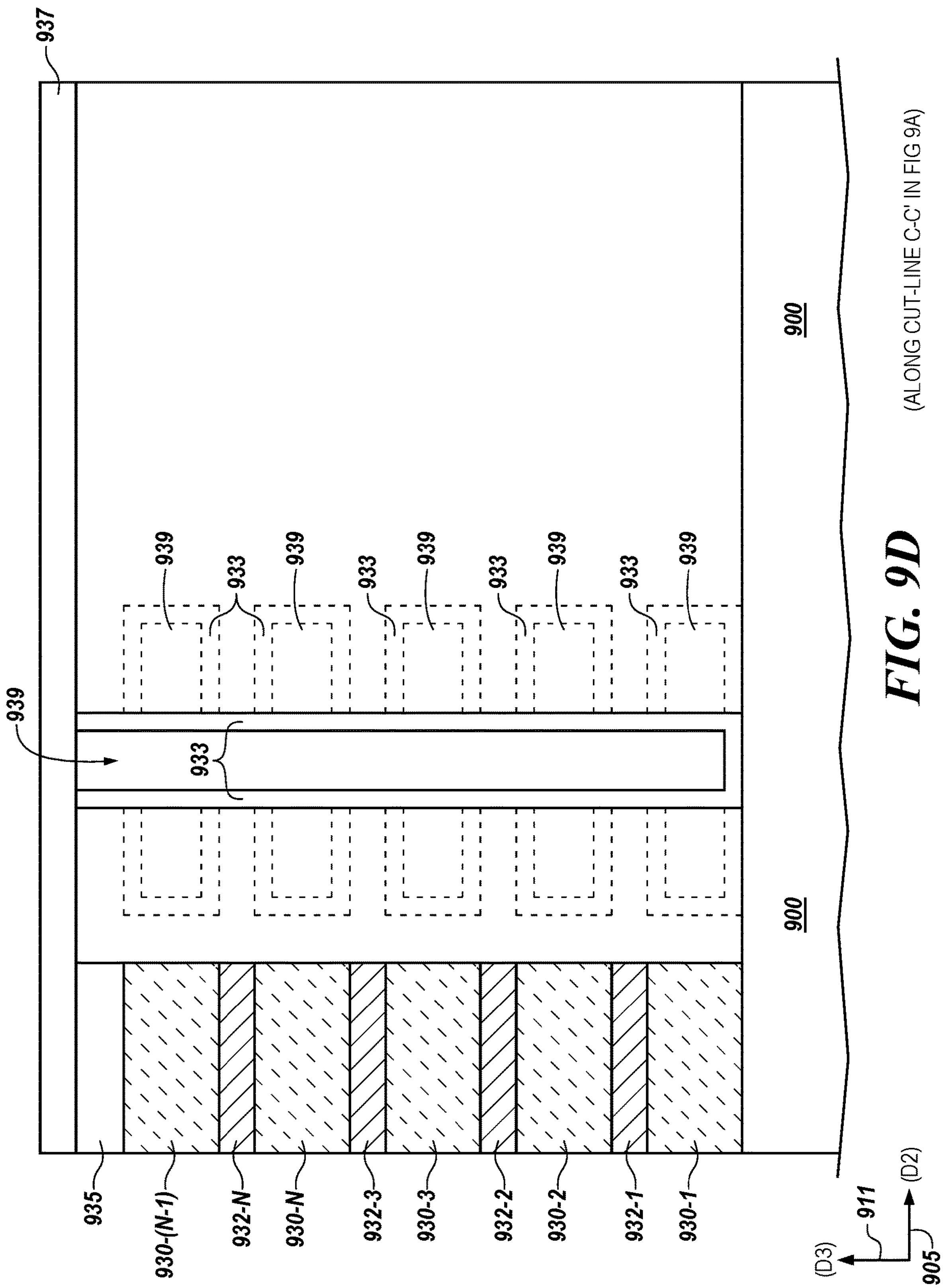

FIG. 9D illustrates a cross sectional view, taken along cut-line C-C' in FIG. 9A, showing another view of the semiconductor structure at this particular point in one example semiconductor fabrication process of an embodiment of the present disclosure. The cross sectional view shown in FIG. 9D is illustrated extending in the second horizontal direction (D2) 905, outside of a region for the horizontally oriented access devices and horizontally oriented storage nodes.

In FIG. 9D, the first dielectric material 939 is shown filling the space along a second direction (D2)905, separating access device and storage nodes regions extending into and out from the plane of the drawings sheet, for a three dimensional array of vertically oriented memory cells. The cross sectional view shown in FIG. 9D is illustrated, right to left in the plane of the drawing sheet, extending in the second direction (D2) 905 along an axis of the repeating iterations of alternating layers of epitaxially grown silicon germanium (SiGe) 930 and epitaxially grown, single crystalline silicon (Si) material 932. The first dielectric material 939 may fill the second vertical openings (831 as illustrated in FIG. 8) adjacent a first region of the epitaxially grown silicon germanium (SiGe) 930 with the first dielectric material 939. A second hard mask 937 may be deposited over the first dielectric material 939, the filled second vertical openings, and over the first hard mask 935.

Figure 9E:
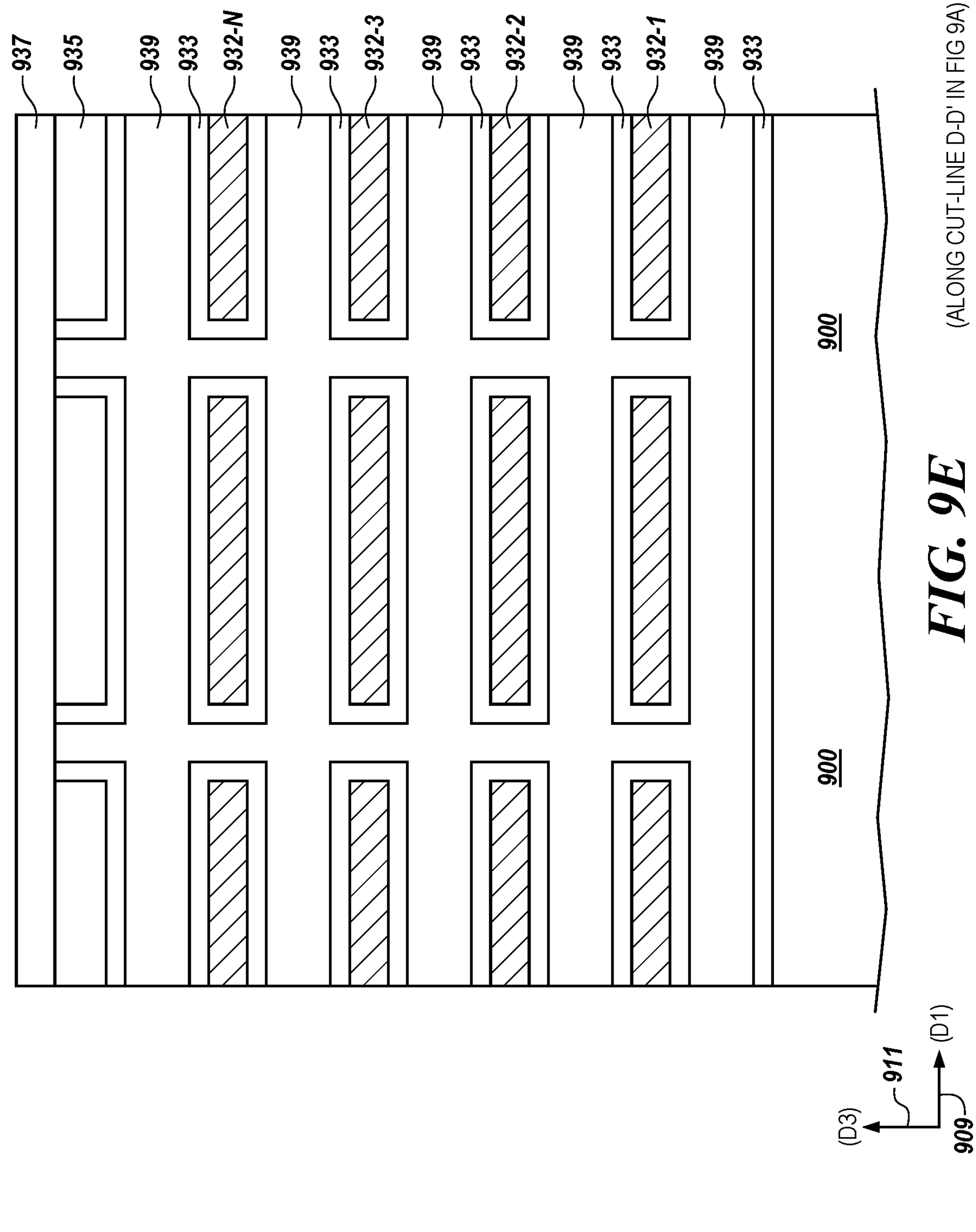

FIG. 9E illustrates a cross sectional view, taken along cut-line D-D' in FIG. 9A, showing another view of the semiconductor structure at this particular point in one example semiconductor fabrication process of an embodiment of the present disclosure. The cross sectional view shown in FIG. 9E is illustrated, right to left in the plane of the drawing sheet, extending in the first direction (D1) 909 along an axis of the repeating iterations of alternating layers of epitaxially grown, single crystalline silicon (Si) material 932.

In FIG. 9E, the first dielectric material 939 is shown filling in the space in between epitaxially grown, single crystalline silicon (Si) material 932, in the opening left by etched epitaxially grown silicon germanium (SiGe). First dielectric material 939 is shown in the spaces between second dielectric material 933 covering epitaxially grown, single crystalline silicon (Si) material 932, which is spaced along a first direction (D1) 909 and stacked vertically in arrays extending in the third direction (D3) 911 in the three dimensional (3D) memory. A hard mask 935 may be covered by second dielectric material 933. The first dielectric material 939 may also fill the spaces between the second dielectric materials 933 covering the hard mask 935. A second hard mask 937 may be deposited over the hard mask 935.

Figure 10A:
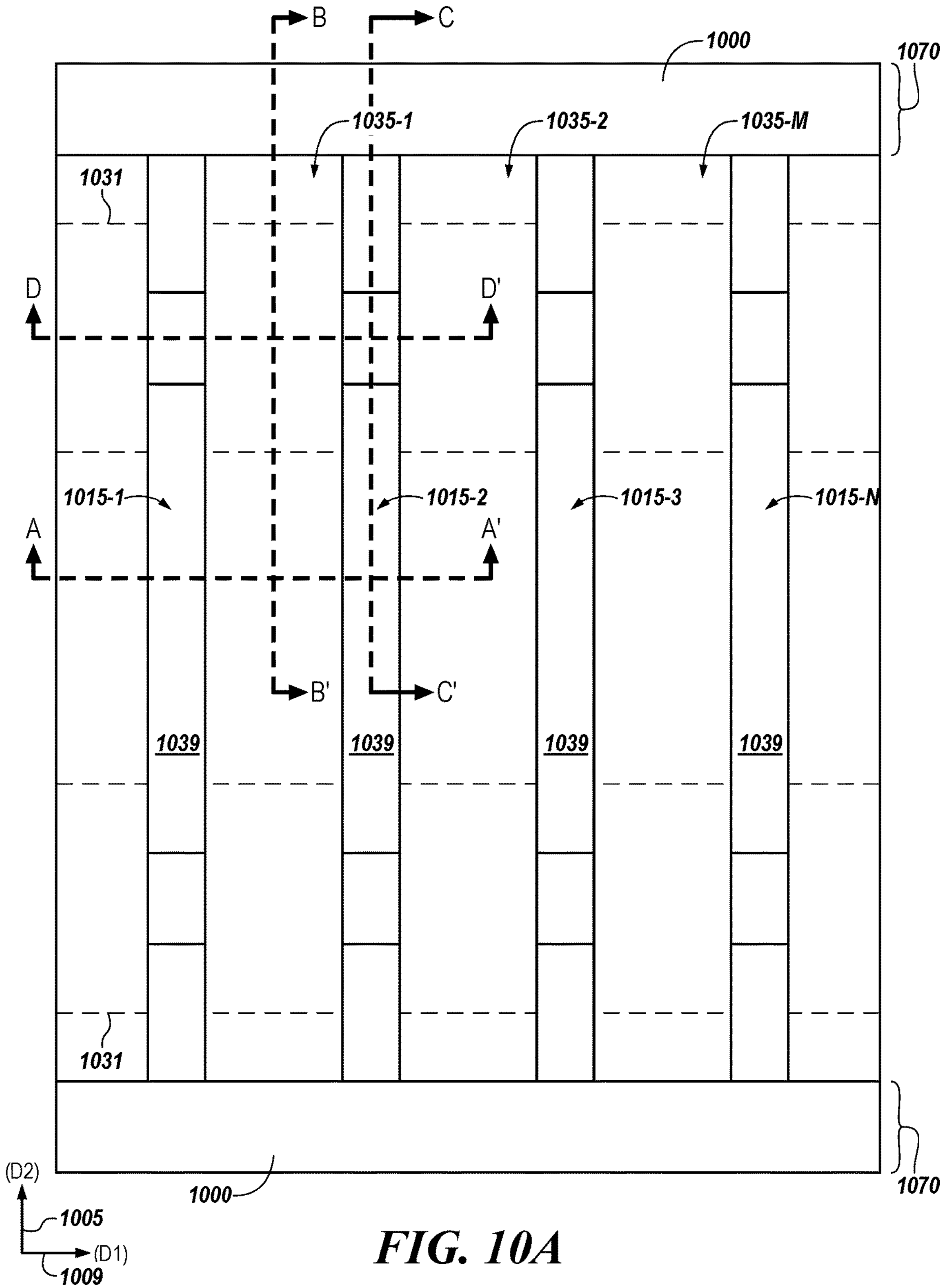
FIGS. 10A to 10E illustrate an example method, at another stage of a semiconductor fabrication process, for forming epitaxial silicon within horizontal access devices in vertical three dimensional (3D) memory, in accordance with a number of embodiments of the present disclosure.

FIG. 10A illustrates an example method, at another stage of a semiconductor fabrication process, for forming epitaxial silicon within horizontal access devices in vertical three dimensional (3D) memory, such as illustrated in FIGS. 1-3, and in accordance with a number of embodiments of the present disclosure. FIG. 10A illustrates a top down view of a semiconductor structure, at a particular point in time, in a semiconductor fabrication process, according to one or more embodiments.

In the example embodiment shown in FIG. 10A, the method comprises forming a third vertical opening 1070 through the vertical stack and extending predominantly in the first horizontal direction to expose sidewalls adjacent a second region of the epitaxially grown silicon germanium (SiGe). The third vertical opening 1070 may be etched through the hard mask 1035. The third vertical opening 1070 may be formed adjacent second vertical openings. And, multiple third vertical opening 1070 may be formed through the layers of materials using photolithographic techniques to pattern the hard mask 1035 and expose particular areas of the vertical stack.

Figure 10B:
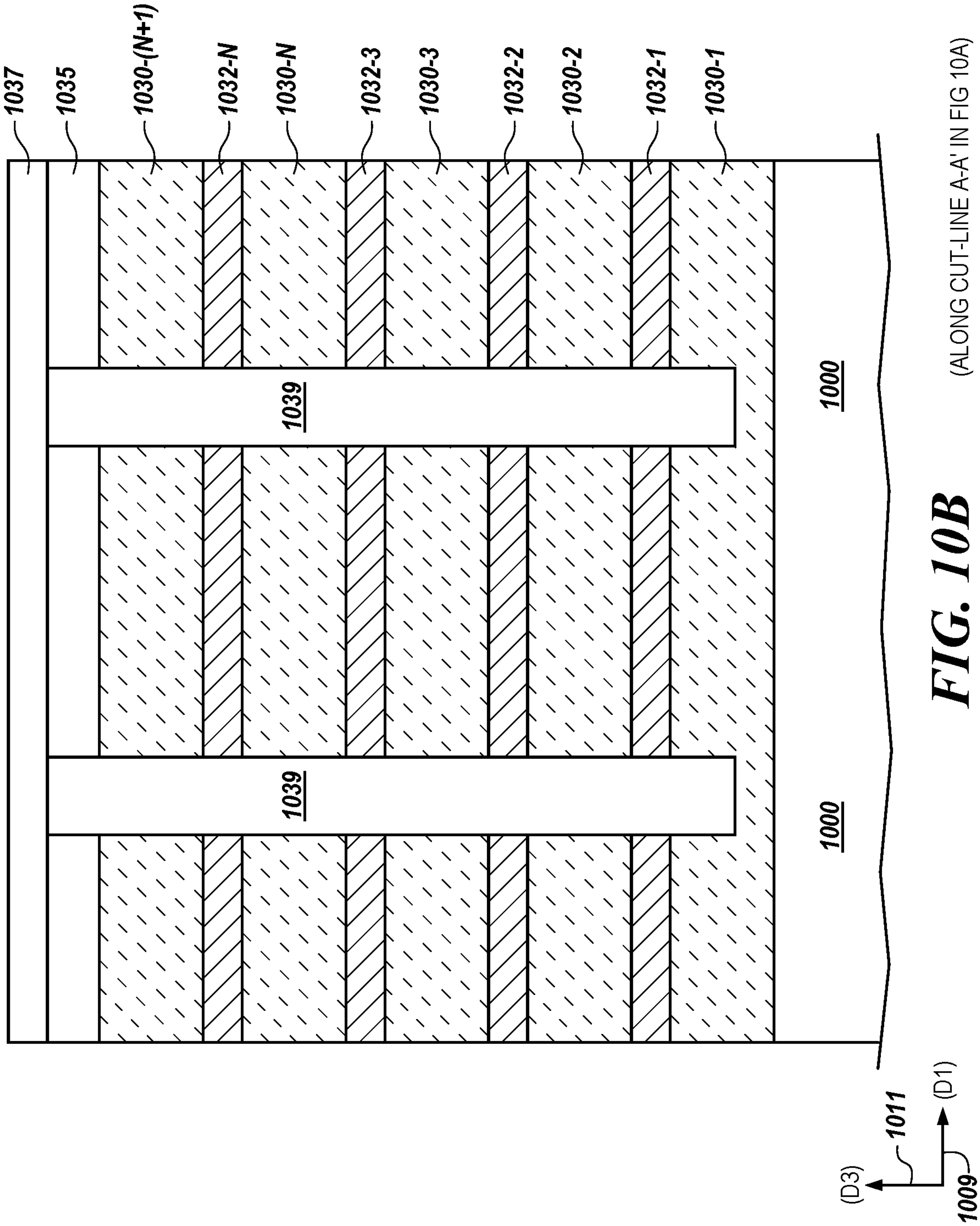

FIG. 10B is a cross sectional view, taken along cut-line A-A' in FIG. 10A, showing another view of the semiconductor structure at this particular time in the semiconductor fabrication process. The cross sectional view shown in FIG. 10B shows the repeating iterations of alternating layers of the epitaxially grown silicon germanium (SiGe) 1030 and the epitaxially grown, single crystalline silicon (Si) material 1032, on a semiconductor substrate 1000.

As shown in FIG. 10B, a plurality of first vertical openings may have already been formed through the layers within the vertically stacked memory cells to expose vertical sidewalls in the vertical stack and filled with a first dielectric material 1039. The first vertical openings were formed through the repeating iterations of the epitaxially grown silicon germanium (SiGe) 1030 and the epitaxially grown, single crystalline silicon (Si) material 1032.

Figure 10C:
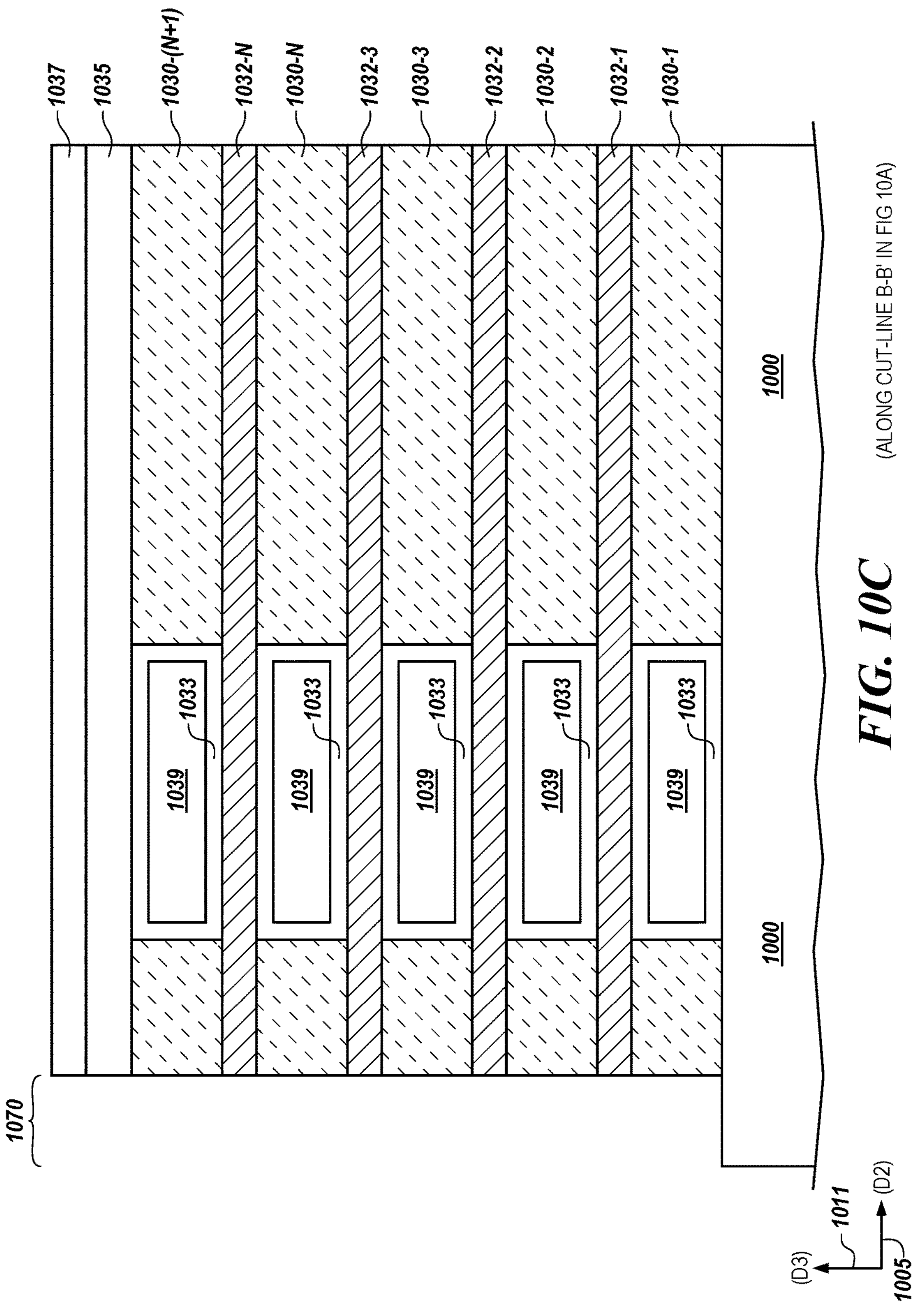

FIG. 10C is another cross-sectional view, at this particular stage of the semiconductor fabrication process, for forming epitaxial silicon within horizontal access devices in vertical three dimensional (3D) memory, such as illustrated in FIGS. 1-3, and in accordance with a number of embodiments of the present disclosure. FIG. 10C illustrates a cross sectional view, taken along cut-line B-B' in FIG. 10A.

As noted above, FIG. 10C illustrates the method comprises forming third vertical openings 1070 through the vertical stack and extending predominantly in the first horizontal direction 1009 to expose sidewalls adjacent a second region of the epitaxially grown silicon germanium (SiGe) 1030. Forming the plurality of patterned third vertical openings 1070 through the vertical stack comprises forming the plurality of patterned third vertical openings 1070 in vertical alignment with a location of the first source/drain regions to serve as the first source/drain regions.

Figure 10D:
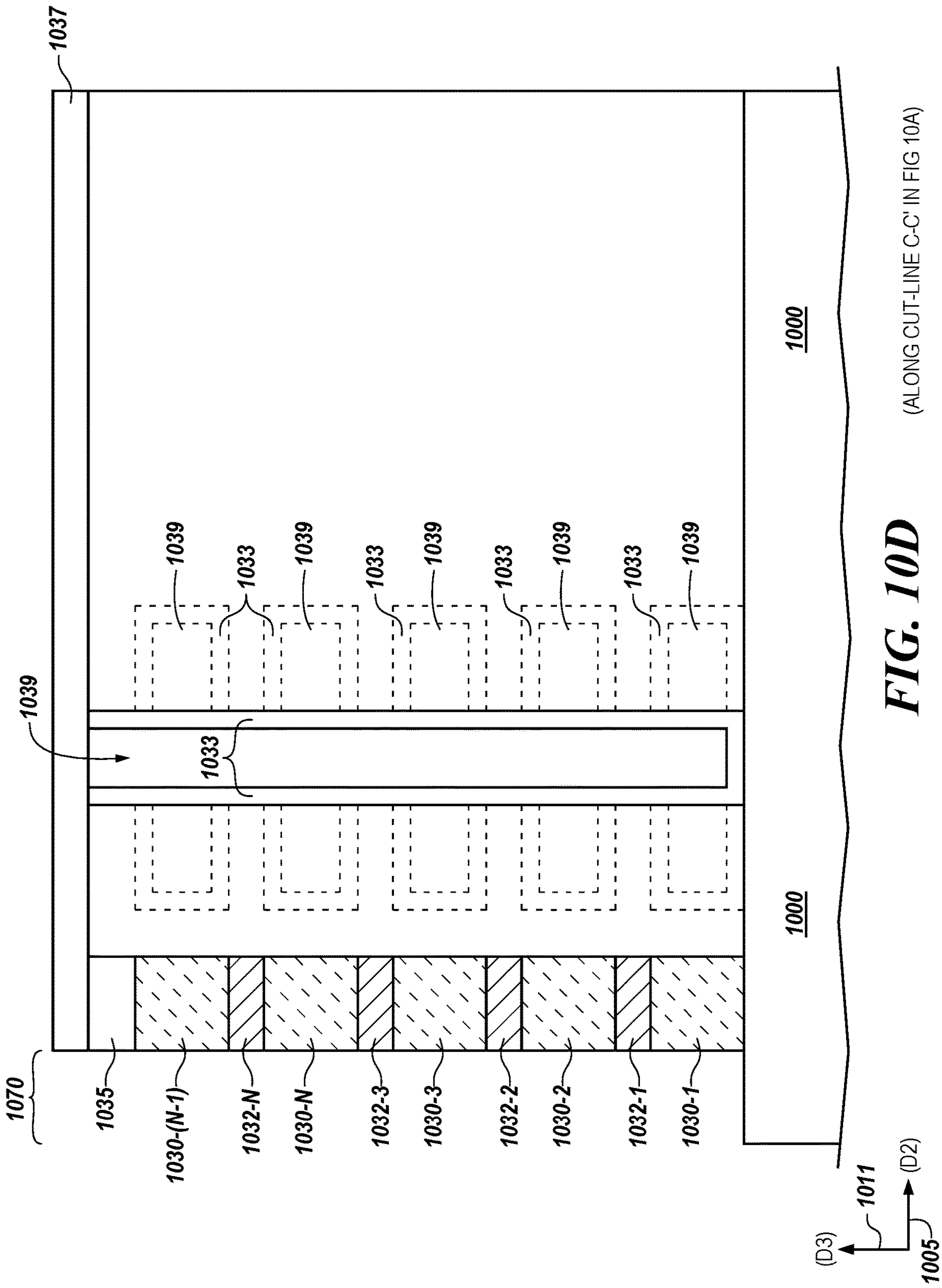

FIG. 10D illustrates a cross sectional view, taken along cut-line C-C' in FIG. 10A, showing another view of the semiconductor structure at this particular point in one example semiconductor fabrication process of an embodiment of the present disclosure. The cross sectional view shown in FIG. 10D is illustrated extending in the second horizontal direction (D2) 1005, outside of a region for the horizontally oriented access devices and horizontally oriented storage nodes.

In FIG. 10D, the first dielectric material 1039 is shown filling the space along a second direction (D2) 1005, separating access device and storage node regions extending into and out from the plane of the drawings sheet, for a three dimensional array of vertically oriented memory cells. The cross sectional view shown in FIG. 10D is illustrated, right to left in the plane of the drawing sheet, extending in the second horizontal direction (D2) 1005 along an axis of the repeating iterations of alternating layers of the epitaxially grown silicon germanium (SiGe) 1030 and the epitaxially grown, single crystalline silicon (Si) material 1032. Third vertical opening 1070 is shown adjacent a second region of the epitaxially grown silicon germanium (SiGe) 1030 extending predominantly in the first horizontal direction 1009 to expose sidewalls of the vertical stack. The second hard mask 1037 may be seen over the first dielectric material 1039, the vertical stack and the filled second vertical openings.

Figure 10E:
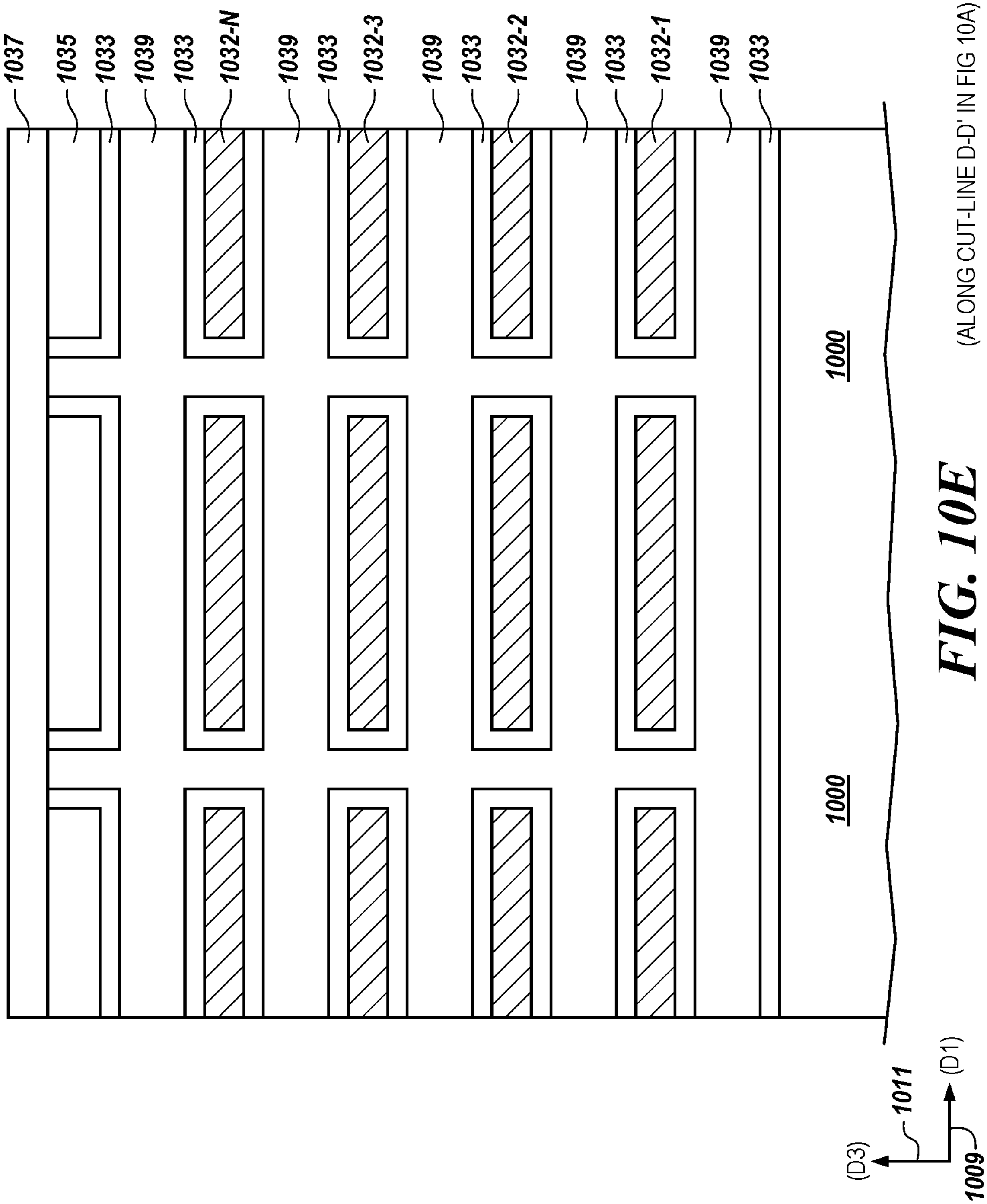

FIG. 10E illustrates a cross sectional view, taken along cut-line D-D' in FIG. 10A, showing another view of the semiconductor structure at this particular point in one example semiconductor fabrication process of an embodiment of the present disclosure. The cross sectional view shown in FIG. 10E is illustrated, right to left in the plane of the drawing sheet, extending in the first horizontal direction (D1) 1009 along a cross section of the repeating iterations of alternating layers of epitaxially grown, single crystalline silicon (Si) material 1032, surrounded by second dielectric material 1033, intersecting across the plurality of first dielectric material 1039. A hard mask 1035 may be covered by second dielectric material 1033. The first dielectric material 1039 may also fill the spaces between the second dielectric materials 1033 and the cross section of repeating iterations of alternating layers of epitaxially grown, single crystalline silicon (Si) material 1032.

Figure 11A:
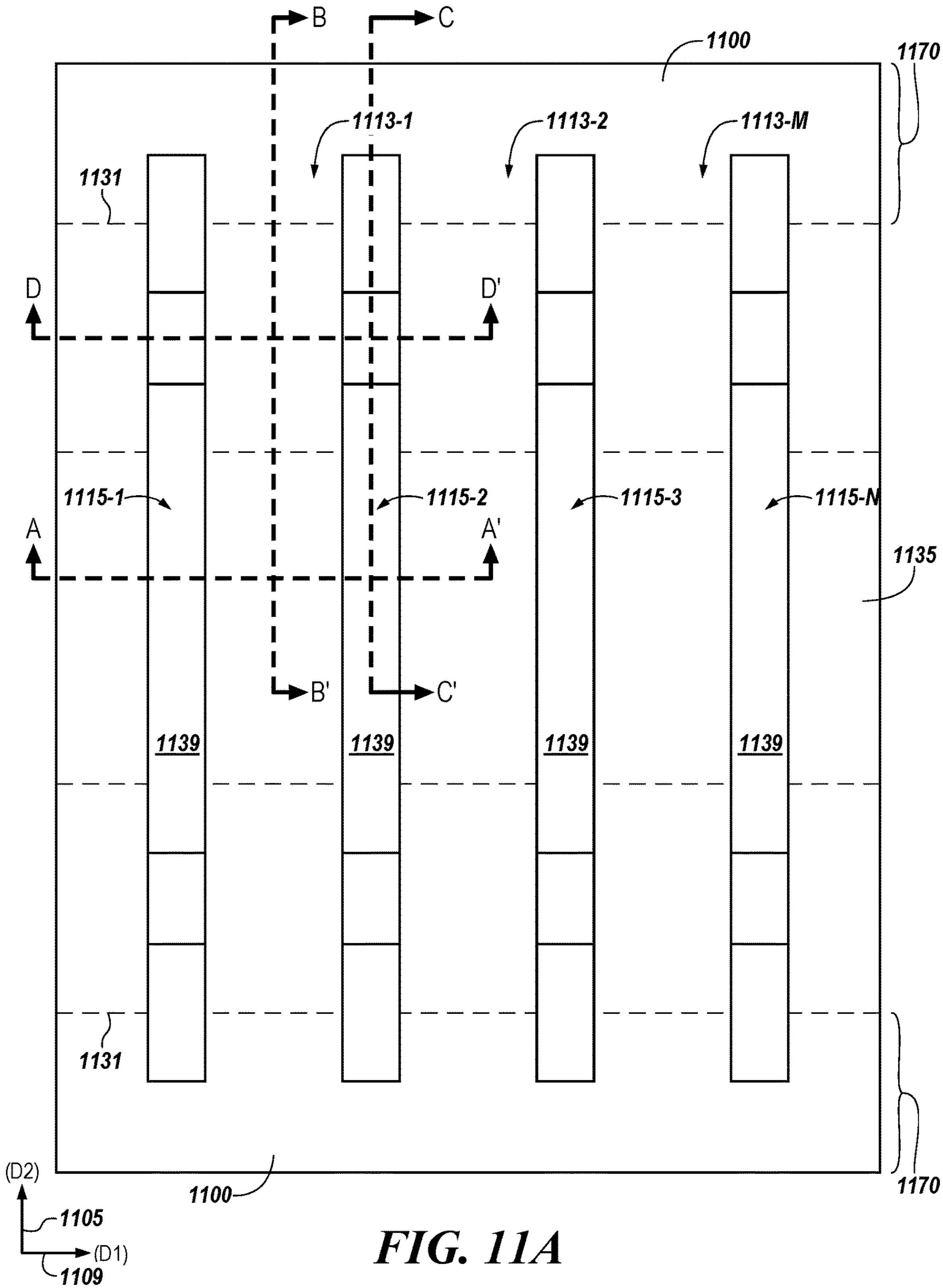
FIGS. 11A to 11E illustrate an example method, at another stage of a semiconductor fabrication process, for forming epitaxial silicon within horizontal access devices in vertical three dimensional (3D) memory, in accordance with a number of embodiments of the present disclosure.

FIG. 11A illustrates an example method, at another stage of a semiconductor fabrication process, for forming epitaxial silicon within horizontal access devices in vertical three dimensional (3D) memory, such as illustrated in FIGS. 1-3, and in accordance with a number of embodiments of the present disclosure. FIG. 11A illustrates a top down view of a semiconductor structure, at a particular point in time, in a semiconductor fabrication process, according to one or more embodiments.

In the example embodiment of FIG. 11A, the method comprises using a photolithographic process to pattern the photolithographic mask 1135. The method in FIGS. 11A-11E further illustrate using one or more etchant processes to selectively etch the SiGe material 1130 to form a plurality of second horizontal openings 1179 (in FIG. 11C) a first distance (Dist 1) from the third vertical opening 1170. As will be seen in FIG. 11C the second horizontal openings 1179 may be selectively etched into the SiGe material 1130 a first distance (Dist 1) to the second dielectric material 1133 formed in the second vertical openings 1131. In some embodiments the second dielectric material 1133 may serve as an etch stop during the selective etching process of the SiGe material 1130.

Figure 11B:
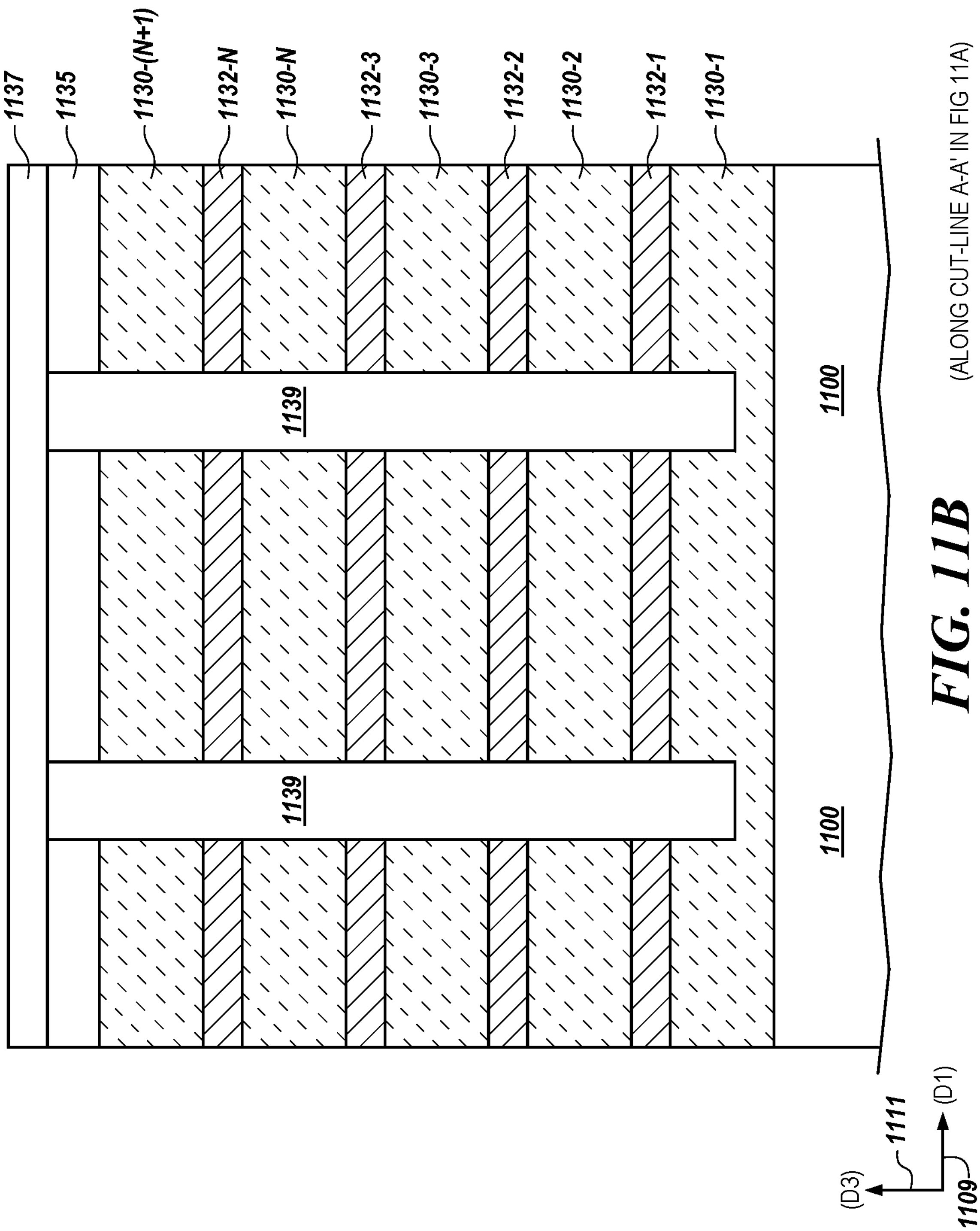

FIG. 11B illustrates a cross sectional view, taken along cut-line A-A' in FIG. 11A, showing another view of the semiconductor structure at this particular point in one example semiconductor fabrication process of an embodiment of the present disclosure. The cross sectional view shown in FIG. 11B shows the repeating iterations of alternating layers of the epitaxially grown silicon germanium (SiGe) 1130 and the epitaxially grown, single crystalline silicon (Si) material 1132, on a semiconductor substrate 1100.

As shown in FIG. 11B, a plurality of first vertical openings were formed through the layers within the vertically stacked memory cells to expose vertical sidewalls in the vertical stack. The first vertical openings may be formed through the repeating iterations of the epitaxially grown silicon germanium (SiGe) 1130 and the epitaxially grown, single crystalline silicon (Si) material 1132.

Figure 11C:
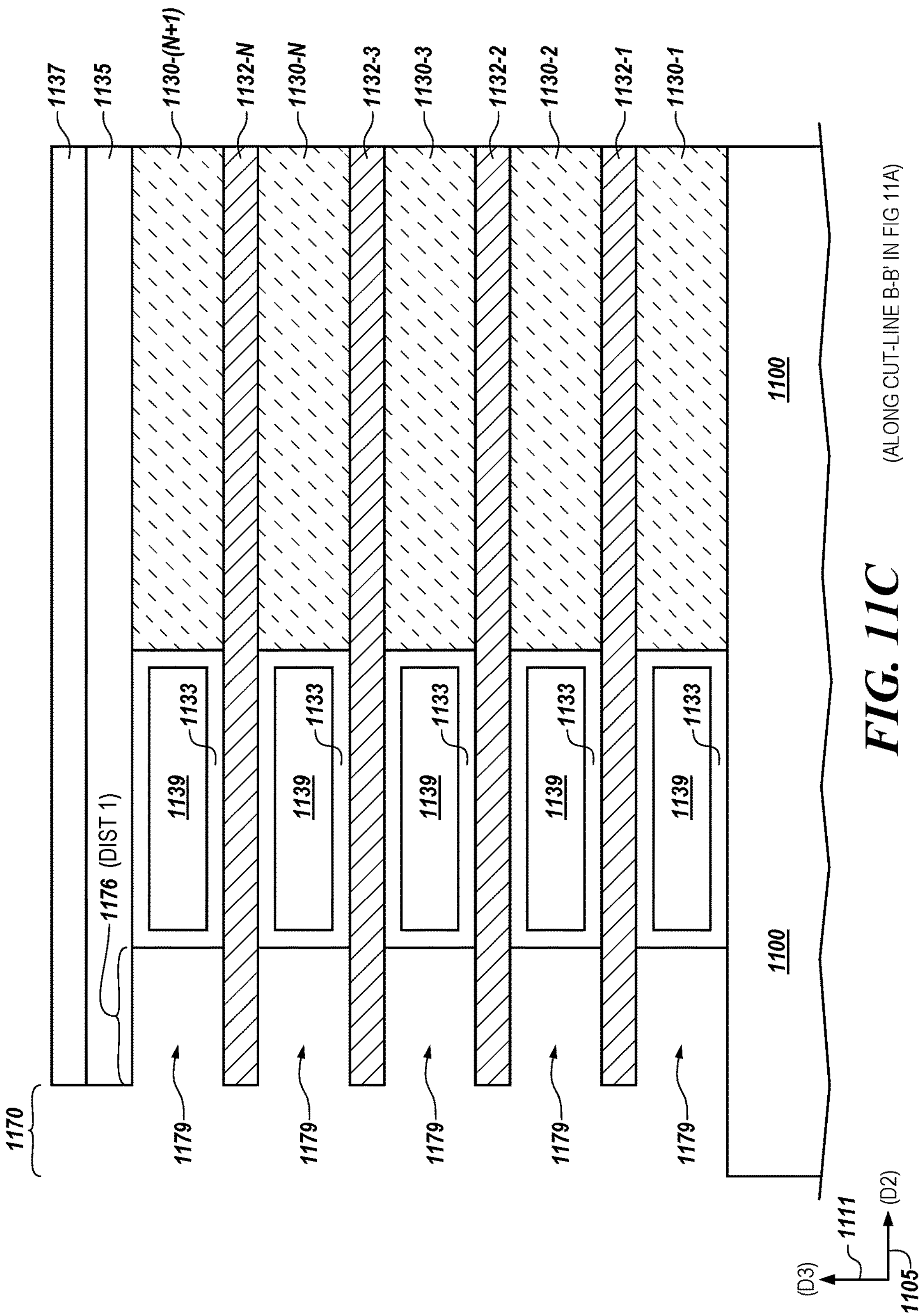

FIG. 11C illustrates a cross sectional view, taken along cut-line B-B' in FIG. 11A, showing another view of the semiconductor structure at this particular point in one example semiconductor fabrication process of an embodiment of the present disclosure. The cross sectional view shown in FIG. 11C is illustrated extending in the second horizontal direction (D2) 1105, left and right along the plane of the drawing sheet, along an axis of the repeating iterations of alternating layers of the epitaxially grown silicon germanium (SiGe) 1130 and the epitaxially grown, single crystalline silicon (Si) material 1132.

In the example embodiment of FIG. 11C the epitaxially grown silicon germanium (SiGe) 1130 is selectively etched to form a plurality of second horizontal openings 1179 extending a first distance (DIST 1) 1176 from the third vertical openings 1170. An etchant may be flowed into the third vertical openings 1170 to selectively etch a portion of the epitaxially grown silicon germanium (SiGe) 1130. For example, an etchant may be flowed into the third vertical openings 1170 to selectively etch a portion of the epitaxially grown silicon germanium (SiGe) 1130. The etchant may selectively remove portions of all iterations of the epitaxially grown silicon germanium (SiGe) 1130 within the stack. As such, the etchant may selective to the epitaxially grown Si material 1132 and selectively remove the first epitaxially grown silicon germanium (SiGe) 1130-1, the second epitaxially grown silicon germanium (SiGe) 1130-2, and the third epitaxially grown silicon germanium (SiGe) 1130-3 a first distance (DIST 1) 1176 within the stack using the second dielectric 1133 as an etch stop.

The selective etchant process may occur in multiple steps to protect the structure and stabilize epitaxially grown, single crystalline silicon (Si) material 1132. The selective etchant process may consist of one or more etch chemistries selected from an aqueous etch chemistry, a semi-aqueous etch chemistry, a vapor etch chemistry, or a plasma etch chemistries, among other possible selective etch chemistries. For example, a dry etch chemistry of oxygen (O2) or O2 and sulfur dioxide (SO2) may be utilized. As another example, a dry etch chemistries of O2 or of O2 and nitrogen (N2) may be used to selectively etch the epitaxially grown silicon germanium (SiGe) 1130. Alternatively, or in addition, a selective etch to remove the epitaxially grown silicon germanium (SiGe) 1130 may comprise a selective etch chemistry of phosphoric acid (H3PO4) or hydrogen fluoride (HF) and/or dissolving the epitaxially grown silicon germanium (SiGe) 1130 using a selective solvent, among other possible etch chemistries or solvents.

The selective etchant process may etch the epitaxially grown silicon germanium (SiGe) 1130 to form second horizontal openings 1179. The selective etchant process may be performed such that the second horizontal openings 1179 has a length (DIST 1) a first distance 1176 from the third vertical openings 1170. The epitaxially grown silicon germanium (SiGe) 1130 may be etched a first distance (DIST 1) 1176 using the second dielectric material 1133 as an etch stop. The first distance (DIST 1) 1176 may be controlled by controlling time, composition of etchant gas, and etch rate of a reactant gas flowed into the third vertical openings 1170, e.g., rate, concentration, temperature, pressure, and time parameters.

As such, the epitaxially grown silicon germanium (SiGe) 1130 may be etched a first distance 1176 from the third vertical openings 1170. The selective etch may be isotropic, but selective to the epitaxially grown silicon (Si) material 1132, removing only the epitaxially grown silicon germanium (SiGe) material 1130, and substantially stopping on the second dielectric material 1133. Thus, in one example embodiment, the selective etchant process may remove substantially all of epitaxially grown silicon germanium (SiGe) 1130 up until reaching the second dielectric material 1133, etching horizontally a first distance (DIST 1) 1176 from the third vertical openings 1170 to the presence or location of the second dielectric material 1133. Embodiments, however, are not limited to this example.

Figure 11D:
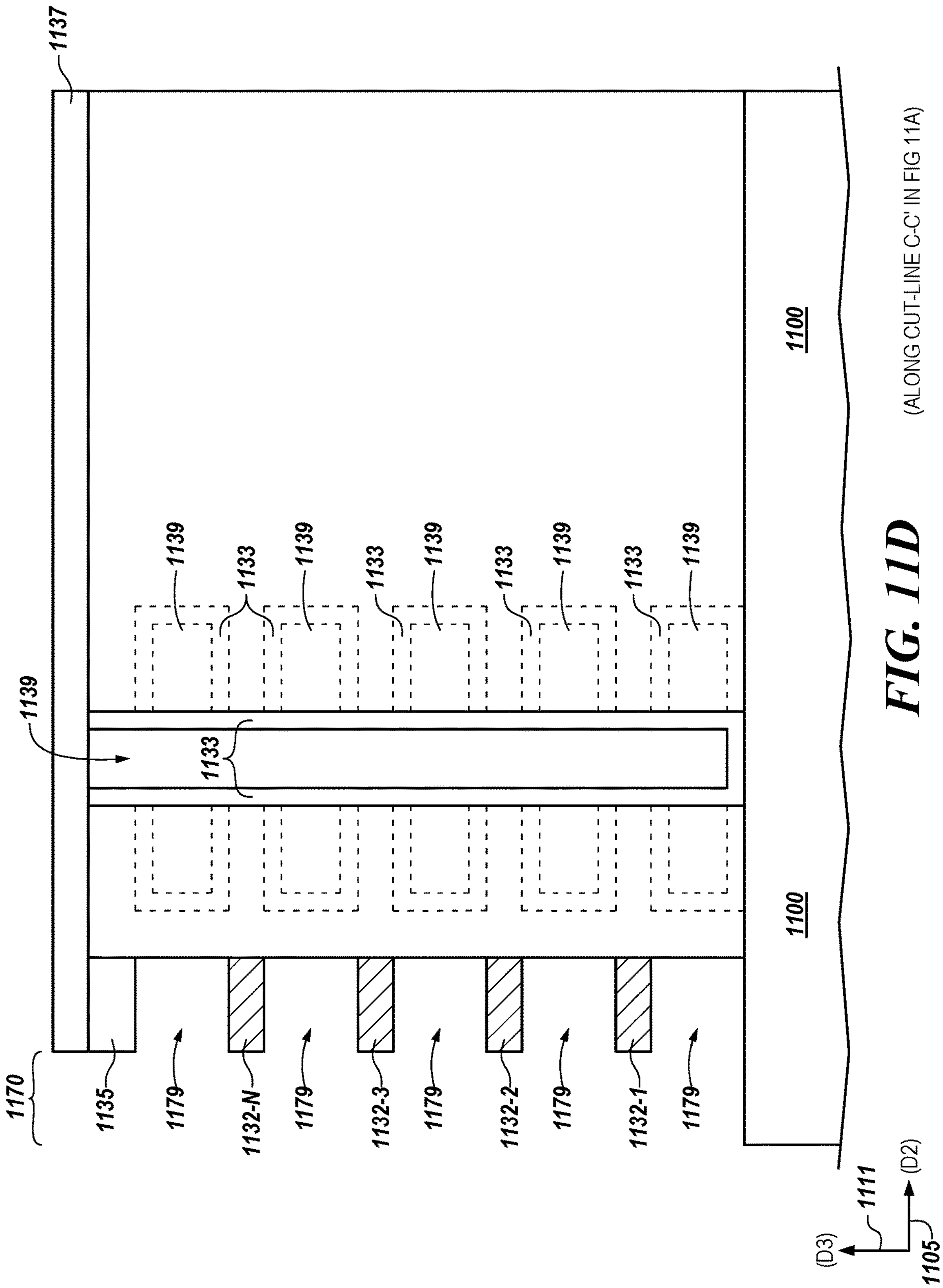

FIG. 11D illustrates a cross sectional view, taken along cut-line C-C' in FIG. 11A, showing another view of the semiconductor structure at this particular point in one example semiconductor fabrication process of an embodiment of the present disclosure. The cross sectional view shown in FIG. 11D is illustrated extending in the second horizontal direction (D2) 1105, left and right in the plane of the drawing sheet, along an axis of the repeating iterations of alternating layers of the etched epitaxially grown silicon germanium (SiGe) forming second horizontal openings 1179, and remaining epitaxially grown, single crystalline silicon (Si) material 1132.

At the left end of the drawing sheet is shown the repeating iterations of alternating layers of the etched epitaxially grown silicon germanium (SiGe) forming second horizontal openings 1179, and epitaxially grown, single crystalline silicon (Si) material 1132. Third vertical opening 1170 is shown adjacent a second region of the second horizontal openings 1179. At the right hand of the drawing sheet, the first dielectric material 1139 may be seen, having the second vertical opening 1131 filled with the second dielectric material 1133 and the first dielectric material 1139. Dashed lines indicate the presence of the first horizontal openings 1130 also filled with the second dielectric material 1133 and the first dielectric material 1139, set into the plane of the drawing sheet, in the cross sectional view, taken along cut-line C-C' in FIG. 11A.

Figure 11E:
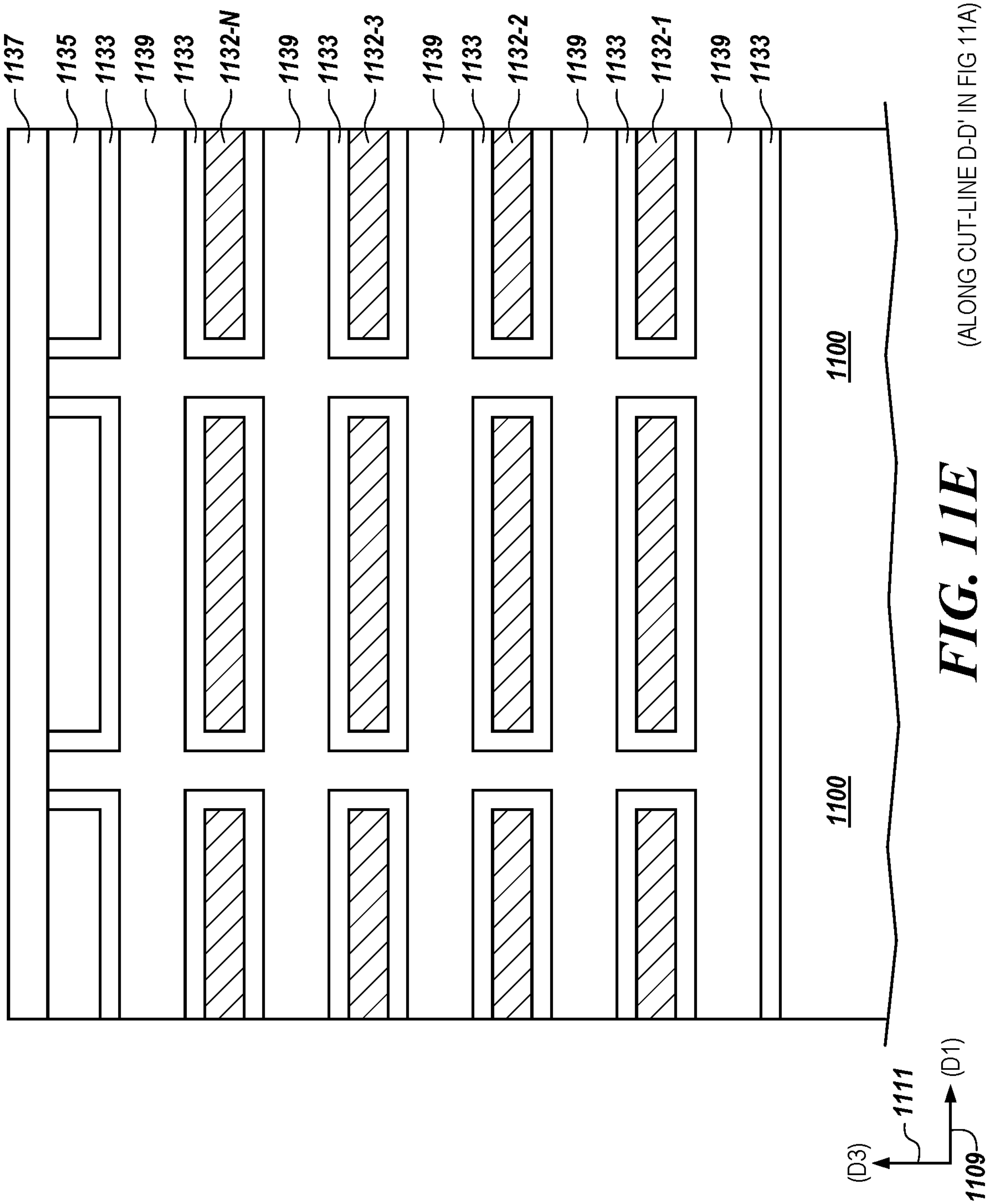

FIG. 11E illustrates a cross sectional view, taken along cut-line D-D' in FIG. 11A, showing another view of the semiconductor structure at this particular point in one example semiconductor fabrication process of an embodiment of the present disclosure. The cross sectional view shown in FIG. 11E is illustrated, right to left in the plane of the drawing sheet, extending in the first direction (D1) 1109 along a cross section of the repeating iterations of alternating layers of alternating layers of epitaxially grown, single crystalline silicon (Si) material 1132, surrounded by second dielectric material 1133, intersecting across the plurality of first dielectric material 1139. A hard mask 1135 may be covered by second dielectric material 1133. The first dielectric material 1139 may also fill the spaces between the second dielectric materials 1133 and the cross section of repeating iterations of alternating layers of epitaxially grown, single crystalline silicon (Si) material 1032.

Figure 12A:
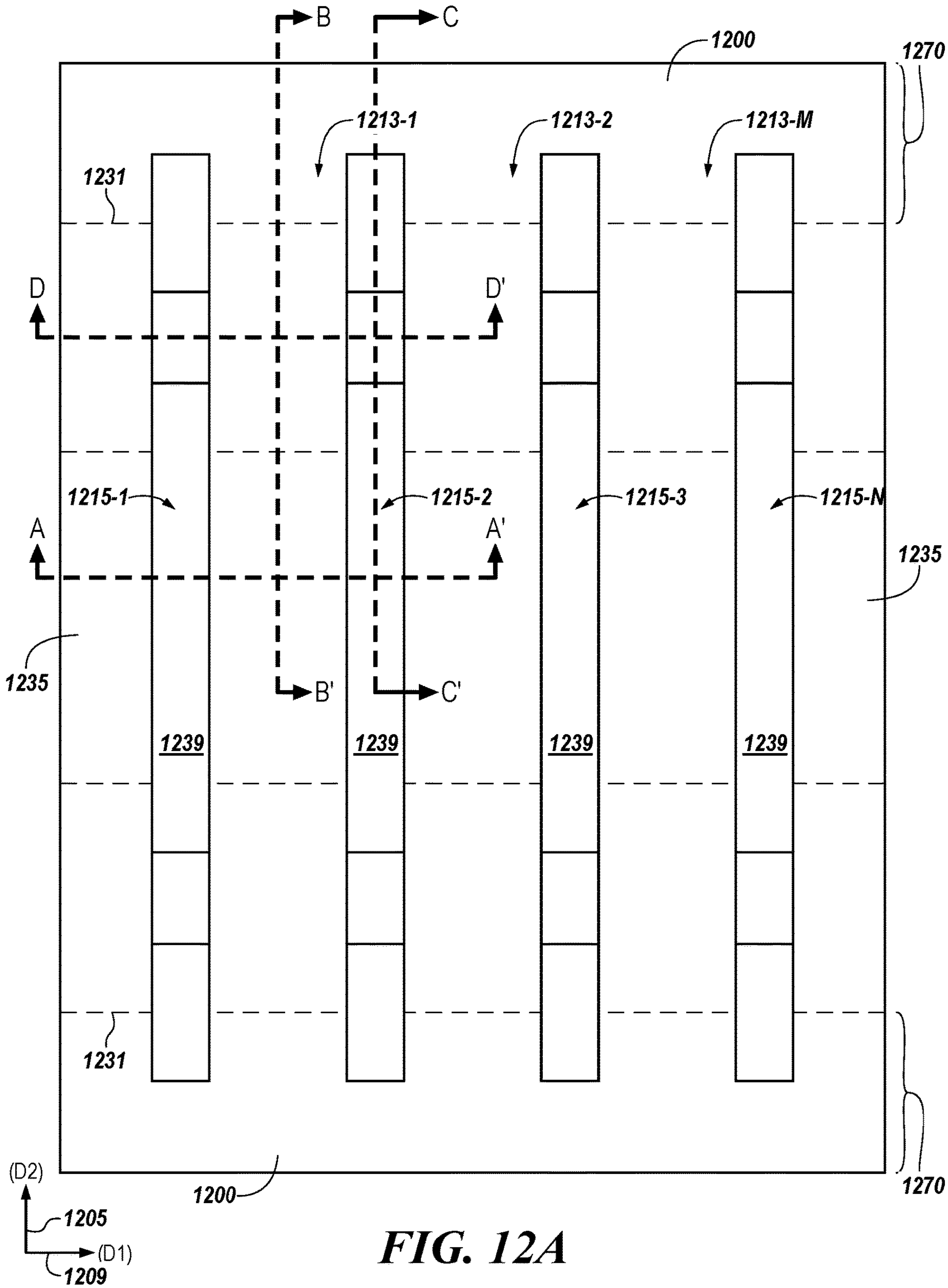
FIGS. 12A to 12E illustrate an example method, at another stage of a semiconductor fabrication process, for forming epitaxial silicon within horizontal access devices in vertical three dimensional (3D) memory, in accordance with a number of embodiments of the present disclosure.

FIG. 12A illustrates an example method, at another stage of a semiconductor fabrication process, for forming epitaxial silicon within horizontal access devices in vertical three dimensional (3D) memory, such as illustrated in FIGS. 1-3, and in accordance with a number of embodiments of the present disclosure. FIG. 12A illustrates a top down view of a semiconductor structure, at a particular point in time, in a semiconductor fabrication process, according to one or more embodiments. As will be seen in FIG. 12C, a timed selective etch process is performed, selectively etching the second dielectric material 1233 a second distance (DIST 2) from the third vertical openings 1270.

Figure 12B:
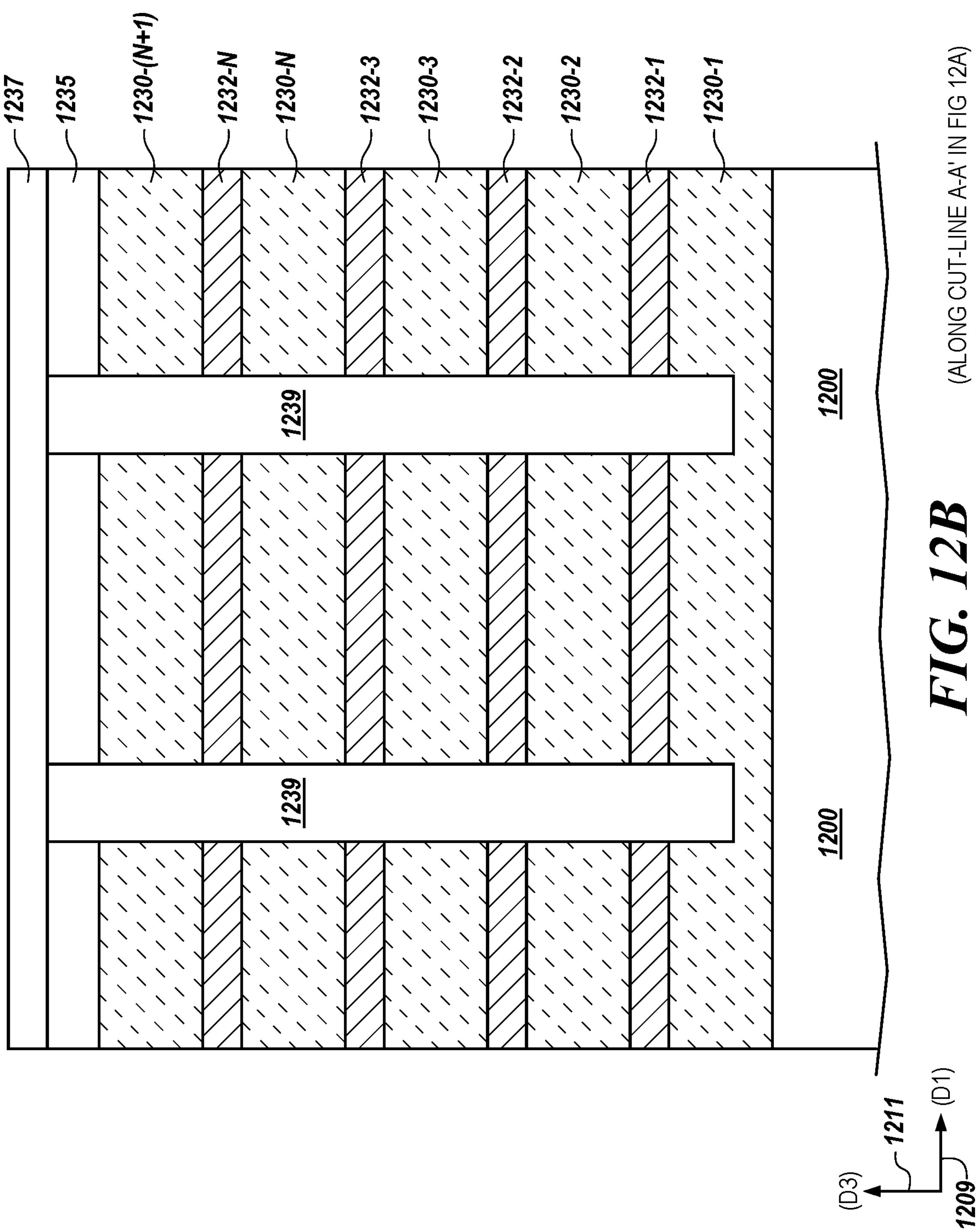

FIG. 12B illustrates a cross sectional view, taken along cut-line A-A' in FIG. 12A, showing another view of the semiconductor structure at this particular point in one example semiconductor fabrication process of an embodiment of the present disclosure. The cross sectional view shown in FIG. 12B shows the repeating iterations of alternating layers of the epitaxially grown silicon germanium (SiGe) 1230 and the epitaxially grown, single crystalline silicon (Si) material 1232, on a semiconductor substrate 1200.

Figure 12C:
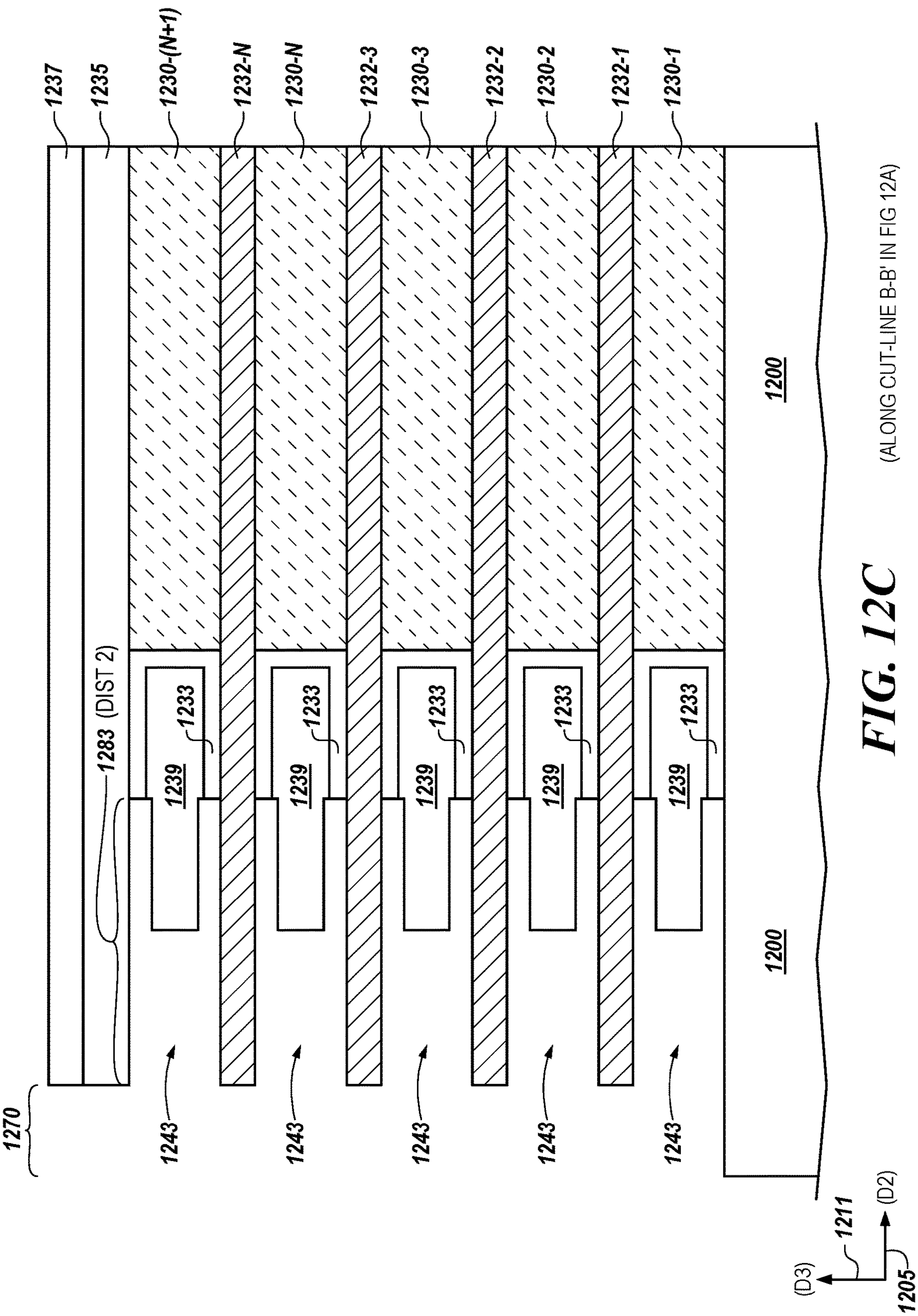

As shown in FIG. 12B, a plurality of first vertical openings were formed through the layers within the vertically stacked memory cells to expose vertical sidewalls in the vertical stack. The first vertical openings were formed through the repeating iterations of the epitaxially grown silicon germanium (SiGe) 1230 and the epitaxially grown, single crystalline silicon (Si) material 1232. FIG. 12C illustrates a cross sectional view, taken along cut-line B-B' in FIG. 12A, showing another view of the semiconductor structure at this particular point in one example semiconductor fabrication process of an embodiment of the present disclosure. The cross sectional view shown in FIG. 12C is illustrated extending in the second horizontal direction (D2) 1205, left and right along the plane of the drawing sheet, along an axis of the repeating iterations of alternating layers of the epitaxially grown silicon germanium (SiGe) 1230 and the epitaxially grown, single crystalline silicon (Si) material 1232. In the example embodiment of FIG. 12C, the second dielectric material 1233 is selectively etched a second distance (D2) 1283 from the third vertical openings 1270. In some examples, the second dielectric material 1233 may be etched back a second distance (DIST 2) 1283 in a timed selective etch, exhume process. Second distance 1283 is the distance from the third vertical openings 1270 to a remaining, unetched portion of the second dielectric material 1233. In some embodiments, the second dielectric material 1233 may be etched back from the third vertical openings 1270 a second distance (DIST 2) 1283 for a range of approximately twenty-five (25) to seventy-five (75) nanometers (nm). The second dielectric material 1233 may be selectively etched, being selective to the epitaxially grown, single crystalline silicon (Si) material 1232 and the first dielectric material 1239, and thus leaving the epitaxially grown, single crystalline silicon (Si) material 1232 and first dielectric material intact. Further, as shown further in FIG. 12D, a portion of the first dielectric material 1239 be removed with an additional selective in the second horizontal openings as part of a controlled oxide lateral punch through the plurality of first vertical openings 1215, between the access device regions and the first horizontal openings 1230, to form continuous second horizontal openings 1243 extending in the first horizontal direction (D1) 1209. Thus, in some embodiments, the second dielectric material 1233 may be etched using a timed exhume process. The first dielectric material 1239 may be etched using another selective lateral punch, e.g., selectively etching an oxide first dielectric material 1239. In some embodiments, the oxide lateral punch may a more controlled etch process using the second dielectric material 1233 as an etch stop, stopping on a vertical portion of the second dielectric material 1233 formed in the second vertical openings 1231 between separated epitaxially grown, single crystalline silicon (Si) material 1232 in the access device regions.

Figure 12D:
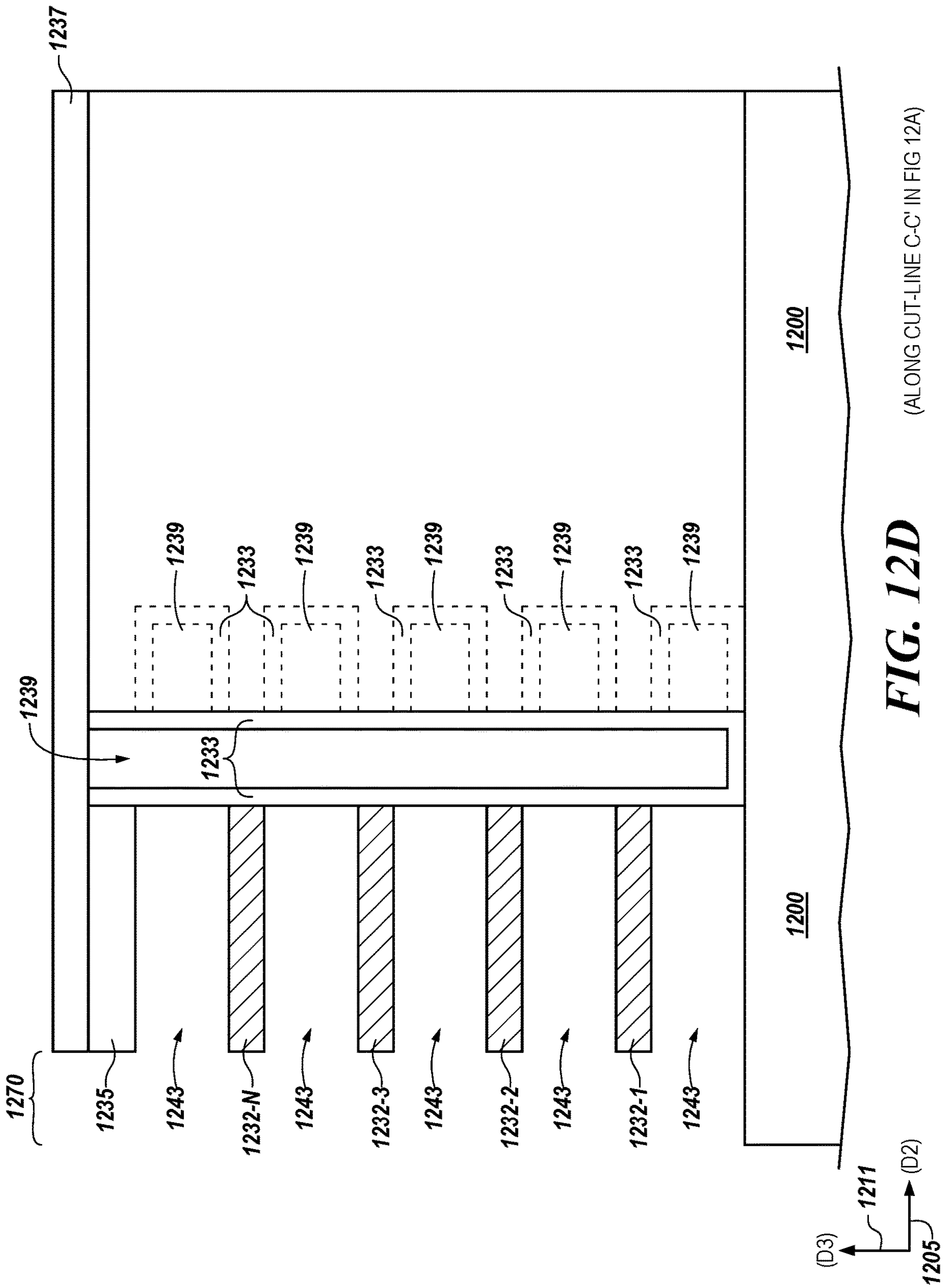

FIG. 12D illustrates a cross sectional view, taken along cut-line C-C' in FIG. 12A, showing another view of the semiconductor structure at this particular point in one example semiconductor fabrication process of an embodiment of the present disclosure. The cross sectional view shown in FIG. 12D is illustrated extending in the second horizontal direction (D2) 1205, left and right in the plane of the drawing sheet, along an axis of the repeating iterations of alternating layers of the etched epitaxially grown silicon germanium (SiGe) and epitaxially grown, single crystalline silicon (Si) material 1232.

In FIG. 12D, the first dielectric material 1239 is shown filling the space along a second horizontal direction (D2) 1205, separating access device and storage node regions extending into and out from the plane of the drawings sheet, for a three dimensional array of vertically oriented memory cells. At the left end of the drawing sheet is shown the repeating iterations of alternating layers of the etched epitaxially grown silicon (SiGe), and etched areas where the first dielectric material has been removed to form continuous second horizontal openings 1243 in a first direction (D1) 1209, separating the layers of epitaxially grown, single crystalline silicon (Si) material 1232. Third vertical opening 1270 is shown adjacent a region of the now continuous second horizontal openings 1243. At the right hand of the drawing sheet, the first dielectric material 1239 may be seen, separating access device and storage node regions in the first direction (D1) 1209, and having the second vertical opening 1231 filled with the second dielectric material 1233 and the first dielectric material 1239. Dashed lines indicate the presence of the remaining portions of the first horizontal openings 1230 filled with the second dielectric material 1233 and the first dielectric material 1239, set into the plane of the drawing sheet, in the cross sectional view, taken along cut-line C-C' in FIG. 12A.

For example, a portion of the first dielectric material 1239 has been etched away, in the originally formed first vertical openings 1215 (615 in FIG. 6A), with the second dielectric material 1233 in the second vertical openings 1231. In some embodiments the etched portion of the first dielectric material 1239, to form the now continuous second horizontal openings 1243, may be removed using an oxide lateral punch.

Figure 12E:
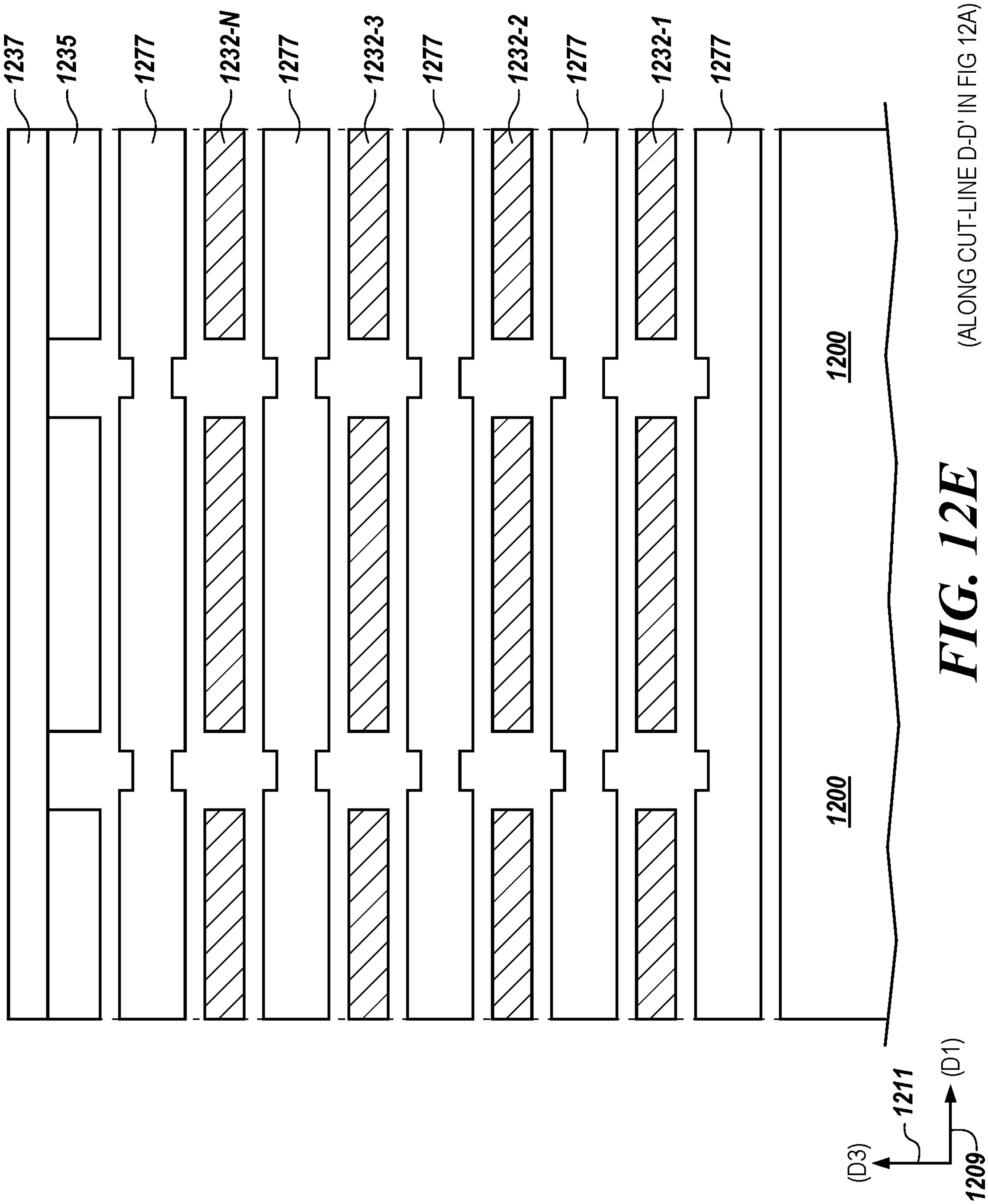

FIG. 12E illustrates a cross sectional view, taken along cut-line D-D' in FIG. 12A, showing another view of the semiconductor structure at this particular point in one example semiconductor fabrication process of an embodiment of the present disclosure. The cross sectional view shown in FIG. 12E is illustrated, right to left in the plane of the drawing sheet, extending in the first direction (D1) 1209 along a cross section of the repeating iterations of alternating layers of epitaxially grown, single crystalline silicon (Si) material 1232 and first dielectric material 1239. In FIG. 12E, second dielectric material 1233 is no longer shown all around epitaxially grown, single crystalline silicon (Si) material 1232, resulting from the timed exhume of the second dielectric material 1233 in this portion of the cross sectional view of the access device region, and thus the second dielectric material 1233 cannot be seen in this view. Some of the first dielectric material 1239 may be removed in the second vertical openings from the lateral punch through as well. In this cross sectional view, the first dielectric material 1239 is still remaining bridged between layers and is interspersed, vertically between the cross sectional views of the epitaxially grown, single crystalline silicon (Si) material 1232. However, in this cross sectional view, open spaces can be viewed immediately adjacent the bridged epitaxially grown, single crystalline silicon (Si) material 1232 and separating the epitaxially grown, single crystalline silicon (Si) material 1232 from the first dielectric material 1239.

Figure 13A:
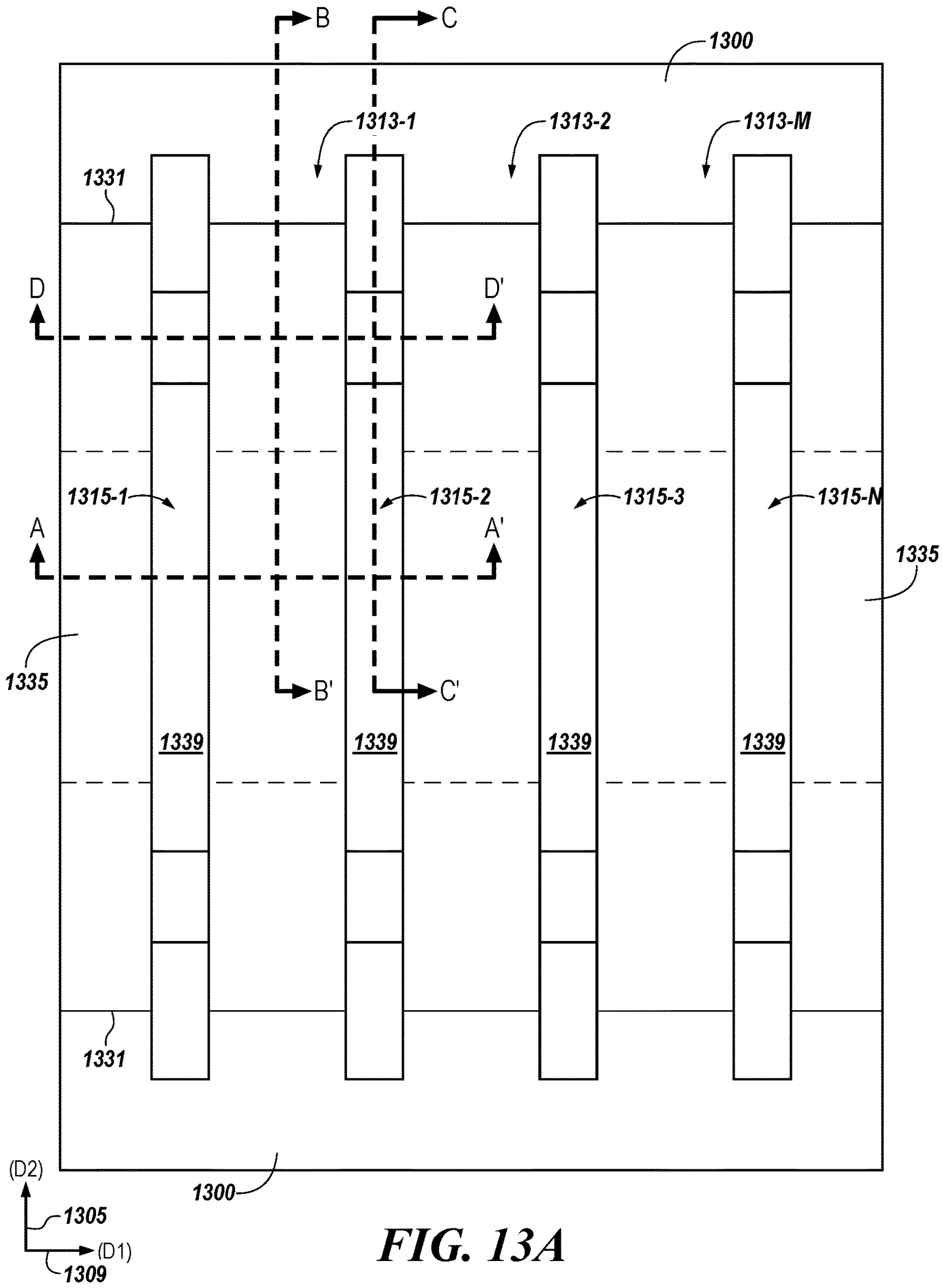
FIGS. 13A to 13E illustrate an example method, at another stage of a semiconductor fabrication process, for forming epitaxial silicon within horizontal access devices in vertical three dimensional (3D) memory, in accordance with a number of embodiments of the present disclosure.

FIG. 13A illustrates an example method, at another stage of a semiconductor fabrication process, for forming epitaxial silicon within horizontal access devices in vertical three dimensional (3D) memory, such as illustrated in FIGS. 1-3, and in accordance with a number of embodiments of the present disclosure. FIG. 13A illustrates a top down view of a semiconductor structure, at a particular point in time, in a semiconductor fabrication process, according to one or more embodiments. As will be seen in FIG. 13C, a gate dielectric material may be formed on exposed surfaces of the epitaxially formed Si material to form horizontal access devices. In some embodiments the gate dielectric material may be an oxide material. The oxide material may be deposited on exposed surfaces of the epitaxially formed Si material using an atomic layer deposition. The ALD deposited oxide material may be densified using a thermal oxidation.

Figure 13B:
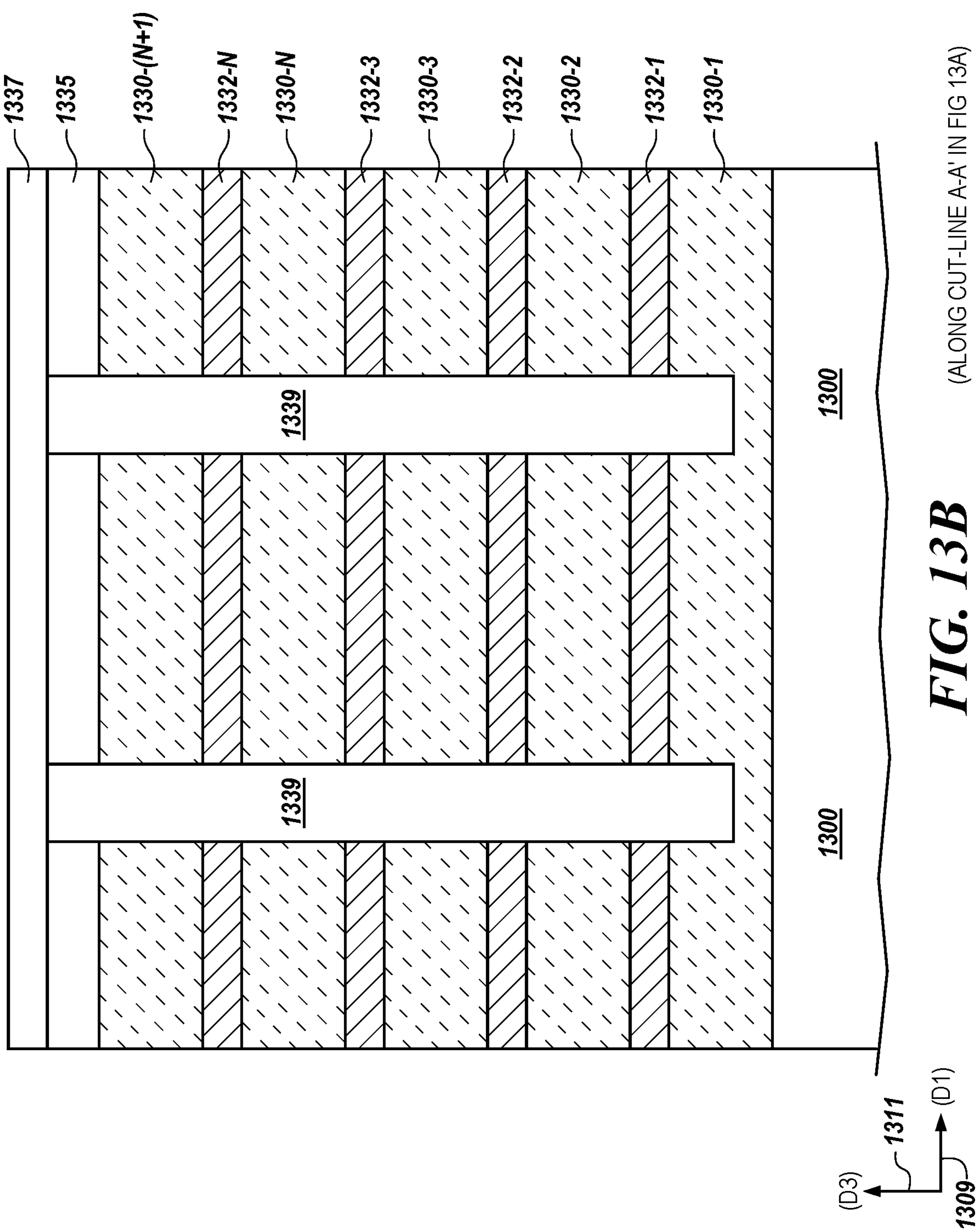

FIG. 13B illustrates a cross sectional view, taken along cut-line A-A' in FIG. 13A, showing another view of the semiconductor structure at this particular point in one example semiconductor fabrication process of an embodiment of the present disclosure. The cross sectional view shown in FIG. 13B shows the repeating iterations of alternating layers of the epitaxially grown silicon germanium (SiGe) 1330 and the epitaxially grown, single crystalline silicon (Si) material 1332, on a semiconductor substrate 1300.

As shown in FIG. 13B, a plurality of first vertical openings were formed through the layers within the vertically stacked memory cells to expose vertical sidewalls in the vertical stack. The first vertical openings were formed through the repeating iterations of the epitaxially grown silicon germanium (SiGe) 1330 and the epitaxially grown, single crystalline silicon (Si) material 1332.

Figure 13C:
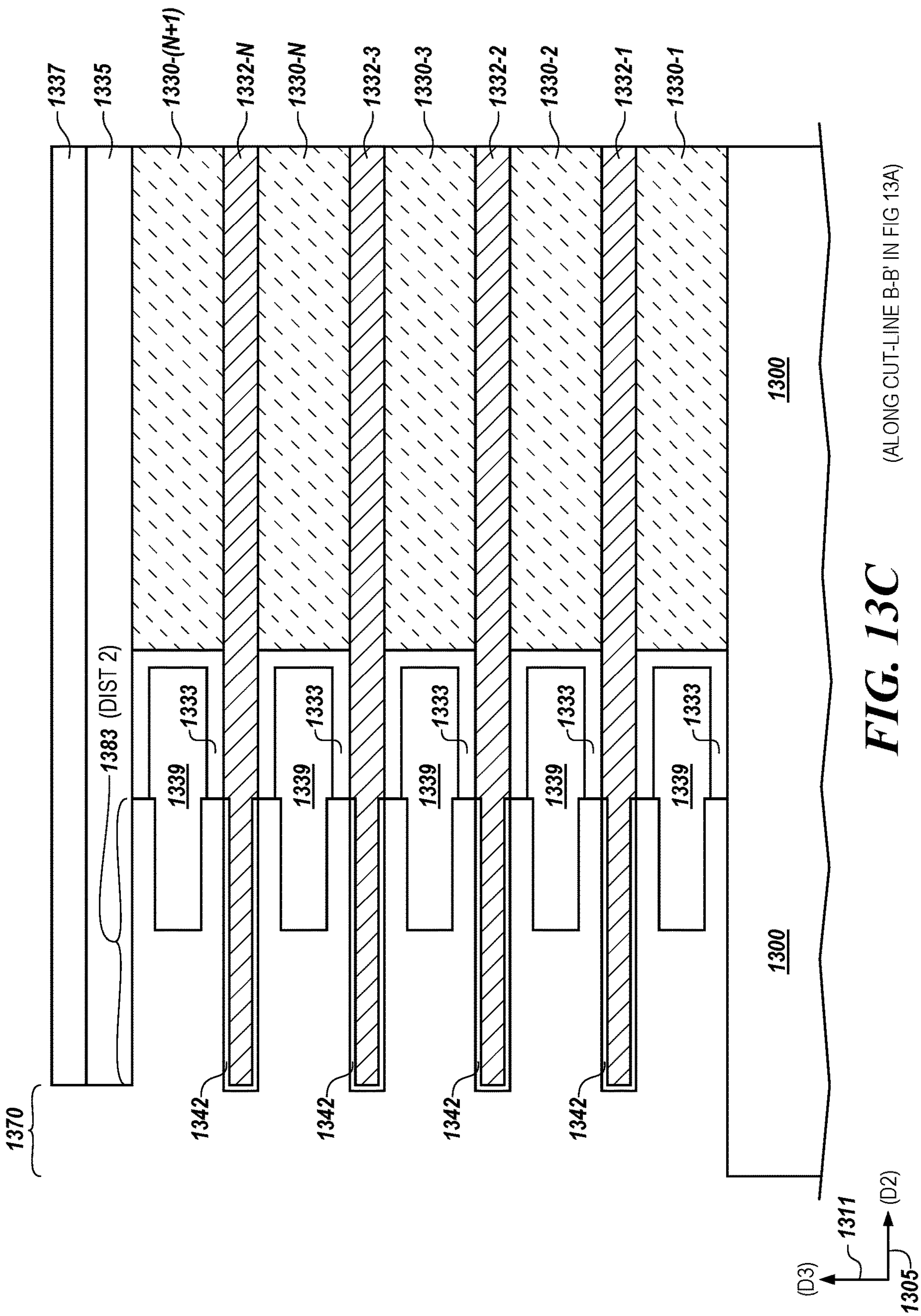

FIG. 13C illustrates a cross sectional view, taken along cut-line B-B' in FIG. 13A, showing another view of the semiconductor structure at this particular point in one example semiconductor fabrication process of an embodiment of the present disclosure. The cross sectional view shown in FIG. 13C is illustrated extending in the second horizontal direction (D2) 1305, left and right along the plane of the drawing sheet, along an axis of the repeating iterations of alternating layers of the epitaxially grown silicon germanium (SiGe) 1330 and the epitaxially grown, single crystalline silicon (Si) material 1332. In the example embodiment of FIG. 13C, epitaxially grown silicon germanium (SiGe) 1330 and second dielectric material 1333 has been etched back, exposing first dielectric material 1339.

A gate dielectric material 1342 may be formed on exposed surfaces of the epitaxially formed Si material 1332 to form horizontal access devices. In some embodiments the gate dielectric material may be an oxide material 1342. The gate dielectric material 1342 may be conformally deposited fully around every surface of the epitaxially formed Si material 1332 to form gate all around (GAA) gate structures, at the channels of the access device regions. The gates opposing the channel regions provide a subthreshold voltage (sub-Vt) slope in a range of approximately 45 to 100 millivolts per decade (mV/dec). The oxide material 1342 may be deposited on exposed surfaces of the epitaxially formed Si material 1332 using an atomic layer deposition. In some examples, an oxide material 1342 may be deposited over the exposed surfaces of the epitaxially grown, single crystalline silicon (Si) material 1332 to prevent oxidization of the epitaxially grown, single crystalline silicon (Si) material 1332. The oxide material 1342 deposition may prevent shorts by protecting the epitaxially grown, single crystalline silicon (Si) material 1332 from interactions with first dielectric material 1339. The oxide material 1342 may be selectively deposited on exposed surfaces of the epitaxially formed epitaxially grown, single crystalline silicon (Si) material 1332 using atomic layer deposition. A thermal oxidation process may be used to densify the ALD deposited oxide material 1342. The thermal oxidation process involves forming oxide material 1342 from a hybrid oxide material. The hybrid oxide material may combine a low temperature oxide material and a high temperature oxide material.

Figure 13D:
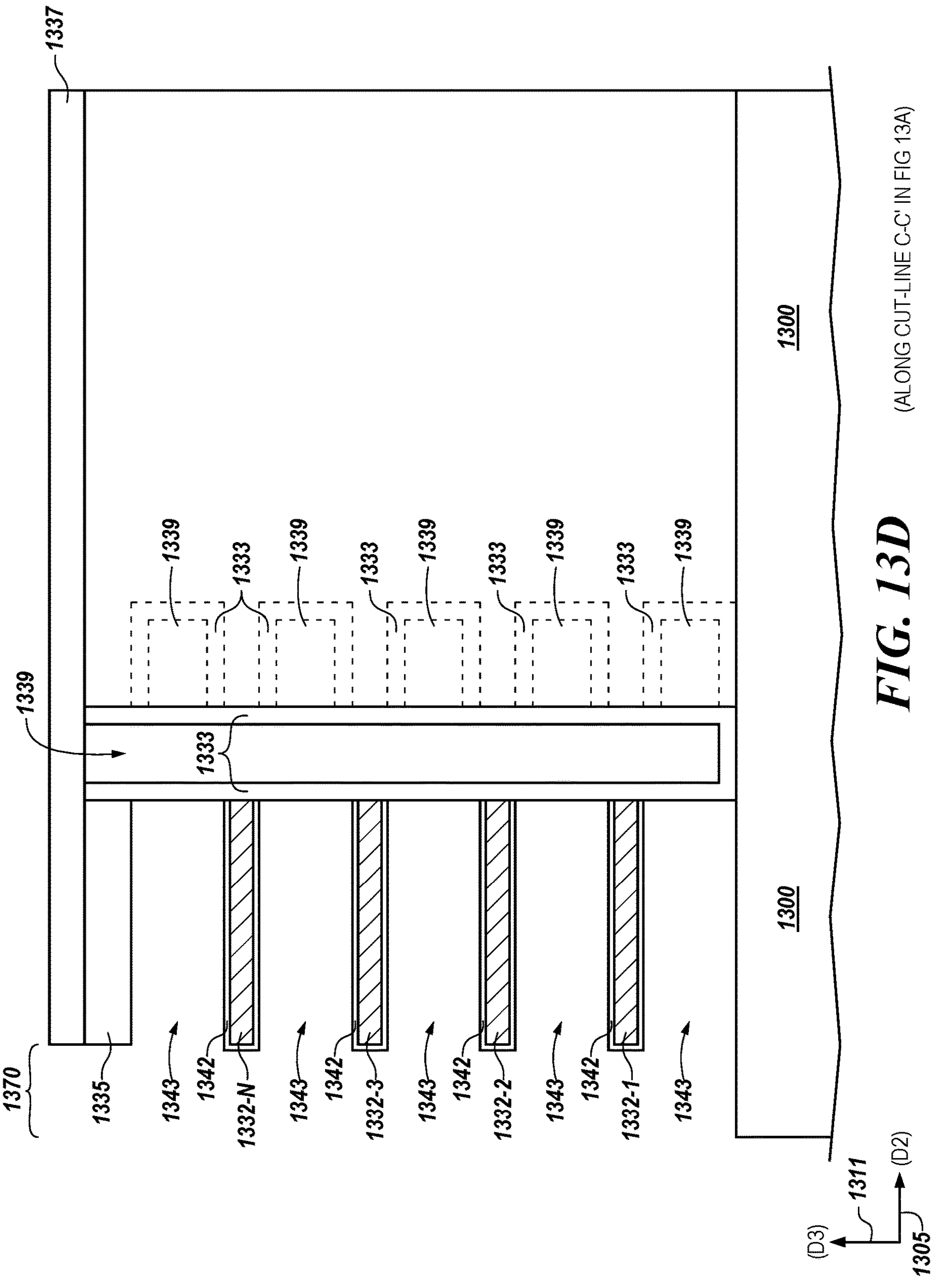

FIG. 13D illustrates a cross sectional view, taken along cut-line C-C' in FIG. 13A, showing another view of the semiconductor structure at this particular point in one example semiconductor fabrication process of an embodiment of the present disclosure. The cross sectional view shown in FIG. 13D is illustrated extending in the second horizontal direction (D2) 1305, left and right in the plane of the drawing sheet, along an axis of the repeating iterations of alternating layers of the etched epitaxially grown silicon germanium (SiGe) and remaining epitaxially grown, single crystalline silicon (Si) material 1332.

In FIG. 13D, at the left end of the drawing sheet is shown the repeating iterations of alternating layers of the etched epitaxially grown silicon (SiGe), and etched areas where the first dielectric material has been removed to form continuous second horizontal openings 1343 in a first direction (D1) 1209, separating the layers of epitaxially grown, single crystalline silicon (Si) material 1132. A gate dielectric material 1342 may be formed on exposed surfaces of the epitaxially formed Si material 1332. At the right hand of the drawing sheet, the first dielectric material 1339 may be seen, separating access device and storage node regions in the first direction (D1) 1309, and having the second vertical opening 1331 filled with the second dielectric material 1333 and the first dielectric material 1339. A portion of the first dielectric material 1339 has been etched away, with the second dielectric material 1333 serving as an etch stop. The second dielectric material 1333 is filled with first dielectric material 1339. The etched portion of the first dielectric material 1339 was removed using an oxide lateral punch.

Figure 13E:
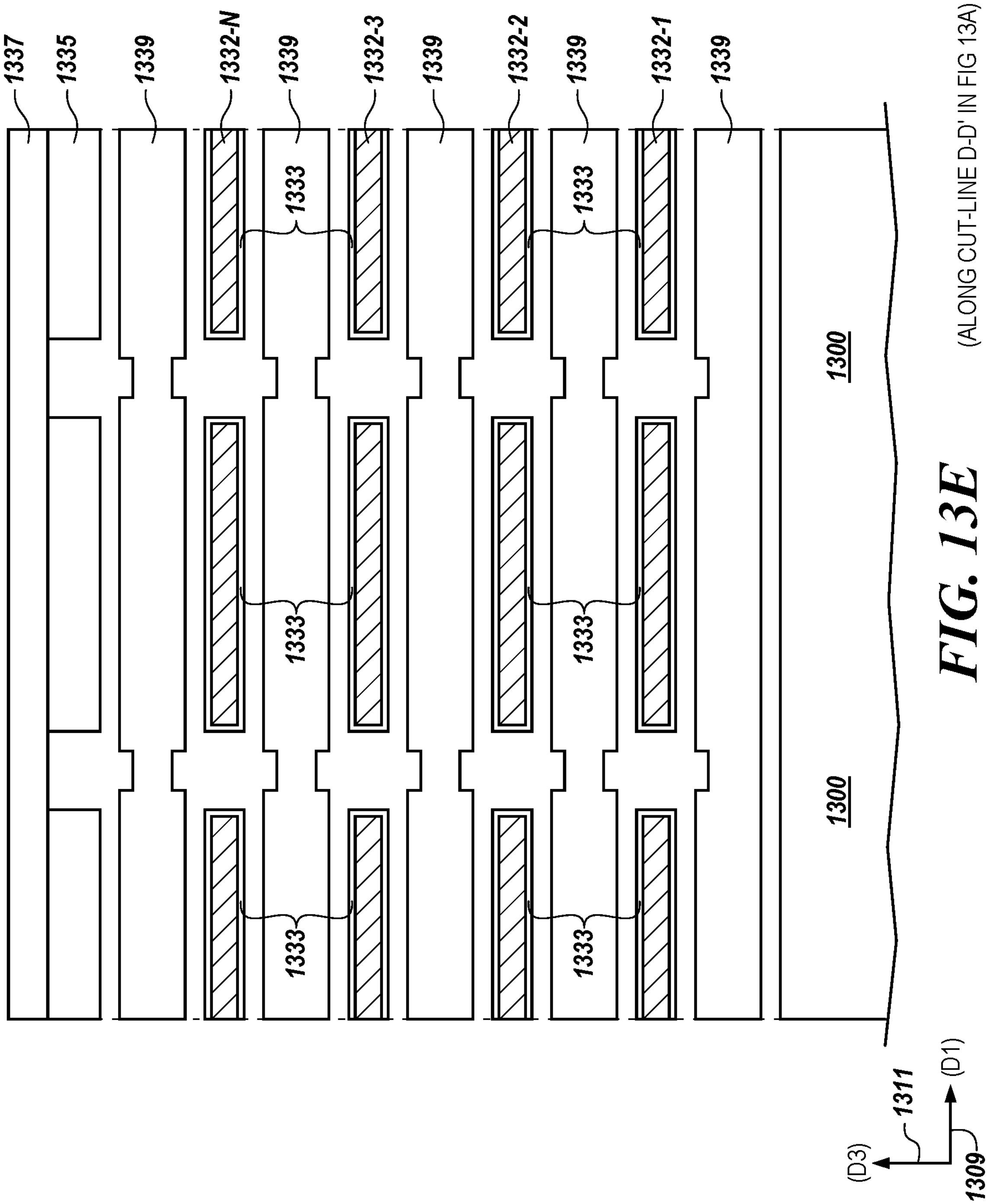

FIG. 13E illustrates a cross sectional view, taken along cut-line D-D' in FIG. 13A, showing another view of the semiconductor structure at this particular point in one example semiconductor fabrication process of an embodiment of the present disclosure. The cross sectional view shown in FIG. 13E is illustrated, right to left in the plane of the drawing sheet, extending in the first direction (D1) 1309 along an axis of the repeating iterations of alternating layers of epitaxially grown, single crystalline silicon (Si) material 1332 and first dielectric material 1339. In FIG. 13E, the gate dielectric material 1342 may be shown surrounding the epitaxially grown, single crystalline silicon (Si) material 1332. In this cross sectional view, the first dielectric material 1339 is still remaining bridged between layers and is interspersed, vertically between the cross sectional views of the epitaxially grown, single crystalline silicon (Si) material 1332.

Figure 14A:
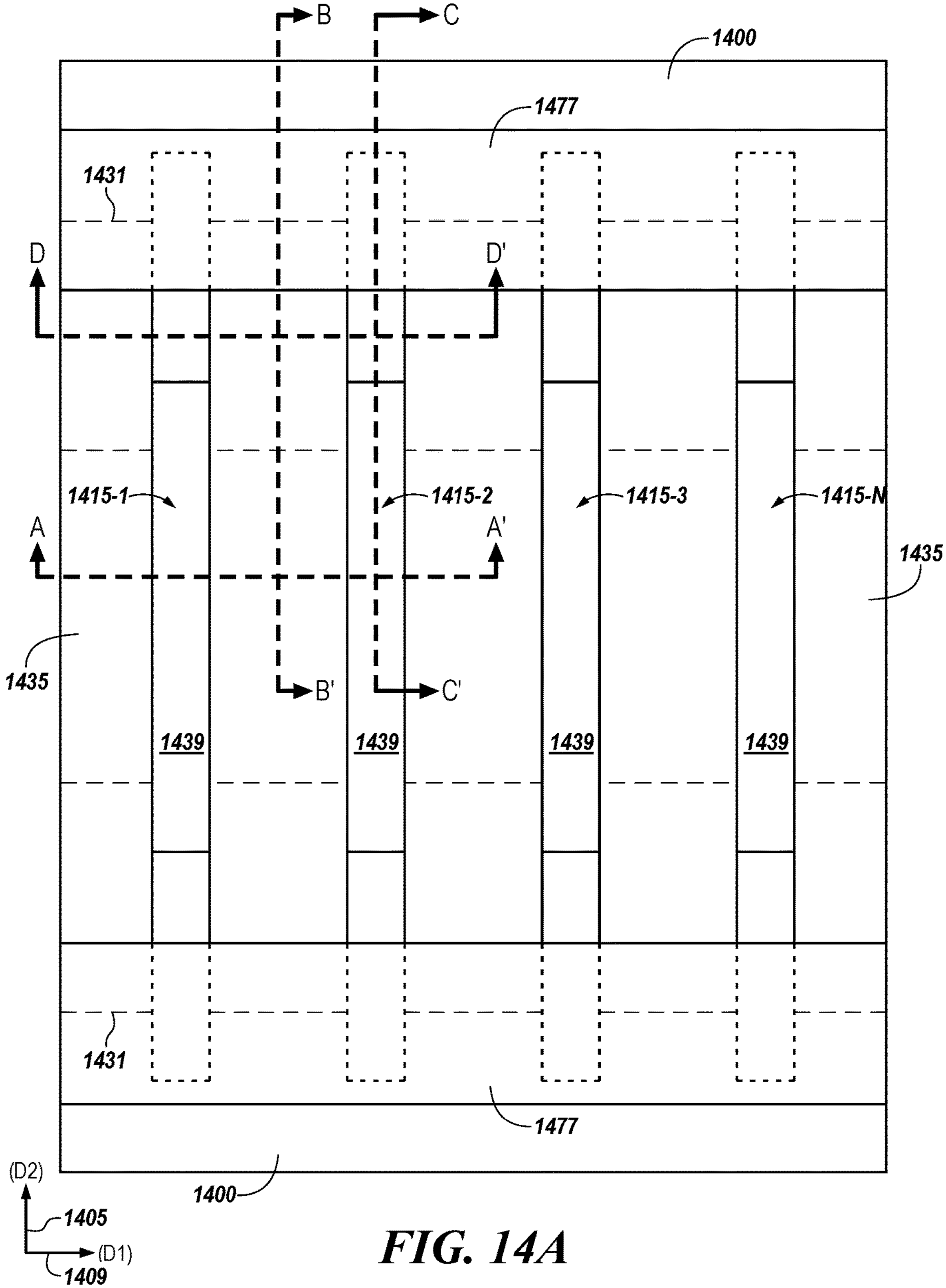
FIGS. 14A to 14E illustrate an example method, at another stage of a semiconductor fabrication process, for forming epitaxial silicon within horizontal access devices in vertical three dimensional (3D) memory, in accordance with a number of embodiments of the present disclosure.

FIG. 14A illustrates an example method, at another stage of a semiconductor fabrication process, for forming epitaxial silicon within horizontal access devices in vertical three dimensional (3D) memory, such as illustrated in FIGS. 1-3, and in accordance with a number of embodiments of the present disclosure. FIG. 14A illustrates a top down view of a semiconductor structure, at a particular point in time, in a semiconductor fabrication process, according to one or more embodiments. In the example embodiment of FIG. 14A, the method comprises using a photolithographic process to pattern the photolithographic mask 1435. A first conductive material 1477 may be deposited above the second vertical openings 1431. The first conductive material 1477 may be deposited in the continuous second horizontal openings to form horizontally oriented access lines opposing channel regions of the epitaxially grown, single crystalline silicon (Si) material 1432.

Figure 14B:
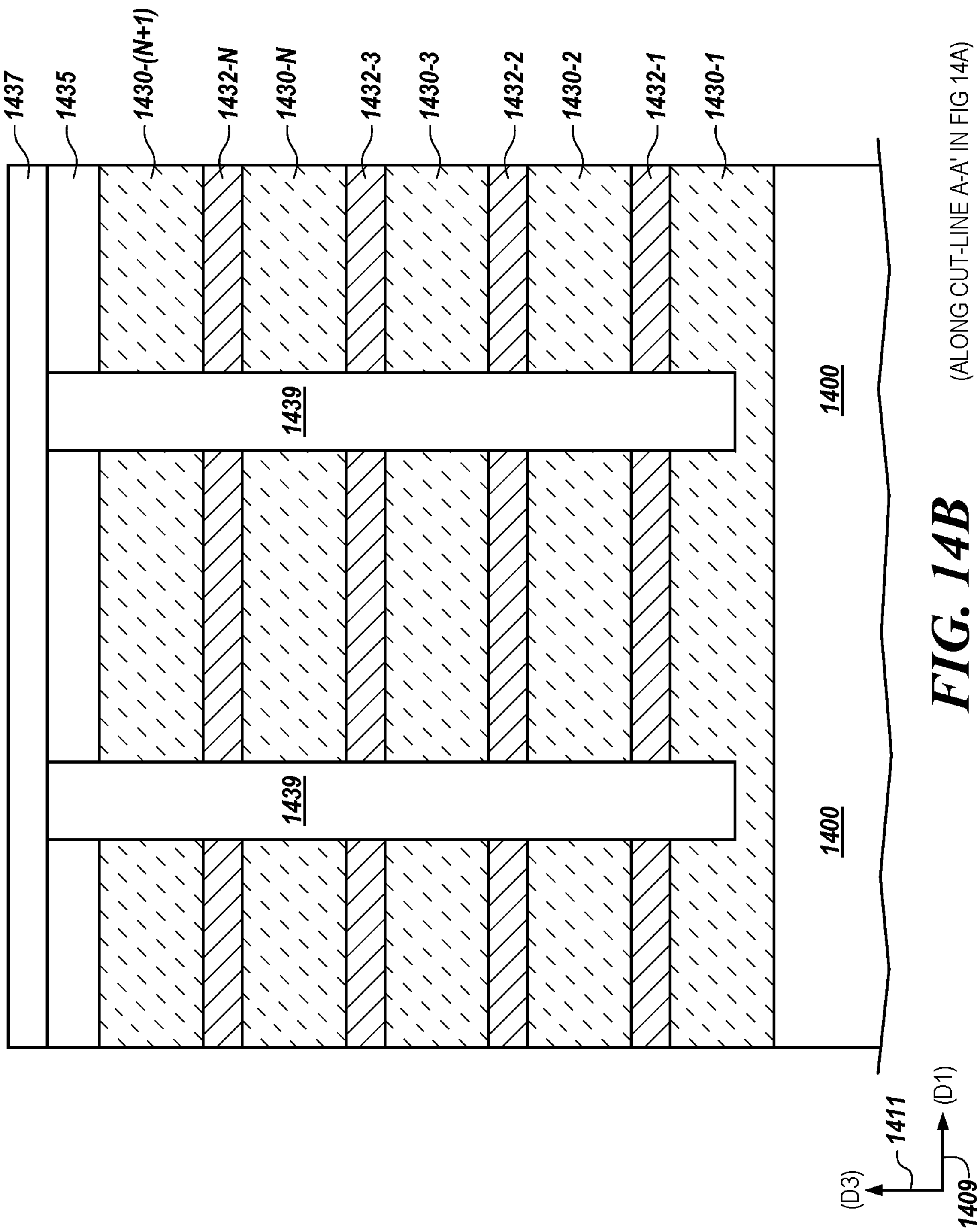

FIG. 14B illustrates a cross sectional view, taken along cut-line A-A' in FIG. 14A, showing another view of the semiconductor structure at this particular point in one example semiconductor fabrication process of an embodiment of the present disclosure. The cross sectional view shown in FIG. 14B shows the repeating iterations of alternating layers of the epitaxially grown silicon germanium (SiGe) 1430 and the epitaxially grown, single crystalline silicon (Si) material 1432, on a semiconductor substrate 1400.

As shown in FIG. 14B, a plurality of first vertical openings were formed through the layers within the vertically stacked memory cells to expose vertical sidewalls in the vertical stack. The first vertical openings were formed through the repeating iterations of the epitaxially grown silicon germanium (SiGe) 1430 and the epitaxially grown, single crystalline silicon (Si) material 1432.

Figure 14C:
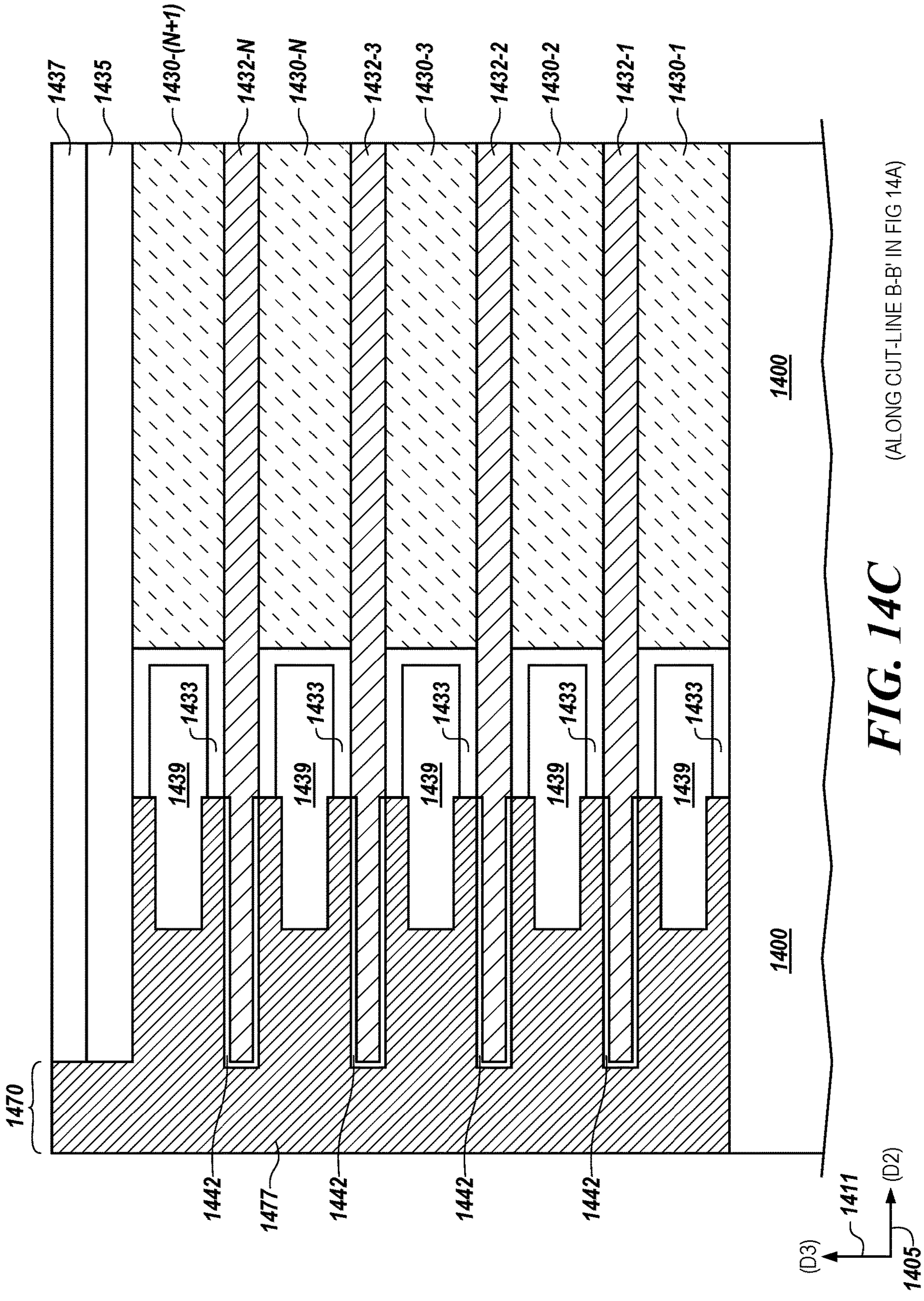

FIG. 14C illustrates a cross sectional view, taken along cut-line B-B' in FIG. 14A, showing another view of the semiconductor structure at this particular point in one example semiconductor fabrication process of an embodiment of the present disclosure. The cross sectional view shown in FIG. 14C is illustrated extending in the second horizontal direction (D2) 1405, left and right along the plane of the drawing sheet, along an axis of the repeating iterations of alternating layers of the epitaxially grown silicon germanium (SiGe) 1430 and the epitaxially grown, single crystalline silicon (Si) material 1432.

A first conductive material 1477 may be deposited on the gate dielectric material 1442. The first conductive material 1477 may be deposited around the epitaxially grown, single crystalline silicon (Si) material 1432 such that the first conductive material 1477 may have a top portion above the epitaxially grown, single crystalline silicon (Si) material 1432 and a bottom portion below the epitaxially grown, single crystalline silicon (Si) material to form gate all around (GAA) gate structures, at the channels of the access device regions. The first conductive material 1477 may be conformally deposited into third vertical openings 1470 and fill the continuous second horizontal openings 1443 up to the unetched portions of the oxide material 1442, the first dielectric material 1439, and the second dielectric material 1433. The first conductive material 1477 may be conformally deposited using a chemical vapor deposition (CVD) process, plasma enhanced CVD (PECVD), atomic layer deposition (ALD), or other suitable deposition process.

In some embodiments, the first conductive material, 1477, may comprise one or more of a doped semiconductor, e.g., doped silicon, doped germanium, etc., a conductive metal nitride, e.g., titanium nitride, tantalum nitride, etc., a metal, e.g., tungsten (W), titanium (Ti), tantalum (Ta), ruthenium (Ru), cobalt (Co), molybdenum (Mo), etc., and/or a metal-semiconductor compound, e.g., tungsten silicide, cobalt silicide, titanium silicide, etc, and/or some other combination thereof. The first conductive material 1477 entwined with the gate dielectric material may form horizontally oriented access lines opposing a channel region of the epitaxially grown, single crystalline silicon (Si) material (which also may be referred to a wordlines).

Figure 14D:
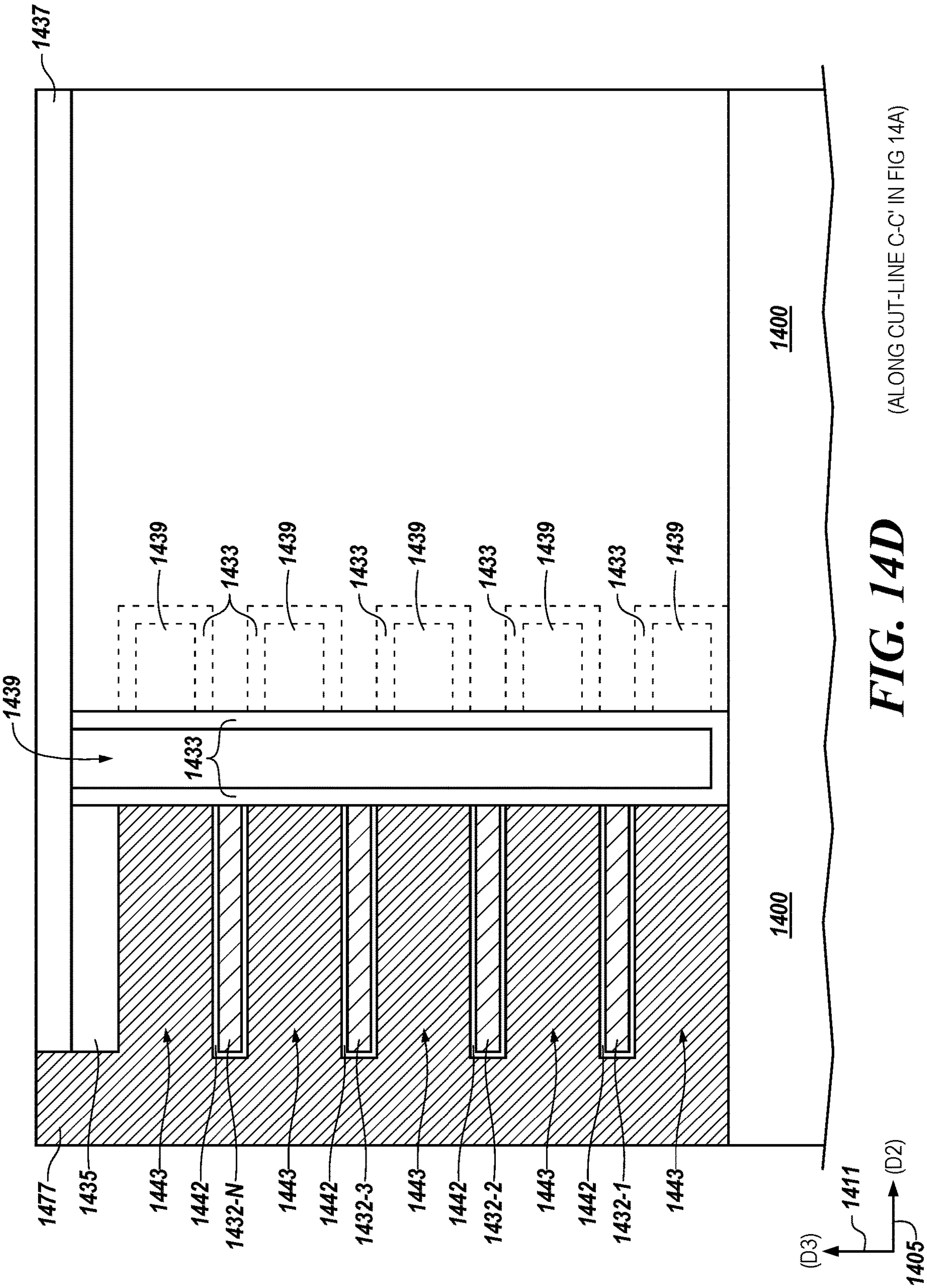

FIG. 14D illustrates a cross sectional view, taken along cut-line C-C' in FIG. 14A, showing another view of the semiconductor structure at this particular point in one example semiconductor fabrication process of an embodiment of the present disclosure. The cross sectional view shown in FIG. 14D is illustrated extending in the second horizontal direction (D2) 1405, left and right in the plane of the drawing sheet, along an axis of the repeating iterations of alternating layers of continuous second horizontal openings 1443 and epitaxially grown, single crystalline silicon (Si) material 1432.

In FIG. 14D, first dielectric material 1439 is shown spaced along a second horizontal direction (D2) 1405, extending into and out from the plane of the drawings sheet, for a three dimensional array of vertically oriented memory cells. At the left end of the drawing sheet is shown the repeating iterations of alternating layers of epitaxially grown, single crystalline silicon (Si) material 1432, separated by continuous second horizontal openings 1443 in a first direction (D1) 1409. The first conductive material 1477 may be conformally deposited into third vertical openings 1470 and into the second horizontal openings 1443. The first conductive material 1477 is formed on the gate dielectric material 1442. At the right hand of the drawing sheet, the first dielectric material 1439 may be seen, separating access device and storage node regions in the first direction (D1) 1409, and having the second horizontal opening 1431 filled with the second dielectric material 1433 and the first dielectric material 1439.

Figure 14E:
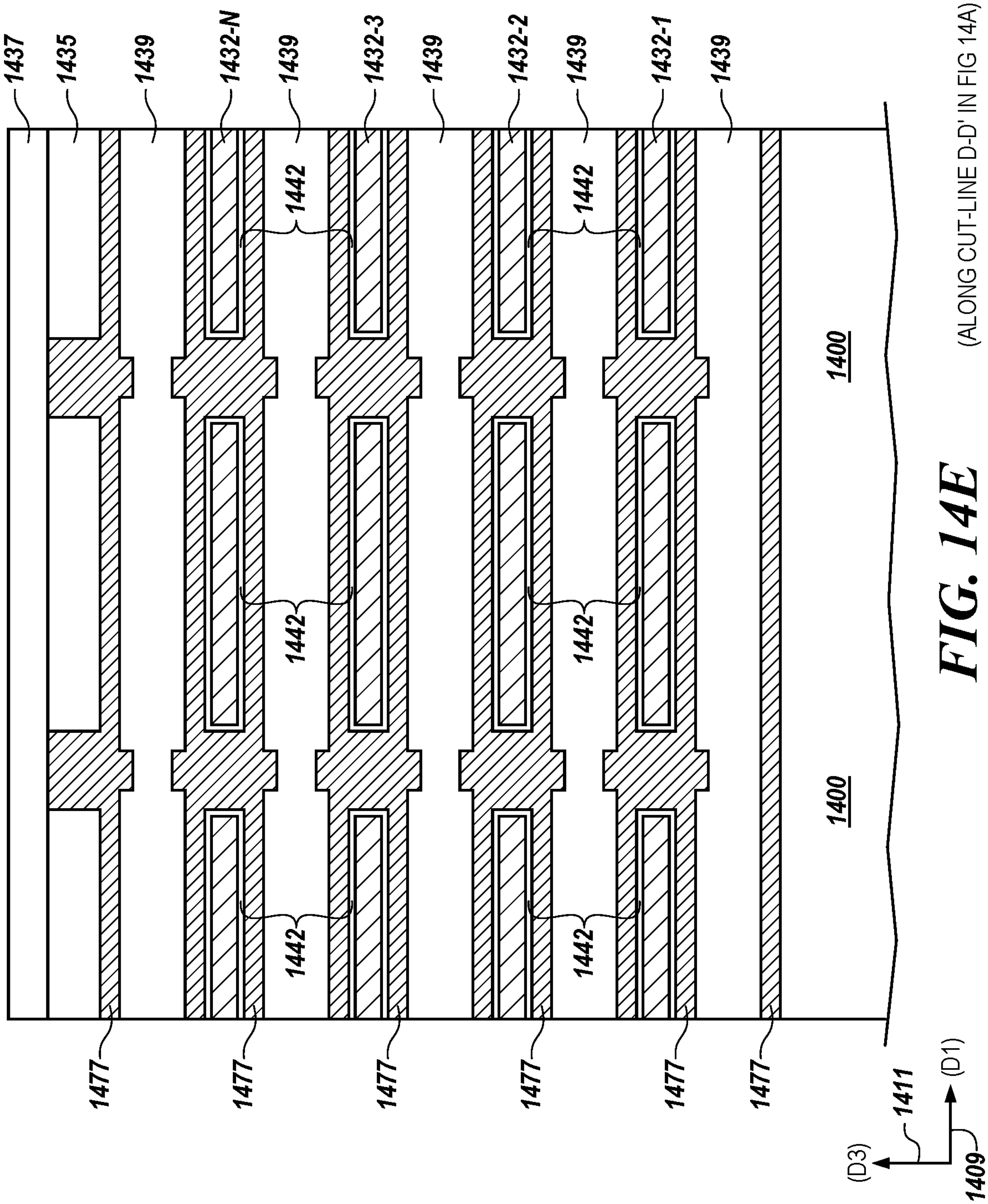

FIG. 14E illustrates a cross sectional view, taken along cut-line D-D' in FIG. 14A, showing another view of the semiconductor structure at this particular point in one example semiconductor fabrication process of an embodiment of the present disclosure. The cross sectional view shown in FIG. 14E is illustrated, right to left in the plane of the drawing sheet, extending in the first direction (D1) 1409 along an axis of the repeating iterations of alternating layers of first dielectric material 1439 and epitaxially grown, single crystalline silicon (Si) material 1432 wrapped with a gate dielectric material 1442. The gate dielectric material 1442 may be conformally deposited fully around every surface of the epitaxially grown, single crystalline silicon (Si) material 1432, to form gate all around (GAA) gate structures, at the channels of the access device regions. The first conductive material 1477 may fill the spaces adjacent the bridged epitaxially grown, single crystalline silicon (Si) material 1432. The epitaxially grown, single crystalline silicon (Si) material 1432 may be surrounded by first conductive material 1477 formed on the gate dielectric material 1442. The first conductive material 1477 may be conformally deposited fully around every surface of the epitaxially grown, single crystalline silicon (Si) material 1432, to form gate all around (GAA) gate structures, at the channels of the access device regions. In FIG. 14E, the first conductive material, 1477 is shown filling in the space in the second horizontal openings 1431 left by the etched second dielectric material 1433.

Figure 15A:
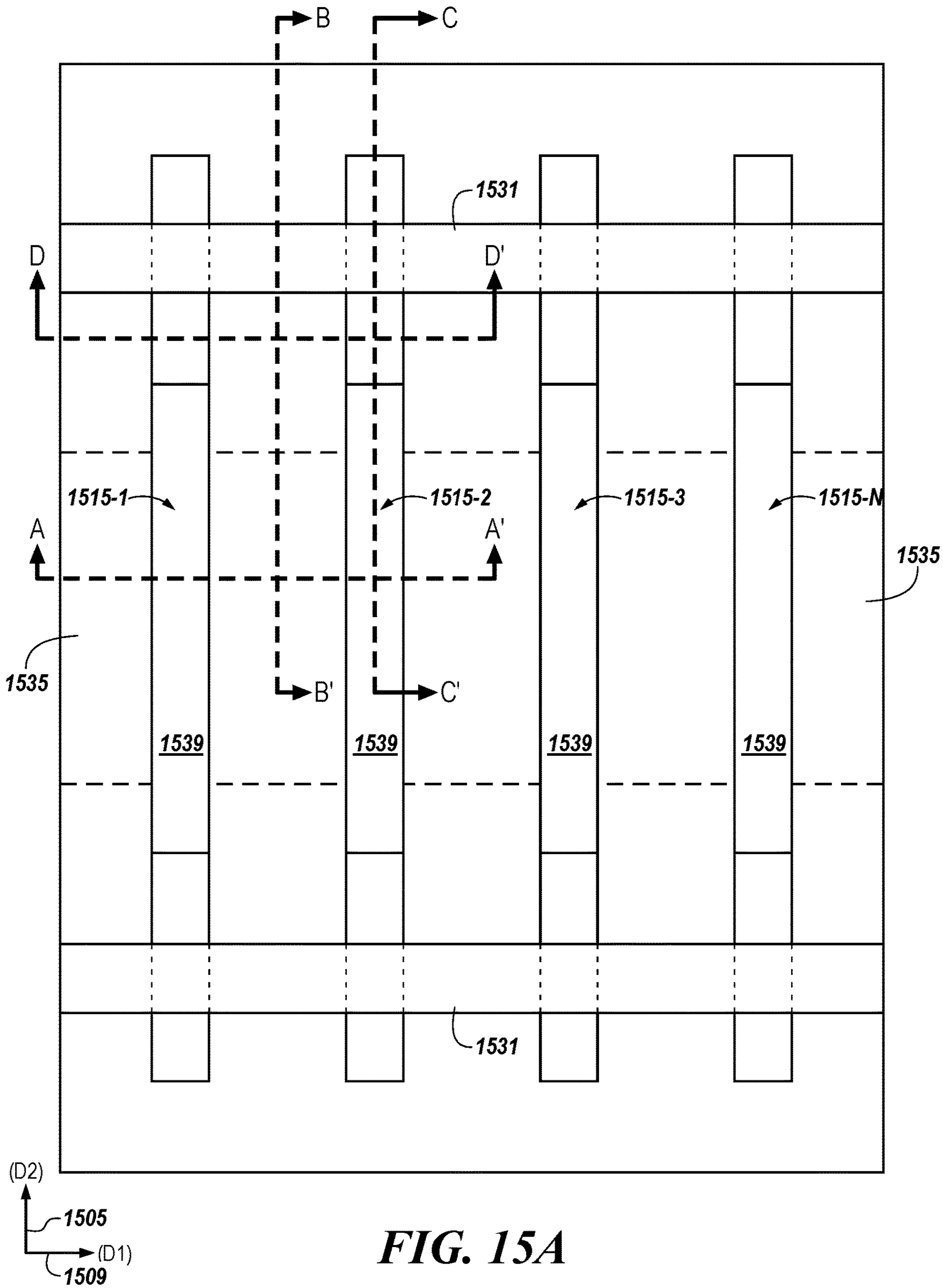
FIGS. 15A to 15E illustrate an example method, at another stage of a semiconductor fabrication process, for forming epitaxial silicon within horizontal access devices in vertical three dimensional (3D) memory, in accordance with a number of embodiments of the present disclosure.

FIG. 15A illustrates an example method, at another stage of a semiconductor fabrication process, for forming epitaxial silicon within horizontal access devices in vertical three dimensional (3D) memory, such as illustrated in FIGS. 1-3, and in accordance with a number of embodiments of the present disclosure. FIG. 15A illustrates a top down view of a semiconductor structure, at a particular point in time, in a semiconductor fabrication process, according to one or more embodiments. In the example embodiment of FIG. 15A, the method comprises using a photolithographic process to pattern the photolithographic mask 1535. A first conductive material 1577 may have been deposited above the second vertical openings 1531 and is now recessed.

Figure 15B:
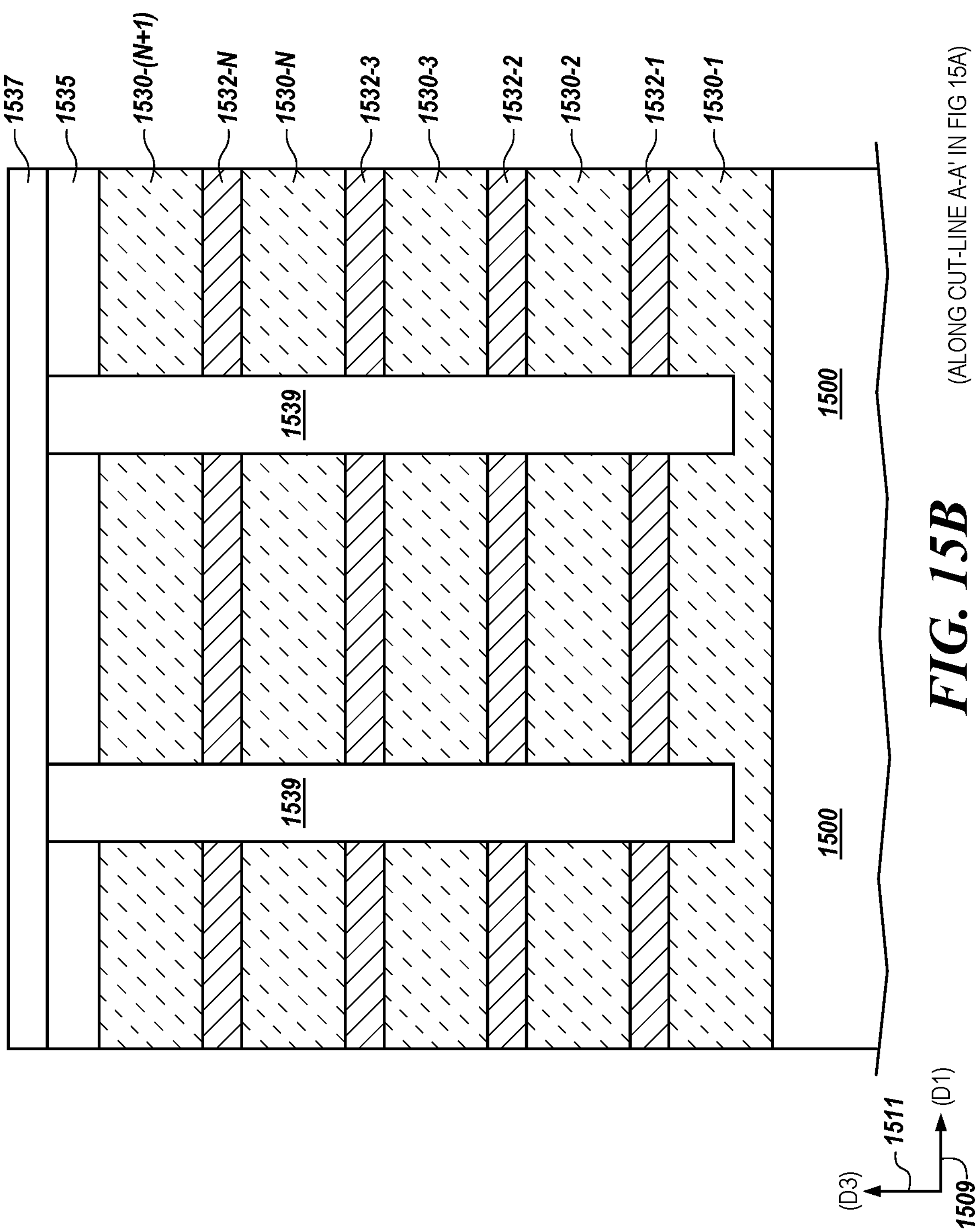

FIG. 15B illustrates a cross sectional view, taken along cut-line A-A' in FIG. 15A in the storage node regions, showing another view of the semiconductor structure at this particular point in one example semiconductor fabrication process of an embodiment of the present disclosure. The cross sectional view shown in FIG. 15B shows the repeating iterations of alternating layers of the epitaxially grown silicon germanium (SiGe) 1530 and the epitaxially grown, single crystalline silicon (Si) material 1532, on a semiconductor substrate 1500 in the storage node regions.

As shown in FIG. 15B, a plurality of first vertical openings may be formed through the layers within the vertically stacked memory cells to expose vertical sidewalls in the vertical stack. The first vertical openings may be formed through the repeating iterations of the epitaxially grown silicon germanium (SiGe) 1530 and the epitaxially grown, single crystalline silicon (Si) material 1532 in the storage node regions.

Figure 15C:
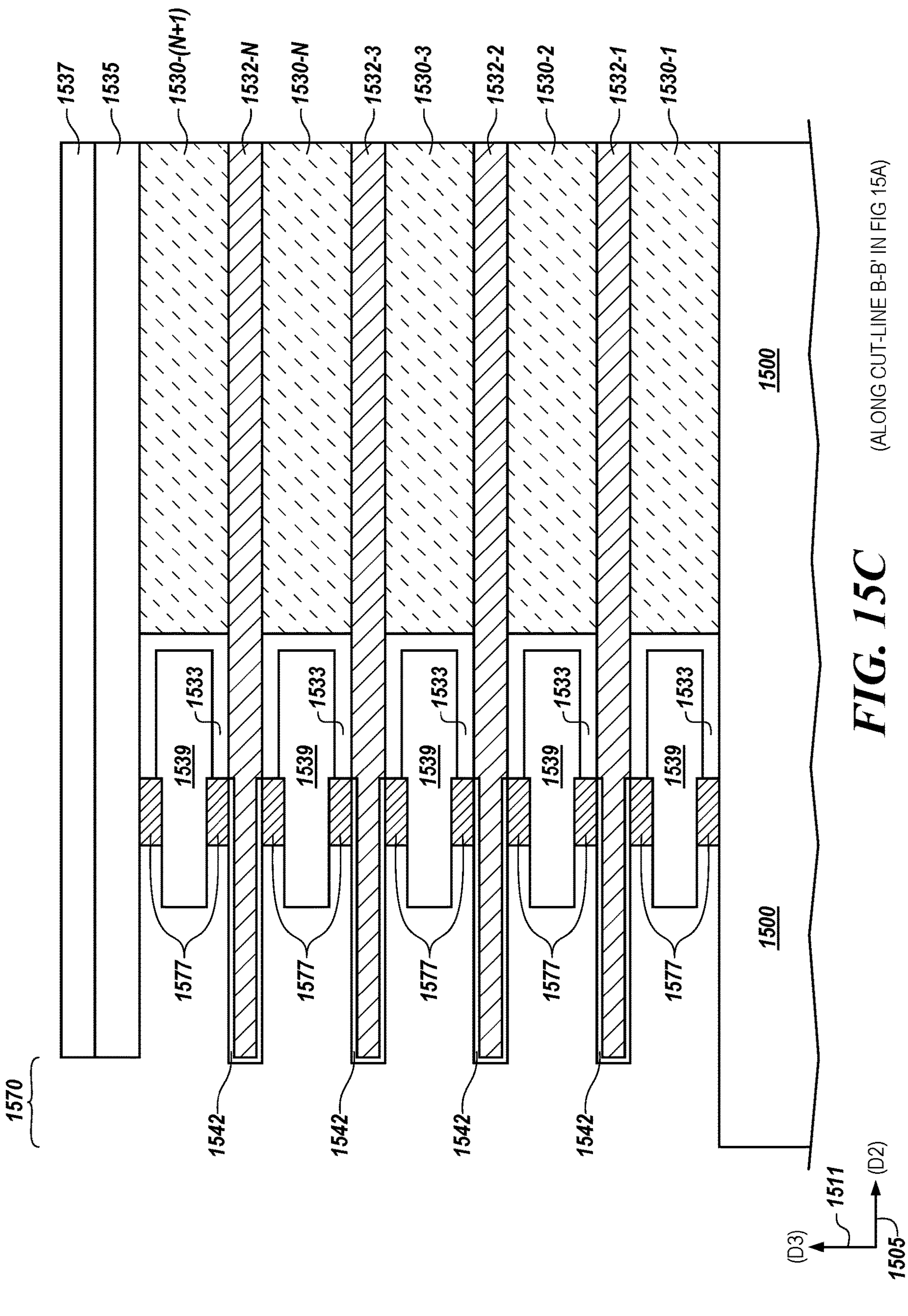

FIG. 15C illustrates a cross sectional view, taken along cut-line B-B' in FIG. 15A, showing another view of the semiconductor structure at this particular point in one example semiconductor fabrication process of an embodiment of the present disclosure. The cross sectional view shown in FIG. 15C is illustrated extending in the second horizontal direction (D2) 1505, left and right along the plane of the drawing sheet, along an axis of the repeating iterations of alternating layers of the epitaxially grown silicon germanium (SiGe) 1530 and the epitaxially grown, single crystalline silicon (Si) material 1532.

A first conductive material 1577 was deposited on the gate dielectric material and formed around the epitaxially grown, single crystalline silicon (Si) material 1532, recessed back, to form gate all around (GAA) structure opposing channel regions of the epitaxially grown, single crystalline silicon (Si) material 1532. The first conductive material 1577, formed on the gate dielectric material 1542, may be recessed and etched away from the third vertical opening 1570. In some embodiments, the first conductive material 1577 may be etched using an atomic layer etching (ALE) process. In some embodiments, the first conductive material 1577 may be etched using an isotropic etch process. The first conductive material 1577 may be selectively etched leaving the oxide material 1542 covering the epitaxially grown, single crystalline silicon (Si) material 1532 and the first dielectric material 1539 intact. The first conductive material 1577 may be selectively etched in the second direction, in the continuous second horizontal openings, a third distance (DIST 3) in a range of twenty (20) to fifty (50) nanometers (nm) back from the third vertical opening 1570. The first conductive material 1577 may be selectively etched around the epitaxially grown, single crystalline silicon (Si) material 1532 back into the continuous second horizontal openings extending in the first horizontal direction.

Figure 15D:
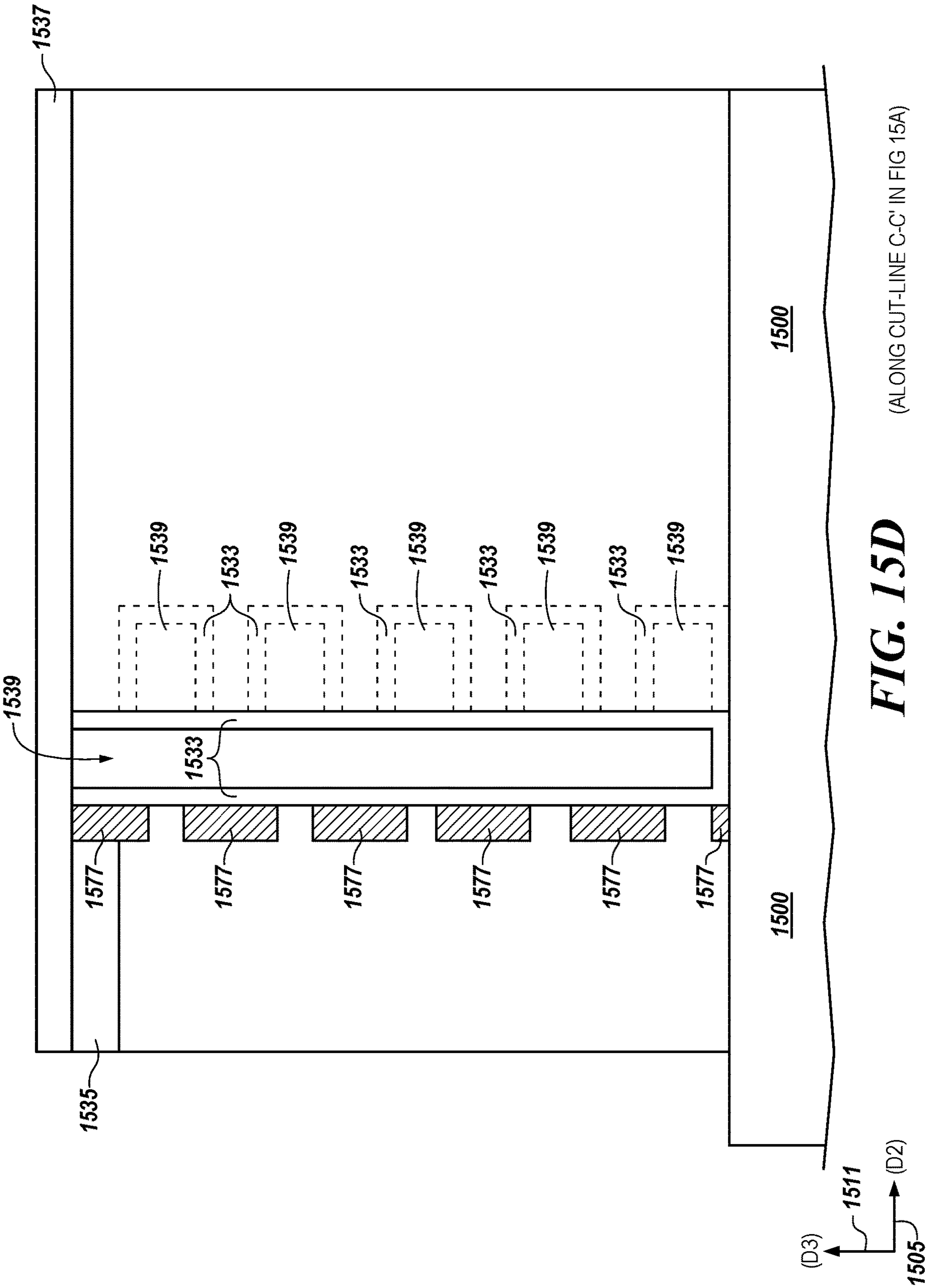

FIG. 15D illustrates a cross sectional view, taken along cut-line C-C' in FIG. 15A, showing another view of the semiconductor structure at this particular point in one example semiconductor fabrication process of an embodiment of the present disclosure. The cross sectional view shown in FIG. 15D is illustrated extending in the second horizontal direction (D2) 1505, left and right in the plane of the drawing sheet, along an axis of the repeating iterations of alternating layers of the etched first conductive material 1577 and epitaxially grown, single crystalline silicon (Si) material 1532.

In FIG. 15D, first dielectric material 1539 is shown spaced along a first horizontal direction (D1) 1509 extending into and out from the plane of the drawings sheet, for a three dimensional array of vertically oriented memory cells. At the left end of the drawing sheet is shown the repeating iterations of alternating layers of the epitaxially grown, single crystalline silicon (Si) material 1532 covered by oxide material 1542, separated by continuous second horizontal openings 1543 in a first direction (D1) 1509. The first conductive material 1577, formed on the gate dielectric material 1542, was etched away from the third vertical opening 1570. The first conductive material 1577, formed on the gate dielectric material 1542, is also recessed back in the continuous second horizontal openings 1543 extending in the first horizontal direction 1509. The first conductive material 1577 may be selectively etched leaving the oxide material 1542 covering the epitaxially grown, single crystalline silicon (Si) material 1532 intact. In this view, the unetched first conductive material 1577 may be seen occupying a portion of the space in the continuous second horizontal openings 1543 between the oxide material 1542. In some embodiments, the first conductive material 1577 may be etched using an atomic layer etching (ALE) process. In some embodiments, the first conductive material 1577 may be etched using an isotropic etch process.

Figure 15E:
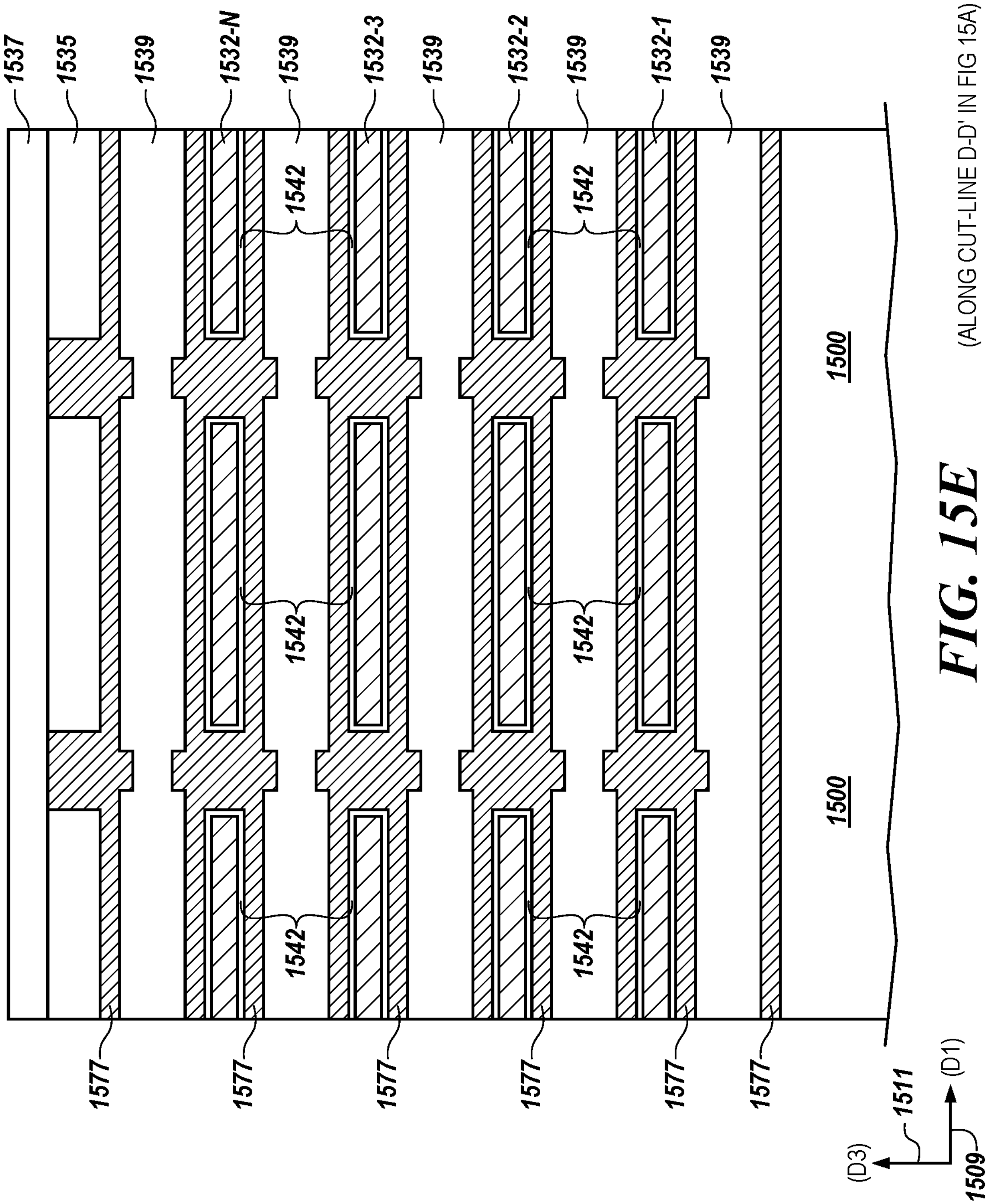

FIG. 15E illustrates a cross sectional view, taken along cut-line D-D' in FIG. 15A in the access device region, showing another view of the semiconductor structure at this particular point in one example semiconductor fabrication process of an embodiment of the present disclosure. The cross sectional view shown in FIG. 15E is illustrated, right to left in the plane of the drawing sheet, extending in the first direction (D1) 1509 along an axis of the repeating iterations of alternating layers of first dielectric material 1539 and epitaxially grown, single crystalline silicon (Si) material 1532 wrapped in an oxide material 1542. The gate dielectric material 1542 has been conformally deposited fully around every surface of the epitaxially grown, single crystalline silicon (Si) material 1532, to form gate all around (GAA) gate structures, at the channels of the access device regions. The first conductive material 1577 has filled the spaces adjacent the bridged epitaxially grown, single crystalline silicon (Si) material 1532 in the access device region. The epitaxially grown, single crystalline silicon (Si) material 1532 is surrounded by first conductive material 1577 formed on the gate dielectric material 1542.

The first conductive material 1577 is deposited on the gate dielectric material 1542 and formed around the epitaxially grown, single crystalline silicon (Si) material 1532 to form gate all around (GAA) structure opposing channel regions of the epitaxially grown, single crystalline silicon (Si) material 1532 in the access device regions. In FIG. 15E, the first conductive material, 1577 is shown filling in the space in the second horizontal openings 1531 left by the etched second dielectric material 1533.

Figure 16A:
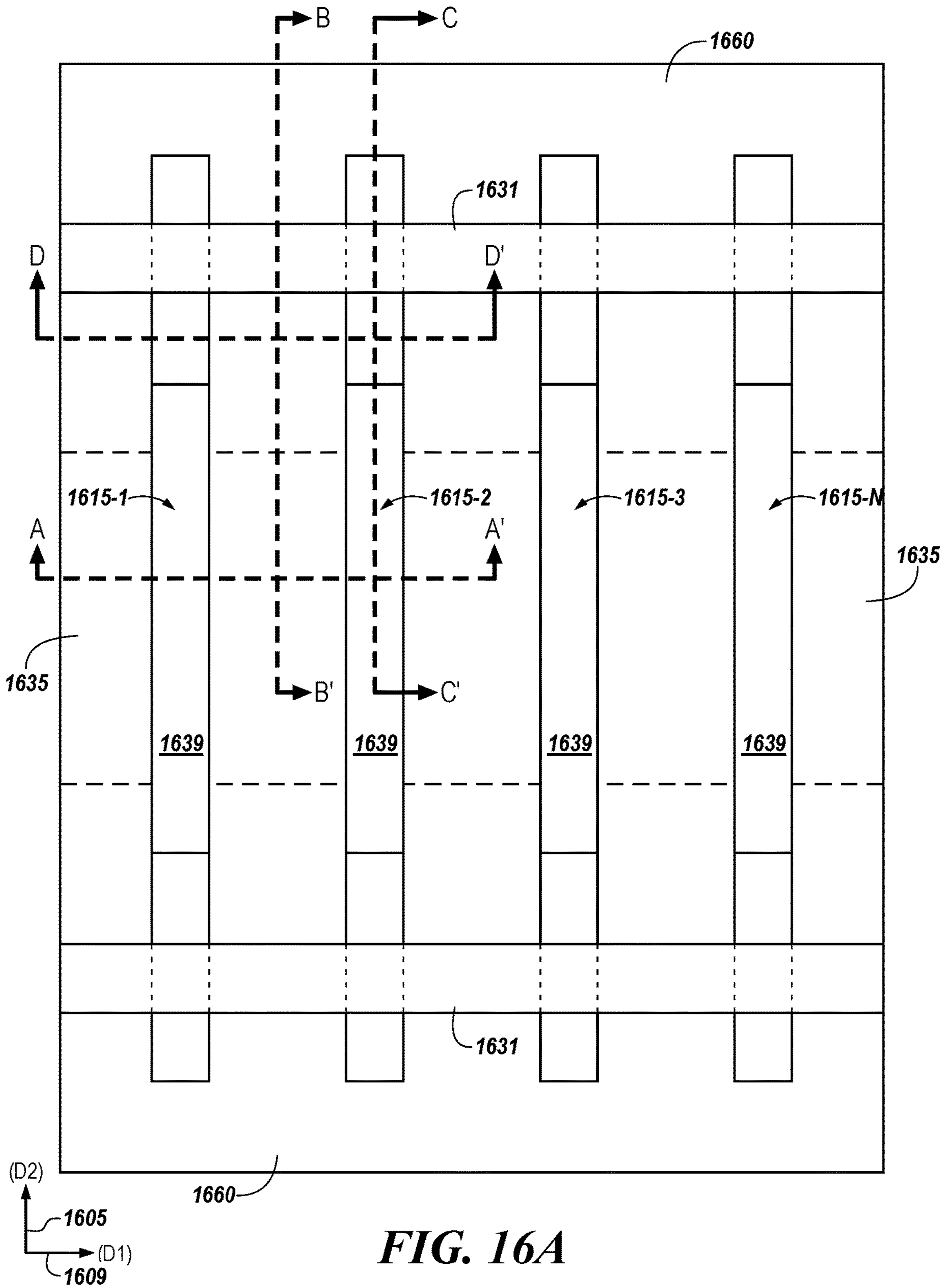
FIGS. 16A to 16E illustrate an example method, at another stage of a semiconductor fabrication process, for forming epitaxial silicon within horizontal access devices in vertical three dimensional (3D) memory, in accordance with a number of embodiments of the present disclosure.

FIG. 16A illustrates an example method, at another stage of a semiconductor fabrication process, for forming epitaxial silicon within horizontal access devices in vertical three dimensional (3D) memory, such as illustrated in FIGS. 1-3, and in accordance with a number of embodiments of the present disclosure. FIG. 16A illustrates a top down view of a semiconductor structure, at a particular point in time, in a semiconductor fabrication process, according to one or more embodiments. In the example embodiment of FIG. 16A, the method comprises using a photolithographic process to pattern the photolithographic mask 1635. The method in FIGS. 16A-16E illustrates an interlayer dielectric (ILD) fill material 1667 may be deposited in the second horizontal openings 1631 to fill the second horizontal openings 1631.

Figure 16B:
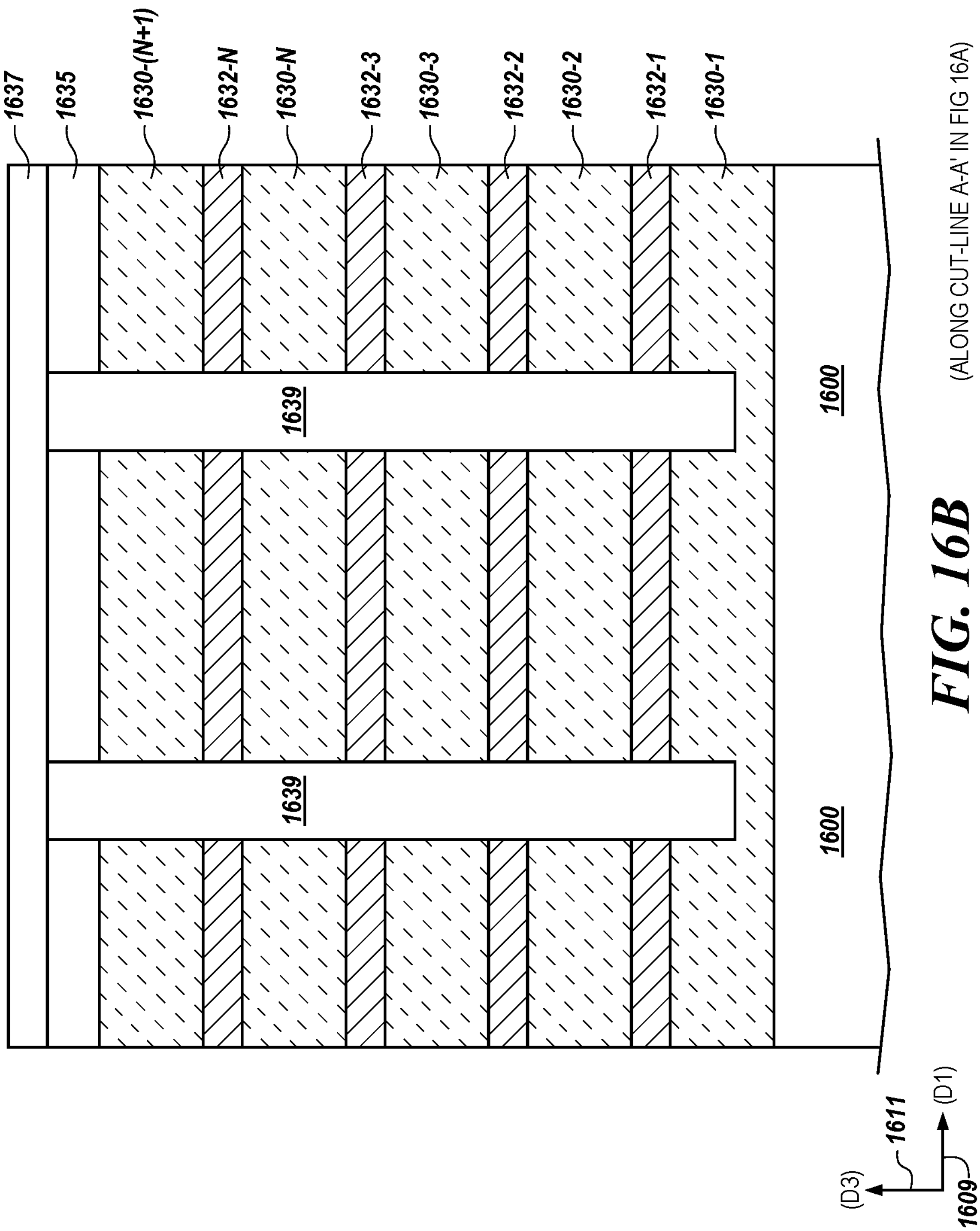

FIG. 16B illustrates a cross sectional view, taken along cut-line A-A' in FIG. 16A in the storage node regions, showing another view of the semiconductor structure at this particular point in one example semiconductor fabrication process of an embodiment of the present disclosure. The cross sectional view shown in FIG. 16B shows the repeating iterations of alternating layers of the epitaxially grown silicon germanium (SiGe) 1630 and the epitaxially grown, single crystalline silicon (Si) material 1632, on a semiconductor substrate 1600.

As shown in FIG. 16B, a plurality of first vertical openings were formed through the layers within the vertically stacked memory cells to expose vertical sidewalls in the vertical stack.

Figure 16C:
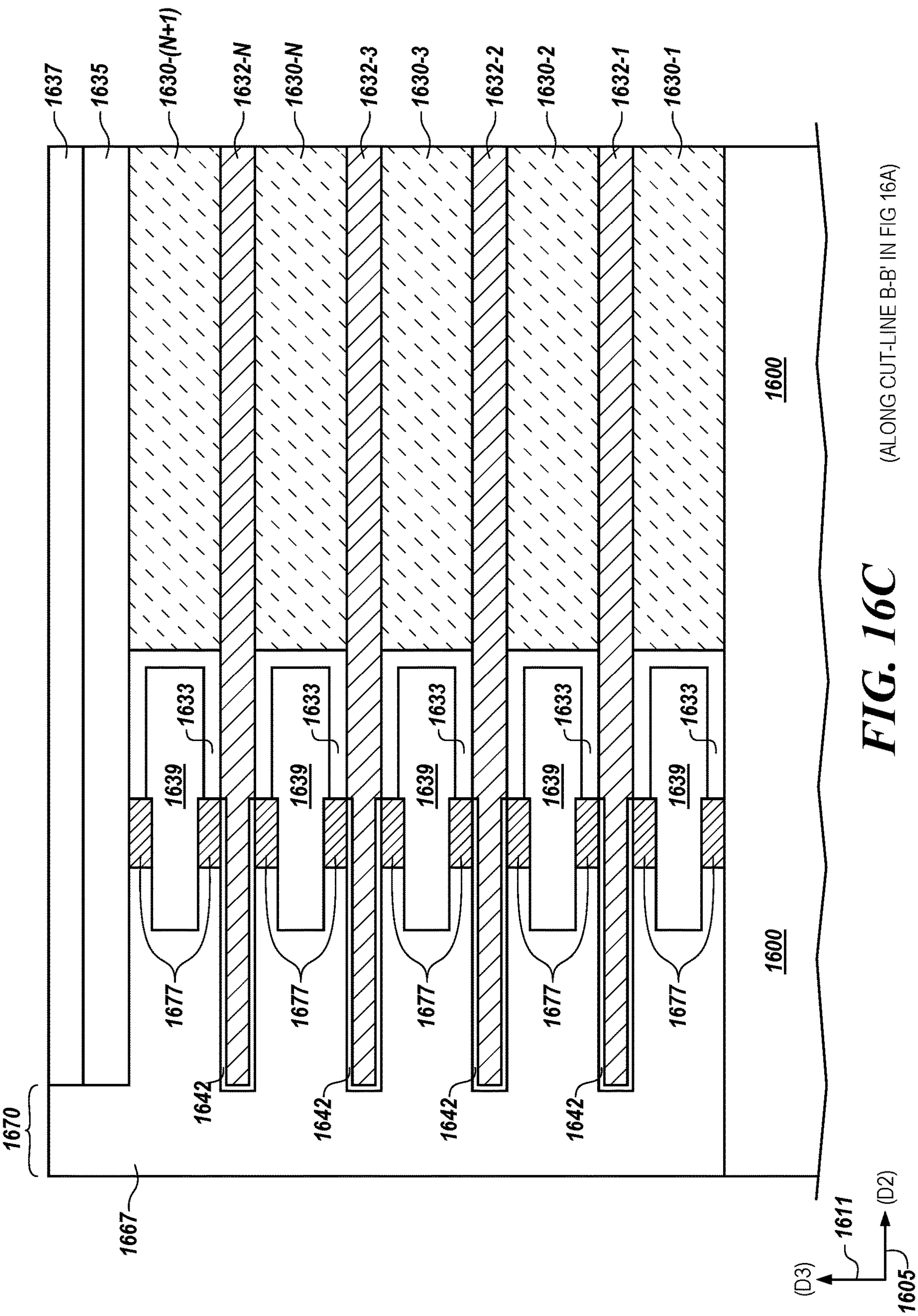

FIG. 16C illustrates a cross sectional view, taken along cut-line B-B' in FIG. 16A, showing another view of the semiconductor structure at this particular point in one example semiconductor fabrication process of an embodiment of the present disclosure. The cross sectional view shown in FIG. 16C is illustrated extending in the second horizontal direction (D2) 1605, left and right along the plane of the drawing sheet, along an axis of the repeating iterations of alternating layers of the epitaxially grown silicon germanium (SiGe) 1630 and the epitaxially grown, single crystalline silicon (Si) material 1632.

An ILD fill material 1667 may be deposited into third vertical openings 1670 and filling the continuous second horizontal openings up to the unetched portions of the oxide material 1642, the first dielectric material 1639, and the first conductive material 1677. The ILD fill material 1667 may be conformally deposited using a chemical vapor deposition (CVD) process, plasma enhanced CVD (PECVD), atomic layer deposition (ALD), or other suitable deposition process.

Figure 16D:
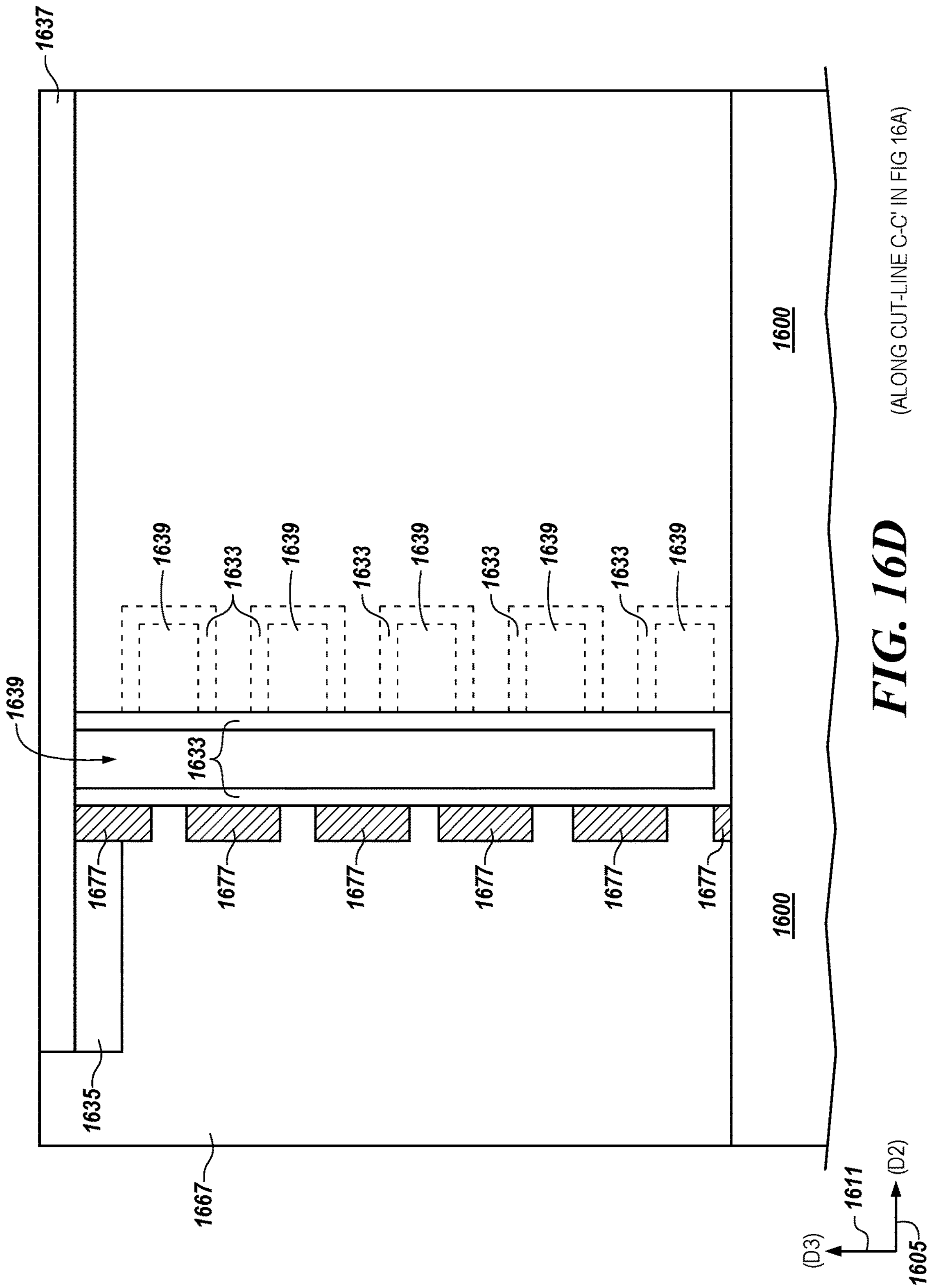

FIG. 16D illustrates a cross sectional view, taken along cut-line C-C' in FIG. 16A, showing another view of the semiconductor structure at this particular point in one example semiconductor fabrication process of an embodiment of the present disclosure. The cross sectional view shown in FIG. 16D is illustrated extending in the second horizontal direction (D2) 1605, left and right in the plane of the drawing sheet, along an axis of the repeating iterations of alternating layers of the etched first conductive material 1677 and epitaxially grown, single crystalline silicon (Si) material 1632.

In FIG. 16D, first dielectric material 1639 is shown spaced along a first horizontal direction (D1) 1609, extending into and out from the plane of the drawings sheet, for a three dimensional array of vertically oriented memory cells. At the left end of the drawing sheet is shown the repeating iterations of alternating layers of the epitaxially grown, single crystalline silicon (Si) material 1632 covered by gate dielectric material 1642, and etched portions of the first conductive material 1677. The ILD fill material 1667 may be conformally deposited into third vertical openings 1670 and into the second continuous horizontal openings 1643 up to the unetched portions of the gate dielectric material 1642 and the etched portions of the first conductive material 1677. The first conductive material 1677 was formed on the gate dielectric material 1642.

Figure 16E:
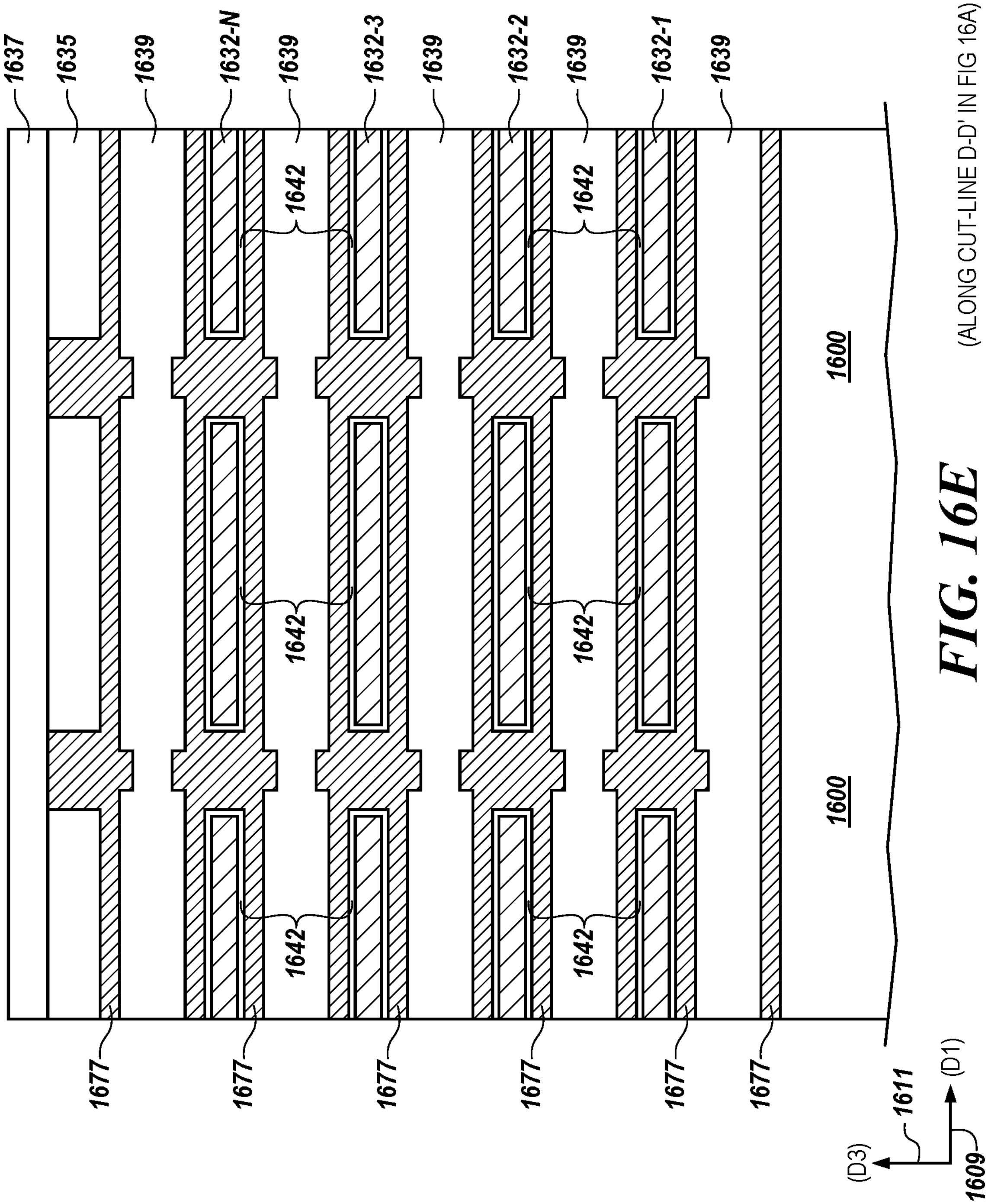

FIG. 16E illustrates a cross sectional view, taken along cut-line D-D' in FIG. 16A in the access device regions, showing another view of the semiconductor structure at this particular point in one example semiconductor fabrication process of an embodiment of the present disclosure. The cross sectional view shown in FIG. 16E is illustrated, right to left in the plane of the drawing sheet, extending in the first direction (D1) 1609 along an axis of the repeating iterations of alternating layers of first dielectric material 1639 and epitaxially grown, single crystalline silicon (Si) material 1632. The epitaxially grown, single crystalline silicon (Si) material 1632 is surrounded by first conductive material 1677 formed on the gate dielectric material 1642. The first conductive material 1677 may fill the spaces adjacent the bridged epitaxially grown, single crystalline silicon (Si)

material 1632. The first conductive material 1677 may be conformally deposited fully around every surface of the epitaxially grown, single crystalline silicon (Si) material 1632, to form gate all around (GAA) gate structures, at the channels of the access device regions. In FIG. 16E, the first conductive material, 1677 is shown filling in the space in the second vertical opening left by the etched second dielectric material 1633.

Figure 17A:
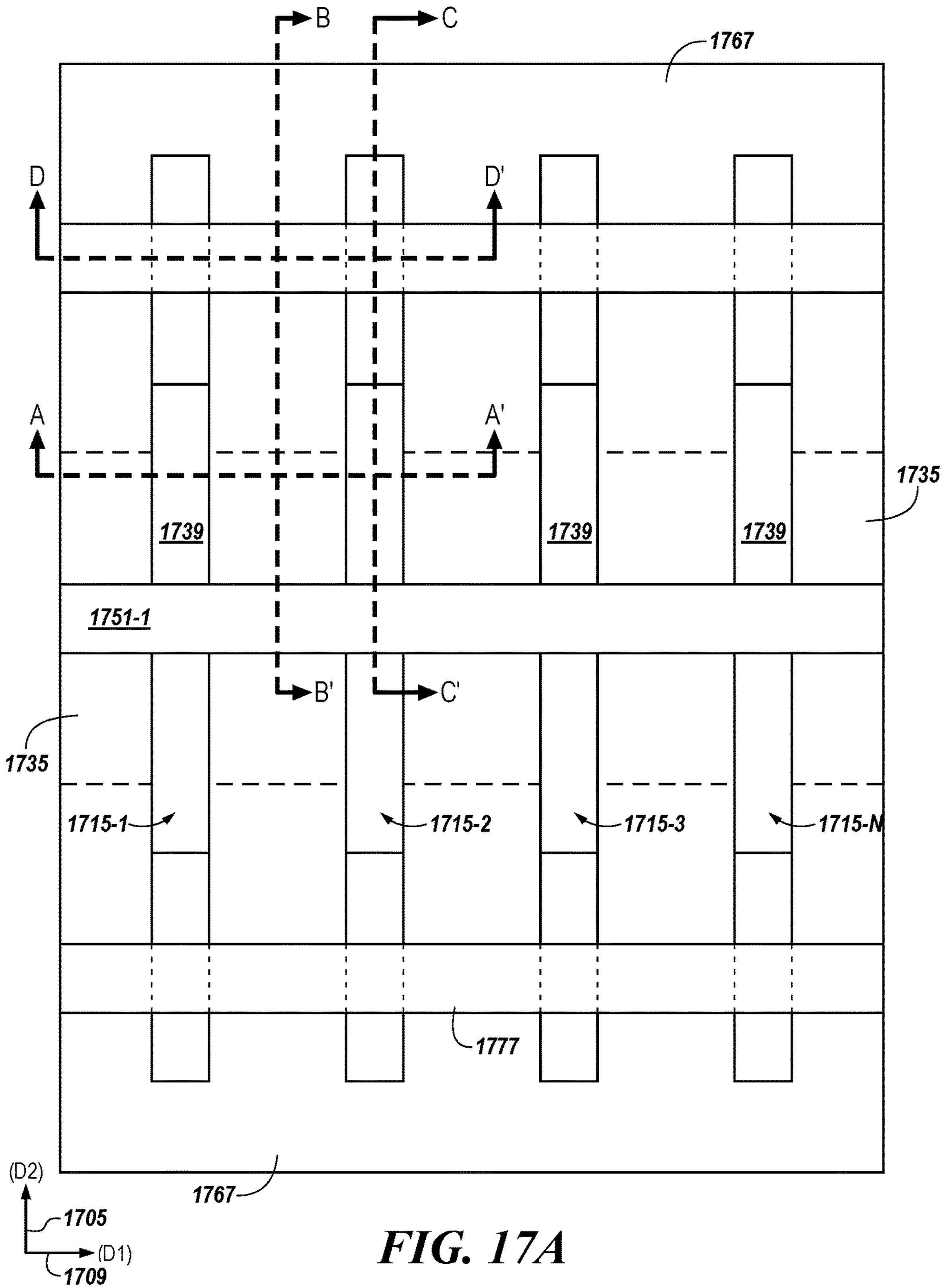
FIGS. 17A to 17E illustrate an example method, at another stage of a semiconductor fabrication process, for forming epitaxial silicon within horizontal access devices in vertical three dimensional (3D) memory, and in accordance with a number of embodiments of the present disclosure.

FIG. 17A illustrates an example method, at another stage of a semiconductor fabrication process, for forming epitaxial silicon within horizontal access devices in vertical three dimensional (3D) memory, such as illustrated in FIGS. 1-3, and in accordance with a number of embodiments of the present disclosure. FIG. 17A illustrates a top down view of a semiconductor structure, at a particular point in time, in a semiconductor fabrication process, according to one or more embodiments. In the example embodiment of FIG. 17A, the method comprises using a photolithographic process to pattern the photolithographic mask 1737 to form fourth vertical opening 1751 adjacent a second region of the epitaxially grown, single crystalline silicon (Si) material 1732 to expose third vertical sidewalls in the stack (e.g., stack shown in FIG. 4). In FIGS. 17A-17E the epitaxially grown, single crystalline silicon (Si) material 1732 is selectively etched in the second horizontal direction to form a plurality of third horizontal openings 1779, in which to form storage nodes, in the second region, e.g., storage node regions in the 3D vertical array of memory cells. Once the epitaxially grown, single crystalline silicon (Si) material 1732 has been removed by selectively etching, second source/drain regions, adjacent channel regions for the horizontal access devices, may be formed in a side surface of the epitaxially grown, single crystalline silicon (Si) material 1732 through gas phase doping from the third horizontal openings 1779.

Figure 17B:
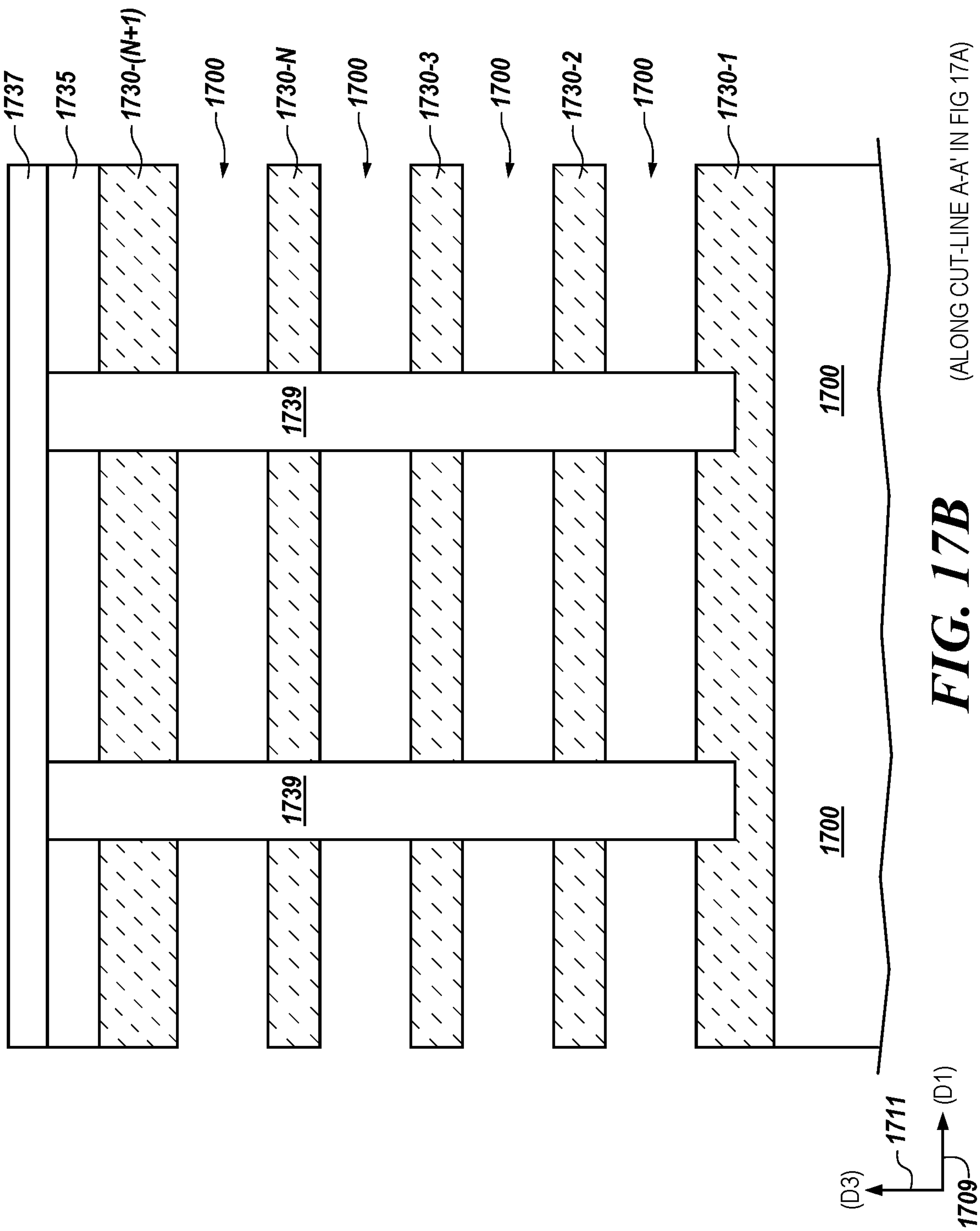

FIG. 17B illustrates a cross sectional view, taken along cut-line A-A' in FIG. 17A in the storage node regions, showing another view of the semiconductor structure at this particular point in one example semiconductor fabrication process of an embodiment of the present disclosure. The cross sectional view shown in FIG. 17B is away from the plurality of separate, horizontal access lines, 1777 and shows bridged, repeating iterations of alternating layers of epitaxially grown silicon germanium (SiGe) 1730 on a semiconductor substrate 1700 bridging openings of the third horizontal openings 1779 to form the vertical stack where the epitaxial silicon material 1732 has been removed to form storage nodes. As shown in FIG. 17B, a vertical direction 1711 is illustrated as a third direction (D3), e.g., z-direction in an x-y-z coordinate system, analogous to the third direction (D3) 1711, among first, second, and third directions, shown in FIGS. 1-3. The plane of the drawing sheet, extending right and left, is in a first direction (D1) 1709. In the example embodiment of FIG. 17B, the materials within the vertical stack—alternating layers of epitaxially grown silicon germanium (SiGe) 1730 are extending into and out of the plane of the drawing sheet in second direction (D2) and along an axis of orientation of the horizontal access devices and horizontal storage nodes of the arrays of vertically stacked memory cells of the three dimensional (3D) memory.

Figure 17C:
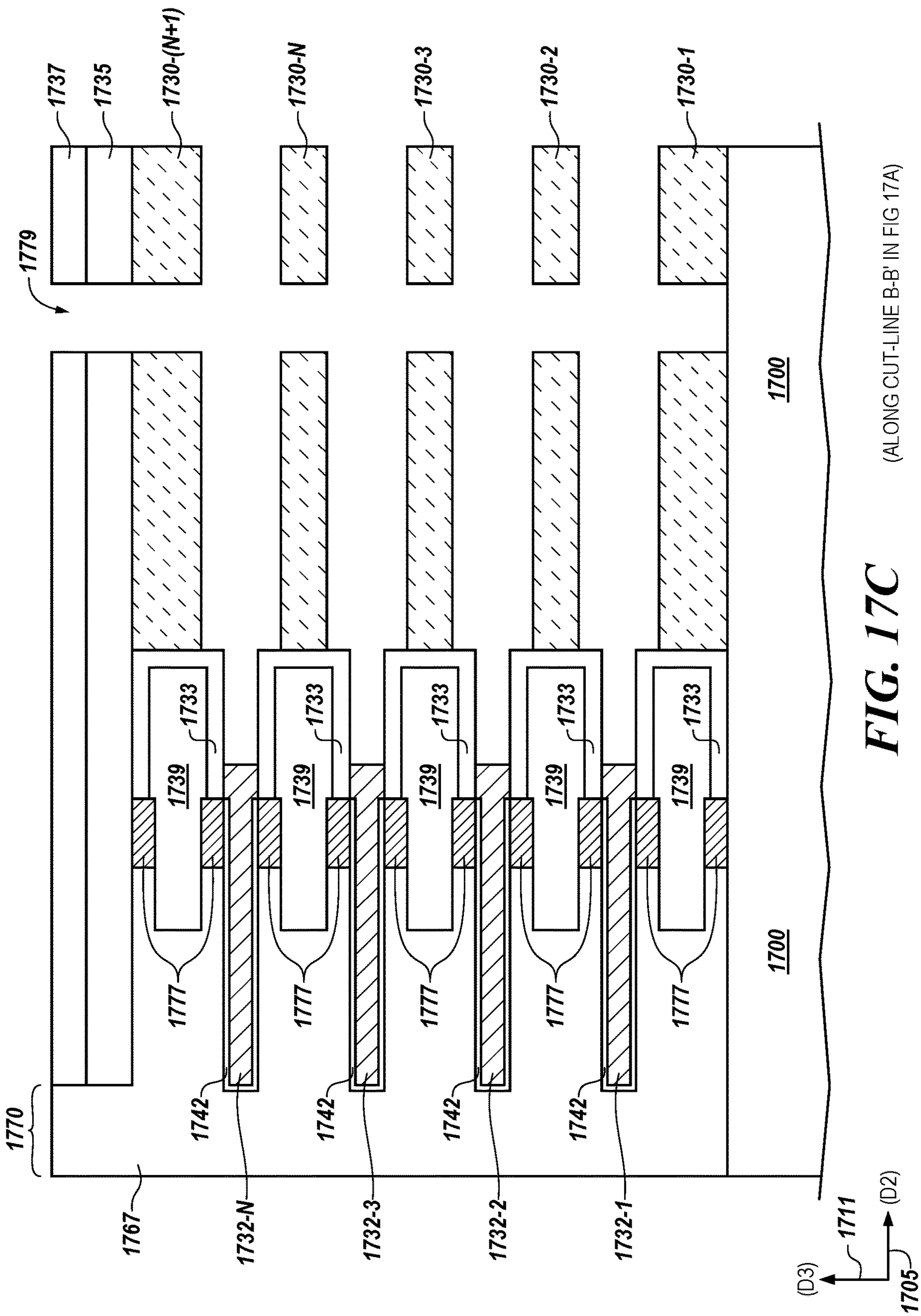

FIG. 17C illustrates a cross sectional view, taken along cut-line B-B' in FIG. 17A, showing another view of the semiconductor structure at this particular point in one example semiconductor fabrication process of an embodiment of the present disclosure. The cross sectional view shown in FIG. 17C is illustrated extending in the second horizontal direction (D2) 1705, left and right along the plane of the drawing sheet, along an axis of the repeating iterations of alternating layers of epitaxially grown silicon germanium (SiGe) 1730, along and in which the horizontally oriented access devices and horizontally oriented storage nodes, e.g., capacitor cells, can be formed within the layers of epitaxially grown, single crystalline silicon (Si) material 1732. As shown in FIG. 17C, a fourth vertical opening 1751 is formed through the vertical stack and the epitaxially grown, single crystalline silicon (Si) material 1732 in the second region 1744 is selectively etched to form the third horizontal openings 1779 in a storage node region in which to form storage nodes, e.g., horizontally oriented capacitor cells (shown next in FIGS. 18A-18E). In one example, an atomic layer etching (ALE) process is used to selectively etch the epitaxially grown, single crystalline silicon (Si) material 1732.

Also shown in FIG. 17C, a source/drain region may be formed by gas phase doping a dopant into a side surface portion of the epitaxially grown, single crystalline silicon (Si) material 1732. In some embodiments, the source/drain region may be a second source/drain region (shown in FIGS. 18A-18E) adjacent storage node regions and on one side of channel regions on an opposite side of channel regions from a first source/drain region connecting to a digit line connection (described in FIGS. 19-22) to the horizontal access devices. In one example, gas phase doping may be used to achieve a highly isotropic e.g., non-directional doping, to form the second source/drain regions for the horizontally oriented access devices. In another example, thermal annealing with doping gas, such as phosphorous (P) may be used with a high energy plasma assist to break the bonding. Embodiments, however, are not so limited and other suitable semiconductor fabrication techniques may be utilized.

Figure 17D:
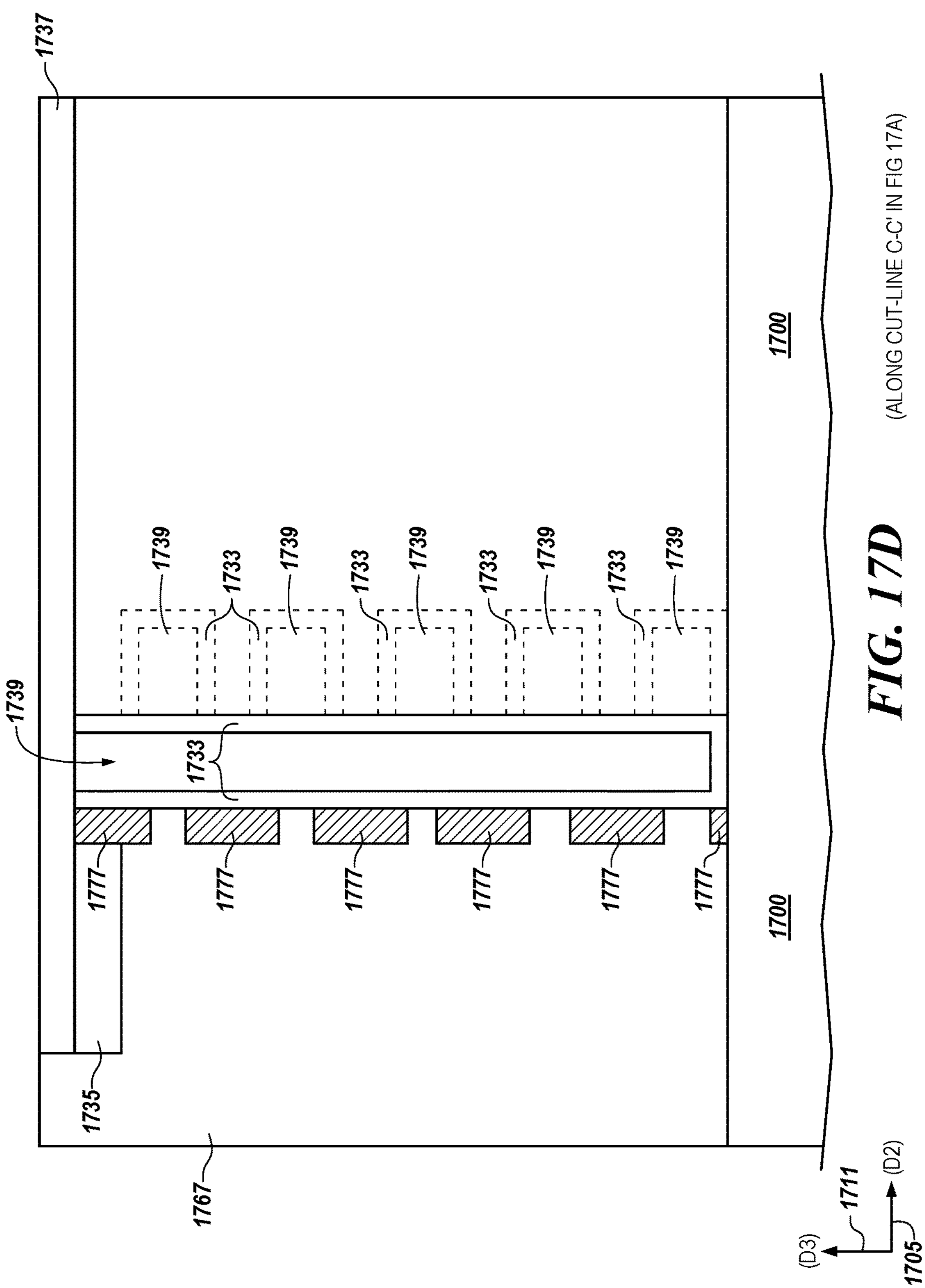

FIG. 17D illustrates a cross sectional view, taken along cut-line C-C' in FIG. 17A, showing another view of the semiconductor structure at this particular point in one example semiconductor fabrication process of an embodiment of the present disclosure. The cross sectional view shown in FIG. 17D is illustrated extending in the second horizontal direction (D2) 1705, left and right in the plane of the drawing sheet, along an axis of the repeating iterations of alternating layers of etched first conductive material 1777 and epitaxially grown, single crystalline silicon (Si) material 1732, outside of a region in which the horizontally oriented access devices and horizontally oriented storage nodes, e.g., capacitor cells, will be formed within the layers of epitaxially grown, single crystalline silicon (Si) material 1732. At the left end of the drawing sheet is shown the repeating iterations of a portion of the first conductive material, 1777 and the epitaxially grown, single crystalline silicon (Si) material 1732 (covered by oxide material 1742), at which location a horizontally oriented first conductive material, e.g., access lines 1777, shown in FIG. 1, et. seq., can be formed. As shown in the cross sectional view of FIG. 17D, an ILD fill material 1767 was deposited into third vertical openings 1770 and filled the continuous second horizontal openings 1743 on the gate dielectric material 1742 and up to the first conductive material 1777.

Figure 17E:
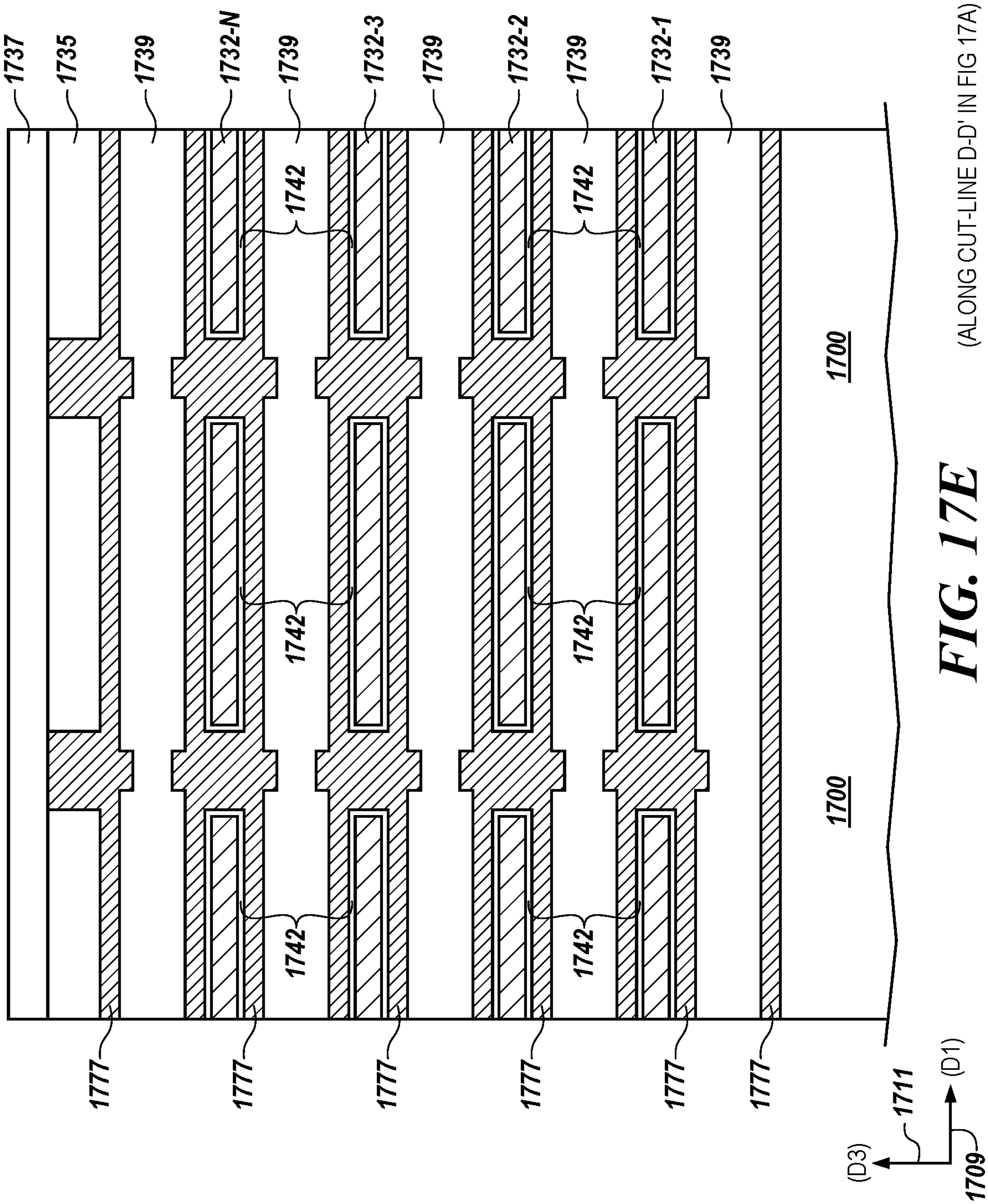

FIG. 17E illustrates a cross sectional view, taken along cut-line D-D' in FIG. 17A, showing another view of the semiconductor structure at this particular point in one example semiconductor fabrication process of an embodiment of the present disclosure. The cross sectional view shown in FIG. 17E is illustrated, right to left in the plane of the drawing sheet, extending in the first direction (D1) 1709 along an axis of the repeating iterations of alternating layers of first dielectric material 1739 bridging epitaxially grown, single crystalline silicon (Si) material 1732 wrapped in a gate dielectric material 1742 surrounded by first conductive material 1777. The first conductive material 1777 may be conformally deposited fully around every surface of the epitaxially grown, single crystalline silicon (Si) material 1732, to form gate all around (GAA) gate structures, at channel regions of the horizontal access devices. In FIG. 17E, the first conductive material, 1777 is shown filling in the space formed by the selective etch that created the second vertical openings and left by the etched second dielectric material 1733.

Figure 18A:
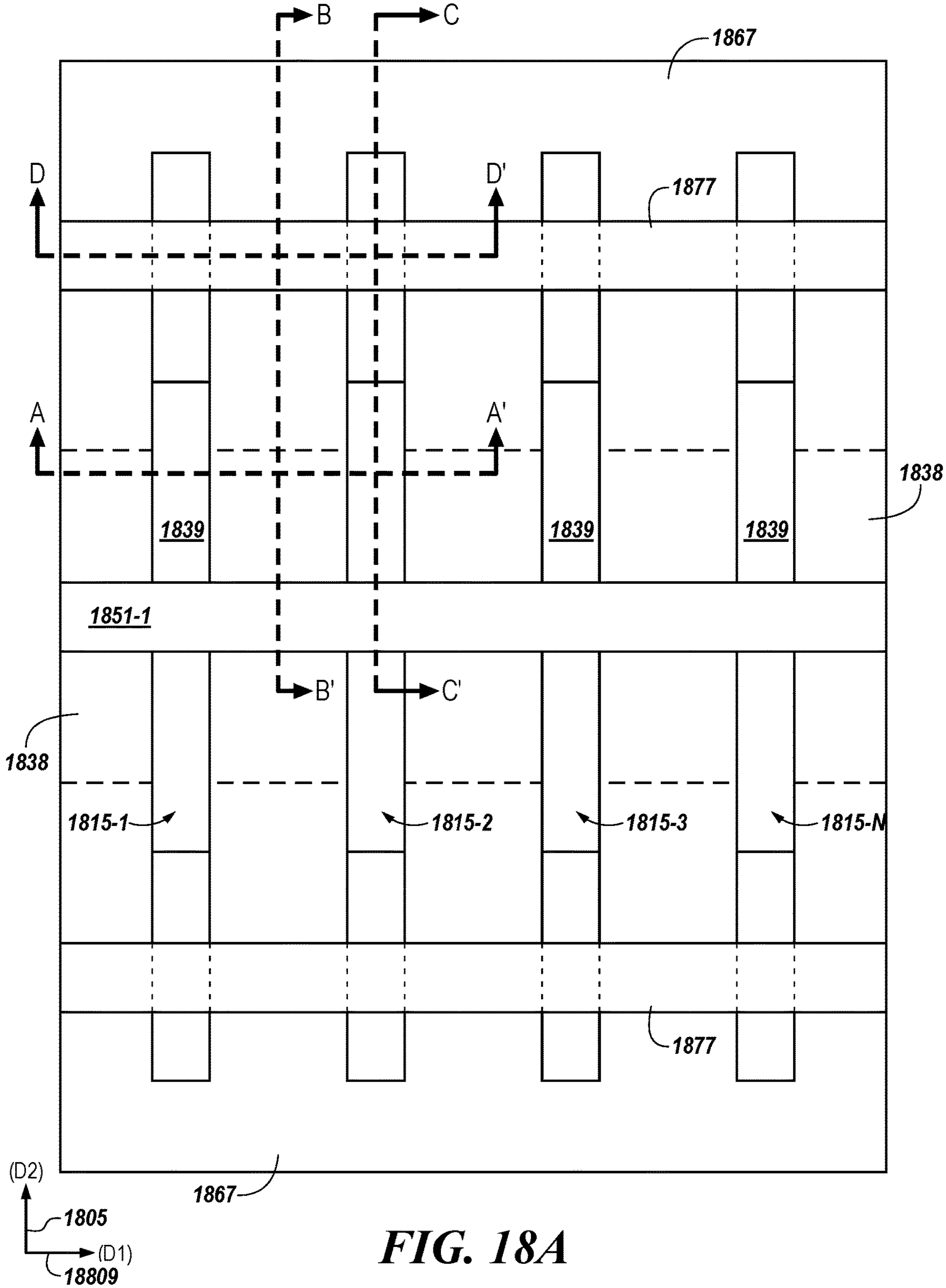
FIGS. 18A to 18E illustrate an example method, at another stage of a semiconductor fabrication process, for forming epitaxial silicon within horizontal access devices in vertical three dimensional (3D) memory, and in accordance with a number of embodiments of the present disclosure.

FIG. 18A illustrates an example method, at another stage of a semiconductor fabrication process, for forming epitaxial silicon within horizontal access devices in vertical three dimensional (3D) memory, such as illustrated in FIGS. 1-3, and in accordance with a number of embodiments of the present disclosure. FIG. 18A illustrates a top down view of a semiconductor structure, at a particular point in time, in a semiconductor fabrication process, according to one or more embodiments. In the example embodiment of FIG. 18A, a sacrificial oxide material 1838 replaces the photolithographic mask 1837 around the fourth vertical opening 1851. The fourth vertical opening 1851 is formed using a photolithographic etchant process through the vertical stack and extending predominantly in the first horizontal direction (D1) 1809. The fourth vertical opening 1851 has been formed through the stack adjacent storage node regions of the vertical 3D memory in order to form storage nodes. The method in FIGS. 18A-18E illustrate storage node formation, e.g., horizontally oriented capacitor cells, in the third horizontal openings (1779 in FIGS. 17B and 17C).

Figure 18B:
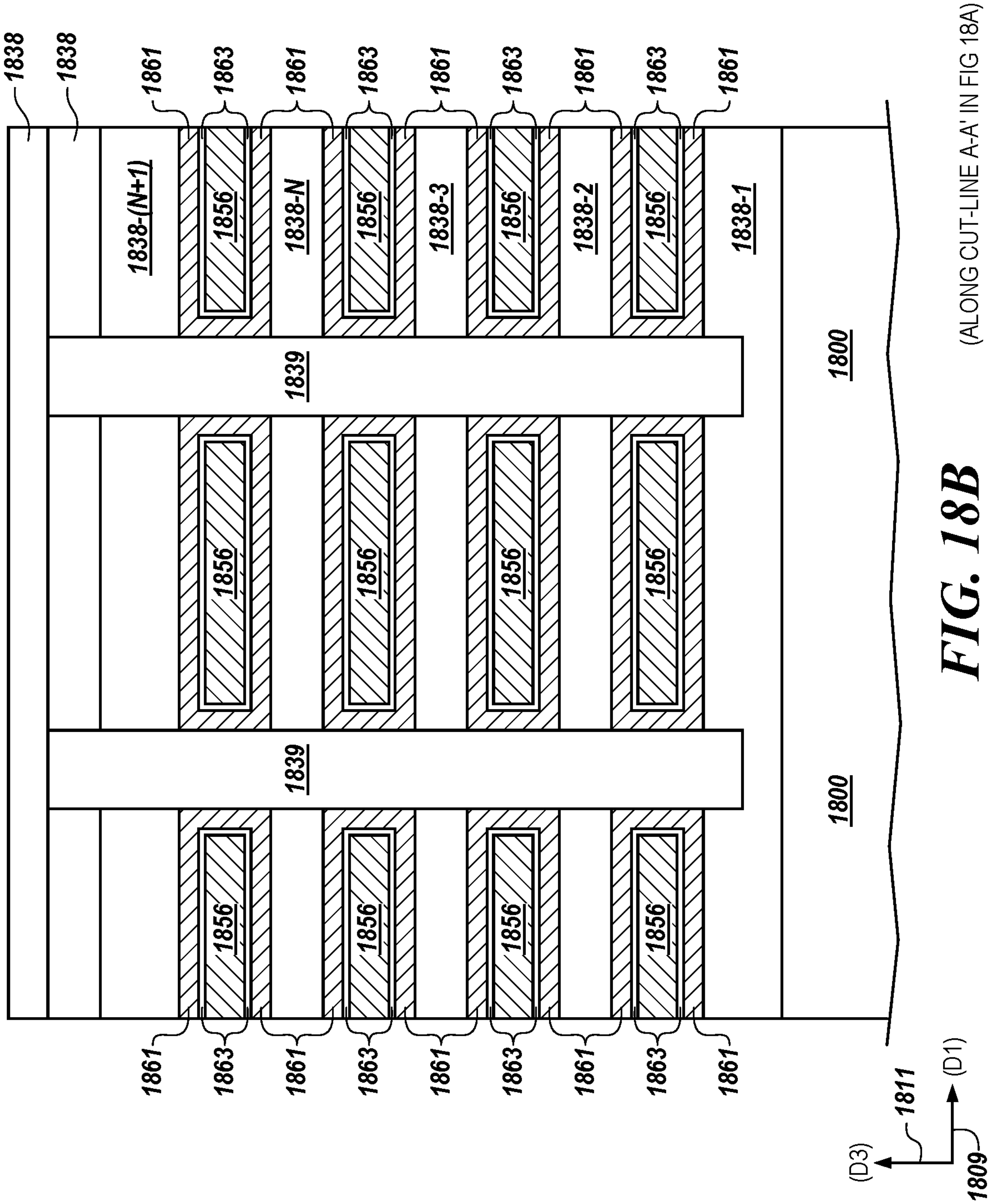

FIG. 18B illustrates a cross sectional view, taken along cut-line A-A' in FIG. 18A, showing another view of the semiconductor structure at this particular point in one example semiconductor fabrication process of an embodiment of the present disclosure. The cross sectional view shown in FIG. 18B is away from the plurality of separate, horizontal access lines, 1877, and shows repeating iterations of alternating layers of a sacrificial oxide material 1838 separated by completed formation of the horizontally oriented capacitor cells. Sacrificial oxide material 1838 may be formed from an oxide or other suitable spin on dielectric (SOD) or ILD fill material. As will be shown and described more in connection with FIG. 18C, the completed horizontally oriented capacitor cells are shown in this cross sectional view having first electrodes 1861, e.g., bottom cell contact electrodes, cell dielectrics 1863, and second electrodes 1856, e.g., top, common node electrodes, on a semiconductor substrate 1800 to form the vertical stack. As shown in FIG. 18B, a vertical direction 1811 is illustrated as a third direction (D3), e.g., z-direction in an x-y-z coordinate system, analogous to the third direction (D3) 1811, among first, second, and third directions, shown in FIGS. 1-3. The plane of the drawing sheet, extending right and left, is in a first direction (D1) 1809. In the example embodiment of FIG. 18B, the first electrodes 1861, e.g., bottom electrodes to be coupled to source/drain regions of horizontal access devices, and second electrodes 1856 are illustrated separated by a cell dielectric material 1863 extending into and out of the plane of the drawing sheet in second direction (D2) and along an axis of orientation of the horizontal access devices and horizontal storage nodes of the arrays of vertically stacked memory cells of the three dimensional (3D) memory.

Figure 18C:
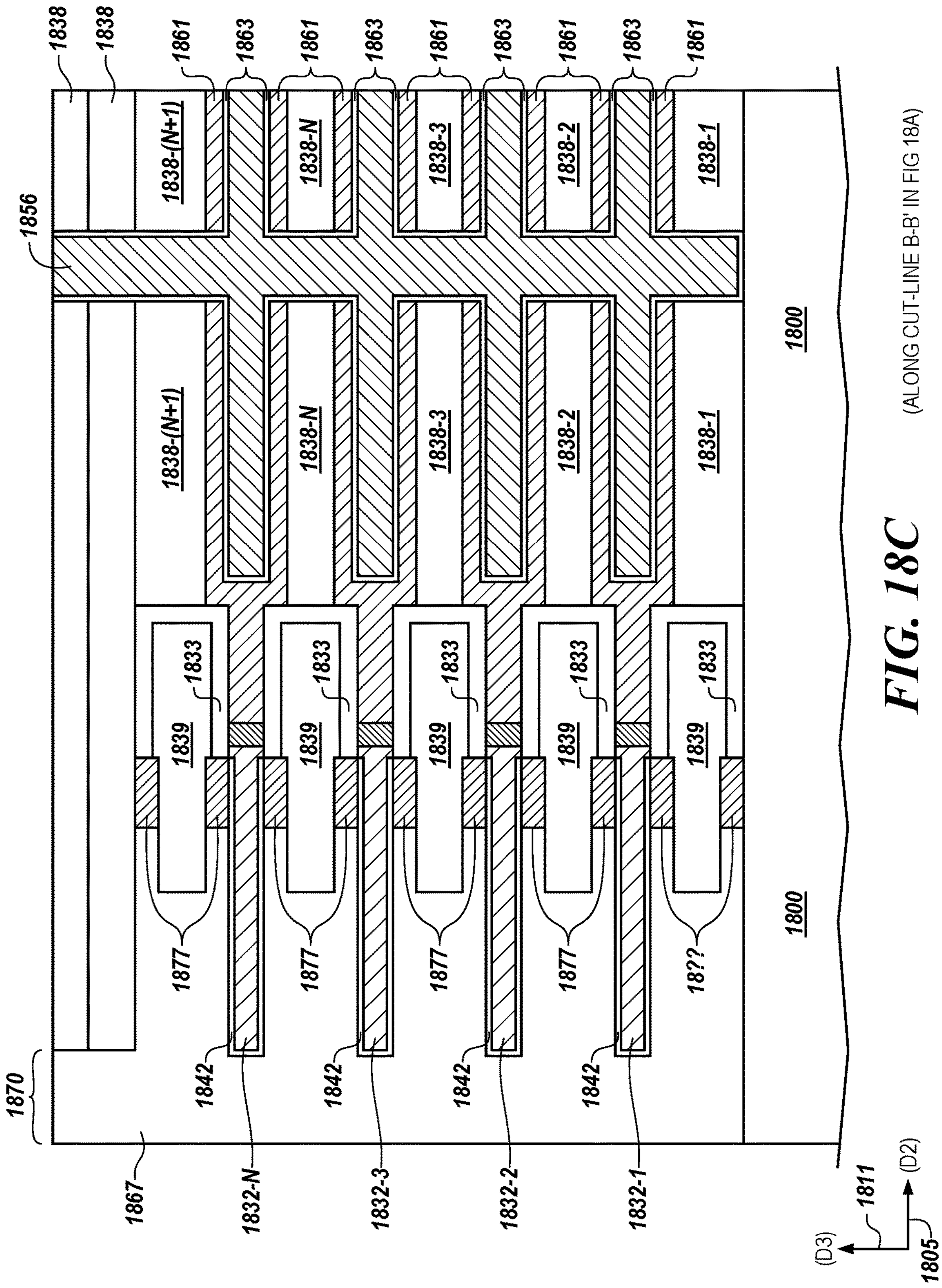

FIG. 18C illustrates a cross sectional view, taken along cut-line B-B' in FIG. 18A, showing another view of the semiconductor structure at this particular point in one example semiconductor fabrication process of an embodiment of the present disclosure. The cross sectional view shown in FIG. 18C is illustrated extending in the second horizontal direction (D2) 1805, left and right along the plane of the drawing sheet, along an axis of the repeating iterations of alternating layers of sacrificial oxide material 1838 and epitaxially grown, single crystalline silicon (Si) material 1832 along and in which the horizontally oriented access devices and horizontally oriented storage nodes, e.g., capacitor cells, can be formed within the layers of epitaxially grown, single crystalline silicon (Si) material 1832.

In the example embodiment of FIG. 18C, the horizontally oriented storage nodes, e.g., capacitor cells, are illustrated as having been formed in this semiconductor fabrication process and first electrodes 1861, e.g., bottom electrodes to be coupled to source/drain regions of horizontal access devices, and second electrodes 1856, e.g., top electrodes to be coupled to a common electrode plane such as a ground plane, separated by cell dielectrics 1863, are shown. However, embodiments are not limited to this example. In other embodiments, the first electrodes 1861, e.g., bottom electrodes to be coupled to source/drain regions of horizontal access devices, and second electrodes 1856, e.g., top electrodes to be coupled to a common electrode plane such as a ground plane, separated by cell dielectrics 1863, may be formed subsequent to forming a first source/drain region, a channel region, and a second source/drain region in a region of the epitaxially grown, single crystalline silicon (Si) material 1832, intended for location, e.g., placement formation, of the horizontally oriented access devices, described next.

In the example embodiment of FIG. 18C, the horizontally oriented storage nodes having the first electrodes 1861, e.g., bottom electrodes to be coupled to source/drain regions of horizontal access devices, and second electrodes 1856, e.g., top electrodes to be coupled to a common electrode plane such as a ground plane, are shown formed in a second horizontal opening, extending in second direction (D2) 1805, left and right in the plane of the drawing sheet, a third distance from the fourth vertical opening, e.g., 1851 in FIG. 18B, formed in the vertical stack, and along an axis of orientation of the horizontal access devices and horizontal storage nodes of the arrays of vertically stacked memory cells of the three dimensional (3D) memory.

Figure 18D:
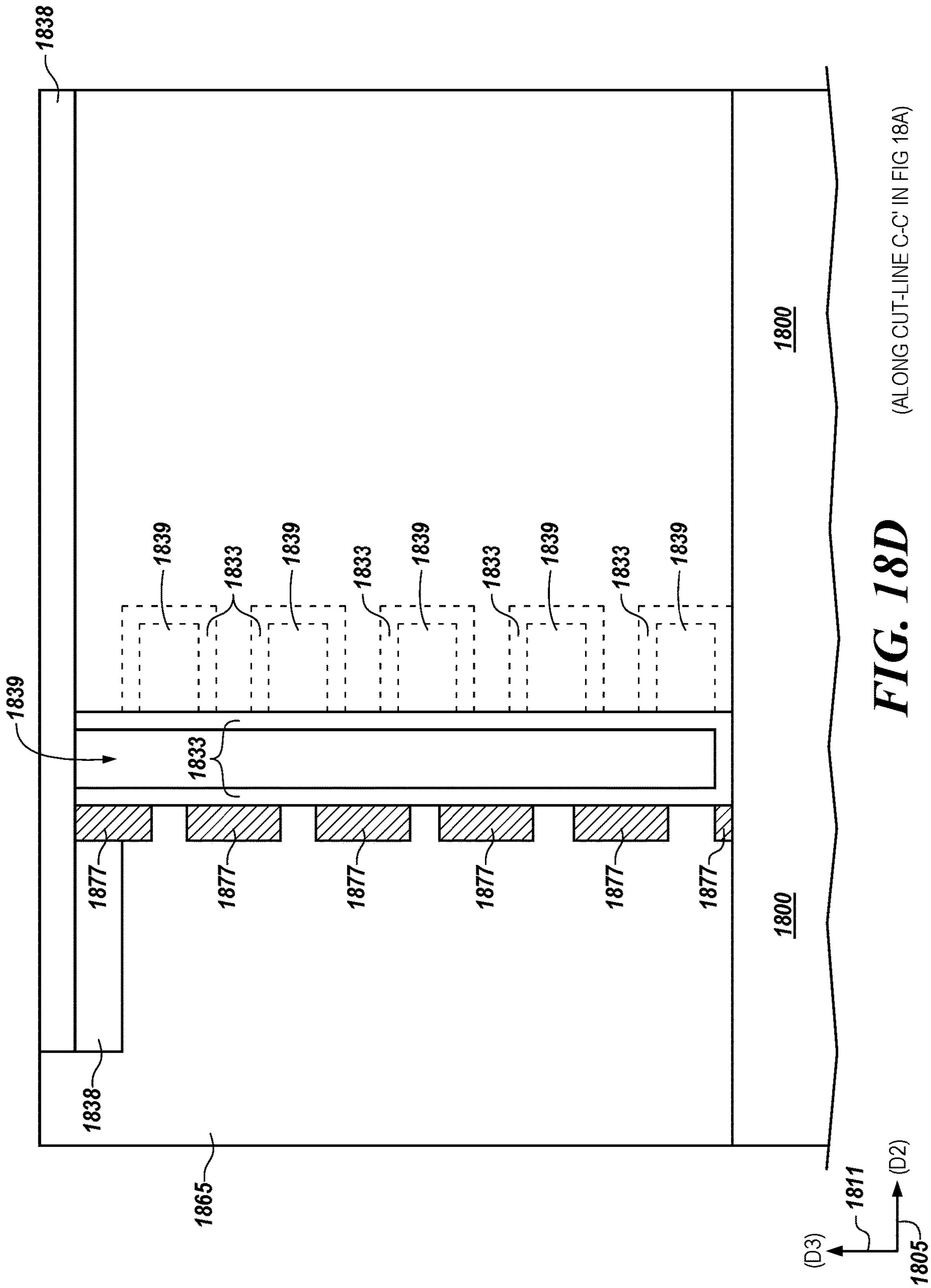

FIG. 18D illustrates a cross sectional view, taken along cut-line C-C' in FIG. 18A, showing another view of the semiconductor structure at this particular point in one example semiconductor fabrication process of an embodiment of the present disclosure. The cross sectional view shown in FIG. 18D is illustrated extending in the second horizontal direction (D2) 1805, left and right in the plane of the drawing sheet, along an axis of the repeating iterations of alternating layers of etched first conductive material 1877 and epitaxially grown, single crystalline silicon (Si) material 1832, outside of a region in which the horizontally oriented access devices and horizontally oriented storage nodes, e.g., capacitor cells, will be formed within the layers of epitaxially grown, single crystalline silicon (Si) material 1832. At the left end of the drawing sheet is shown the repeating iterations of a portion of the first conductive material, 1877 and the epitaxially grown, single crystalline silicon (Si) material 1832 (covered by oxide material 1842), at which location a horizontally oriented first conductive material, e.g., access lines 1877, shown in FIG. 1, et. seq., can be formed.

Figure 18E:
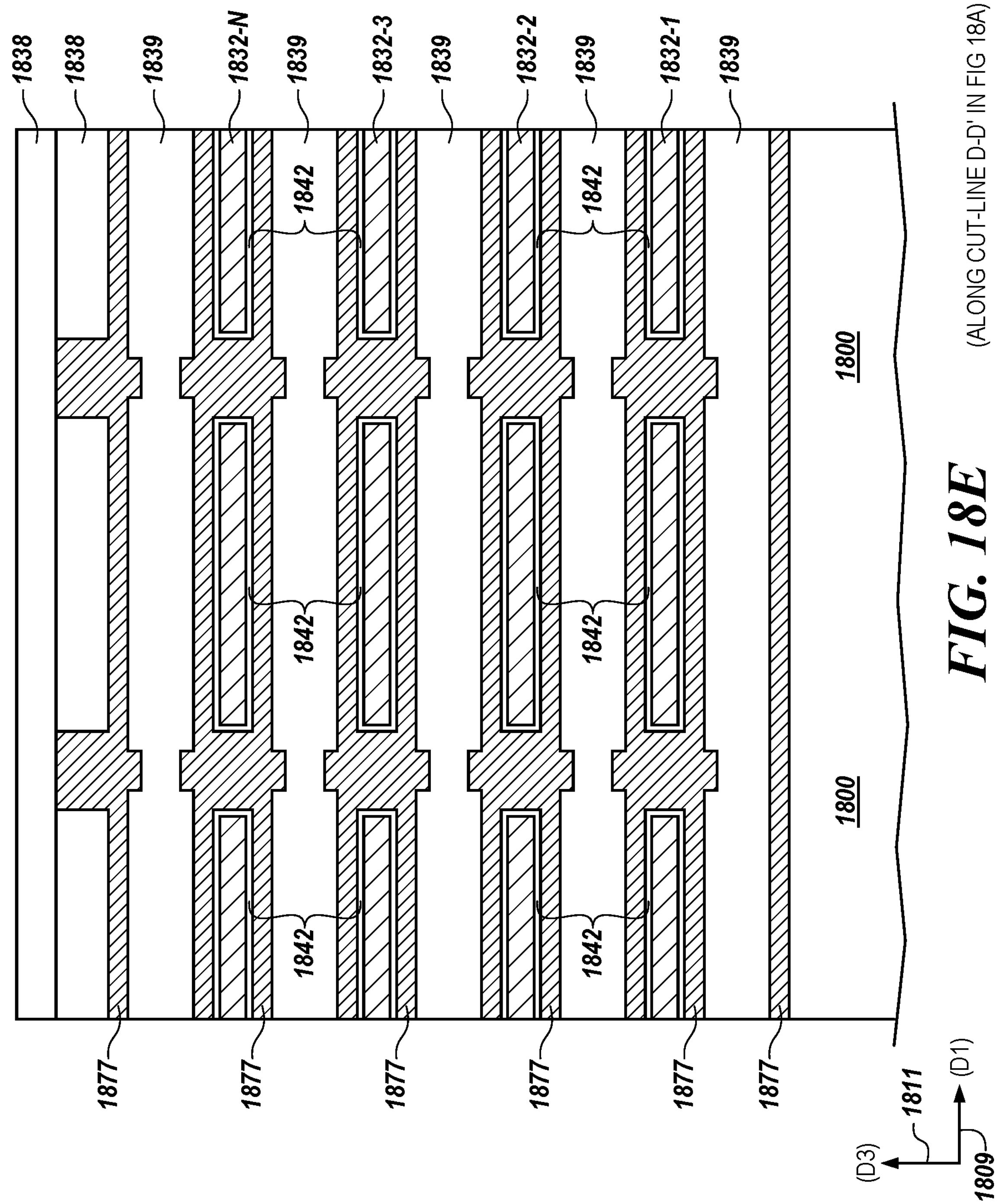

FIG. 18E illustrates a cross sectional view, taken along cut-line D-D' in FIG. 18A, showing another view of the semiconductor structure at this particular point in one example semiconductor fabrication process of an embodiment of the present disclosure. The cross sectional view shown in FIG. 18E is illustrated, right to left in the plane of the drawing sheet, extending in the first direction (D1) 1809 along an axis of the repeating iterations of alternating layers of first dielectric material 1839 and epitaxially grown, single crystalline silicon (Si) material 1832 wrapped in an oxide material 1842 surrounded by first conductive material 1877 entwined with a gate dielectric material. The first conductive material 1877 may be conformally deposited fully around every surface of the epitaxially grown, single crystalline silicon (Si) material 1832, to form gate all around (GAA) gate structures, at the channels of the access device regions. In FIG. 18E, the first conductive material, 1877 is shown filling in the space in the second vertical opening left by the etched second dielectric material.

Figure 19A:
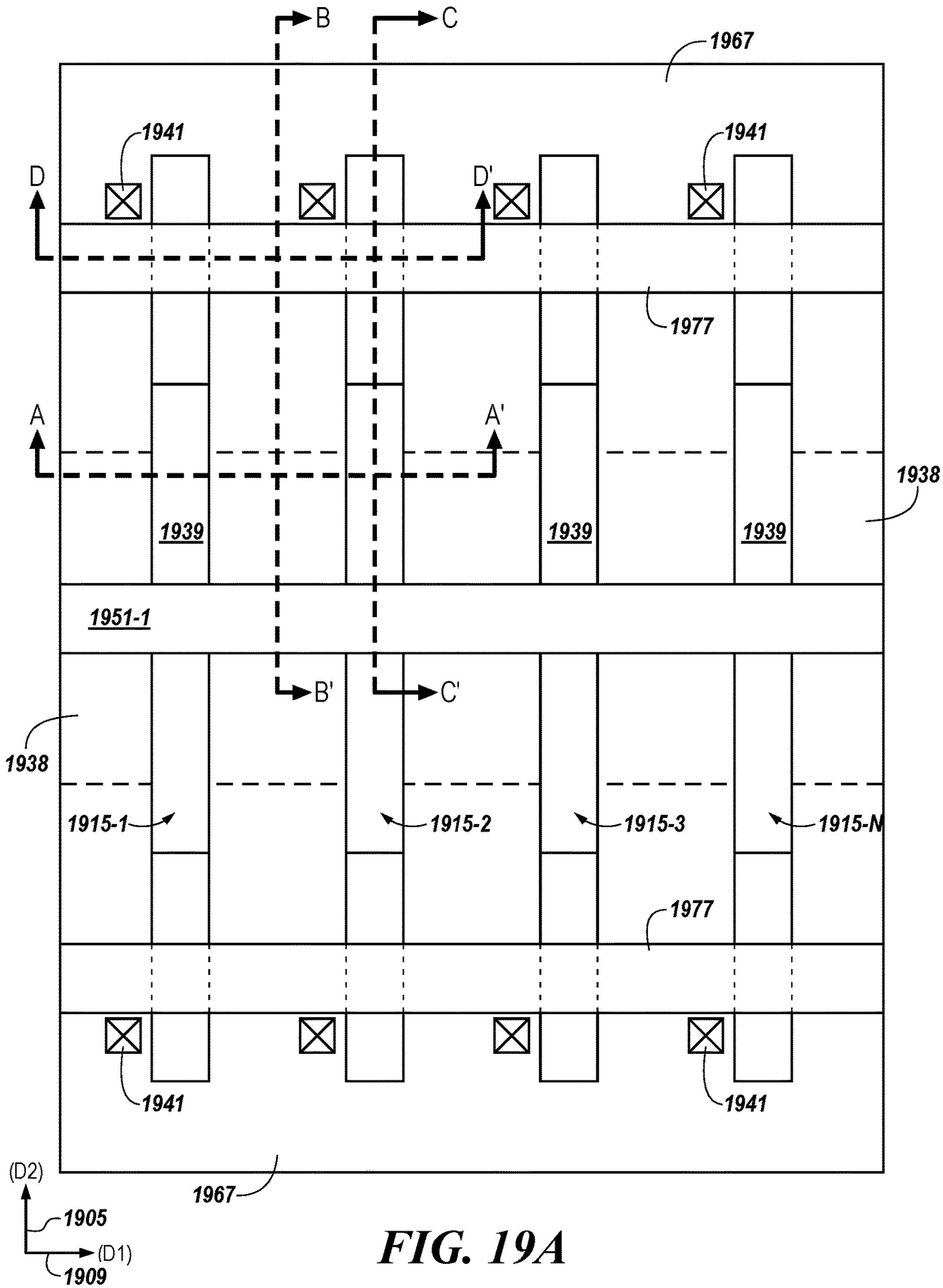
FIGS. 19A to 19E illustrate an example method, at another stage of a semiconductor fabrication process, for forming epitaxial silicon within horizontal access devices in vertical three dimensional (3D) memory, in accordance with a number of embodiments of the present disclosure.

FIG. 19A illustrates an example method, at another stage of a semiconductor fabrication process, for forming epitaxial silicon within horizontal access devices in vertical three dimensional (3D) memory, such as illustrated in FIGS. 1-3, and in accordance with a number of embodiments of the present disclosure. FIG. 19A illustrates a top down view of a semiconductor structure, at a particular point in time, in a semiconductor fabrication process, according to one or more embodiments.

The method in FIG. 19A further illustrates using one or more etchant processes to form fourth vertical opening 1951 in a storage node region through the vertical stack and extending predominantly in the first horizontal direction (D1) 1909. The one or more etchant processes forms a fourth vertical opening 1951 to expose third sidewalls in the repeating iterations of alternating layers of second electrodes 1956 and sacrificial oxide material 1938, in the vertical stack, adjacent a second region of the epitaxially grown, single crystalline silicon (Si) material.

Figure 19B:
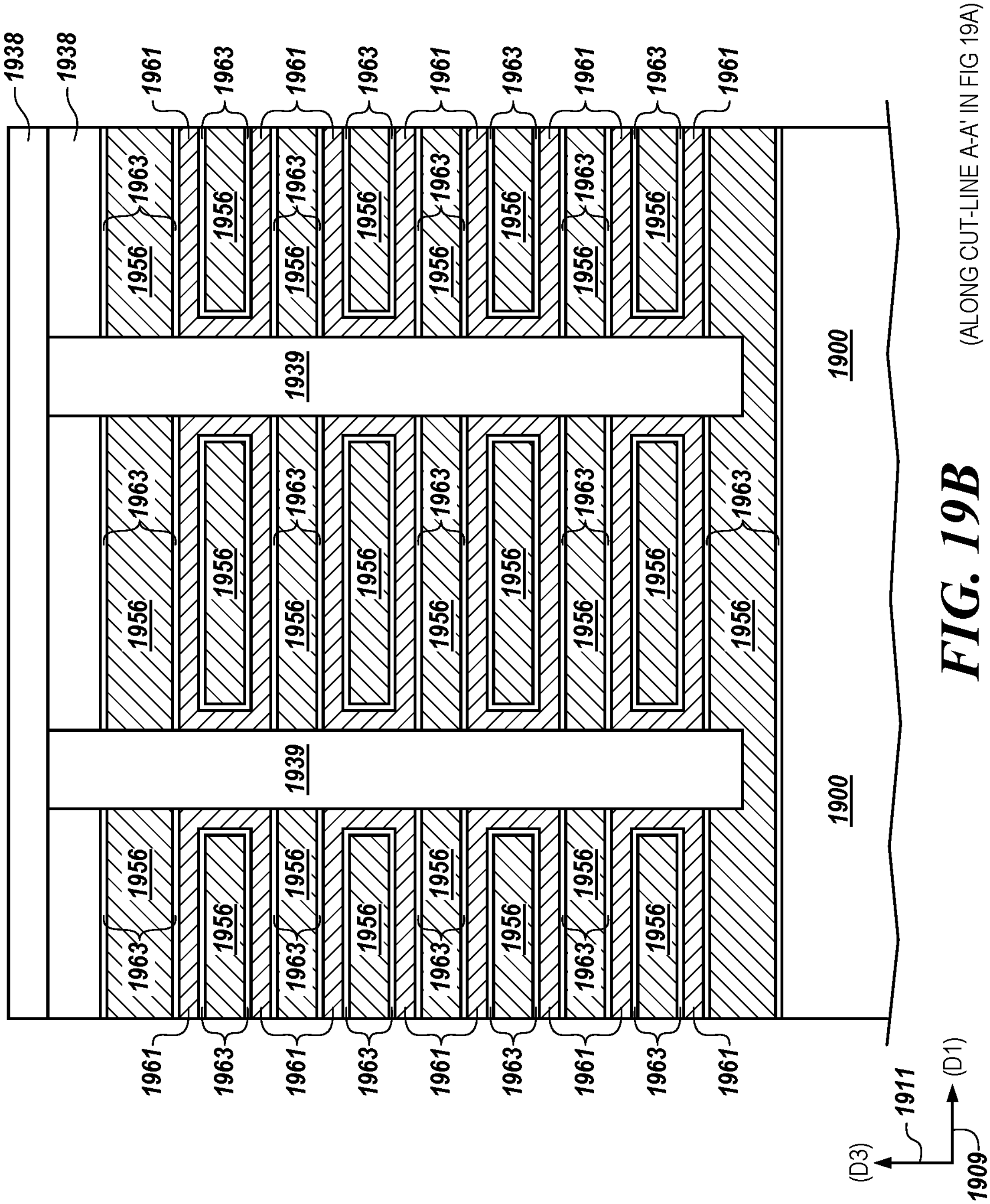

FIG. 19B illustrates a cross sectional view, taken along cut-line A-A' in FIG. 19A, showing another view of the semiconductor structure at this particular point in one example semiconductor fabrication process of an embodiment of the present disclosure. The cross sectional view shown in FIG. 19B is away from the plurality of separate, horizontal access lines 1977, and shows repeating iterations of alternating layers of second electrodes 1956 separated by horizontally oriented capacitor cells having first electrodes 1961, e.g., bottom cell contact electrodes, cell dielectrics 1963, and top, common node electrodes, on a semiconductor substrate 1900 to form the vertical stack. As shown in FIG. 8B, a vertical direction 1911 is illustrated as a third direction (D3), e.g., z-direction in an x-y-z coordinate system, analogous to the third direction (D3) 1911, among first, second, and third directions, shown in FIGS. 1-3. The plane of the drawing sheet, extending right and left, is in a first direction (D1) 1909. In the example embodiment of FIG. 19B, the first electrodes 1961, e.g., bottom electrodes to be coupled to source/drain regions of horizontal access devices, and second electrodes 1956 are illustrated separated by a cell dielectric material 1963 extending into and out of the plane of the drawing sheet in second direction (D2) and along an axis of orientation of the horizontal access devices and horizontal storage nodes of the arrays of vertically stacked memory cells of the three dimensional (3D) memory.

Figure 19C:
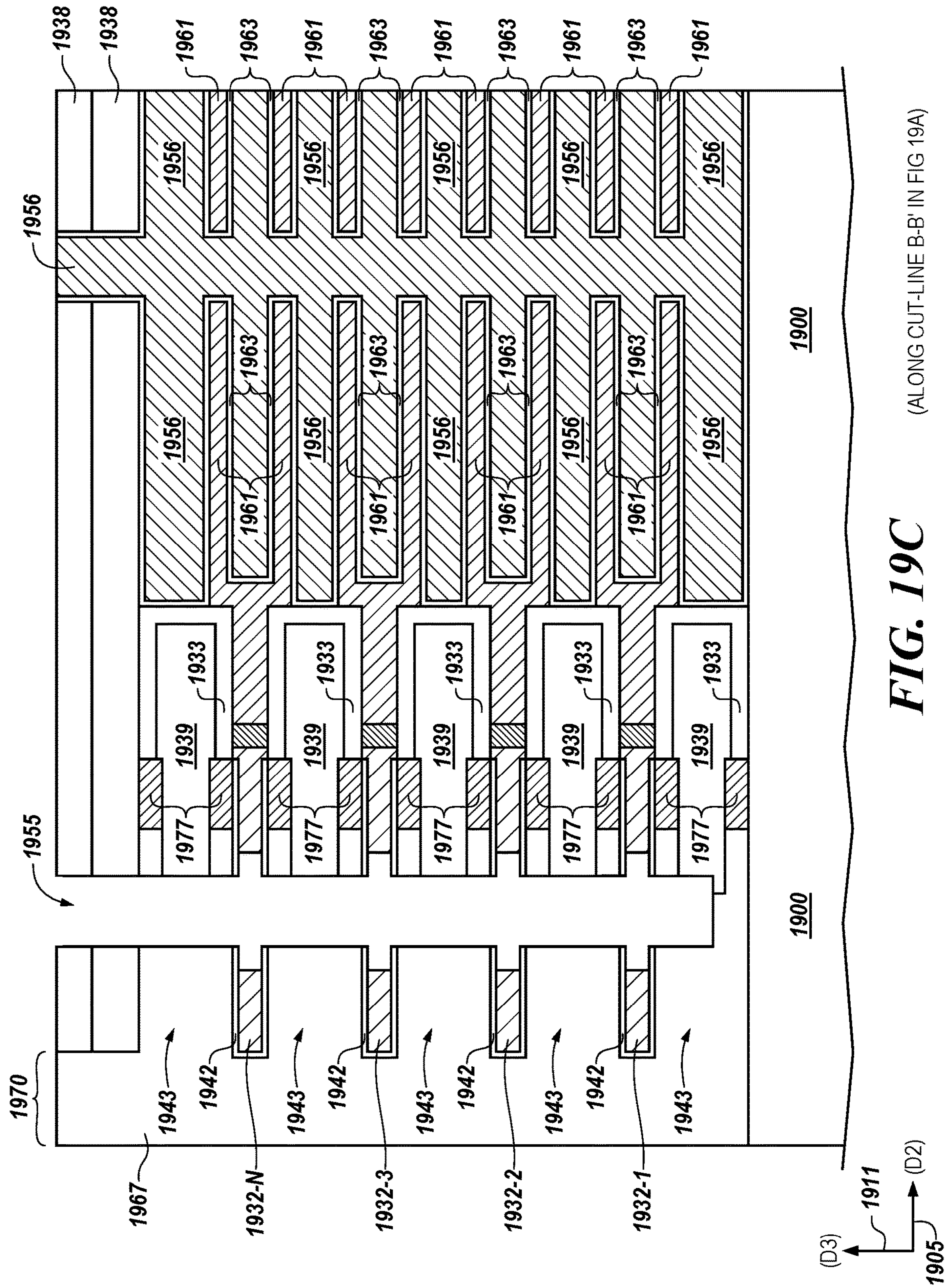

FIG. 19C illustrates a cross sectional view, taken along cut-line B-B' in FIG. 19A, showing another view of the semiconductor structure at this particular point in one example semiconductor fabrication process of an embodiment of the present disclosure. The cross sectional view shown in FIG. 19C is illustrated extending in the second horizontal direction (D2) 1905, left and right along the plane of the drawing sheet, along an axis of the repeating iterations of alternating layers of second electrodes 1956 along and in which the horizontally oriented access devices and horizontally oriented storage nodes, e.g., capacitor cells, can be formed within the layers of epitaxially grown, single crystalline silicon (Si) material 1932.

In the example embodiment of FIG. 19C, the horizontally oriented storage nodes, e.g., capacitor cells, are illustrated as having been formed been formed in this semiconductor fabrication process and first electrodes 1961, e.g., bottom electrodes to be coupled to source/drain regions of horizontal access devices, and second electrodes 1956, e.g., top electrodes to be coupled to a common electrode plane such as a ground plane, separated by cell dielectrics 1963, are shown. In this embodiment, a dual-sided capacitor is illustrated as an alternative to the single-sided capacitor. However, embodiments are not limited to this example. In other embodiments, the first electrodes 1961, e.g., bottom electrodes to be coupled to source/drain regions of horizontal access devices, and second electrodes 1956, e.g., top electrodes to be coupled to a common electrode plane such as a ground plane, separated by cell dielectrics 1963, may be formed subsequent to forming a first source/drain region, a channel region, and a second source/drain region in a region of the epitaxially grown, single crystalline silicon (Si) material 1932, intended for location, e.g., placement formation, of the horizontally oriented access devices, described next.

In the example embodiment of FIG. 19C, the horizontally oriented storage nodes having the first electrodes 1961, e.g., bottom electrodes to be coupled to source/drain regions of horizontal access devices, and second electrodes 1956, e.g., top electrodes to be coupled to a common electrode plane such as a ground plane, are shown formed in a third horizontal opening, extending in second direction (D2) 1905, left and right in the plane of the drawing sheet, a third distance from the vertical opening formed in the vertical stack, e.g., 401 in FIG. 4, and along an axis of orientation of the horizontal access devices and horizontal storage nodes of the arrays of vertically stacked memory cells of the three dimensional (3D) memory. In FIG. 19C, a neighboring, horizontal access line 1977 is illustrated adjacent the second dielectric material 1933, with a portion of the first conductive material 1977-1 located above the epitaxially grown, single crystalline silicon (Si) material 1932, and a portion of the first conductive material 1977-2 located below the epitaxially grown, single crystalline silicon (Si) material 1932 indicating a location set inward from the plane and orientation of the drawing sheet.

The second source drain region may be formed by gas phase doping a dopant in a side surface of the epitaxially grown, single crystalline silicon (Si) material 1932 from the third horizontal openings to form second source/drain regions horizontally adjacent the channel region; and depositing horizontally oriented capacitor cells having a bottom electrode formed in electrical contact with the second source/drain regions. In some embodiments, an ILD fill material 1967 may be deposited into third vertical openings 1970 and filling the continuous second horizontal openings 1943 up to the unetched portions of the oxide material 1942 and fourth vertical opening where the second conductive material 1941 is coupled with the metal material 1971.

In some embodiments, an ILD fill material 1967 may be deposited into third vertical openings 1970 and filling the continuous second horizontal openings up to the unetched portions of the oxide material 1942 and opening 1955.

Fourth vertical opening 1981 may be where the second conductive material may be subsequently deposited.

Figure 19D:
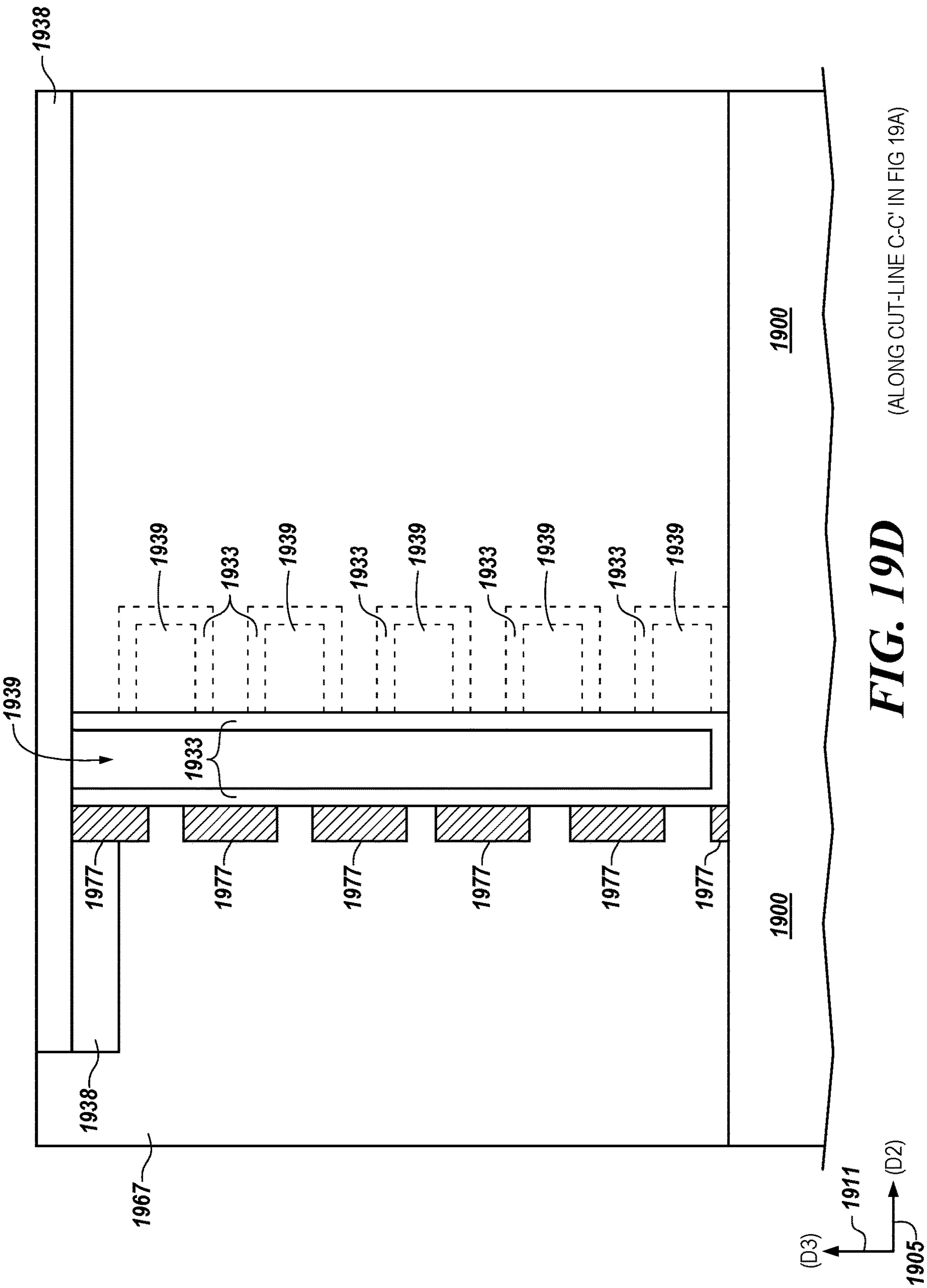

FIG. 19D illustrates a cross sectional view, taken along cut-line C-C' in FIG. 19A, showing another view of the semiconductor structure at this particular point in one example semiconductor fabrication process of an embodiment of the present disclosure. The cross sectional view shown in FIG. 19D is illustrated extending in the second horizontal direction (D2) 1905, left and right in the plane of the drawing sheet. At the left end of the drawing sheet is shown the repeating iterations of alternating layers of a portion of the first conductive material 1977. In some embodiments, an ILD fill material 1967 may be deposited into third vertical openings 1970 and filling the continuous second horizontal openings up to the unetched portions of the oxide material 1942 and opening 1955. Opening 1955 may be where the second conductive material may be subsequently deposited.

Figure 19E:
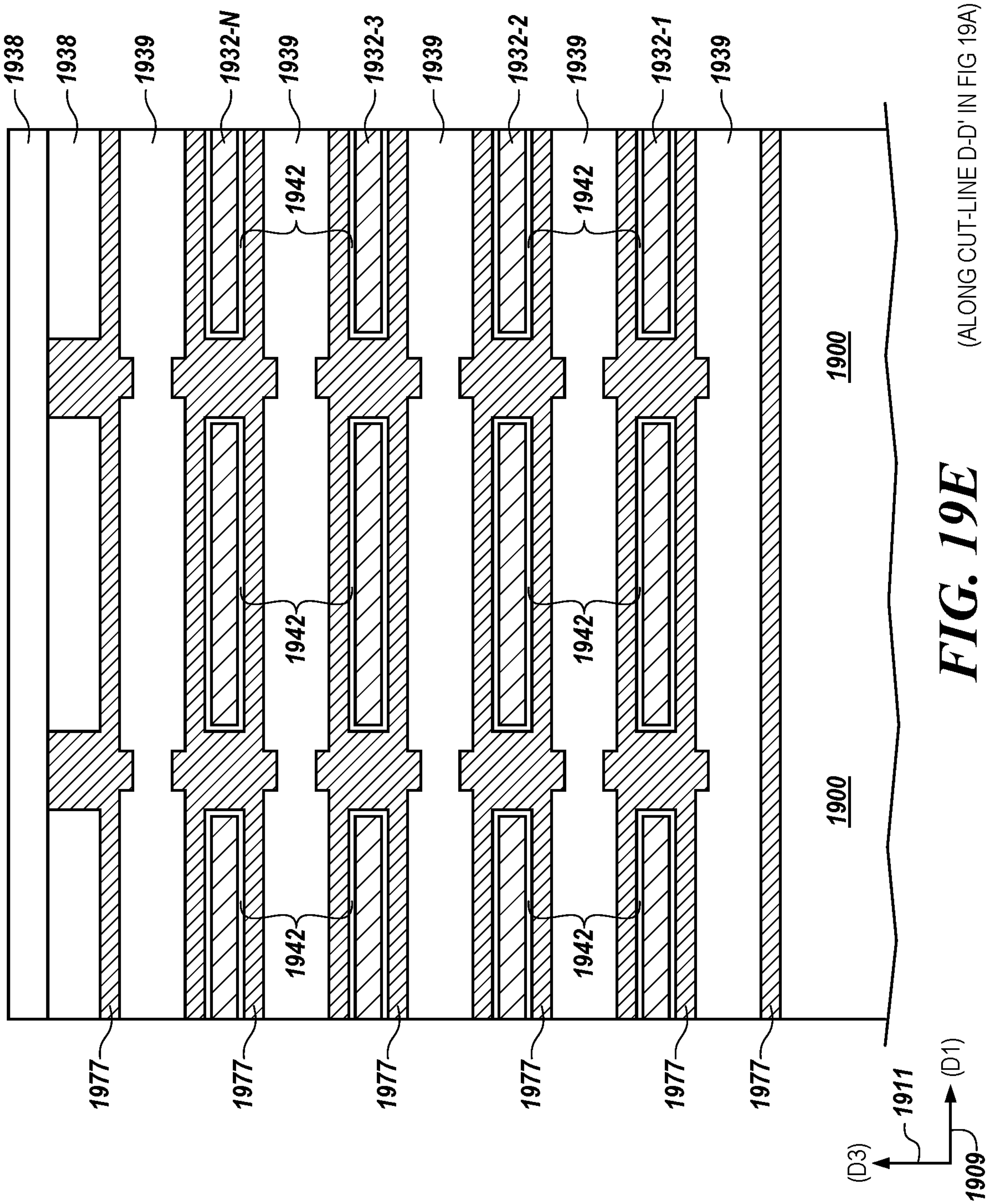

FIG. 19E illustrates a cross sectional view, taken along cut-line D-D' in FIG. 19A, showing another view of the semiconductor structure at this particular point in one example semiconductor fabrication process of an embodiment of the present disclosure. The cross sectional view shown in FIG. 19E is illustrated, right to left in the plane of the drawing sheet, extending in the first direction (D1) 1909 along an axis of the repeating iterations of alternating layers of epitaxially grown, single crystalline silicon (Si) material 1932 surrounded by oxide material 1942 on all sides, intersecting across the plurality of separate, horizontal access lines 1977. In FIG. 19E, the first dielectric fill material 1939 is shown separating the space between neighboring horizontally oriented access devices and horizontally oriented storage nodes, which may be formed extending into and out from the plane of the drawing sheet as described in more detail below, and can be spaced along a first direction (D1) 1909 and stacked vertically in arrays extending in the third direction (D3) 1911 in the three dimensional (3D) memory.

Figure 20A:
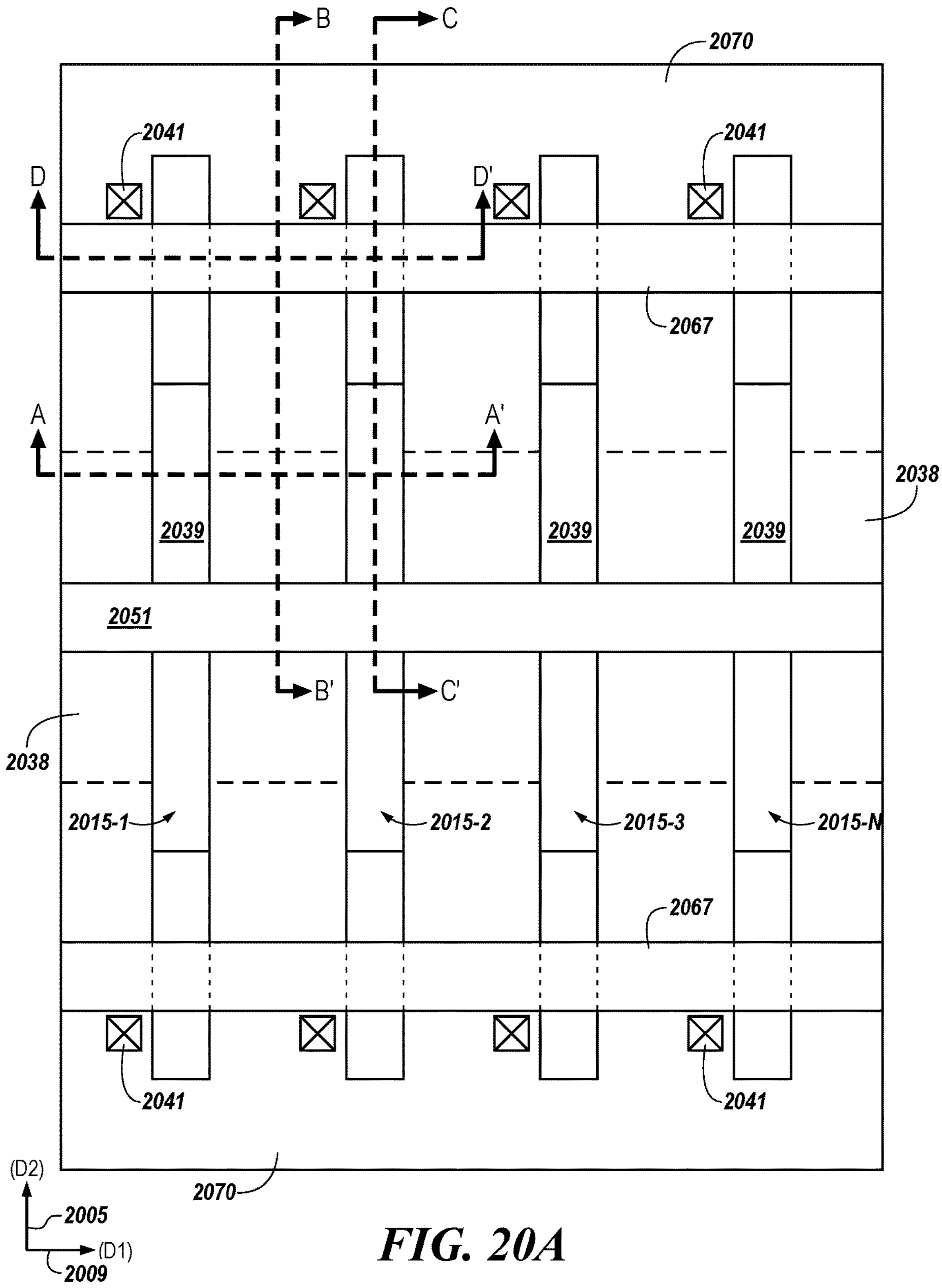
FIGS. 20A to 20E illustrate an example method, at another stage of a semiconductor fabrication process, for forming epitaxial silicon within horizontal access devices in vertical three dimensional (3D) memory, in accordance with a number of embodiments of the present disclosure.

FIG. 20A illustrates an example method, at another stage of a semiconductor fabrication process, for forming epitaxial silicon within horizontal access devices in vertical three dimensional (3D) memory, such as illustrated in FIGS. 1-3, and in accordance with a number of embodiments of the present disclosure. FIG. 20A illustrates a top down view of a semiconductor structure, at a particular point in time, in a semiconductor fabrication process, according to one or more embodiments.

The method in FIG. 20A further illustrates using one or more etchant processes to form fourth vertical opening 2051 in a storage node region through the vertical stack and extending predominantly in the first horizontal direction (D1) 2009. The one or more etchant processes forms fourth vertical opening 2051 to expose third sidewalls in the repeating iterations of alternating layers of epitaxially grown, single crystalline silicon (Si) material 2032, in the vertical stack, adjacent a second region of the epitaxially grown, single crystalline silicon (Si) material. A first conductive material 2077 may be formed above the fourth vertical opening 2051. An ILD fill material 2067 may be formed above the first conductive material 2077.

In some embodiments, this process is performed after selectively removing an access device region of the epitaxially grown, single crystalline silicon (Si) material in which to form a first source/drain region, channel region, and second source/drain region of the horizontally oriented access devices, as illustrated in FIG. 10. According to an example embodiment, shown in FIGS. 20B-20E, the method comprises selectively etching the second region of the epitaxially grown, single crystalline silicon (Si) material 2032, to deposit a second source/drain region and capacitor cells through the second horizontal opening, which is a second horizontal distance back from fourth vertical opening 2051 in the vertical stack. In some embodiments, as shown in FIGS. 20B-20E, the method comprises forming capacitor cell as the storage node in the second horizontal opening. By way of example, and not by way of limitation, forming the capacitor comprises using an atomic layer deposition (ALD) process to sequentially deposit, in the second horizontal opening, a first electrode and a second electrode separated by a cell dielectric. Other suitable semiconductor fabrication techniques and/or storage nodes structures may be used.

Figure 20B:
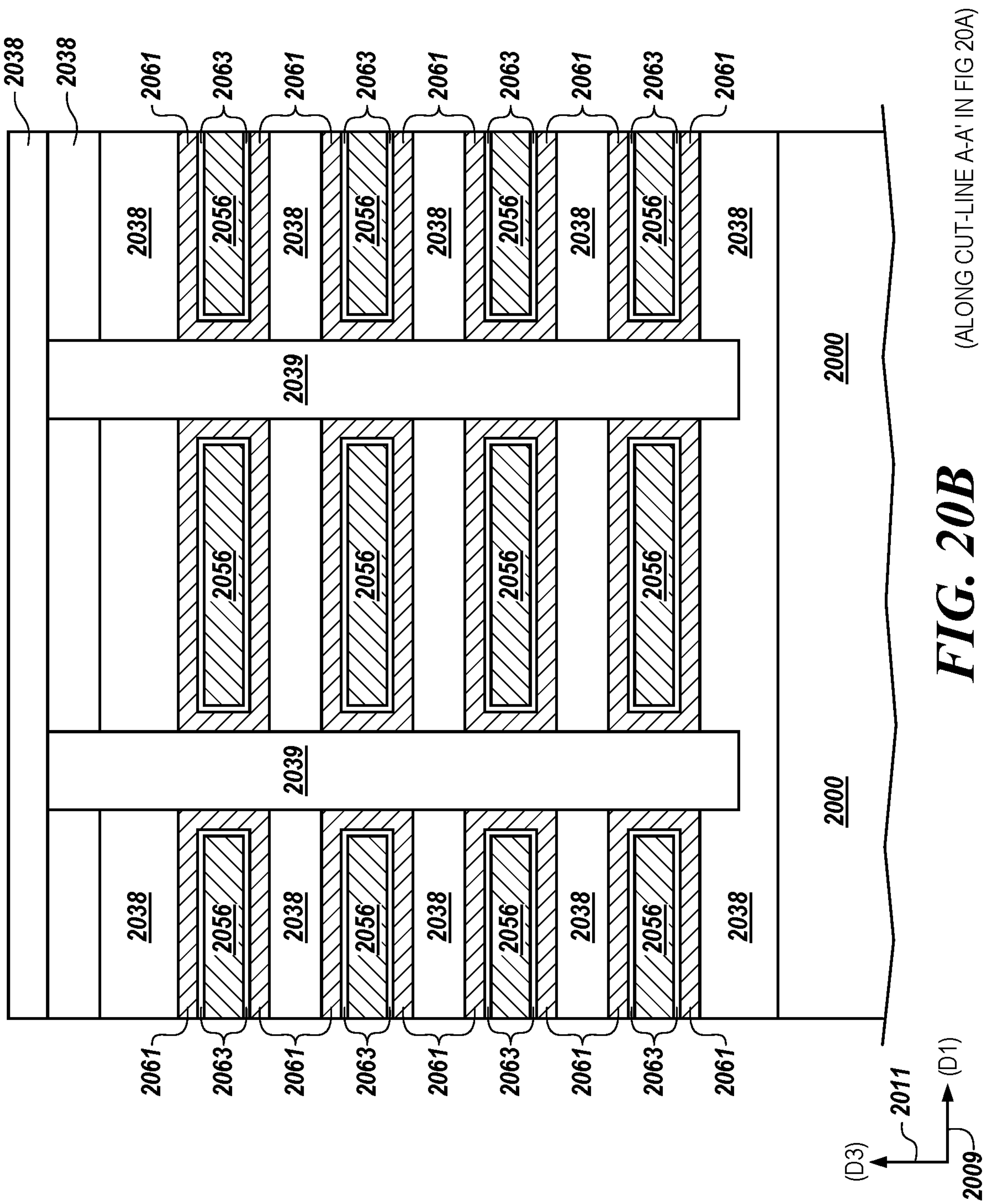

FIG. 20B illustrates a cross sectional view, taken along cut-line A-A' in FIG. 20A, showing another view of the semiconductor structure at this particular point in one example semiconductor fabrication process of an embodiment of the present disclosure. The cross sectional view shown in FIG. 20B is away from the plurality of separate, horizontal access lines and shows repeating iterations of alternating layers of sacrificial oxide material 2038 separated by horizontally oriented capacitor cells having first electrodes 2061, e.g., bottom cell contact electrodes, cell dielectrics 2063, and second electrodes 2056, e.g., top, common node electrodes, on a semiconductor substrate 2000 to form the vertical stack. As shown in FIG. 20B, a vertical direction 2011 is illustrated as a third direction (D3), e.g., z-direction in an x-y-z coordinate system, analogous to the third direction (D3) 2011, among first, second, and third directions, shown in FIGS. 1-3. The plane of the drawing sheet, extending right and left, is in a first direction (D1) 2009. In the example embodiment of FIG. 20B, the first electrodes 2061, e.g., bottom electrodes to be coupled to source/drain regions of horizontal access devices, and second electrodes 2056 are illustrated separated by a cell dielectric material 2063 extending into and out of the plane of the drawing sheet in second direction (D2) and along an axis of orientation of the horizontal access devices and horizontal storage nodes of the arrays of vertically stacked memory cells of the three dimensional (3D) memory.

Figure 20C:
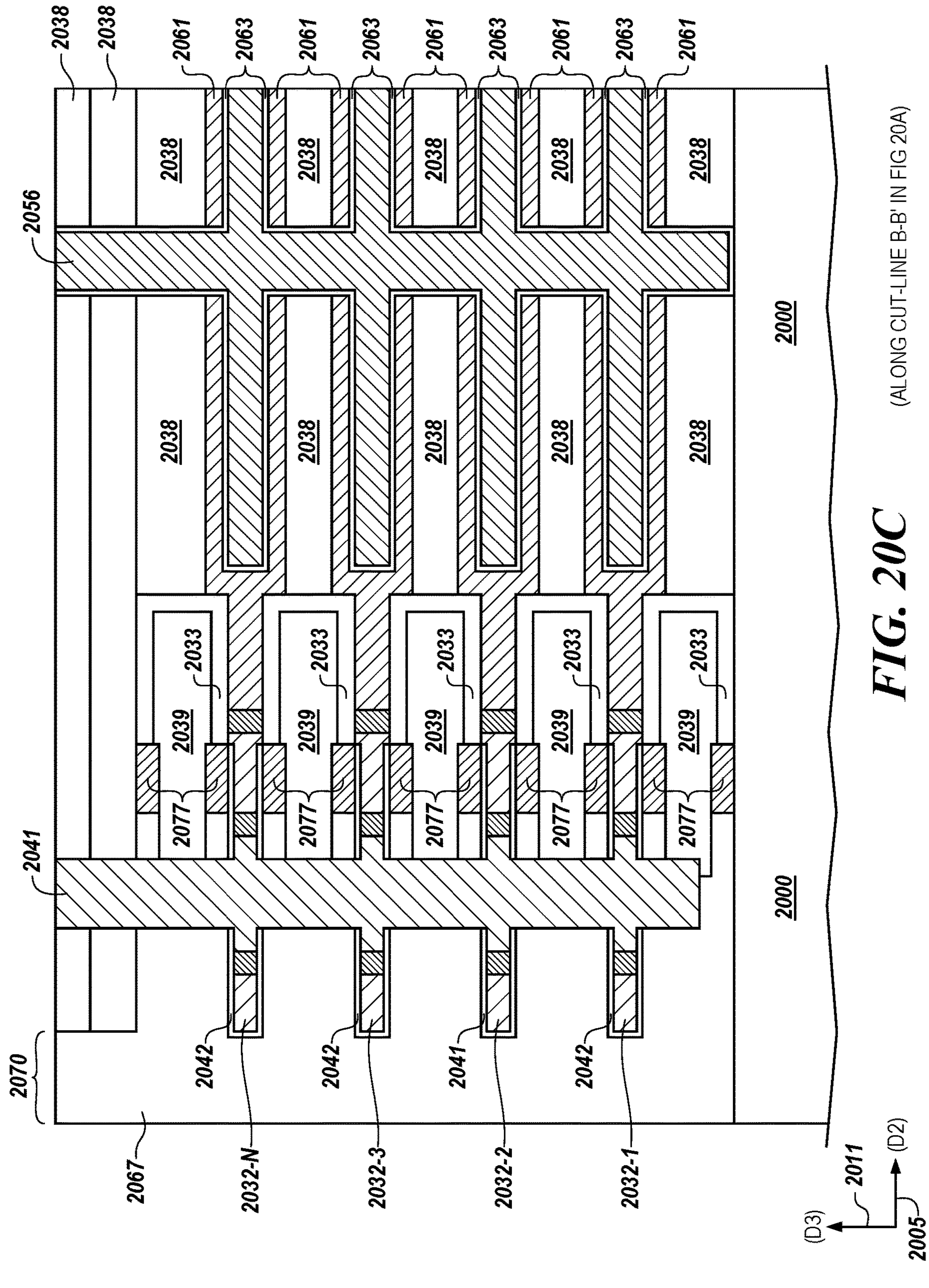

FIG. 20C illustrates a cross sectional view, taken along cut-line B-B' in FIG. 20A, showing another view of the semiconductor structure at this particular point in one example semiconductor fabrication process of an embodiment of the present disclosure. The cross sectional view shown in FIG. 20C is illustrated extending in the second horizontal direction (D2) 2005, left and right along the plane of the drawing sheet, along an axis of the repeating iterations of alternating layers of sacrificial oxide material 2038 surrounded by capacitor cells having first electrodes 2061, e.g., bottom cell contact electrodes, cell dielectrics 2063, and divided by second electrodes 2056, along and in which the horizontally oriented access devices and horizontally oriented storage nodes, e.g., capacitor cells, can be formed.

In the example embodiment of FIG. 20C, the horizontally oriented storage nodes, e.g., capacitor cells, are illustrated as having been formed in this semiconductor fabrication process and first electrodes 2061, e.g., bottom electrodes to be coupled to source/drain regions of horizontal access devices, and second electrodes 2056, e.g., top electrodes to be coupled to a common electrode plane such as a ground plane, separated by cell dielectrics 2063, are shown. However, embodiments are not limited to this example. In other embodiments, the first electrodes 2061, e.g., bottom electrodes to be coupled to source/drain regions of horizontal access devices, and second electrodes 2056, e.g., top electrodes to be coupled to a common electrode plane such as a ground plane, separated by cell dielectrics 2063, may be formed subsequent to forming a first source/drain region, a channel region, and a second source/drain region, intended for location, e.g., placement formation, of the horizontally oriented access devices, described next.

In the example embodiment of FIG. 20C, the horizontally oriented storage nodes having the first electrodes 2061, e.g., bottom electrodes to be coupled to source/drain regions of horizontal access devices, and second electrodes 2056, e.g., top electrodes to be coupled to a common electrode plane such as a ground plane, are shown formed in a second horizontal opening, extending in second direction (D2), left and right in the plane of the drawing sheet, formed in the vertical stack, e.g., 401 in FIG. 4, and along an axis of orientation of the horizontal access devices and horizontal storage nodes of the arrays of vertically stacked memory cells of the three dimensional (3D) memory.

The second conductive material 2041 may be formed as a vertical digit line adjacent first conductive material 2077. The second conductive material 2041 may form vertically oriented digit lines adjacent a first source/drain region. The first source/drain region may be formed by diffusing n-type dopants from the n-type poly silicon (Si) material of the second conductive material 2041 into the silicon material gas phase doping a dopant into a top surface portion of the epitaxially grown, single crystalline silicon (Si) material.

In some embodiments, an ILD fill material 2067 may be deposited into third vertical openings 2070 and filling the continuous second horizontal openings up to the unetched portions of the oxide material 2042 and second conductive material 2041. In some embodiments, the second conductive material 2041 may be formed from a silicide. In some embodiments, the second conductive material 2041 may comprise a titanium material. In some embodiments, the second conductive material 2041 may comprise a titanium nitride (TiN) material. In some embodiments, the second conductive material 2041 may comprise a Ruthenium (Ru) material. In some embodiments, the second conductive material 2041 may be tungsten (W).

In one embodiment, the second conductive material 2041 may be formed by gas phase doping a high energy gas phase dopant, such as phosphorus (P) atoms, as impurity dopants, at a high plasma energy such as PECVD to form a high concentration, n-type doped (n+) region within the fourth vertical opening 2081. A polysilicon (Si) material may be deposited into the fourth vertical opening 2081. For example, a highly phosphorus (P) doped (n+) poly-silicon germanium (SiGe) material into the fourth vertical openings 2081 to form the second conductive material 2041.

The first source/drain region may be formed by out-diffusing n-type (n+) dopants into the epitaxially grown, single crystalline silicon (Si) material. In one embodiment, the plurality of patterned fourth vertical openings may be adjacent the first source/drain region and the high concentration, n-type dopant may be out-diffused into the epitaxially grown, single crystalline silicon (Si) material, to form the first source/drain region. The first source/drain region may be formed on the epitaxially grown, single crystalline silicon (Si) material.

Figure 20D:
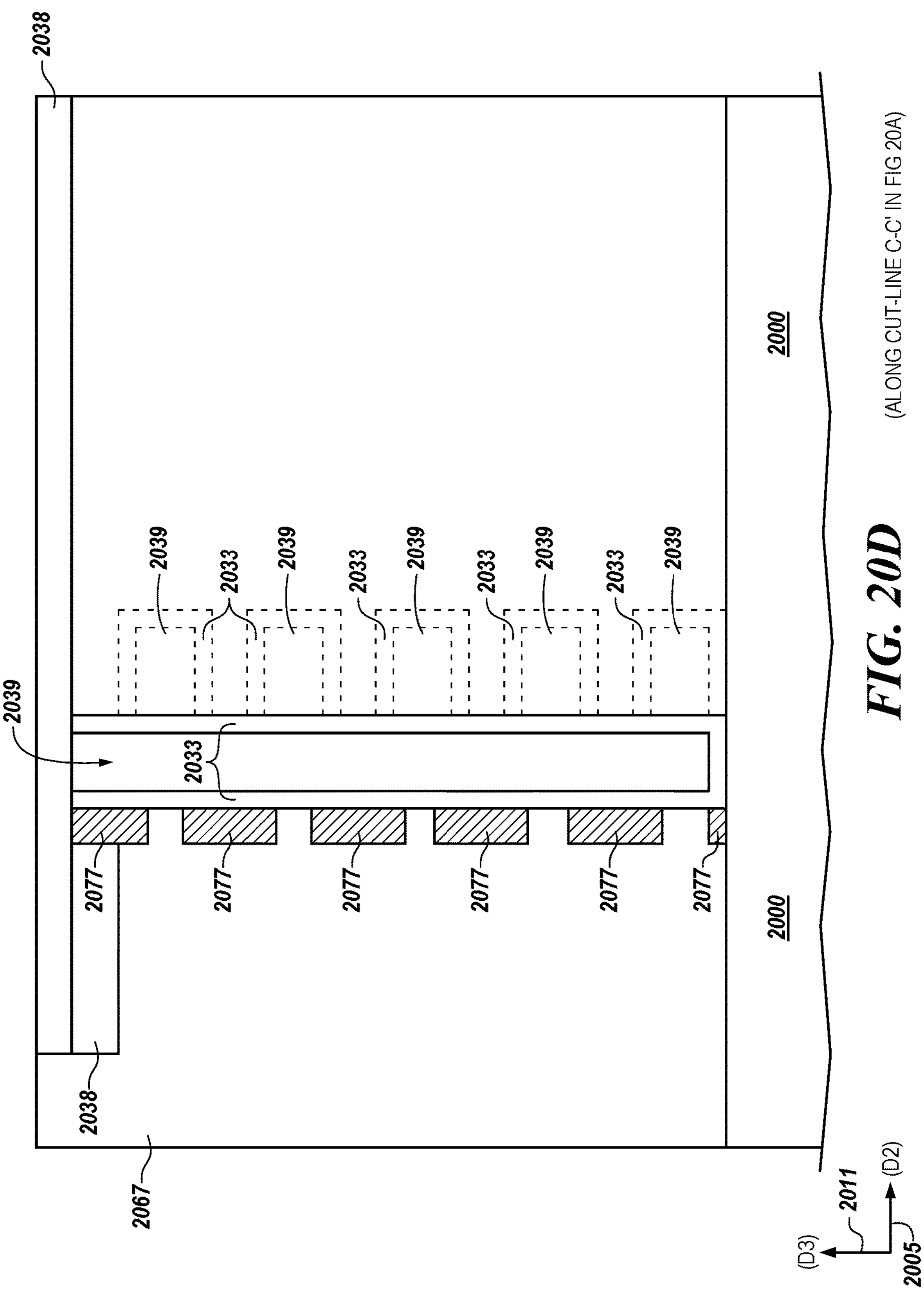

FIG. 20D illustrates a cross sectional view, taken along cut-line C-C' in FIG. 20A, showing another view of the semiconductor structure at this particular point in one example semiconductor fabrication process of an embodiment of the present disclosure. The cross sectional view shown in FIG. 20D is illustrated extending in the second horizontal direction (D2) 2005, left and right in the plane of the drawing sheet. At the left end of the drawing sheet is shown the repeating iterations of alternating layers of a portion of the first conductive material 2077.

Figure 20E:
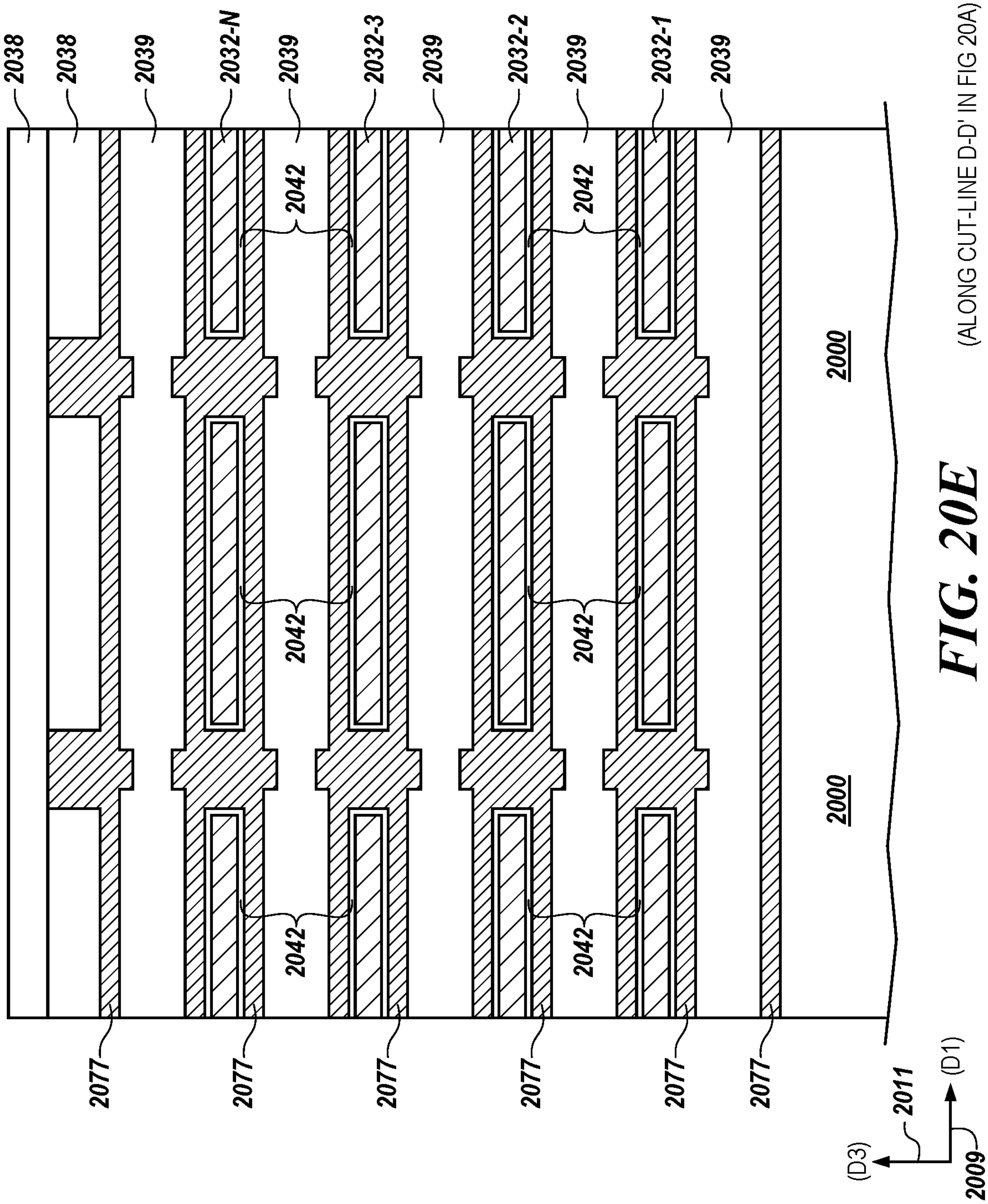

FIG. 20E illustrates a cross sectional view, taken along cut-line D-D' in FIG. 20A, showing another view of the semiconductor structure at this particular point in one example semiconductor fabrication process of an embodiment of the present disclosure. The cross sectional view shown in FIG. 20E is illustrated, right to left in the plane of the drawing sheet, extending in the first direction (D1) 2009 along an axis of the repeating iterations of alternating layers of grown, single crystalline silicon (Si) material 2032 surrounded by oxide material 2042 on all sides, intersecting across the plurality of separate, horizontal access lines 2077. In FIG. 20E, the first dielectric fill material 2039 is shown separating the space between neighboring horizontally oriented access devices and horizontally oriented storage nodes, which may be formed extending into and out from the plane of the drawing sheet as described in more detail below, and can be spaced along a first direction (D1) 2009 and stacked vertically in arrays extending in the third direction (D3) 2011 in the three dimensional (3D) memory.

Figure 21A:
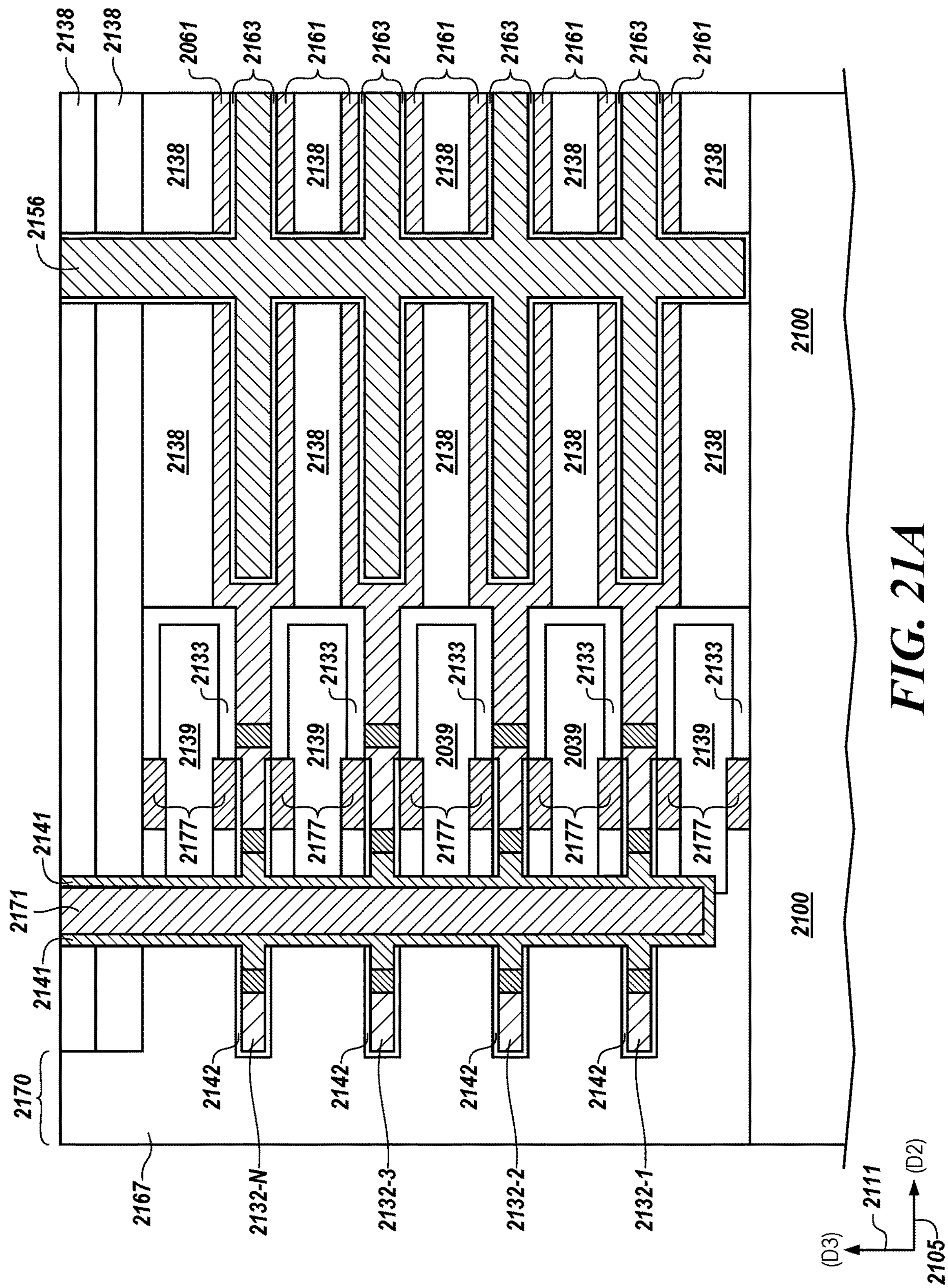
FIGS. 21A to 21B illustrate cross sectional views of an example horizontally oriented access device coupled to a horizontally oriented access lines, having vertical digit lines for semiconductor devices, in accordance with a number of embodiments of the present disclosure.

FIG. 21A illustrates a cross sectional view, taken along cut-line B-B' in FIG. 20A, showing another view of the semiconductor structure at this particular point in one example semiconductor fabrication process of an embodiment of the present disclosure. The cross sectional view shown in FIG. 21A is illustrated extending in the second horizontal direction (D2) 2105, left and right along the plane of the drawing sheet, along an axis of the repeating iterations of alternating layers of sacrificial oxide material 2038 surrounded by capacitor cells having first electrodes 2061, e.g., bottom cell contact electrodes, cell dielectrics 2063, and divided by second electrodes 2056, along and in which the horizontally oriented access devices and horizontally oriented storage nodes, e.g., capacitor cells, can be formed. In the example embodiment of FIG. 21A, the horizontally oriented storage nodes, e.g., capacitor cells, are illustrated as having been formed in this semiconductor fabrication process and first electrodes 2161, e.g., bottom electrodes to be coupled to source/drain regions of horizontal access devices, and second electrodes 2156, e.g., top electrodes to be coupled to a common electrode plane such as a ground plane, separated by cell dielectrics 2163, are shown. However, embodiments are not limited to this example. In other embodiments the first electrodes 2161, e.g., bottom electrodes to be coupled to source/drain regions of horizontal access devices, and second electrodes 2156, e.g., top electrodes to be coupled to a common electrode plane such as a ground plane, separated by cell dielectrics 2163, may be formed subsequent to forming a first source/drain region 2175, a channel region, and a second source/drain region, intended for location, e.g., placement formation, of the horizontally oriented access devices, described next.

In the example embodiment of FIG. 21A, the horizontally oriented storage nodes having the first electrodes 2161, e.g., bottom electrodes to be coupled to source/drain regions of horizontal access devices, and second electrodes 2156, e.g., top electrodes to be coupled to a common electrode plane such as a ground plane, are shown formed in a fourth horizontal opening, extending in second direction (D2), left and right in the plane of the drawing sheet, formed in the vertical stack, e.g., 401 in FIG. 4, and along an axis of orientation of the horizontal access devices and horizontal storage nodes of the arrays of vertically stacked memory cells of the three dimensional (3D) memory.

The second conductive material 2141 may be formed within third vertical openings 2181. The second conductive material 2141 may be formed from a high concentration, n-type dopant. The high concentration, n-type dopant may be formed by depositing a polysilicon material onto the second conductive material 2141. For example, the high concentration, n-type dopant may be formed by depositing a highly phosphorus (P) doped (n+) poly-silicon germanium (SiGe) material onto the second conductive material 2141.

A metal material 2171 may be deposited into the third vertical opening 2181, within second conductive material 2141. In some embodiments, the metal material 2171 may comprise one or more of a doped semiconductor, e.g., doped silicon, doped germanium, etc., a conductive metal nitride, e.g., titanium nitride, tantalum nitride, etc., a metal, e.g., tungsten (W), titanium (Ti), tantalum (Ta), ruthenium (Ru), cobalt (Co), molybdenum (Mo), etc., and/or a metal-semiconductor compound, e.g., tungsten silicide, cobalt silicide, titanium silicide, etc, and/or some other combination thereof. The metal material 2171 coupled to the second conductive material 2141 may be formed vertically adjacent first conductive material 2177.

Figure 21B:
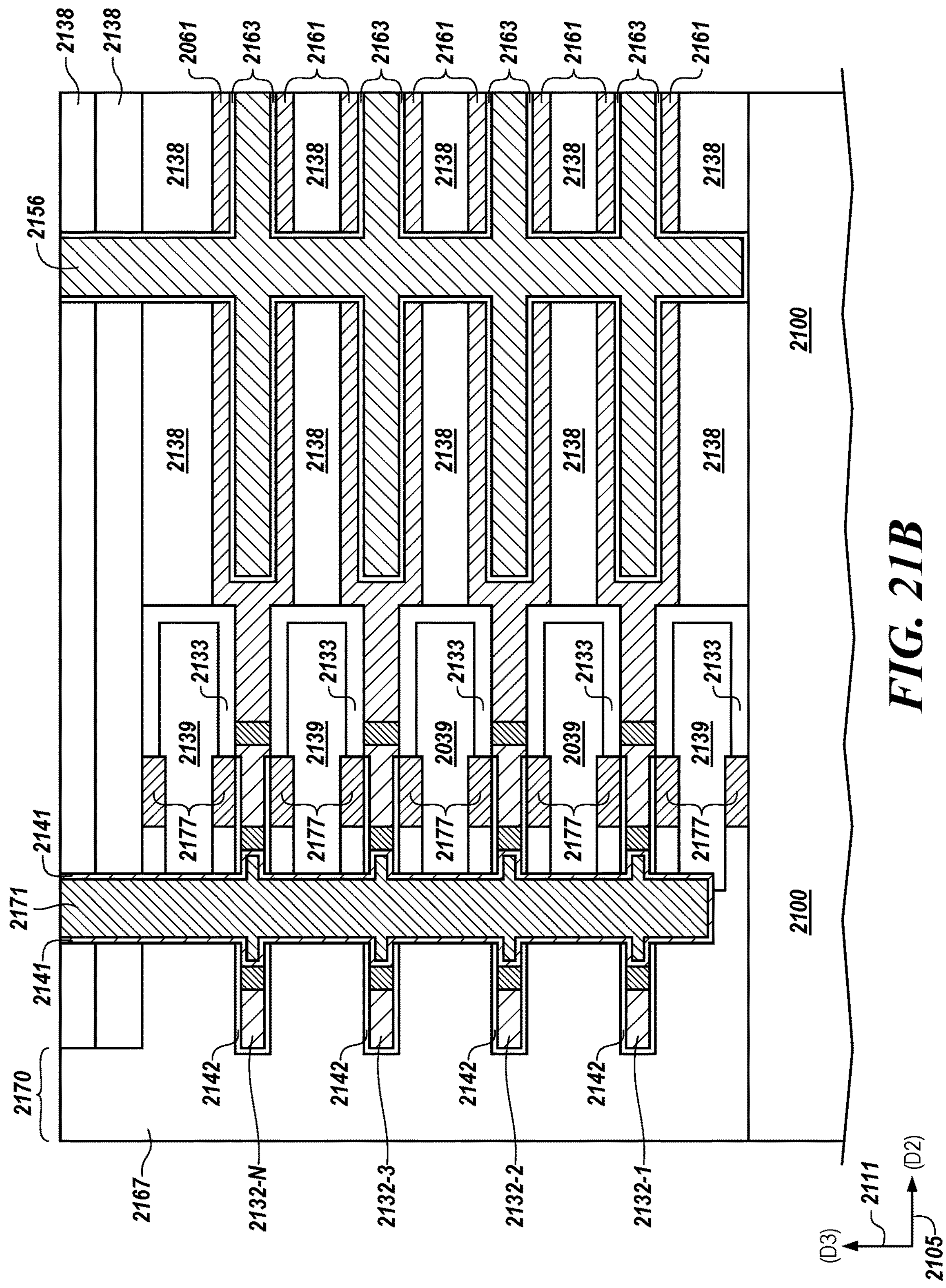

FIG. 21B illustrates an alternate cross sectional view, taken along cut-line B-B' in FIG. 20A, showing another view of the semiconductor structure at this particular point in one example semiconductor fabrication process of an embodiment of the present disclosure. The cross sectional view shown in FIG. 21B is illustrated extending in the second horizontal direction (D2) 2105, left and right along the plane of the drawing sheet, along an axis of the repeating iterations of alternating layers of sacrificial oxide material 2138 surrounded by capacitor cells having first electrodes 2161, e.g., bottom cell contact electrodes, cell dielectrics 2163, and divided by second, along and in which the horizontally oriented access devices and horizontally oriented storage nodes, e.g., capacitor cells, can be formed. In the example embodiment of FIG. 21B, the horizontally oriented storage nodes, e.g., capacitor cells, are illustrated as having been formed in this semiconductor fabrication process and first electrodes 2161, e.g., bottom electrodes to be coupled to source/drain regions of horizontal access devices, and second electrodes 2156, e.g., top electrodes to be coupled to a common electrode plane such as a ground plane, separated by cell dielectrics 2163, are shown. However, embodiments are not limited to this example. In other embodiments the first electrodes 2161, e.g., bottom electrodes to be coupled to source/drain regions of horizontal access devices, and second electrodes 2156, e.g., top electrodes to be coupled to a common electrode plane such as a ground plane, separated by cell dielectrics 2163, may be formed subsequent to forming a second conductive material coupled to a source/drain region and a channel region.

In the example embodiment of FIG. 21B, the horizontally oriented storage nodes having the first electrodes 2161, e.g., bottom electrodes to be coupled to source/drain regions of horizontal access devices, and second electrodes 2156, e.g., top electrodes to be coupled to a common electrode plane such as a ground plane, are shown formed in a second horizontal opening, extending in second direction (D2), left and right in the plane of the drawing sheet, formed in the vertical stack, e.g., 401 in FIG. 4, and along an axis of orientation of the horizontal access devices and horizontal storage nodes of the arrays of vertically stacked memory cells of the three dimensional (3D) memory.

The second conductive material 2141 may be formed within third vertical openings 2181. The second conductive material 2141 may be formed from a high concentration, n-type dopant. The high concentration, n-type dopant may be formed by depositing a polysilicon material onto the second conductive material 2141. For example, the high concentration, n-type dopant may be formed by depositing a highly phosphorus (P) doped (n+) poly-silicon germanium (SiGe) material onto the second conductive material 2141.

A metal material 2171 may be deposited into the third vertical opening 2181, within second conductive material 2141. In some embodiments, the metal material 2171 may comprise one or more of a doped semiconductor, e.g., doped silicon, doped germanium, etc., a conductive metal nitride, e.g., titanium nitride, tantalum nitride, etc., a metal, e.g., tungsten (W), titanium (Ti), tantalum (Ta), ruthenium (Ru), cobalt (Co), molybdenum (Mo), etc., and/or a metal-semiconductor compound, e.g., tungsten silicide, cobalt silicide, titanium silicide, etc, and/or some other combination thereof. The metal material 2171 coupled to the second conductive material 2141 may be formed vertically adjacent first conductive material 2177.

Figure 22B:
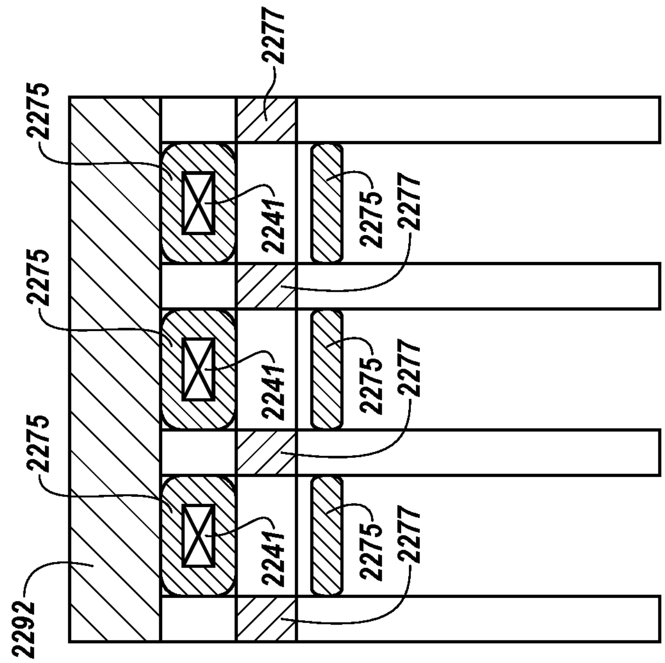
FIGS. 22A to 22B illustrate an example method, at another stage of a semiconductor fabrication process, for forming epitaxial silicon within horizontal access devices in vertical three dimensional (3D) memory, in accordance with a number of embodiments of the present disclosure.
Figure 22A:
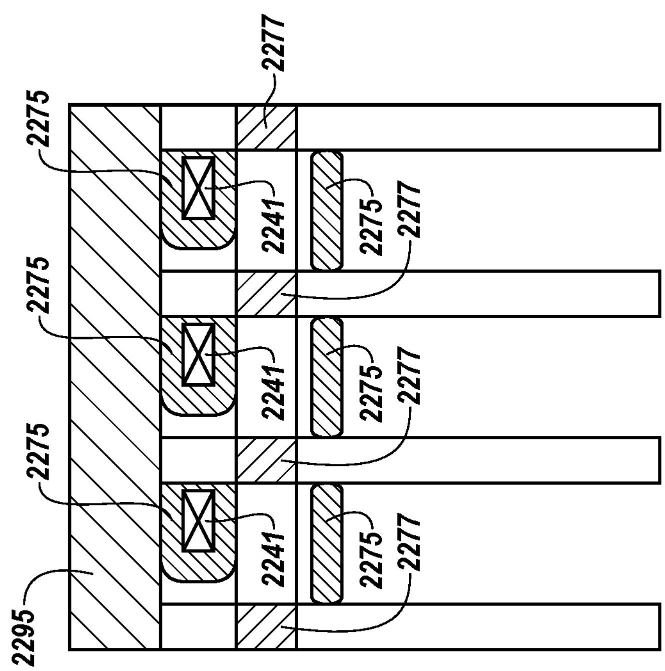

FIG. 22A illustrates an example method, at another stage of a semiconductor fabrication process, forming epitaxial silicon within horizontal access devices in vertical three dimensional (3D) memory, in accordance with a number of embodiments of the present disclosure. FIG. 22A illustrates a top down view of a semiconductor structure, at a particular point in time, in a semiconductor fabrication process, according to one or more embodiments. In the example embodiment of FIG. 22A, the method comprises using a photolithographic process to pattern the photolithographic mask 2237 where a second conductive material 2241 is asymmetric to reserve room for a body contact 2295. The method in FIG. 22A further illustrates using one or more etchant processes to form a vertical opening 2251 in a storage node region 2250 through the vertical stack and extending predominantly in the first horizontal direction (D1) 2209. The one or more etchant processes forms a vertical opening 2251 to expose third sidewalls in the repeating iterations of alternating layers in the vertical stack, adjacent a second region of the semiconductor material.

According to an example embodiment, the method comprises selectively etching the second region of the epitaxially grown, single crystalline silicon (Si) material 2232, to deposit a second source/drain region and capacitor cells through the fourth vertical opening. By way of example, and not by way of limitation, forming the capacitor comprises using an atomic layer deposition (ALD) process to sequentially deposit, in the second horizontal opening, a first electrode 2261 and a second electrode 2256 separated by a cell dielectric 2263. Other suitable semiconductor fabrication techniques and/or storage nodes structures may be used.

In other embodiments, the method further comprises forming a first source/drain region and second conductive material 2241 through third vertical openings 2281. A second conductive material 2241 may be formed vertically through a plurality of patterned third vertical openings 2281 through the vertical stack. The vertically oriented digit lines are formed asymmetrically adjacent in electrical contact with the first source/drain regions 2275. The second conductive material 2241 may form vertical digit lines adjacent a first source/drain region 2275. The first source/drain region 2275 may be formed adjacent a first conductive material 2277 and surrounding the plurality of patterned third vertical openings 2281.

FIG. 22B illustrates an example method, at another stage of a semiconductor fabrication process, forming epitaxial silicon within horizontal access devices in vertical three dimensional (3D) memory, in accordance with a number of embodiments of the present disclosure. FIG. 22B illustrates a top down view of a semiconductor structure, at a particular point in time, in a semiconductor fabrication process, according to one or more embodiments. In the example embodiment of FIG. 22B, the method comprises using a photolithographic process to pattern the photolithographic mask 2237 where a second conductive material 2241 is deposited symmetrically. The method in FIG. 22B further illustrates using one or more etchant processes to form a vertical opening 2251 in a storage node region 2250 through the vertical stack and extending predominantly in the first horizontal direction (D1) 2209. The one or more etchant processes forms a vertical opening 2251 to expose third sidewalls in the vertical stack, adjacent a second region of the semiconductor material.

According to an example embodiment, the method comprises selectively etching the second region of the epitaxially grown, single crystalline silicon (Si) material 2232 to deposit a second source/drain region and capacitor cells. In some embodiments, the method comprises forming capacitor cell as the storage node in the second horizontal opening. By way of example, and not by way of limitation, forming the capacitor comprises using an atomic layer deposition (ALD) process to sequentially deposit, in the second horizontal opening, a first electrode 2261 and a second electrode 2256 separated by a cell dielectric 2263. Other suitable semiconductor fabrication techniques and/or storage nodes structures may be used.

In other embodiments, the method further comprises forming a first source/drain region and second conductive material 2241 through third vertical openings 2281. A second conductive material 2241 may be formed vertically through a plurality of patterned third vertical openings 2281 through the vertical stack. The second conductive material 2241 may be formed symmetrically as a vertical digit line contact. The vertically oriented digit lines are formed symmetrically, in vertical alignment, in electrical contact with the first source/drain regions 2275. The second conductive material 2241 may be formed in contact with an insulator material 2292 such that there is no body contact within a second vertical opening 2270. Second conductive material 2241 may form vertical digit lines adjacent a first source/drain region 2275. The first source/drain region 2275 may be formed adjacent a first conductive material 2277 and surrounding the plurality of patterned third vertical openings 2281.

Figure 23A:
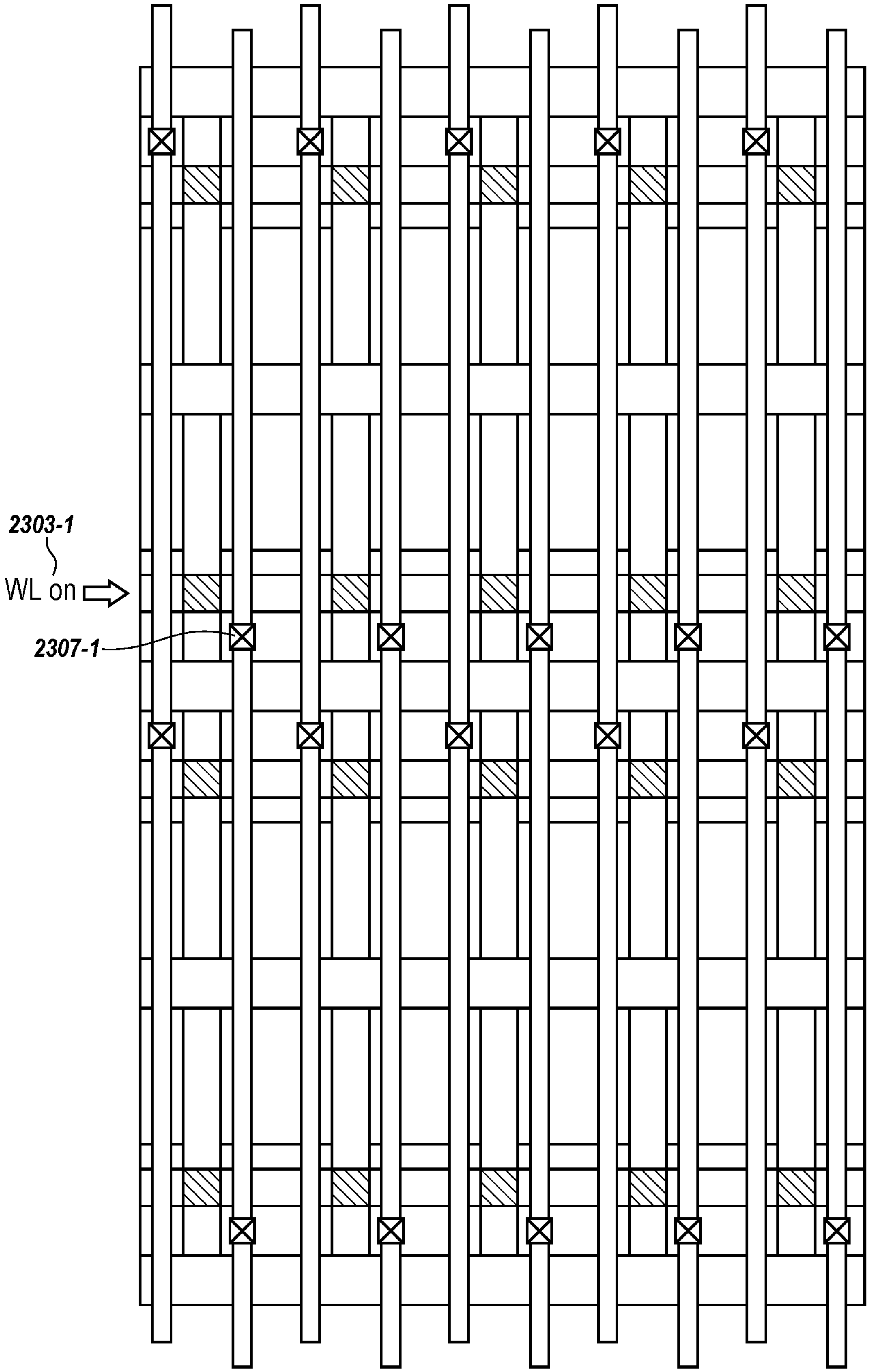
FIGS. 23A to 23B illustrate top views of an example horizontally oriented access device coupled to a horizontally oriented access lines, having vertical digit lines for semiconductor devices, in accordance with a number of embodiments of the present disclosure.

FIG. 23A illustrates an alternate top view, showing another view of the semiconductor structure at this particular point in one example semiconductor fabrication process, and in accordance with a number of embodiments of the present disclosure. FIG. 23A illustrates a top down view of a semiconductor structure with dual vertical digit lines. As illustrated in FIG. 23A, embodiments of the present disclosure may be employed in a structure wherein the array of vertically stacked memory cells is electrically coupled in a folded digit line architecture. In a folded digit line structure, the dual structures may share a single word line 2303. A folded digit line structure may be possible when the digit lines 2307 has an odd amount of word lines 2303. A folded digit line structure may be possible when only one word line is turned on in the sub array block.

Figure 23B:
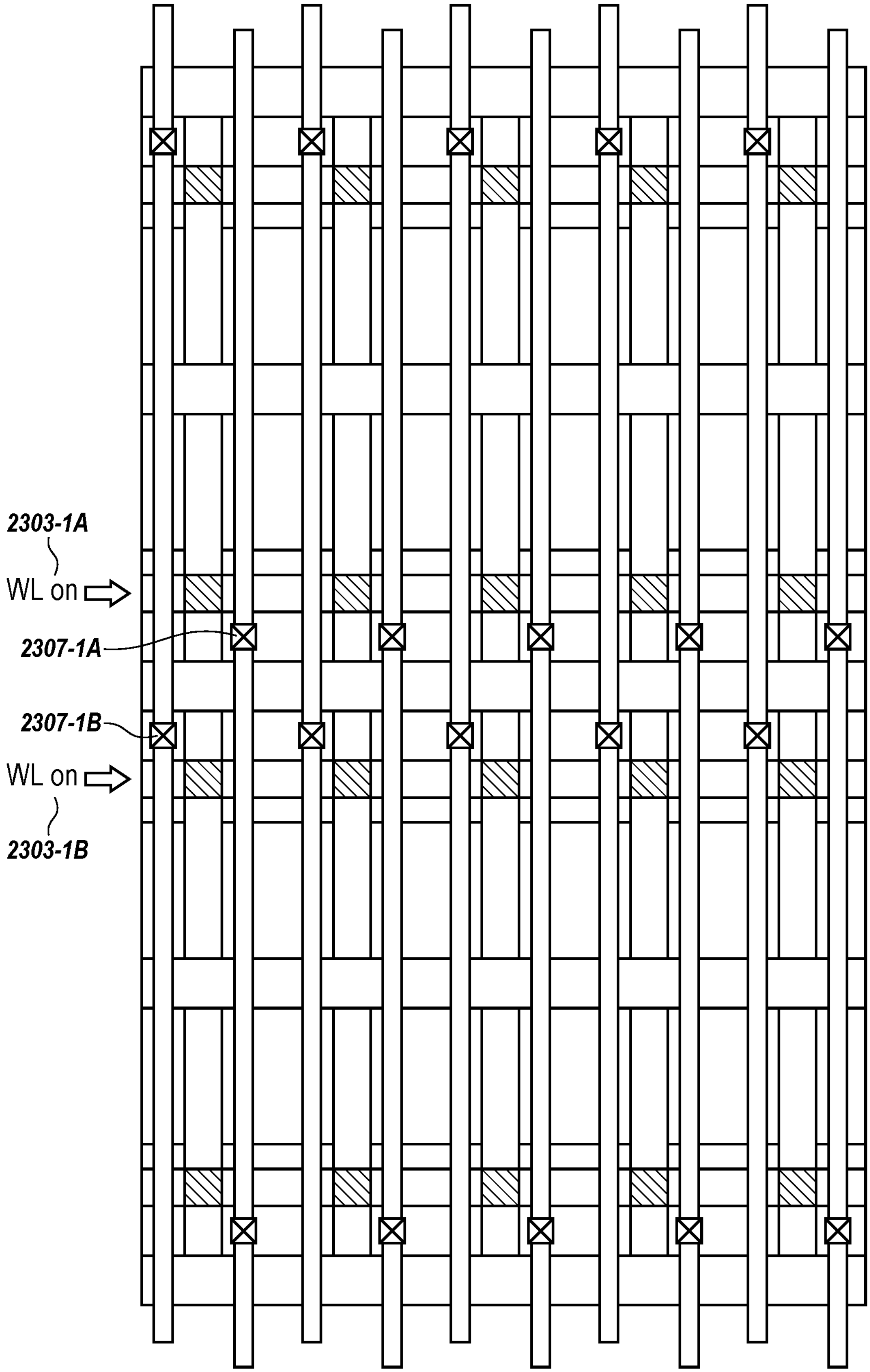

FIG. 23B illustrates an alternate top view, showing another view of the semiconductor structure at this particular point in one example semiconductor fabrication process, and in accordance with a number of embodiments of the present disclosure. FIG. 23B illustrates a top down view of a semiconductor structure with dual vertical digit lines. As illustrated in FIG. 23B, embodiments of the present disclosure may be employed in a structure wherein the array of vertically stacked memory cells is electrically coupled in an open digit line architecture. In an open digit line structure, each digit line structure may have its own word line 2303, such that a dual vertical digit line structure may have two wordlines. An open digit line structure may be possible when the digit lines 2307 has an even amount of word lines 2303. If two neighboring wordlines are turned on, only an open digit line structure may be possible; a folded digit line structure would not be possible.

Figure 24:
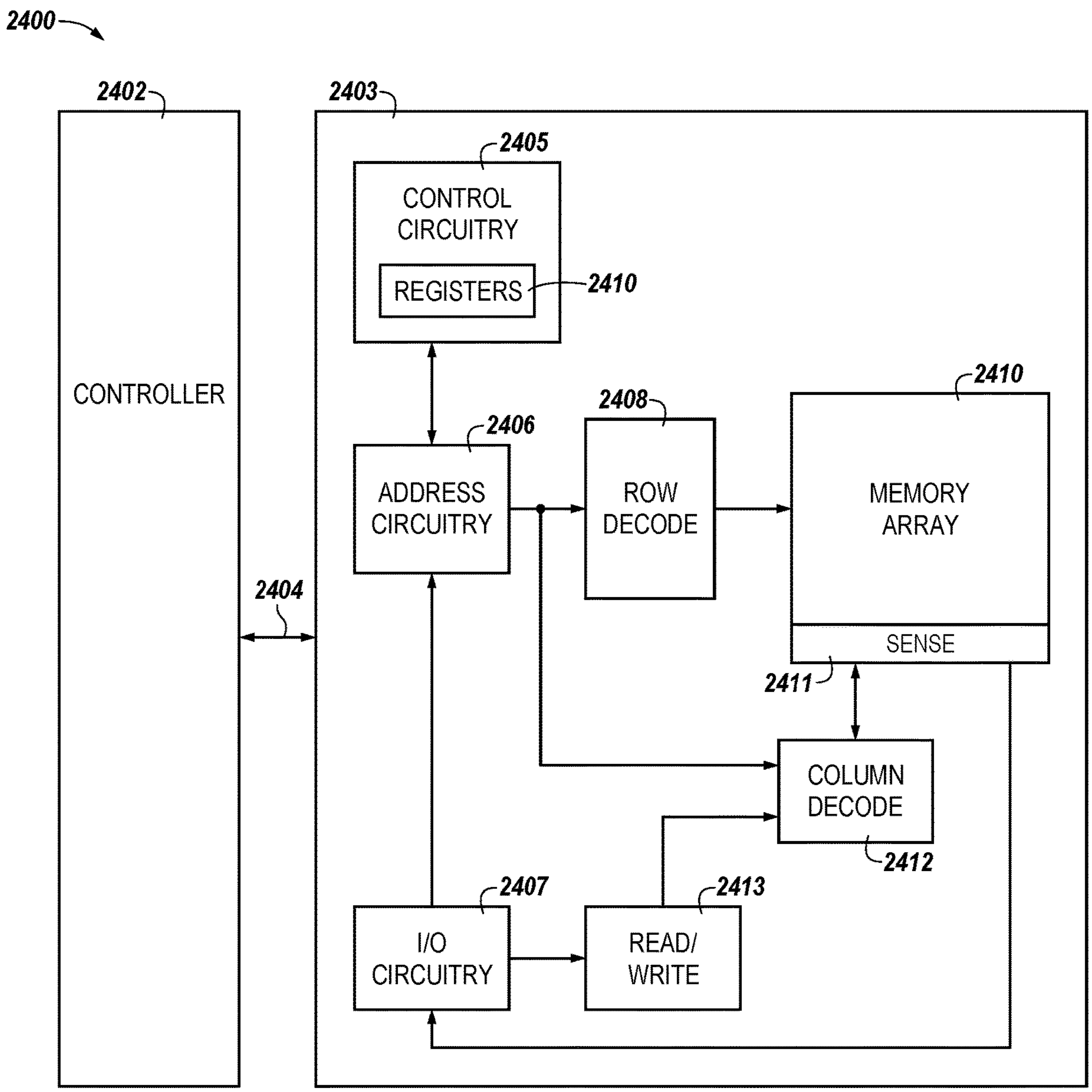
FIG. 24 is a block diagram of an apparatus in the form of a computing system including a memory device in accordance with a number of embodiments of the present disclosure.

FIG. 24 is a block diagram of an apparatus in the form of a computing system 2400 including a memory device 2403 in accordance with a number of embodiments of the present disclosure. As used herein, a memory device 2403, a memory array 2410, and/or a host 2402, for example, might also be separately considered an "apparatus." According to embodiments, the memory device 2402 may comprise at least one memory array 2410 with a memory cell formed having a digit line and body contact, according to the embodiments described herein.

In this example, system 2400 includes a host 2402 coupled to memory device 2403 via an interface 2404. The computing system 2400 can be a personal laptop computer, a desktop computer, a digital camera, a mobile telephone, a memory card reader, or an Internet-of-Things (IoT) enabled device, among various other types of systems. Host 2402 can include a number of processing resources (e.g., one or more processors, microprocessors, or some other type of controlling circuitry) capable of accessing memory 2403. The system 2400 can include separate integrated circuits, or both the host 2402 and the memory device 2403 can be on the same integrated circuit. For example, the host 2402 may be a system controller of a memory system comprising multiple memory devices 2403, with the system controller 2405 providing access to the respective memory devices 2403 by another processing resource such as a central processing unit (CPU).

In the example shown in FIG. 24, the host 2402 is responsible for executing an operating system (OS) and/or various applications (e.g., processes) that can be loaded thereto (e.g., from memory device 2403 via controller 2405). The OS and/or various applications can be loaded from the memory device 2403 by providing access commands from the host 2402 to the memory device 2403 to access the data comprising the OS and/or the various applications. The host 2402 can also access data utilized by the OS and/or various applications by providing access commands to the memory device 2403 to retrieve said data utilized in the execution of the OS and/or the various applications.

For clarity, the system 2400 has been simplified to focus on features with particular relevance to the present disclosure. The memory array 2410 can be a DRAM array comprising at least one memory cell having a digit line and body contact formed according to the techniques described herein. For example, the memory array 2410 can be an unshielded DL 4F2 array such as a 3D-DRAM memory array. The array 2410 can comprise memory cells arranged in rows coupled by word lines (which may be referred to herein as access lines or select lines) and columns coupled by digit lines (which may be referred to herein as sense lines or data lines). Although a single array 2410 is shown in FIG. 24, embodiments are not so limited. For instance, memory device 2403 may include a number of arrays 2410 (e.g., a number of banks of DRAM cells).

The memory device 2403 includes address circuitry 2406 to latch address signals provided over an interface 2404. The interface can include, for example, a physical interface employing a suitable protocol (e.g., a data bus, an address bus, and a command bus, or a combined data/address/command bus). Such protocol may be custom or proprietary, or the interface 2404 may employ a standardized protocol, such as Peripheral Component Interconnect Express (PCIe), Gen-Z, CCIX, or the like. Address signals are received and decoded by a row decoder 2408 and a column decoder 2412 to access the memory array 2410. Data can be read from memory array 2410 by sensing voltage and/or current changes on the sense lines using sensing circuitry 2411. The sensing circuitry 2411 can comprise, for example, sense amplifiers that can read and latch a page (e.g., row) of data from the memory array 2410. The I/O circuitry 2407 can be used for bi-directional data communication with the host 2402 over the interface 2404. The read/write circuitry 2413 is used to write data to the memory array 2410 or read data from the memory array 2410. As an example, the circuitry 2413 can comprise various drivers, latch circuitry, etc.

Control circuitry 2405 decodes signals provided by the host 2402. The signals can be commands provided by the host 2402. These signals can include chip enable signals, write enable signals, and address latch signals that are used to control operations performed on the memory array 2410, including data read operations, data write operations, and data erase operations. In various embodiments, the control circuitry 2405 is responsible for executing instructions from the host 2402. The control circuitry 2405 can comprise a state machine, a sequencer, and/or some other type of control circuitry, which may be implemented in the form of hardware, firmware, or software, or any combination of the three. In some examples, the host 2402 can be a controller external to the memory device 2403. For example, the host 2402 can be a memory controller which is coupled to a processing resource of a computing device.

The term semiconductor can refer to, for example, a material, a wafer, or a substrate, and includes any base semiconductor structure. "Semiconductor" is to be understood as including silicon-on-sapphire (SOS) technology, silicon-on-insulator (SOI) technology, thin-film-transistor (TFT) technology, doped and undoped semiconductors, epitaxial silicon supported by a base semiconductor structure, as well as other semiconductor structures. Furthermore, when reference is made to a semiconductor in the preceding description, previous process steps may have been utilized to form regions/junctions in the base semiconductor structure, and the term semiconductor can include the underlying materials containing such regions/junctions.

The figures herein follow a numbering convention in which the first digit or digits correspond to the drawing figure number and the remaining digits identify an element or component in the drawing. Similar (e.g., the same) elements or components between different figures may be identified by the use of similar digits. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure and should not be taken in a limiting sense.

As used herein, "a number of" or a "quantity of" something can refer to one or more of such things. For example, a number of or a quantity of memory cells can refer to one or more memory cells. A "plurality" of something intends two or more. As used herein, multiple acts being performed concurrently refers to acts overlapping, at least in part, over a particular time period. As used herein, the term "coupled" may include electrically coupled, directly coupled, and/or directly connected with no intervening elements (e.g., by direct physical contact), indirectly coupled and/or connected with intervening elements, or wirelessly coupled. The term coupled may further include two or more elements that co-operate or interact with each other (e.g., as in a cause and effect relationship). An element coupled between two elements can be between the two elements and coupled to each of the two elements.

It should be recognized the term vertical accounts for variations from "exactly" vertical due to routine manufacturing, measuring, and/or assembly variations and that one of ordinary skill in the art would know what is meant by the term "perpendicular." For example, the vertical can correspond to the z-direction. As used herein, when a particular element is "adjacent to" an other element, the particular element can cover the other element, can be over the other element or lateral to the other element and/or can be in direct physical contact the other element. Lateral to may refer to the horizontal direction (e.g., the y-direction or the x-direction) that may be perpendicular to the z-direction, for example.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

What is claimed is:

1. A method for forming arrays of vertically stacked memory cells, having horizontally oriented access devices and storage nodes, comprising:

- epitaxially forming alternating layers of silicon germanium (SiGe) material and silicon (Si) material from a substrate to form a vertical stack;
- forming a plurality of first vertical openings, having a first horizontal direction and a second horizontal direction, through the vertical stack, the first vertical openings extending predominantly in the second horizontal direction to form elongated vertical, pillar columns with first vertical sidewalls in the stack;
- filling the plurality of first vertical openings with a first dielectric material;
- forming a plurality of spaced, second vertical openings through the vertical stack by selectively removing a portion of the first dielectric material in the plurality of first vertical openings to expose sidewalls adjacent a first region of the epitaxially grown silicon germanium (SiGe);
- selectively etching the epitaxially grown silicon germanium (SiGe) isotropically to form a plurality of first horizontal openings;

conformally depositing a second dielectric material on exposed surfaces in the plurality of first horizontal openings;

depositing the first dielectric material to fill the plurality of first horizontal openings;

forming a third vertical opening through the vertical stack and extending predominantly in the first horizontal direction to expose sidewalls adjacent a second region of the epitaxially grown silicon germanium (SiGe);

selectively etching the epitaxially grown silicon germanium (SiGe) to form a plurality of second horizontal openings extending a first distance (D1) from the third vertical opening;

selectively etching the second dielectric material a second distance (D2) from the third vertical opening; and forming a gate dielectric material on exposed surfaces of the epitaxially formed Si material to form horizontal access devices.

2. The method of claim 1, wherein forming the gate dielectric material comprises:

using atomic layer deposition to first deposit a layer of an oxide material on exposed surfaces of the epitaxially formed Si material; and using a thermal oxidation to densify the ALD deposited oxide material.

3. The method of claim 1, wherein selectively etching the epitaxially grown silicon germanium (SiGe) to form a plurality of second horizontal openings extending a first distance (D1) from the third vertical opening comprises using the second dielectric material as an etch stop.

4. The method of claim 1, further comprising forming the second dielectric material from a silicon nitride material with a conformal thickness (t1) in a range of approximately 100 to 300 angstroms (Å).

5. The method of claim 1, further comprising epitaxially growing the Si material to have a vertical thickness (t2) in a range of approximately 50 to 300 angstroms (Å).

6. The method of claim 1, wherein depositing a first conductive material comprises depositing the first conductive material fully around every surface of the Si material, to form gate all around (GAA) gate structures, at channels of the access device regions.

7. The method of claim 1, further comprising depositing a first conductive material on the gate dielectric material and formed around the Si material, recessed back, to form gate all around (GAA) structure opposing channel regions of the Si material.

8. The method of claim 1, wherein the method comprises:

removing a portion of the first dielectric material filled in the plurality of first vertical openings, between the first horizontal openings, to form continuous second horizontal openings extending in the first horizontal direction; and depositing the first conductive material in the continuous second horizontal openings to form horizontally oriented access lines opposing channel regions of the Si material.

9. The method of claim 1, the method further comprising forming a plurality of patterned fourth vertical openings through the vertical stack adjacent first source/drain regions in which to deposit a second conductive material to form vertically oriented digit lines.

10. The method of claim 9, further comprising:

depositing a doped, n-type poly silicon (Si) material in the plurality of patterned fourth vertical openings through the vertical stack adjacent first source/drain regions to form the vertically oriented digit lines; and annealing to diffuse n-type dopants from the n-type poly silicon (Si) material into the epitaxially formed Si material to form first source/drain regions in the horizontally oriented access devices adjacent channel regions.

11. The method of claim 1, further comprising:

forming a fourth vertical opening adjacent a second region of the epitaxially grown, single crystalline silicon (Si) material to expose third vertical sidewalls in the vertical stack;

selectively etching the epitaxially grown, single crystalline silicon (Si) material in the second horizontal direction to form a plurality of third horizontal openings in the second region;

gas phase doping a dopant in a side surface of the epitaxially grown, single crystalline silicon (Si) material from the third horizontal openings to form second source/drain regions horizontally adjacent the channel region; and depositing horizontally oriented capacitor cells having a bottom electrode formed in electrical contact with the second source/drain regions.

12. The method of claim 1, wherein depositing a first conductive material around the Si material comprises depositing the first conductive material having a top portion above the Si material and a bottom portion below the epitaxially grown, single crystalline silicon (Si) material.

13. The method of claim 1, wherein selectively etching the second dielectric material comprises removing the second dielectric material using a timed exhume process a second distance (DIST 2) in a range of approximately twenty-five (25) to seventy-five (75) nanometers (nm).

14. The method of claim 1, further comprising selectively recessing a first conductive material and a gate dielectric material in the second direction, in the continuous second horizontal openings, a third distance (DIST 3) in a range of twenty (20) to fifty (50) nanometers (nm) back from the third vertical opening.

15. The method of claim 1, further comprising selectively recessing the first conductive material and the gate dielectric material a third distance (DIST 3) around the semiconductor material back into the continuous second horizontal openings extending in the first horizontal direction using an atomic layer etching (ALE) process.

16. The method of claim 1, wherein depositing a conductive material on a gate dielectric material, recessed back, in the continuous second horizontal openings extending in the first horizontal direction comprises depositing the gate dielectric and the conductive material using an atomic layer deposition (ALD) process.

17. The method of claim 1, further comprising depositing a ruthenium (Ru) composition as a second conductive material in the plurality of patterned fourth vertical openings through the vertical stack to form vertically oriented digit lines.

18. A method for forming arrays of vertically stacked memory cells, having horizontally oriented access devices and storage nodes, comprising:

epitaxially forming alternating layers of silicon germanium (SiGe) material and silicon (Si) material from a substrate to form a vertical stack;

forming a plurality of first vertical openings, having a first horizontal direction and a second horizontal direction, through the vertical stack, the first vertical openings extending predominantly in the second horizontal direction to form elongated vertical, pillar columns with first vertical sidewalls in the stack;

filling the plurality of first vertical openings with a first dielectric material;

forming a plurality of spaced, second vertical openings through the vertical stack by patterning (in the first horizontal direction) and selectively removing the first dielectric material in the plurality of first vertical openings to expose second vertical sidewalls adjacent a first region of the epitaxially grown silicon germanium (SiGe);

selectively etching the epitaxially grown silicon germanium (SiGe) isotropically to form a plurality of first horizontal openings in the first region separating layers of the Si material;

conformally depositing a second dielectric material to a first thickness (t1) on exposed surfaces in the plurality of first horizontal openings;

depositing the first dielectric material through the plurality of spaced, second vertical openings to fill the plurality of first horizontal openings;

forming a third vertical opening through the vertical stack and extending predominantly in the first horizontal direction to expose third vertical sidewalls adjacent a second region of the epitaxially grown silicon germanium (SiGe); and selectively etching the epitaxially grown silicon germanium (SiGe) to form a plurality of second horizontal openings in the second region separating layers of the Si material a first distance (D1) from the third vertical opening and stopping on the second dielectric material.

19. The method of claim 18, further comprising selectively etching the second dielectric material using a timed exhume a second distance (D2) from the third vertical opening.

20. The method of claim 18, further comprising:

removing a portion of the first dielectric material filled in the plurality of first vertical openings, between the first horizontal openings, to form continuous second horizontal openings extending in the first horizontal direction;

depositing a first conductive material on a gate dielectric material and formed around the Si material, recessed back, in the continuous second horizontal openings to form horizontally oriented access lines opposing a channel region of the Si material; and forming a plurality of patterned fourth vertical openings through the vertical stack adjacent first source/drain regions in which to deposit a second conductive material to form vertically oriented digit lines.

21. The method of claim 20, depositing a poly silicon (Si) material having a high concentration of an n-type (n+) dopant in the patterned fourth vertical openings.

22. The method of claim 21, further comprising forming the epitaxially grown silicon germanium (SiGe) from an oxide material with a thickness in a range of approximately 300 to 600 angstroms (Å).

23. The method of claim 21, wherein forming the plurality of patterned fourth vertical openings through the vertical stack comprises forming the plurality of patterned fourth vertical openings in vertical alignment with a location of the first source/drain regions to serve as the first source/drain regions.

24. The method of claim 21, wherein forming the plurality of patterned fourth vertical openings through the vertical stack comprises forming the plurality of patterned fourth vertical openings adjacent a location of the first source/drain regions and out-diffusing the n-type (n+) dopant into the epitaxially grown, single crystalline silicon (Si) material to form the first source/drain regions.

25. The method of claim 21, further comprising depositing a tungsten (W) material on the poly silicon (Si) material in the patterned fourth vertical openings.

26. The method of claim 21, further comprising depositing a titanium/titanium nitride (TiN) conductive material on the poly silicon (Si) material, via the patterned fourth vertical openings, to form a titanium silicide as part of the vertically oriented digit line coupled to first source/drain regions of the horizontally oriented access devices.

27. The method of claim 21, wherein depositing a poly silicon (Si) material having a high concentration of an n-type (n+) dopant in the patterned fourth vertical openings comprises depositing a highly phosphorus (P) doped (n+) polysilicon germanium (SiGe) material.

* * * * *